(12) United States Patent
Kim

(10) Patent No.: US 9,929,369 B2
(45) Date of Patent: Mar. 27, 2018

(54) ORGANIC ELECTROLUMINESCENT ELEMENT AND METHOD FOR MANUFACTURING THE SAME

(75) Inventor: Ki-Beom Kim, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 71 days.

(21) Appl. No.: 13/814,872

(22) PCT Filed: Jul. 28, 2011

(86) PCT No.: PCT/JP2011/067267
§ 371 (c)(1),
(2), (4) Date: Feb. 7, 2013

(87) PCT Pub. No.: WO2012/020650
PCT Pub. Date: Feb. 16, 2012

(65) Prior Publication Data
US 2013/0134410 A1   May 30, 2013

(30) Foreign Application Priority Data

Aug. 10, 2010   (JP) .................. 2010-179274

(51) Int. Cl.
*H01L 51/52* (2006.01)
*H01L 51/00* (2006.01)
(Continued)

(52) U.S. Cl.
CPC ...... *H01L 51/5206* (2013.01); *H01L 51/0039* (2013.01); *H01L 51/0043* (2013.01);
(Continued)

(58) Field of Classification Search
CPC .................................. H01L 51/0034
(Continued)

(56) References Cited

U.S. PATENT DOCUMENTS 7,553,594 B2 * 6/2009 Ogaki et al. ............. 430/66
2004/0227460 A1  11/2004 Liao et al.
(Continued)

FOREIGN PATENT DOCUMENTS

CN          1610466 A      4/2005
JP       2006-344606 A    12/2006
(Continued)

OTHER PUBLICATIONS

Office Action dated Mar. 11, 2014 in corresponding Japanese Patent Application No. 2010-179274 with English translation.
(Continued)

*Primary Examiner* — Matthew Reames
*Assistant Examiner* — Christopher Culbert
(74) *Attorney, Agent, or Firm* — Sughrue Mion, PLLC

(57) ABSTRACT

The present invention provides a multi-photon-type organic electroluminescent element including a charge generation layer using a material that is difficult to be degraded even at around normal atmospheric pressure. In an organic electroluminescent element (10) including a pair of electrodes consisting of an anode (32) and a cathode (34), a plurality of light-emitting layers (50) provided between the electrodes, and a charge generation layer (70) provided between the light-emitting layers adjacent to each other, the charge generation layer contains an ionic polymer generating at least any one of an electron and a hole.

3 Claims, 1 Drawing Sheet

(51) Int. Cl.
*H05B 33/12* (2006.01)
*H01L 51/50* (2006.01)

(52) U.S. Cl.
CPC .......... *H05B 33/12* (2013.01); *H01L 51/5044* (2013.01); *H01L 51/5092* (2013.01); *H01L 51/5278* (2013.01)

(58) Field of Classification Search
USPC .......................................................... 257/40
See application file for complete search history.

(56) References Cited

U.S. PATENT DOCUMENTS

| | | |
|---|---|---|
| 2005/0264174 A1 | 12/2005 | Liao et al. |
| 2007/0001588 A1 | 1/2007 | Boroson et al. |
| 2007/0001590 A1 | 1/2007 | Tateishi et al. |
| 2007/0235742 A1 | 10/2007 | Tobise et al. |
| 2010/0102761 A1 | 4/2010 | Von Malm et al. |
| 2011/0006294 A1* | 1/2011 | Tanaka .................. C08G 61/02 257/40 |

FOREIGN PATENT DOCUMENTS

| | | |
|---|---|---|
| JP | 2007-043080 A | 2/2007 |
| JP | 2007-059848 A | 3/2007 |
| JP | 2007242601 A | 9/2007 |
| JP | 2007-287652 A | 11/2007 |
| JP | 2008-501223 A | 1/2008 |
| JP | 2009-500794 A | 1/2009 |
| JP | 2009239279 A | 10/2009 |
| JP | 2010-033984 A | 2/2010 |
| JP | 2010033984 A * | 2/2010 |

OTHER PUBLICATIONS

Communication dated Sep. 29, 2015 from the Intellectual Property Office of People's Republic of China issued in corresponding application No. 201180048999.1.

State Intellectual Property Office of People's Republic of China, "First Office Action," issued in connection with Chinese Patent Application No. 201180048999.1, dated Feb. 4, 2015.

European Patent Office, "Communication with Extended Search Report," issued in connection with European Patent Application No. 11816316.1, dated Mar. 25, 2015.

* cited by examiner

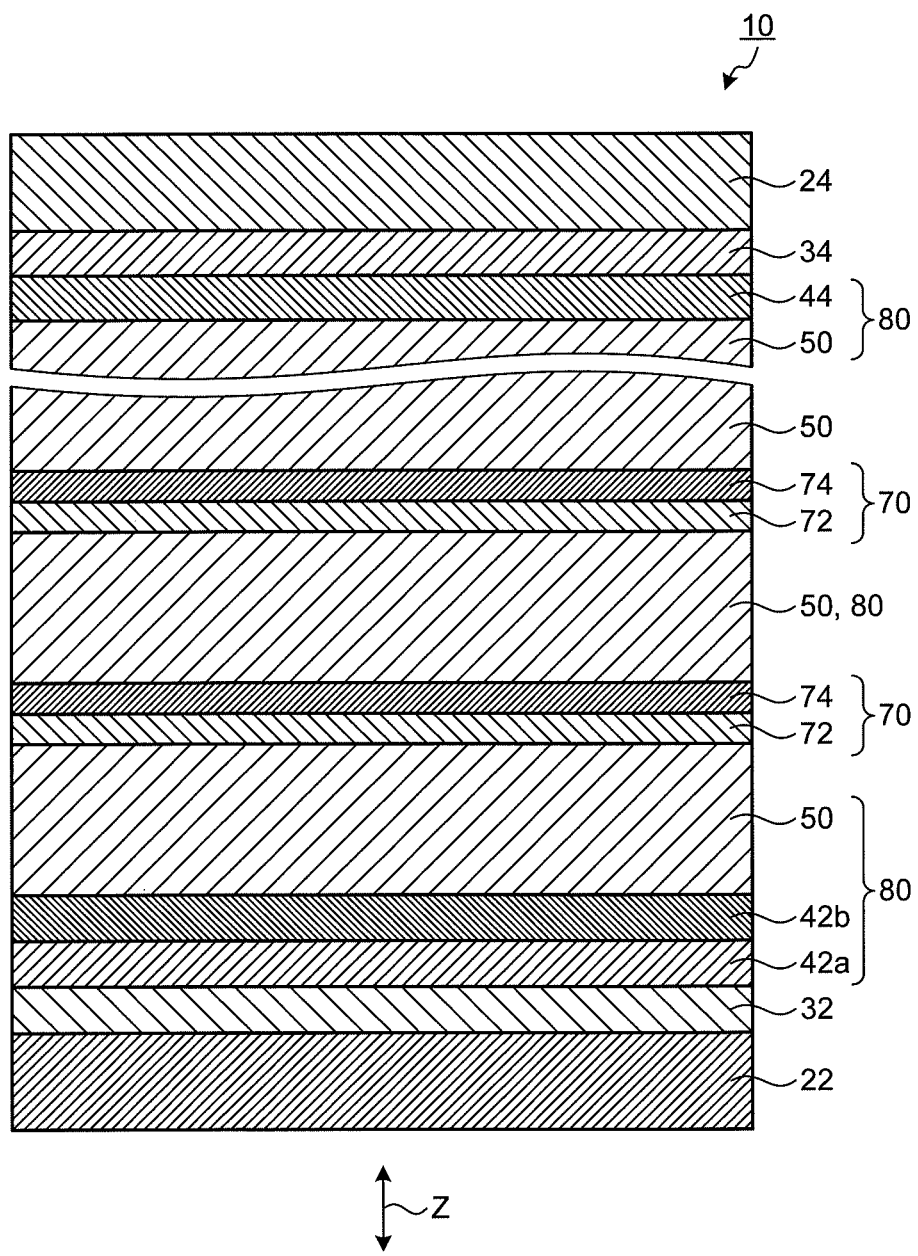

ORGANIC ELECTROLUMINESCENT ELEMENT AND METHOD FOR MANUFACTURING THE SAME

CROSS REFERENCE TO RELATED APPLICATIONS

This application is a National Stage of International Application No. PCT/JP2011/067267 filed Jul. 28, 2011, claiming priority based on Japanese Patent Application No. 2010-179274, filed Aug. 10, 2010, the contents of all of which are incorporated herein by reference in their entirety.

TECHNICAL FIELD

The present invention relates to an organic electroluminescent element (also referred to as an "organic EL element") and a method for manufacturing the same.

BACKGROUND ART

The organic EL element comprises a pair of electrodes consisting of an anode and a cathode, and a light-emitting layer provided between these electrodes. An organic EL element in which one layer of light-emitting layer is provided is called a "single photon-type organic EL element" and an organic EL element in which a plurality of light-emitting layers are provided is called a "multi-photon-type organic EL element".

When a voltage is applied to the organic EL element, a hole is injected from the anode and an electron is injected from the cathode. Then, the injected hole and the injected electron are coupled with each other in the light-emitting layer to generate light emission.

In the multi-photon-type organic EL element, for the purpose of lengthening the life of the element or enhancing the brightness of the element, a plurality of light-emitting layers are provided and usually, between the light-emitting layers, a charge generation layer is provided. As a material for the charge generation layer, an alkali metal, an alkaline earth metal, an inorganic semiconductor material, a charge transporting organic material, and the like are used mainly from the viewpoint of electric characteristics. The charge generation layer is made up, for example, by layering an electron generation layer made of an inorganic semiconductor material having electron injection characteristic and a hole generation layer having hole injection characteristic. The electron generation layer or the hole generation layer is formed by co-depositing the above-described materials or by depositing the above-described material individually (see Patent Document 1).

RELATED ART DOCUMENTS

Patent Document

Patent Document 1: JP 2007-59848 A

DISCLOSURE OF INVENTION

Problem to be Solved by the Invention

An alkali metal, an alkaline earth metal, an alkali metal fluoride, and the like used for the charge generation layer is easily reacted with the moisture and oxygen in the atmosphere and is rapidly oxidized. When the charge generation layer is oxidized, the function thereof is degraded. As a result, the characteristics of the organic EL element lower, for example, the brightness lowers and the life of the element is shortened.

In the conventional technology, all layers comprising the charge generation layer are formed in a vacuum atmosphere and then, the organic EL element itself is sealed airtight, so that the organic EL element is manufactured without exposing the charge generation layer to the atmosphere. Therefore, the degradation of the charge generation layer and the lowering of the characteristics of the organic EL element caused by the degradation of the charge generation layer are prevented.

When the light-emitting layer or the like is formed by a coating method, an ink is rapidly vaporized in an atmosphere having high vacuum degree, so that it is necessary to form the light-emitting layer or the like in an atmosphere at around normal atmospheric pressure or in an atmosphere having low vacuum degree. In this case, by forming the charge generation layer with the above-described materials, the charge generation layer is degraded when the light-emitting layer or the like is formed and the above-described problem caused by the degradation of the charge generation layer is manifested.

Accordingly, it is an object of the present invention to provide a multi-photon-type organic EL element comprising a charge generation layer using a material that is difficult to be degraded even in an atmosphere at around normal atmospheric pressure, and further to provide a simple method for manufacturing the organic EL element.

Means for Solving Problem

As a result of assiduous research on ionic polymers and organic EL elements using them, the inventors of the present invention have found that by using an ionic polymer that is difficult to be degraded in an atmosphere at around normal atmospheric pressure and further, in the atmosphere, the above-described problems may be solved, and have completed the present invention.

That is, the present invention provides [1] to [4] below:
[1] An organic electroluminescent element comprising:
a pair of electrodes comprising an anode and a cathode;
a plurality of light-emitting layers provided between the electrodes; and
a charge generation layer provided between the light-emitting layers that are adjacent to each other, wherein the charge generation layer comprises an ionic polymer that generates electrons and holes respectively or together.
[2] The organic electroluminescent element according to above [1], wherein the charge generation layer is formed of a single layer.
[3] The organic electroluminescent element according to above [1] or [2], further comprising: an electron injection layer provided between the cathode and one of the light-emitting layers that is arranged closest to the cathode, wherein the electron injection layer comprises an ionic polymer.
[4] A method for manufacturing an organic electroluminescent element that comprises a pair of electrodes comprising an anode and a cathode, a plurality of light-emitting layers provided between the electrodes, and a charge generation layer provided between the light-emitting layers that are adjacent to each other, the method comprising the step of:
forming the charge generation layer by an applying method using a coating liquid comprising an ionic polymer.

Effect of the Invention

The organic EL element of the present invention uses as a material for the charge generation layer, the ionic polymer capable of maintaining charge generation characteristics in an atmosphere at around normal atmospheric pressure and further, even in the atmosphere. Therefore, the organic EL element of the present invention is excellent in characteristics such as having a long life.

Through the method for manufacturing the organic EL element of the present invention, a material that is difficult to be degraded in an atmosphere at around normal atmospheric pressure and further, even in the atmosphere is used as a material for the charge generation layer. Therefore, a step of forming the charge generation layer, the light-emitting layer, or the like may be performed in an atmosphere at around normal atmospheric pressure and further, in the atmosphere, so that the manufacturing step may be simplified and the manufacturing cost may be remarkably reduced.

BRIEF DESCRIPTION OF DRAWINGS

FIG. 1 is a cross-sectional view schematically illustrating one example of the configuration of an organic EL element.

DESCRIPTION OF EMBODIMENTS

Referring to the drawings, an embodiment of the present invention will now be described. Here, it is no more than that in each drawing, the shape, the size, and the disposition of each constituent are schematically illustrated to a degree by which the present invention may be comprehended. The present invention is not limited by the descriptions below and each constituent may vary as appropriate so long as the variation does not depart from the gist of the present invention. Here, in each drawing used for the descriptions below, the same constituent is indicated with the same symbol and an overlapped description may be omitted. The organic EL element of the present invention is not necessarily manufactured or used, for example, in the disposition illustrated in the drawings. In the descriptions below, particularly, one direction of the thickness direction of the substrate may be called "upper" and another direction of the thickness direction may be called "lower".

<Configuration Example of Organic EL Element>

Referring to FIG. 1, the configuration example of an organic EL element of the present invention is described. FIG. 1 is a cross-sectional view schematically illustrating one example of the configuration of the organic EL element.

As illustrated in FIG. 1, an organic EL element 10 of the present invention comprises as the basic configuration, a pair of electrodes consisting of an anode 32 and a cathode 34, a plurality of light-emitting layers 50 provided between the pair of electrodes (32, 34), and a charge generation layer 70 provided between the light-emitting layers 50 adjacent to each other. The charge generation layer 70 contains one or more types of ionic polymers generating at least any one of an electron and a hole.

In the organic EL element 10, in addition to the light-emitting layer 50 and the charge generation layer 70, a prescribed layer may be provided. For example, as the prescribed layer, a hole injection layer, a hole transport layer, an electron transport layer, an electron injection layer, and the like are provided between the pair of electrodes (32, 34).

Each member of (1) to (3) below may be called a "light-emitting unit 80". In the thickness direction of the charge generation layer 70, (1) a member sandwiched between a pair of charge generation layers 70 adjacent to each other, (2) a member placed between a charge generation layer 70 arranged closest to the anode 32 among a plurality of charge generation layers 70 and the anode 32, and (3) a member sandwiched between a charge generation layer 70 arranged closest to the cathode 34 among the charge generation layers 70 and the anode 34. A direction corresponding to the thickness direction of the charge generation layer 70 may be merely called "thickness direction Z".

Each of the light-emitting units 80 comprises at least one light-emitting layer 50. In each light-emitting unit 80, in addition to one light-emitting layer 50, the above-described prescribed layer may be provided.

In the present embodiment, the organic EL element 10 comprises x (the symbol "x" represents an integer of 2 or more) light-emitting units 80.

Between a pair of light-emitting units 80 adjacent to each other in the thickness direction Z, the charge generation layer 70 is provided. The number of the charge generation layers 70 provided in one organic EL element 70 is less than the number of the light-emitting units 80 by one, that is, (x−1). Accordingly, when x is "2", one charge generation layer 70 is provided and when x is 3 or more, a plurality of charge generation layers 70 are provided. The charge generation layer 70 is placed so that one surface of the charge generation layer 70 in the thickness direction Z and another surface of the charge generation layer 70 in the thickness direction Z are in contact with the light-emitting units 80 that sandwich the charge generation layer 70 therebetween.

Each light-emitting unit 80 and each charge generation layer 70 are placed with the thickness directions Z thereof substantially conforming to each other and are layered alternately along the thickness direction Z.

Numbers are assigned to the individual light-emitting units 80 in such a manner that, from the light-emitting unit 80 arranged closest to the anode 32 in order, the light-emitting units 80 are named the first light-emitting unit 80, the second light-emitting unit 80, . . . , and the xth light-emitting unit 80. For example, the light-emitting unit 80 arranged closest to the anode 32 among a plurality of light-emitting units 80 is named the first light-emitting unit 80 and the light-emitting unit 80 arranged closest to the cathode 34 is named the xth light-emitting unit 80. A light-emitting layer 50 comprised in the nth (the symbol "n" represents an integer of 1 or more and x or less) light-emitting unit 80 is named the nth light-emitting layer 50 corresponding to the number of light-emitting units 80.

In each light-emitting unit 80, among the above-described prescribed layers, the hole injection layer and the hole transport layer are arranged closer to the anode 32 than the light-emitting layer 50 and the electron injection layer and the electron transport layer are arranged closer to the cathode 34 than the light-emitting layer 50.

Each charge generation layer 70 is made up of (1) a single layer body consisting of a single layer or (2) a layered body formed by stacking a plurality of layers. In the embodiment illustrated in FIG. 1, each charge generation layer 70 is made up by stacking a hole generation layer 74 and an electron generation layer 72. In each charge generation layer 70, between the hole generation layer 74 and the electron generation layer 72, the hole generation layer 74 is arranged closer to the cathode 34 and the electron generation layer 72 is arranged closer to the anode 32.

The charge generation layer 70 is provided between the light-emitting units 80, so that the light-emitting units 80 are arranged at the terminal closest to the anode 32 and at the terminal closest to the cathode 34 in a layered body consisting of the light-emitting unit 80 and the charge generation layer 70. Specifically, the first light-emitting unit 80 is arranged at the terminal closest to the anode 32, whereas the xth light-emitting unit 80 is arranged at the terminal closest to the cathode 34. Accordingly, the first light-emitting unit 80 is arranged so as to come into contact with the anode 32 and the xth light-emitting unit 80 is arranged so as to come into contact with the cathode 34.

In the present embodiment, the organic EL element 10 is provided on a first substrate 22. Moreover, the anode 32 of the organic EL element 10 is provided so as to come into contact with one of two main surfaces of the first substrate 22 opposite to each other in the thickness direction of the first substrate 22.

The first light-emitting unit 80 of the present embodiment illustrated in FIG. 1 is arranged so as to come into contact with the anode 32. This first light-emitting unit 80 consists of a hole injection layer 42a, a hole transport layer 42b, and the first light-emitting layer 50 and is made up by stacking the hole injection layer 42a, the hole transport layer 42b, and the first light-emitting layer 50 in this order from the anode 32 side.

In the embodiment illustrated in FIG. 1, among all the light-emitting units 80, the light-emitting units 80 remaining after excluding the first and xth light-emitting units 80 are made up of the light-emitting layer 50 alone. As described above, each light-emitting unit 80 may comprise, in addition to the light-emitting layer 50, prescribed layers.

The xth light-emitting unit 80 of the present embodiment illustrated in FIG. 1 consists of the xth light-emitting layer 50 and an electron injection layer 44 and is made up by stacking the xth light-emitting layer 50 and the electron injection layer 44 in this order from the anode 32 side.

The cathode 34 is provided so as to come into contact with the electron injection layer 44 of the xth light-emitting unit 80.

In the embodiment illustrated in FIG. 1, a second substrate 24 is provided on the cathode 34. The second substrate 24 is laminated to the first substrate 22 through an adhesive member. The organic EL element 10 is enclosed with the first substrate 22, the second substrate 24, and the adhesive member to be sealed airtight.

The organic EL element 10 of the present invention is characterized by the ionic polymers comprised in the electron injection layer 44 and the charge generation layer 70. The ionic polymer will be described first, followed by the electron injection layer 44 and the charge generation layer 70 using the ionic polymers.

(Ionic Polymers)

Examples of the ionic polymers applicable to the present invention may include polymers having a structural unit containing one or more types of groups selected from the group consisting of groups represented by Formula (1) below and groups represented by Formula (2) below. A form of the ionic polymer include a polymer having a structural unit containing one or more types of groups selected from the group consisting of groups represented by Formula (1) and groups represented by Formula (2) in a content of 15% by mole to 100% by mole based on the number of moles of all structural units.

(In Formula (1), $Q^1$ is a divalent organic group; $Y^1$ represents $-CO_2^-$, $-SO_3^-$, $-SO_2^-$, $-PO_3^{2-}$, or $-B(R^a)_3^-$; $M^1$ is a metal cation or an ammonium cation optionally having a substituent; $Z^1$ represents $F^-$, $Cl^-$, $Br^-$, $I^-$, $OH^-$, $R^aSO_3^-$, $R_aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$; n1 represents an integer of 0 or more; a1 represents an integer of 1 or more and b1 represents an integer of 0 or more, provided that a1 and b1 are selected so that the electric charge of the group represented by Formula (1) becomes 0. $R^a$ represents an alkyl group having 1 to 30 carbon atoms that may have a substituent or an aryl group having 6 to 50 carbon atoms that may have a substituent. When each of $Q^1$, $M^1$, and $Z^1$ are plurally present, a plurality of each $Q^1$, $M^1$, or $Z^1$ may be the same as or different from each other).

(In Formula (2), $Q^2$ represents a divalent organic group; $Y^2$ represents a carbo cation, an ammonium cation, a phosphonyl cation or a sulfonyl cation or an iodonium cation; $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$; $Z^2$ represents a metal cation or an ammonium cation optionally having a substituent; n2 represents an integer of 0 or more. a2 represents an integer of 1 or more and b2 represents an integer of 0 or more, provided that a2 and b2 are selected so that the electric charge of the group represented by Formula (2) becomes 0. $R^b$ represents an alkyl group having 1 to 30 carbon atoms that may have a substituent or an aryl group having 6 to 50 carbon atoms that may have a substituent. When each of $Q^2$, $M^2$, and $Z^2$ are plurally present, a plurality of each $Q^2$, $M^2$, or $Z^2$ may be the same as or different from each other).

One embodiment of the ionic polymer used in the present invention further may be a polymer having a group represented by Formula (3) below. When the ionic polymer has the group represented by Formula (3), the group represented by Formula (3) may be contained in a structural unit of the ionic polymer, may be contained in the same structural unit as the structural unit containing one or more types of groups selected from the group consisting of groups represented by Formula (1) and groups represented by Formula (2), or may be contained in other different structural units. Furthermore, one embodiment of the ionic polymer may be a polymer having a structural unit containing at least one type among groups represented by Formula (1), groups represented by Formula (2), or groups represented by Formula (3) in a content of 15% by mole to 100% by mole based on the number of moles of all structural units.

(In Formula (3), $Q^3$ represents a divalent organic group; $Y^3$ represents $-CN$ or a group represented by any one of Formula (4) to Formula (12); and n3 represents an integer of 0 or more.

[Chemical Formula 1]

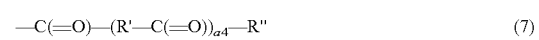

  (11)

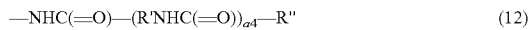  (12)

(in Formulae (4) to (12), R' represents a divalent hydrocarbon group optionally having a substituent; R" represents a hydrogen atom, a monovalent hydrocarbon group optionally having a substituent, —COOH, —SO₃H, —OH, —SH, —NR$^c_2$, —CN, or —C(=O)NR$^c_2$; R''' represents a trivalent hydrocarbon group optionally having a substituent; a3 represents an integer of 1 or more; a4 represents an integer of 0 or more; R$^c$ represents an alkyl group having 1 to 30 carbon atoms that may have a substituent or an aryl group having 6 to 50 carbon atoms that may have a substituent; and when each of R', R", and R''' are plurally present, a plurality of each R', R", or R''' may be the same as or different from each other).

The ionic polymer contains preferably one or more types of structural units selected from the group consisting of a structural unit represented by Formula (13), a structural unit represented by Formula (15), a structural unit represented by Formula (17), and a structural unit represented by Formula (20) in a content of 15% by mole to 100% by mole based on the number of moles of all structural units.

[Chemical Formula 2]

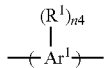  (13)

(In Formula (13), R¹ is a monovalent group containing a group represented by Formula (14); Ar¹ represents a (2+n4) valent aromatic group optionally having a substituent besides R¹; n4 represents an integer of 1 or more. When R¹ is plurally present, each R¹ may be the same as or different from each other.

[Chemical Formula 3]

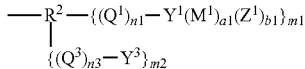  (14)

(In Formula (14), R² is a (1+m1+m2) valent organic group; Q¹, Q³, Y¹, M¹, Z¹, Y³, n1, a1, b1, and n3 represent the same as defined above; m1 and m2 each independently represent an integer of 1 or more; and when each of Q¹, Q³, Y¹, M¹, Z⁻, Y³, n1, a1, b1, and n3 is plurally present, a plurality of each Q¹, Q³, Y¹, M¹, Z¹, Y³, n1, a1, b1, or n3 may be the same as or different from each other).

[Chemical Formula 4]

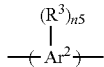  (15)

(In Formula (15), R³ is a monovalent group containing a group represented by Formula (16); Ar² represents a (2+n5) valent aromatic group optionally having a substituent besides R³; n5 represents an integer of 1 or more. When R³ is plurally present, each R³ may be the same as or different from each other,

[Chemical Formula 5]

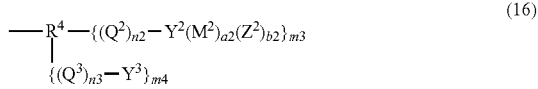  (16)

(In Formula (16), R⁴ represents a (1+m3+m4) valent organic group; Q², Q³, Y², M², Z², Y³, n2, a2, b2, and n3 represent the same meanings as described above; and m3 and m4 each independently represent an integer of 1 or more. When each of Q², Q³, Y², M², Z², Y³, n2, a2, b2, and n3 is plurally present, a plurality of each Q², Q³, Y², M², Z², Y³, n2, a2, b2, or n3 may be the same as or different from each other).

[Chemical Formula 6]

  (17)

(In Formula (17), R⁵ is a monovalent group comprising a group represented by Formula (18); R⁶ is a monovalent group comprising a group represented by Formula (19); Ar³ represents a (2+n6+n7) valent aromatic group optionally having a substituent besides R⁵ and R⁶; and n6 and n7 represent independently an integer of 1 or more. When each of R⁵ and R⁶ is plurally present, a plurality of each R⁵ or R⁶ may be the same as or different from each other,

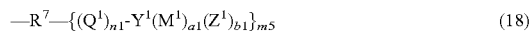  (18)

(in Formula (18), R⁷ represents a direct bond or a (1+m5) valent organic group; Q¹, Y¹, M¹, Z¹, n1, a1, and b1 represent the same as defined above; m5 represents an integer of 1 or more. Each of Q¹, Y¹, M¹, Z¹, n1, a1, and b1 is plurally present, a plurality of each Q¹, Y¹, M¹, Z¹, n1, a1, or b1 may be the same as or different from each other),

  (19)

(in Formula (19), R⁸ represents a single bond or a (1+m6) valent organic group; Y³ and n3 represent the same as defined above. m6 represents an integer of 1 or more, provided that when R⁸ is a single bond, m6 represents 1. When each of Q³, Y³, and n3 is plurally present, a plurality of each Q³, Y³, or n3 may be the same as or different from each other).

[Chemical Formula 7]

  (20)

(In Formula (20), R⁹ is a monovalent group containing a group represented by Formula (21); R¹⁰ is a monovalent group containing a group represented by Formula (22); Ar⁴ represents a (2+n8+n9) valent aromatic group optionally having a substituent besides R⁹ and R¹⁰; and n8 and n9 each independently represent an integer of 1 or more. When each of $R^9$ and $R^{10}$ is plurally present, a plurality of each $R^9$ or $R^{10}$ may be the same as or different from each other,

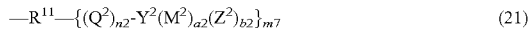 (21)

(in Formula (21), $R^{11}$ represents a single bond or a (1+m7) valent organic group; $Q^2$, $Y^2$, $M^2$, $Z^2$, n2, a2, and b2 represent the same meanings as described above. m7 represents an integer of 1 or more, provided that when $R^{11}$ is a single bond, m7 represents 1. When each of $Q^2$, $Y^2$, $M^2$, $Z^2$, n2, a2, and b2 is plurally present, a plurality of each $Q^2$, $Y^2$, $M^2$, $Z^2$, n2, a2, or b2 may be the same as or different from each other),

 (22)

(in Formula (22), $R^{12}$ represents a single bond or a (1+m8) valent organic group; $Y^3$ and n3 represent the same as defined above. m8 represents an integer of 1 or more, provided that when $R^{12}$ is a single bond, m8 represents 1. When each of $Q^3$, $Y^3$, and n3 is plurally present, a plurality of each $Q^3$, $Y^3$, or n3 may be the same as or different from each other).

The structural unit in the ionic polymer may comprise two or more types of groups represented by Formula (1), may comprise two or more types of groups represented by Formula (2), or may comprise two or more types of groups represented by Formula (3).

Group Represented by Formula (1)

In Formula (1), examples of the divalent organic group represented by $Q^1$ may include: a divalent saturated hydrocarbon group having 1 to 50 carbon atoms that may have a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; a divalent unsaturated hydrocarbon group having 2 to 50 carbon atoms that may have a substituent that includes an alkenylene group having 2 to 50 carbon atoms that may have a substituent such as an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent, and an ethynylene group; a divalent saturated cyclic hydrocarbon group having 3 to 50 carbon atoms that may have a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an arylene group having 6 to 50 carbon atoms that may have a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; an alkyleneoxy group having 1 to 50 carbon atoms that may have a substituent such as a methyleneoxy group, an ethyleneoxy group, a propyleneoxy group, a butyleneoxy group, a pentyleneoxy group, hexyleneoxy group, and a group in which at least one hydrogen atom in these groups is substituted with a substituent; an imino group having a substituent containing a carbon atom; and a silylene group having a substituent containing a carbon atom. From the viewpoint of easy synthesis of monomers that are the raw material of the ionic polymer (hereinafter, called "raw material monomers"), a divalent saturated hydrocarbon group, an arylene group, and an alkyleneoxy group are preferred.

The above-described substituent may be an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amido group, an acid imido group, a monovalent heterocyclic group, a hydroxy group, a carboxy group, a substituted carboxy group, a cyano group, and a nitro group, and when the substituent is plurally present, the substituents may be the same as or different from each other. Among these, substituents besides an amino group, a silyl group, a halogen atom, a hydroxy group, and a nitro group contain a carbon atom.

The substituent will now be described. The term "$C_{m-n}$" (m and n each are a positive integer satisfying m<n) means that the number of carbon atoms of the organic group expressed together with this term is m to n. For example, a $C_{m-n}$ alkyl group means that the number of carbon atoms of the alkyl group is m to n; a $C_{m-n}$ alkylaryl group means that the number of carbon atoms of the alkyl group in the $C_{m-n}$ alkylaryl group is m to n; and an aryl-$C_{m-n}$ alkyl group means that the number of carbon atoms of the alkyl group in the aryl-$C_{m-n}$ alkyl group is m to n.

The alkyl group as the substituent may be straight chain or branched chain, and may also be a cycloalkyl group. The alkyl group has the number of carbon atoms of usually 1 to 20, and preferably 1 to 10. Examples of the alkyl group may include a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group. The hydrogen atom in the alkyl group may be substituted with a fluorine atom. Examples of the relevant fluorine atom-substituted alkyl group may include a trifluoromethyl group, a pentafluoroethyl group, a perfluorobutyl group, a perfluorohexyl group, and a perfluorooctyl group. Examples of the $C_{1-12}$ alkyl group may include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, and a lauryl group.

The alkoxy group as the substituent may be straight chain or branched chain, may also be a cycloalkyloxy group, and may further have a substituent. The alkoxy group as the substituent has the number of carbon atoms of usually 1 to 20, and preferably 1 to 10. Examples of the alkoxy group as the substituent may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a nonyloxy group, a decyloxy group, and a lauryloxy group. The hydrogen atom in the alkoxy group may be substituted with a fluorine atom. Examples of the relevant fluorine atom-substituted alkoxy group may include a trifluoromethoxy group, a pentafluoroethoxy group, a perfluorobutoxy group, a perfluorohexyloxy group, and a perfluorooctyloxy group. The alkoxy group may also include a methoxymethyloxy group and a 2-methoxyethyloxy group. Examples of the $C_{1-12}$ alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group.

The alkylthio group as the substituent may be straight chain or branched chain, may also be a cycloalkylthio group, and may further have a substituent. The alkylthio group as the substituent has the number of carbon atoms of usually 1 to 20, and preferably 1 to 10. Examples of the alkylthio group as the substituent may include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, and a laurylthio group. The hydrogen atom in the alkylthio group may be substituted with a fluorine atom. Examples of the relevant fluorine atom-substituted alkylthio group may include a trifluoromethylthio group.

The aryl group as the substituent is an atomic group remaining after eliminating one hydrogen atom bonded to a carbon atom making-up an aromatic ring from an aromatic hydrocarbon, and examples of the aryl group as the substituent may include a group having a benzene ring, a group having a fused ring, and a group in which two or more independent benzene rings or fused rings are bonded through a single bond or a divalent organic group, for example, an alkenylene group such as a vinylene group. The aryl group as the substituent has the number of carbon atoms of usually 6 to 60, and preferably 7 to 48. Examples of the aryl group as the substituent may include a phenyl group, a $C_{1-12}$ alkoxyphenyl group, a $C_{1-12}$ alkylphenyl group, a 1-naphthyl group, a 2-naphthyl group, a 1-anthryl group, a 2-anthryl group, and a 9-anthryl group. The hydrogen atom in the aryl group may be substituted with a fluorine atom. Examples of the relevant fluorine atom-substituted aryl group may include a pentafluorophenyl group. Among the aryl groups, a $C_{1-12}$ alkoxyphenyl group and a $C_{1-12}$ alkylphenyl group are preferred.

Among the aryl groups, examples of the $C_{1-12}$ alkoxyphenyl group may include a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, and a lauryloxyphenyl group.

Among the aryl groups, examples of the $C_{1-12}$ alkylphenyl group may include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

The aryloxy group as the substituent has the number of carbon atoms of usually 6 to 60, and preferably 7 to 48. Examples of the aryloxy group may include a phenoxy group, a $C_{1-12}$ alkoxyphenoxy group, a $C_{1-12}$ alkylphenoxy group, a 1-naphthyloxy group, a 2-naphthyloxy group, and a pentafluorophenyloxy group. Among the aryloxy groups as the substituent, a $C_{1-12}$ alkoxyphenoxy group and a $C_{1-12}$ alkylphenoxy group are preferred.

Among the aryloxy groups, examples of the $C_{1-12}$ alkoxyphenoxy group may include a methoxyphenoxy group, an ethoxyphenoxy group, a propyloxyphenoxy group, an isopropyloxyphenoxy group, a butoxyphenoxy group, an isobutoxyphenoxy group, a sec-butoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryloxyphenoxy group.

Among the aryloxy groups, examples of the $C_{1-12}$ alkylphenoxy group may include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

The arylthio group as the substituent may be, for example, a group in which a sulfur atom is bonded to the aryl group. The arylthio group as the substituent may have a substituent on an aromatic ring of the aryl group. The arylthio group has the number of carbon atoms of usually 6 to 60, and preferably 6 to 30. Examples of the arylthio group as the substituent may include a phenylthio group, a $C_{1-12}$ alkoxyphenylthio group, a $C_{1-12}$ alkylphenylthio group, a 1-naphthylthio group, a 2-naphthylthio group, and a pentafluorophenylthio group.

The arylalkyl group as the substituent may be, for example, a group in which the alkyl group is bonded to the aryl group. The arylalkyl group as the substituent may have a substituent. The arylalkyl group as the substituent has the number of carbon atoms of usually 7 to 60, and preferably 7 to 30. Examples of the arylalkyl group as the substituent may include a phenyl-$C_{1-12}$ alkyl group, a $C_{1-12}$ alkoxyphenyl-$C_{1-12}$ alkyl group, a $C_{1-12}$ alkylphenyl-$C_{1-12}$ alkyl group, a 1-naphthyl-$C_{1-12}$ alkyl group, and a 2-naphthyl-$C_{1-12}$ alkyl group.

The arylalkoxy group as the substituent may be, for example, a group in which the alkoxy group is bonded to the aryl group. The arylalkoxy group as the substituent may further have a substituent. The arylalkoxy group as the substituent has the number of carbon atoms of usually 7 to 60, and preferably 7 to 30. Examples of the arylalkoxy group as the substituent may include a phenyl-$C_{1-12}$ alkoxy group, a $C_{1-12}$ alkoxyphenyl-$C_{1-12}$ alkoxy group, a $C_{1-12}$ alkylphenyl-$C_{1-12}$ alkoxy group, a 1-naphthyl-$C_{1-12}$ alkoxy group, and a 2-naphthyl-$C_{1-12}$ alkoxy group.

The arylalkylthio group as the substituent may be, for example, a group in which the alkylthio group is bonded to the aryl group. The arylalkylthio group as the substituent may further have a substituent. The arylalkylthio group as the substituent has the number of carbon atoms of usually 7 to 60, and preferably 7 to 30. Examples of the arylalkylthio group as the substituent may include a phenyl-$C_{1-12}$ alkylthio group, a $C_{1-12}$ alkoxyphenyl-$C_{1-12}$ alkylthio group, a $C_{1-12}$ alkylphenyl-$C_{1-12}$ alkylthio group, a 1-naphthyl-$C_{1-12}$ alkylthio group, and a 2-naphthyl-$C_{1-12}$ alkylthio group.

The arylalkenyl group as the substituent may be, for example, a group in which an alkenyl group is bonded to the aryl group. The arylalkenyl group as the substituent has the number of carbon atoms of usually 8 to 60, and preferably 8 to 30. Examples of the arylalkenyl group as the substituent may include a phenyl-$C_{2-12}$ alkenyl group, a $C_{1-12}$ alkoxyphenyl-$C_{2-12}$ alkenyl group, a $C_{1-12}$ alkylphenyl-$C_{2-12}$ alkenyl group, a 1-naphthyl-$C_{2-12}$ alkenyl group, and a 2-naphthyl-$C_{2-12}$ alkenyl group. Among them, a $C_{1-12}$ alkoxyphenyl-$C_{2-12}$ alkenyl group and a $C_{2-12}$ alkylphenyl-$C_{2-12}$ alkenyl group are preferred. Here, examples of the $C_{2-12}$ alkenyl group may include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

The arylalkynyl group as the substituent may be, for example, a group in which an alkynyl group is bonded to the aryl group. The arylalkynyl group as the substituent has the number of carbon atoms of usually 8 to 60, and preferably 8 to 30. Examples of the arylalkynyl group as the substituent may include a phenyl-$C_{2-12}$ alkynyl group, a $C_{1-12}$ alkoxyphenyl-$C_{2-12}$ alkynyl group, a $C_{1-12}$ alkylphenyl-$C_{2-12}$ alkynyl group, a 1-naphthyl-$C_{2-12}$ alkynyl group, and a 2-naphthyl-$C_{2-12}$ alkynyl group, and among them, a $C_{1-12}$ alkoxyphenyl-$C_{2-12}$ alkynyl group and a $C_{1-12}$ alkylphenyl-$C_{2-12}$ alkynyl group are preferred. Examples of the $C_{2-12}$ alkynyl group may include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

The substituted amino group as the substituent is preferably an amino group in which at least one hydrogen atom in the amino group is substituted with one or two groups selected from the group consisting of an alkyl group, an aryl group, an arylalkyl group, and a monovalent heterocyclic group. The alkyl group, the aryl group, the arylalkyl group, and the monovalent heterocyclic group may further have a substituent. The substituted amino group as the substituent has the number of carbon atoms of usually 1 to 60, and preferably 2 to 48, without including the number of carbon atoms of the substituent that the alkyl group, the aryl group, the arylalkyl group, or the monovalent heterocyclic group may further have. Examples of the substituted amino group as the substituent may include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_{1-12}$ alkoxyphenyl)amino group, a di($C_{1-12}$ alkoxyphenyl)amino group, a di($C_{1-12}$ alkylphenyl)amino group, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, a (phenyl-$C_{1-12}$ alkyl)amino group, a ($C_{1-12}$ alkoxyphenyl-$C_{1-12}$ alkyl)amino group, a ($C_{1-12}$ alkylphenyl-$C_{1-12}$ alkyl)amino group, a di($C_{1-12}$ alkoxyphenyl-$C_{1-12}$ alkyl)amino group, a di($C_{1-12}$ alkylphenyl-$C_{1-12}$ alkyl)amino group, a 1-naphthyl-$C_{1-12}$ alkylamino group, and a 2-naphthyl-$C_{1-12}$ alkylamino group.

Examples of the substituted silyl group as the substituent may include a silyl group in which at least one hydrogen atom in the silyl group is substituted with one to three groups selected from the group consisting of an alkyl group, an aryl group, an arylalkyl group, and a monovalent heterocyclic group. The alkyl group, the aryl group, the arylalkyl group, and the monovalent heterocyclic group may further have a substituent. The substituted silyl group as the substituent has the number of carbon atoms of usually 1 to 60, and preferably 3 to 48, without including the number of carbon atoms of the substituent that the alkyl group, the aryl group, the arylalkyl group, or the monovalent heterocyclic group may further have. Examples of the substituted silyl group as the substituent may include a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_{1-12}$ alkyl)silyl group, a ($C_{1-12}$ alkoxyphenyl-$C_{1-12}$ alkyl)silyl group, a ($C_{1-12}$ alkylphenyl-$C_{1-12}$ alkyl)silyl group, a (1-naphthyl-$C_{1-12}$ alkyl)silyl group, a (2-naphthyl-$C_{1-12}$ alkyl)silyl group, a (phenyl-$C_{1-12}$ alkyl)dimethylsilyl group, a triphenylsilyl group, a tri(p-xylyl)silyl group, a tribenzylsilyl group, a diphenylmethylsilyl group, a tert-butyldiphenylsilyl group, and a dimethylphenylsilyl group.

The halogen atom as the substituent may be a fluorine atom, a chlorine atom, a bromine atom, and an iodine atom.

The acyl group as the substituent has the number of carbon atoms of usually 2 to 20, and preferably 2 to 18. Examples of the acyl group as the substituent may include an acetyl group, a propionyl group, a butyryl group, an isobutyryl group, a pivaloyl group, a benzoyl group, a trifluoroacetyl group, and a pentafluorobenzoyl group.

The acyloxy group as the substituent has the number of carbon atoms of usually 2 to 20, and preferably 2 to 18. Examples of the acyloxy group as the substituent may include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

The imine residue as the substituent means a residue remaining after eliminating one hydrogen atom from an imine compound having a structure represented by at least any one of a formula: H—N=C< and a formula: —N=CH—. Examples of such an imine compound may include a compound in which a hydrogen atom bonded to a nitrogen atom in aldimine, ketimine and aldimine is substituted with an alkyl group, an aryl group, an arylalkyl group, an arylalkenyl group, an arylalkynyl group, or the like. The imine residue as the substituent has the number of carbon atoms of usually 2 to 20, and preferably 2 to 18. Examples of the imine residue as the substituent may include a group represented by a general formula: —CR$^\beta$=N—R$^\gamma$ or a general formula: —N=C(R$^\gamma$)$_2$ (where R$^\beta$ represents a hydrogen atom, an alkyl group, an aryl group, an arylalkyl group, an arylalkenyl group, or an arylalkynyl group; and R$^\gamma$s represent independently an alkyl group, an aryl group, an arylalkyl group, an arylalkenyl group, or an arylalkynyl group, provided that when two R$^\gamma$ exist, the two R$^\gamma$ may be bonded with each other to be integrated to form a ring as a divalent group, for example, an alkylene group having 2 to 18 carbon atoms such as an ethylene group, a trimethylene group, a tetramethylene group, a pentamethylene group, and a hexamethylene group). Examples of the imine residue as the substituent may include the following groups.

[Chemical Formula 8]

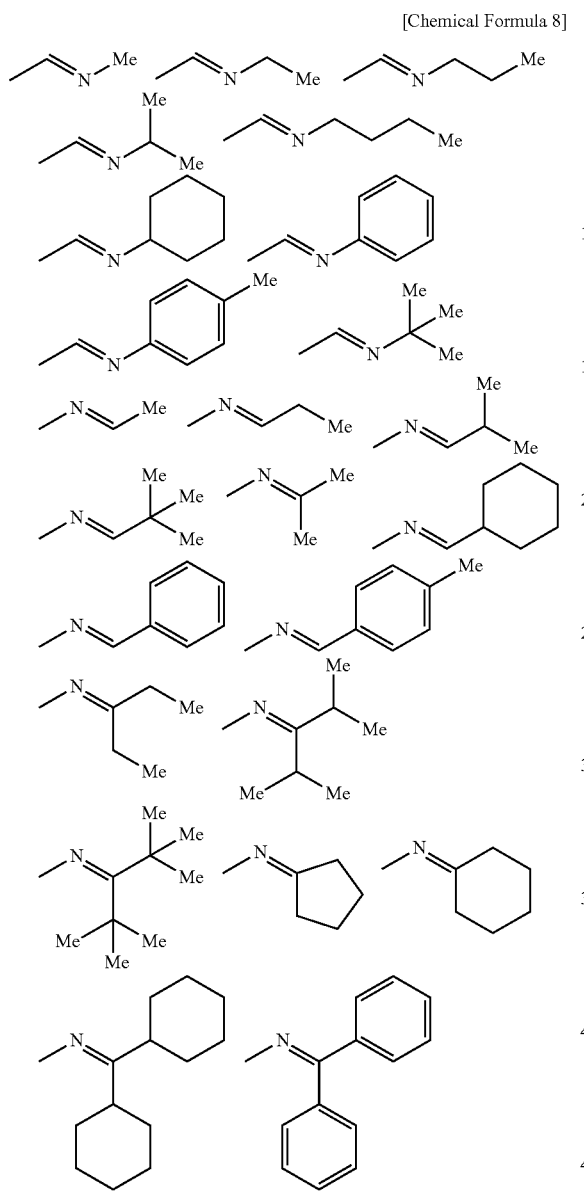

(In formulae, Me represents a methyl group, which is the same hereinafter).

The amido group as the substituent has the number of carbon atoms of usually 1 to 20, and preferably 2 to 18. Examples of the amido group as the substituent may include a formamido group, an acetamido group, a propioamido group, a butyroamido group, a benzamido group, a trifluoroacetamido group, a pentafluorobenzamido group, a diformamido group, a diacetamido group, a dipropioamido group, a dibutyroamido group, a dibenzamido group, a ditrifluoroacetamido group, and a dipentafluorobenzamido group.

The acid imido group as the substituent is a residue obtained by eliminating hydrogen atom bonded to a nitrogen atom from an acid imide, and has the number of carbon atoms of usually 4 to 20, and preferably 4 to 18. Examples of the acid imido group as the substituent may include the following groups.

[Chemical Formula 9]

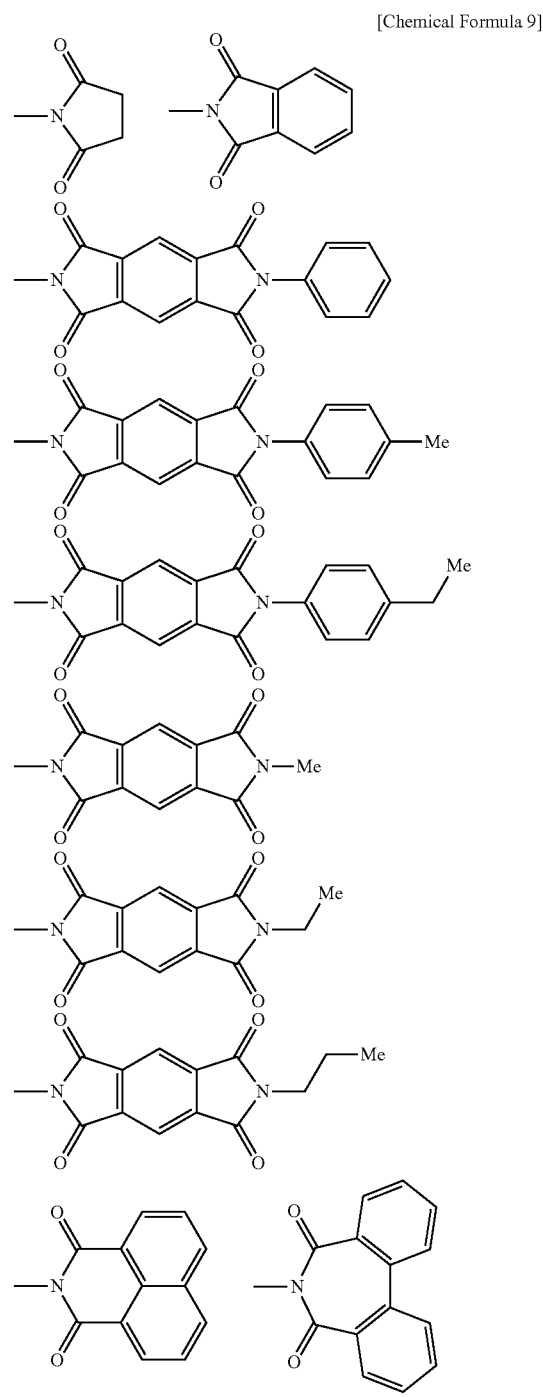

The monovalent heterocyclic group as the substituent refers to an atomic group remaining after eliminating one hydrogen atom from a heterocyclic compound. Here, the heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element making-up the ring, among organic compounds having a cyclic structure. The monovalent heterocyclic group as the substituent may further have a substituent. The monovalent heterocyclic group as the substituent has the number of carbon atoms of usually 3 to 60, and preferably 3 to 20. Here, the number of carbon atoms of the monovalent heterocyclic group as the substituent does not include the number of carbon atoms of the substituent that the monovalent heterocyclic group may further have. Examples of such a monovalent heterocyclic group may include a thienyl group, a $C_{1-12}$ alkylthienyl group, a pyrrolyl group, a furyl group, a pyridyl group, a $C_{1-12}$ alkylpyridyl group, a pyridazinyl group, a pyrimidyl group, a pyrazinyl group, a triazinyl group, a pyrrolidyl group, a piperidyl group, a quinolyl group, and an isoquinolyl group, and among them, a thienyl group, a $C_{1-12}$ alkylthienyl group, a pyridyl group, and a $C_{1-12}$ alkylpyridyl group are preferred. Here, the monovalent heterocyclic group as the substituent is preferably a monovalent aromatic heterocyclic group.

The substituted carboxy group as the substituent refers to a group in which a hydrogen atom in a carboxy group is substituted with an alkyl group, an aryl group, an arylalkyl group, or a monovalent heterocyclic group, that is, a group represented by a formula: —C(=O)OR* (where R* is an alkyl group, an aryl group, an arylalkyl group, or a monovalent heterocyclic group). The substituted carboxy group has the number of carbon atoms of usually 2 to 60, and preferably 2 to 48. The alkyl group, the aryl group, the arylalkyl group, and the monovalent heterocyclic group may have a substituent. Here, the number of carbon atoms mentioned above does not include the number of carbon atoms of the substituent that the alkyl group, the aryl group, the arylalkyl group, or the monovalent heterocyclic group may have. Examples of the substituted carboxy group may include a methoxycarbonyl group, an ethoxycarbonyl group, a propoxycarbonyl group, an isopropoxycarbonyl group, a butoxycarbonyl group, an isobutoxycarbonyl group, a sec-butoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

In Formula (1), $Y^1$ represents a monovalent group such as —$CO_2^-$, —$SO_3^-$, —$SO_2^-$, —$PO_3^-$, or —$B(R^a)_3^-$, and $Y^1$ is preferably —$CO_2^-$, —$SO_2^-$, or —$PO_3^-$ and more preferably —$CO_2^-$ from the viewpoint of the acidity of the ionic polymer, and preferably —$CO_2^-$, —$SO_3^-$, —$SO_2^-$, or —$PO_3^-$ from the viewpoint of the stability of the ionic polymer.

In Formula (1), $M^1$ represents a metal cation or an ammonium cation optionally having a substituent. The metal cation is preferably a monovalent, divalent, or trivalent ion and examples thereof may include an ion of Li, Na, K, Cs, Be, Mg, Ca, Ba, Ag, Al, Bi, Cu, Fe, Ga, Mn, Pb, Sn, Ti, V, W, Y, Yb, Zn, or Zr, and the like. Among them, $Li^+$, $Na^+$, $K^+$, $Cs^+$, $Ag^+$, $Mg^{2+}$, and $Ca^{2+}$ are preferred. Examples of the substituent that the ammonium cation may have may include an alkyl group having 1 to 10 carbon atoms such as a methyl group, an ethyl group, a propyl group, an isopropyl group, a butyl group, an isobutyl group, and a tert-butyl group.

In Formula (1), $Z^1$ represents F$^-$, Cl$^-$, Br$^-$, I$^-$, OH$^-$, $R^aSO_3^-$, $R^aCOO^-$, ClO$^-$, $ClO_2^-$, $ClO_3^-$, $ClO_4^-$, SCN$^-$, CN$^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$.

In Formula (1), n1 represents an integer of 0 or more, and n1 is preferably an integer of from 0 to 8 and more preferably an integer of from 0 to 2 from the viewpoint of the synthesis of the raw material monomers.

In Formula (1), n1 represents an integer of 1 or more and b1 represents an integer of 0 or more.

a1 and b1 are selected so that the electric charge of the group represented by Formula (1) becomes 0. For example, when $Y^1$ is —$CO_2^-$, —$SO_3^-$, —$SO_2^-$, —$PO_3^-$, or —$B(R^a)_3^-$, $M^1$ is a monovalent metal cation or an ammonium cation optionally having a substituent, and $Z^1$ is F$^-$, Cl$^-$, Br$^-$, I$^-$, OH$^-$, $R^aSO_3^-$, $R^aCOO^-$, ClO$^-$, $ClO_2^-$, $ClO_3^-$, $ClO_4^-$, SCN$^-$, CN$^-$, $NO_3^-$, $HSO_4^-$, $H_2PO_4^-$, $BF_4^-$, or $PF_6^-$, a1 and b1 are selected so that they satisfy a1=b1+1. When $Y^1$ is —$CO_2^-$, —$SO_3^-$, —$SO_2^-$, —$PO_3^-$, or —$B(R^a)_3^-$, $M^1$ is a divalent metal cation, and $Z^1$ is F$^-$, Cl$^-$, Br$^-$, I$^-$, OH$^-$, $R^aSO_3$, $R^aCOO^-$, ClO$^-$, $ClO_2^-$, $ClO_3^-$, $ClO_4^-$, SCN$^-$, CN$^-$, $NO_3^-$, $HSO_4^-$, $H_2PO_4^-$, $BF_4^-$, or $PF_6^-$, a1 and b1 are selected so that they satisfy b1=2×a1−1. When $Y^1$ is —$CO_2^-$, —$SO_3^-$, —$SO_2^-$, —$PO_3^-$, or —$B(R^a)_3^-$, $M^1$ is a trivalent metal cation, and $Z^1$ is F$^-$, Cl$^-$, Br$^-$, I$^-$, OH$^-$, $R^aSO_3^-$, $R^aCOO^-$, ClO$^-$, $ClO_2^-$, $ClO_3^-$, $ClO_4^-$, SCN$^-$, CN$^-$, $NO_3^-$, $HSO_4^-$, $H_2PO_4^-$, $BF_4^-$, or $PF_6^-$, a1 and b1 are selected so that they satisfy b1=3×a1−1. When $Y^1$ is —$CO_2^-$, —$SO_3^-$, —$SO_2^-$, —$PO_3^-$, or —$B(R^a)_3^-$, $M^1$ is a monovalent metal cation or an ammonium cation optionally having a substituent, and $Z^1$ is $SO_4^{2-}$ or $HPO_4^{2-}$, a1 and b1 are selected so that they satisfy a1=2×b1+1. In any one of the numerical formulae above expressing the relationship between a1 and b1, a1 is preferably an integer of 1 to 5, more preferably 1 or 2.

$R^a$ represents an alkyl group having 1 to 30 carbon atoms that may have a substituent or an aryl group having 6 to 50 carbon atoms that may have a substituent. Examples of the substituent that these groups may have may include the same substituents shown as examples in the description with respect to $Q^1$. When the substituent is plurally present, the substituents may be the same as or different from each other. Examples of $R^a$ may include an alkyl group having 1 to 20 carbon atoms such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group, and an aryl group having 6 to 30 carbon atoms such as a phenyl group, a 1-naphthyl group, a 2-naphthyl group, a 1-anthryl group, a 2-anthryl group, and a 9-anthryl group.

Examples of the group represented by Formula (1) may include the following groups.

[Chemical Formula 10]

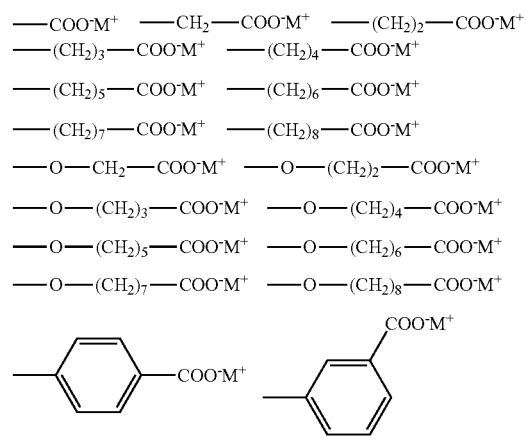

-continued

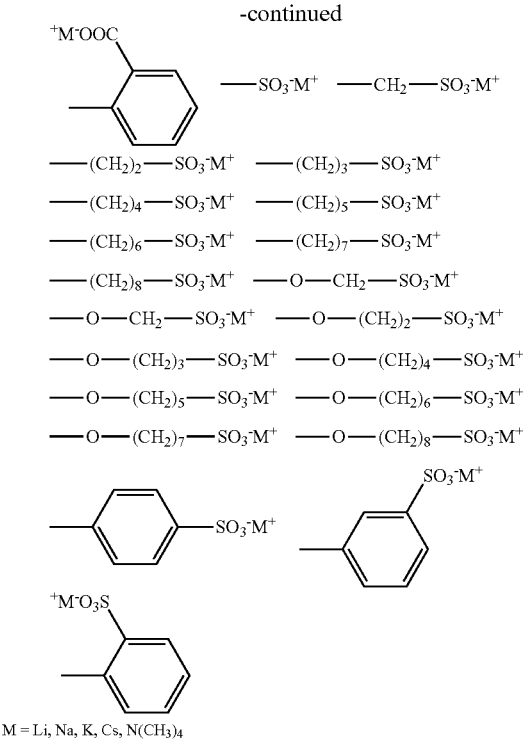

M = Li, Na, K, Cs, N(CH$_3$)$_4$

Group Represented by Formula (2)

In Formula (2), examples of the divalent organic group represented by Q$^2$ may include the same groups shown as examples with respect to the divalent organic group represented by Q$^1$. From the viewpoint of easy synthesis of raw material monomers, the divalent organic group represented by Q$^2$ is preferably a saturated divalent hydrocarbon group, a divalent arylene group, and a divalent alkyleneoxy group.

The group included as examples for the divalent organic group represented by Q$^2$ may have a substituent, and examples of the substituent may include the same substituents shown as examples in the description with respect to Q$^1$. When the substituent is plurally present, the substituents may be the same as or different from each other.

In Formula (2), Y$^2$ represents a carbo cation, an ammonium cation, a phosphonyl cation, a sulfonyl cation, or an iodonium cation.

Examples of the carbo cation may include a group represented by

—C$^+$R$_2$ where R each independently represent an alkyl group or an aryl group.

Examples of the ammonium cation may include a group represented by

—N$^+$R$_3$ where R each independently represent an alkyl group or an aryl group.

Examples of the phosphonyl cation may include a group represented by

—P$^+$R$_3$ where R each independently represent an alkyl group or an aryl group.

Examples of the sulfonyl cation may include a group represented by

—S$^+$R$_2$ where R each independently represent an alkyl group or an aryl group.

Examples of the iodonium cation include a group represented by

—I$^+$R$_2$ where R each independently represent an alkyl group or an aryl group.

In Formula (2), Y$^2$ is preferably a carbo cation, an ammonium cation, a phosphonyl cation, a sulfonyl cation, and more preferably an ammonium cation from the viewpoints of easy synthesis of raw material monomers and the stability of the raw material monomers and the ionic polymer relative to air, moisture, or heat.

In Formula (2), Z$^2$ represents a metal cation or an ammonium cation optionally having a substituent. The metal cation is preferably a monovalent, divalent, or trivalent ion and examples thereof may include an ion of Li, Na, K, Cs, Be, Mg, Ca, Ba, Ag, Al, Bi, Cu, Fe, Ga, Mn, Pb, Sn, Ti, V, W, Y, Yb, Zn, or Zr, and the like. Examples of the substituent that the ammonium cation may have may include an alkyl group having 1 to 10 carbon atoms such as a methyl group, an ethyl group, a propyl group, an isopropyl group, a butyl group, an isobutyl group, and a tert-butyl group.

In Formula (2), M$^2$ represents F$^-$, Cl$^-$, Br$^-$, I$^-$, OH$^-$, R$^b$SO$_3^-$, R$^b$COO$^-$, ClO$^-$, ClO$_2^-$, ClO$_3^-$, ClO$_4^-$, SCN$^-$, CN$^-$, NO$_3^-$, SO$_4^{2-}$, HSO$_4^-$, PO$_4^{3-}$, HPO$_4^{2-}$, H$_2$PO$_4^-$, BF$_4^-$, or PF$_6^-$.

In Formula (2), n2 represents an integer of 0 or more, preferably an integer of from 0 to 6, and more preferably an integer of from 0 to 2.

In Formula (2), a2 represents an integer of 1 or more and b2 represents an integer of 0 or more.

a2 and b2 are selected so that the electric charge of the group represented by Formula (2) becomes 0. For example, in the case where M$^2$ is F$^-$, Cl$^-$, Br$^-$, I$^-$, OH$^-$, R$^b$SO$_3^-$, R$^b$COO$^-$, ClO$^-$, ClO$_2^-$, ClO$_3^-$, ClO$_4^-$, SCN$^-$, CN$^-$, NO$_3^-$, HSO$_4^-$, H$_2$PO$_4^-$, BF$_4^-$, or PF$_6^-$: when Z$^2$ is a monovalent metal ion or an ammonium ion optionally having a substituent, a1 and b1 are selected so that they satisfy a2=b2+1; when Z$^2$ is a divalent metal ion, a1 and b1 are selected so that they satisfy a2=2×b2+1; and when Z$^2$ is a trivalent metal ion, a1 and b1 are selected so that they satisfy a2=3×b2+1. In the case where M$^2$ is SO$_4^{2-}$ or HPO$_4^{2-}$: when Z$^2$ is a monovalent metal ion or an ammonium ion optionally having a substituent, a1 and b1 are selected so that they satisfy b2=2×a2−1; and when Z$^2$ is a trivalent metal ion, a2 and b2 are selected so that they satisfy the relationship of 2×a2=3×b2+1. In any one of the numerical formulae above expressing the relationship between a2 and b2, a2 is preferably an integer of from 1 to 3, more preferably 1 or 2.

R$^b$ represents an alkyl group having 1 to 30 carbon atoms that may have a substituent or an aryl group having 6 to 50 carbon atoms that may have a substituent, and examples of the substituent that these groups may have may include the same substituents shown as examples in the description with respect to Q$^1$. When the substituent is plurally present, the substituents may be the same as or different from each other. Examples of R$^b$ may include an alkyl group having 1 to 20 carbon atoms such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group, and an aryl group having 6 to 30 carbon atoms such as a phenyl group, a 1-naphthyl group, a 2-naphthyl group, a 1-anthryl group, a 2-anthryl group, and a 9-anthryl group.
Examples of the group represented by Formula (2) may include the following groups.
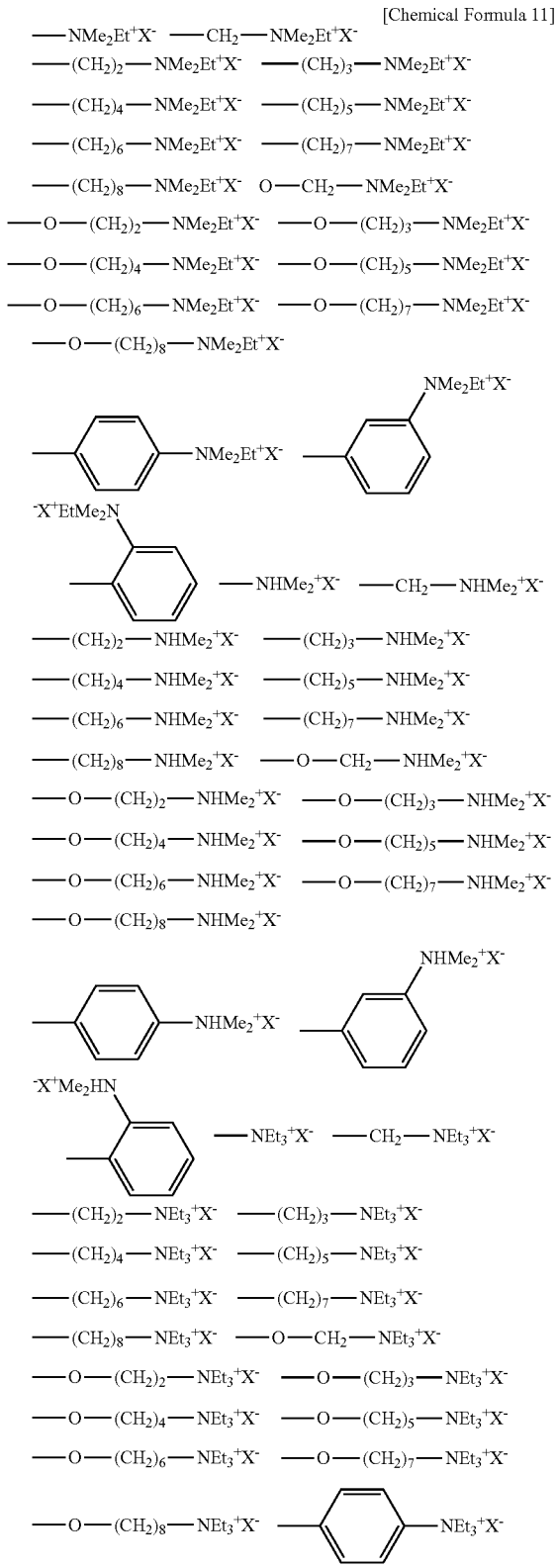
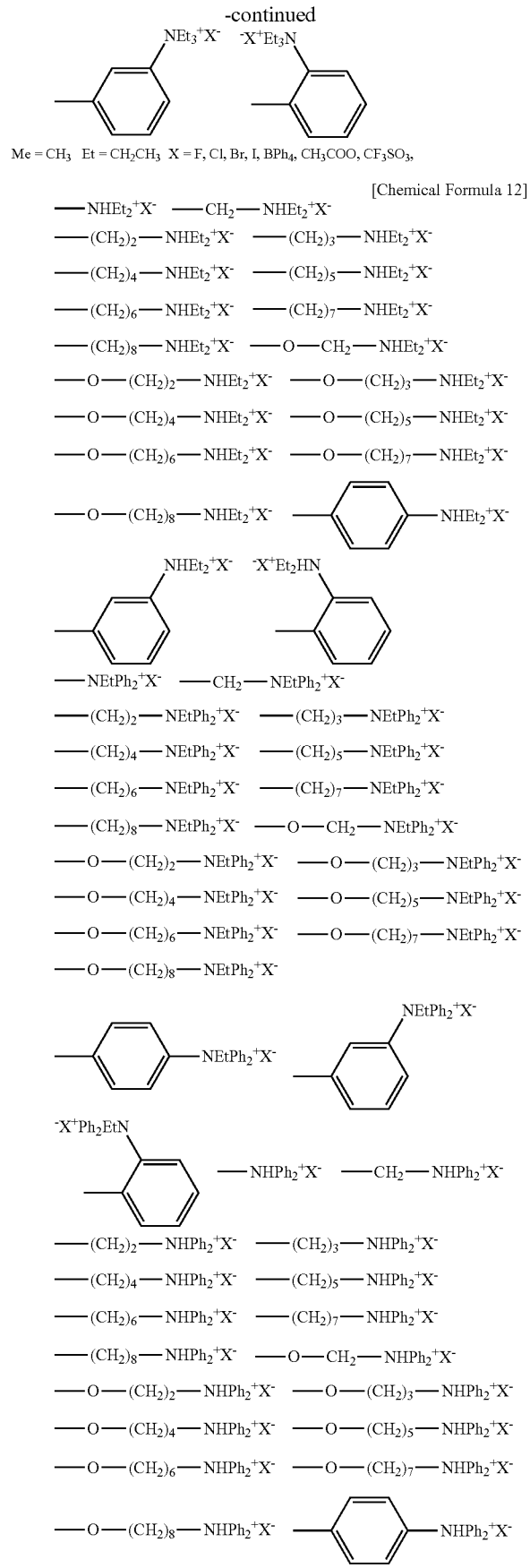

-continued

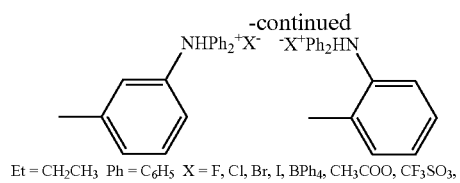

Et = CH₂CH₃  Ph = C₆H₅  X = F, Cl, Br, I, BPh₄, CH₃COO, CF₃SO₃,

Group Represented by Formula (3)

In Formula (3), examples of the divalent organic group represented by $Q^3$, may include the same groups shown as examples with respect to the divalent organic group represented by $Q^1$, and the divalent organic group of $Q^3$ is preferably a saturated divalent hydrocarbon group, a divalent arylene group, and a divalent alkyleneoxy group from the viewpoint of easy synthesis of raw material monomers.

The group included as examples for the divalent organic group represented by $Q^3$ may have a substituent, and examples of the substituent may include the same substituents shown as examples in the description with respect to $Q^1$. When the substituent exists is plurally present, the substituents may be the same as or different from each other.

The divalent organic group represented by $Q^3$ is preferably a group represented by —(CH₂)—.

n3 represents an integer of 0 or more, preferably an integer of 0 to 20, and more preferably an integer of 0 to 8.

In Formula (3), $Y^3$ represents —CN or a group represented by any one of Formulae (4) to (12).

In Formulae (4) to (12), examples of the divalent hydrocarbon group represented by R' may include: a saturated divalent hydrocarbon group having 1 to 50 carbon atoms that may have a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; an unsaturated divalent hydrocarbon group having 2 to 50 carbon atoms that may have a substituent that includes an alkenylene group having 2 to 50 carbon atoms that may have a substituent such as an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent, and an ethynylene group; a saturated divalent cyclic hydrocarbon group having 3 to 50 carbon atoms that may have a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an arylene group having 6 to 50 carbon atoms that may have a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; and an alkyleneoxy group having 1 to 50 carbon atoms that may have a substituent such as a methyleneoxy group, an ethyleneoxy group, a propyleneoxy group, a butyleneoxy group, a pentyleneoxy group, a hexyleneoxy group, and a group in which at least one hydrogen atom in these groups is substituted with a substituent.

The substituent may be the same substituent shown as an example in the description with respect to $Q^1$. When the substituent is plurally present, the substituents may be the same as or different from each other.

In Formulae (4) to (12), the monovalent hydrocarbon group having 1 to 20 carbon atoms represented by R'' may be an alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; and an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent. From the viewpoint of the solubility of the ionic polymer, a methyl group, an ethyl group, a phenyl group, a 1-naphthyl group, and a 2-naphthyl group are preferred. The substituent may be the same substituent shown as an example in the description with respect to $Q^1$. When the substituent is plurally present, the substituents may be the same as or different from each other.

In Formula (5), examples of the trivalent hydrocarbon group represented by R''' may include: an alkyltriyl group having 1 to 20 carbon atoms that may have a substituent such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group, and a group in which at least one hydrogen atom in these groups is substituted with a substituent; and an aryl group having 6 to 30 carbon atoms that may have a substituent such as a 1,2,3-benzenetriyl group, a 1,2,4-benzenetriyl group, a 1,3,5-benzenetriyl group, and a group in which at least one hydrogen atom in these groups is substituted with a substituent. From the viewpoint of the solubility of the ionic polymer, a methanetriyl group, an ethanetriyl group, a 1,2,4-benzenetriyl group, and a 1,3,5-benzenetriyl group are preferred. The substituent may be the same substituent shown as an example in the description with respect to $Q^1$. When the substituent is plurally present, the substituents may be the same as or different from each other.

In Formulae (4) to (12), $R^c$ is preferably a methyl group, an ethyl group, a phenyl group, a 1-naphthyl group, or a 2-naphthyl group from the viewpoint of the solubility of the ionic polymer.

In Formula (4) and Formula (5), a3 represents an integer of 1 or more, and preferably an integer of 3 to 10. In Formulae (6) to (12), a4 represents an integer of 0 or more. In Formula (6), a4 is preferably an integer of 0 to 30, more preferably an integer of 3 to 20. In Formulae (7) to (10), a4 is preferably an integer of 0 to 10, more preferably an integer of 0 to 5. In Formula (11), a4 is preferably an integer of 0 to 20, more preferably an integer of 3 to 20. In Formula (12), a4 is preferably an integer of 0 to 20, more preferably an integer of 0 to 10.

$Y^3$ is, from the viewpoint of easy synthesis of the raw material monomer, preferably —CN, a group represented by Formula (4), a group represented by Formula (6), a group represented by Formula (10), or a group represented by Formula (11), more preferably a group represented by Formula (4), a group represented by Formula (6), or a group represented by Formula (11), and particularly preferably the following groups.

[Chemical Formula 13]

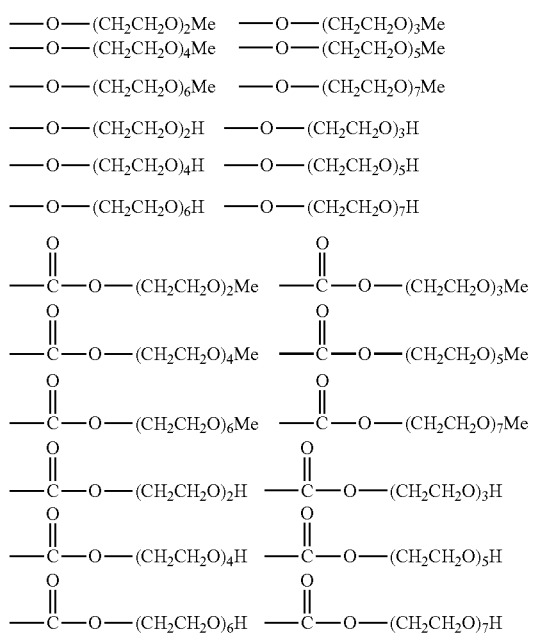

Structural Unit in Ionic Polymer

The ionic polymer used in the present invention preferably has a structural unit represented by Formula (13), a structural unit represented by Formula (15), a structural unit represented by Formula (17), or a structural unit represented by Formula (20) and more preferably is an ionic polymer having these structural units in a content of 15% to 100% by mole based on the number of moles of all structural units.

Structural Unit Represented by Formula (13)

In Formula (13), $R^1$ is a monovalent group containing a group represented by Formula (14); $Ar^1$ represents a (2+n4) valent aromatic group optionally having a substituent besides $R^1$; and n4 represents an integer of 1 or more.

The group represented by Formula (14) may be bonded to $Ar^1$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^1$ may have a substituent besides $R^1$. The substituent may be the same substituent shown as an example in the description with respect to $Q^1$. When the substituent is plurally present, the substituents may be the same as or different from each other.

The substituent, besides $R^1$, that $Ar^1$ has is preferably an alkyl group, an alkoxy group, an aryl group, an aryloxy group, a carboxy group, or a substituted carboxy group from the viewpoint of easy synthesis of raw material monomers.

In Formula (13), n4 represents an integer of 1 or more, preferably an integer of 1 to 4, and more preferably an integer of 1 to 3.

Examples of the (2+n4) valent aromatic group represented by $Ar^1$ in Formula (13) may include a (2+n4) valent aromatic hydrocarbon group and a (2+n4) valent aromatic heterocyclic group and among them, preferred is a (2+n4) valent aromatic group containing a carbon atom alone or a carbon atom and one or more atoms selected from the group consisting of a hydrogen atom, a nitrogen atom, and an oxygen atom. Examples of the (2+n4) valent aromatic group may include: a (2+n4) valent aromatic group remaining after eliminating (2+n4) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n4) valent group remaining after eliminating (2+n4) hydrogen atoms from a fused polycyclic aromatic ring system formed by fusing two or more rings selected from the group consisting of the monocyclic aromatic rings; a (2+n4) valent group remaining after eliminating (2+n4) hydrogen atoms from an aromatic ring assembly formed by linking two or more aromatic rings selected from the group consisting of the monocyclic aromatic rings and the fused polycyclic aromatic ring systems through a single bond, an ethenylene group, or an ethynylene group; and a (2+n4) valent group remaining after eliminating (2+n4) hydrogen atoms from a crosslinkage-having polycyclic aromatic ring formed by crosslinking two aromatic rings adjacent to each other of the fused polycyclic aromatic ring system or the aromatic ring assembly through a divalent group such as a methylene group, an ethylene group, and a carbonyl group.

Examples of the monocyclic aromatic ring may include the following rings.

[Chemical Formula 14]

1

2

3

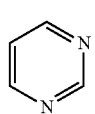

4

Examples of the fused polycyclic aromatic ring system may include the following rings.

[Chemical Formula 15]

Examples of the aromatic ring assembly may include the following rings.

[Chemical Formula 16]

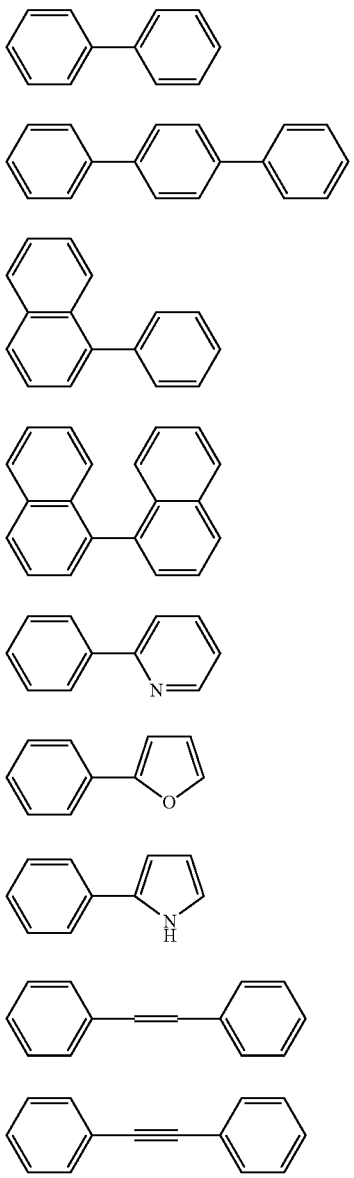

Examples of the crosslinkage-having polycyclic aromatic ring may include the following rings.

[Chemical Formula 17]

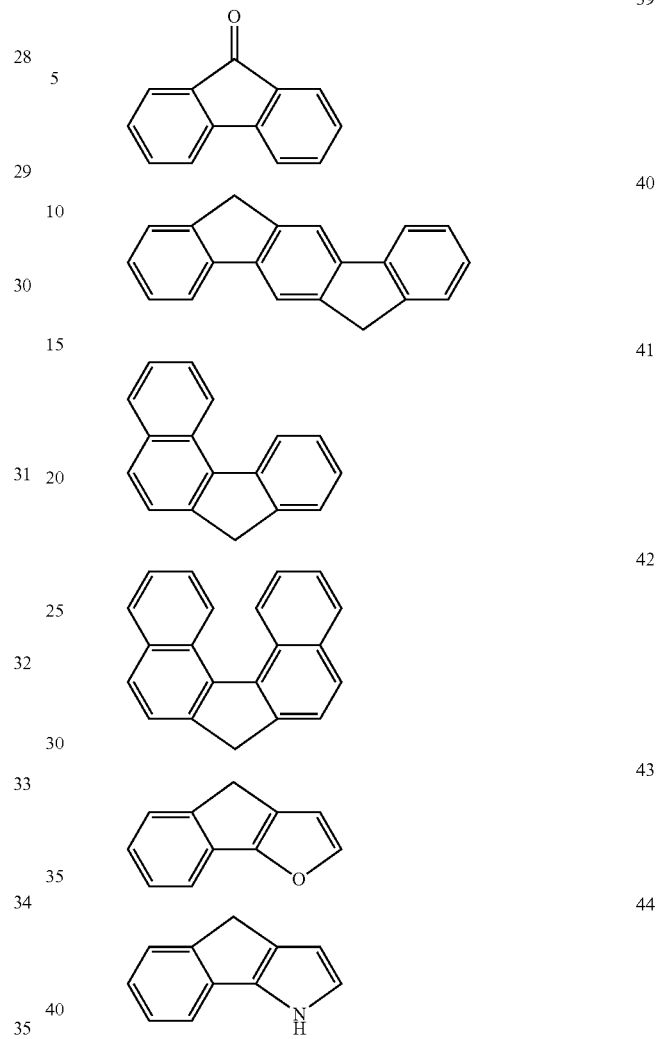

The (2+n4) valent aromatic group is preferably a group remaining after eliminating (2+n4) hydrogen atoms from a ring represented by any of Formula 1 to Formula 14, Formula 26 to Formula 29, Formula 37 to Formula 39, and Formula 41, more preferably a group remaining after eliminating (2+n4) hydrogen atoms from a ring represented by any of Formula 1 to Formula 6, Formula 8, Formula 13, Formula 26, Formula 27, Formula 37 and Formula 41, and further preferably a group remaining after eliminating (2+n4) hydrogen atoms from a ring represented by Formula 1, Formula 37, or Formula 41 from the viewpoint of easy synthesis of raw material monomers.

In Formula (14), examples of the (1+m1+m2) valent organic group represented by $R^2$ may include: a group remaining after eliminating (m1+m2) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m1+m2) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m1+m2) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m1+m2) hydrogen atoms from an amino group having a substituent containing a carbon atom; and a group remaining after eliminating (m1+m2) hydrogen atoms from a silyl group having a substituent containing a carbon atom. Among them, preferred are a group remaining after eliminating (m1+m2) hydrogen atoms from an alkyl group, a group remaining after eliminating (m1+m2) hydrogen atoms from an aryl group, and a group remaining after eliminating (m1+m2) hydrogen atoms from an alkoxy group from the viewpoint of easy synthesis of raw material monomers.

The substituent may be the same substituent shown as an example in the description with respect to $Q^1$. When the substituent is plurally present, the substituents may be the same as or different from each other.

Structural Unit Represented by Formula (15)

In Formula (15), $R^3$ is a monovalent group containing a group represented by Formula (16); $Ar^2$ represents a (2+n5) valent aromatic group optionally having a substituent besides $R^3$; and n5 represents an integer of 1 or more.

The group represented by Formula (16) may be bonded to $Ar^2$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^2$ may have a substituent besides $R^3$. The substituent may be the same substituent shown as an example in the description with respect to $Q^1$. When the substituent is plurally present, the substituents may be the same as or different from each other.

The substituent, besides $R^3$, that $Ar^2$ has is preferably an alkyl group, an alkoxy group, an aryl group, an aryloxy group, a carboxy group, or a substituted carboxy group from the viewpoint of easy synthesis of raw material monomers.

In Formula (15), n5 represents an integer of 1 or more, preferably an integer of from 1 to 4, and more preferably an integer of from 1 to 3.

The (2+n5) valent aromatic group represented by $Ar^2$ in Formula (15) may be a (2+n5) valent aromatic hydrocarbon group or a (2+n5) valent aromatic heterocyclic group and among them, preferred is a (2+n5) valent aromatic group containing a carbon atom alone or a carbon atom and one or more atoms selected from the group consisting of a hydrogen atom, a nitrogen atom, and an oxygen atom. Examples of the (2+n5) valent aromatic group include: a (2+n5) valent group remaining after eliminating (2+n5) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n5) valent group remaining after eliminating (2+n5) hydrogen atoms from a fused polycyclic aromatic ring system formed by fusing two or more rings selected from the group consisting of the monocyclic aromatic rings; a (2+n5) valent group remaining after eliminating (2+n5) hydrogen atoms from an aromatic ring assembly formed by linking two or more aromatic rings selected from the group consisting of the monocyclic aromatic rings and the fused polycyclic aromatic ring systems through a single bond, an ethenylene group, or an ethynylene group; and a (2+n5) valent group remaining after eliminating (2+n5) hydrogen atoms from a crosslinkage-having polycyclic aromatic ring formed by crosslinking two aromatic rings adjacent to each other of the fused polycyclic aromatic ring system or the aromatic ring assembly through a divalent group such as a methylene group, an ethylene group, and a carbonyl group.

Examples of the monocyclic aromatic ring may include rings represented by Formula 1 to Formula 12 shown as examples in the description with respect to the structural unit represented by Formula (13).

Examples of the fused polycyclic aromatic ring system may include rings represented by Formula 13 to Formula 27 shown as examples in the description with respect to the structural unit represented by Formula (13).

Examples of the aromatic ring assembly may include rings represented by Formula 28 to Formula 36 shown as examples in the description with respect to the structural unit represented by Formula (13).

Examples of the crosslinkage-having polycyclic aromatic ring include rings represented by Formula 37 to Formula 44 shown as examples in the description with respect to the structural unit represented by Formula (13).

Examples of the (2+n5) valent aromatic group may include preferably a group remaining after eliminating (2+n5) hydrogen atoms from a ring represented by any of Formula 1 to Formula 14, Formula 26 to Formula 29, Formula 37 to Formula 39, and Formula 41, more preferably a group remaining after eliminating (2+n5) hydrogen atoms from a ring represented by any of Formula 1 to Formula 6, Formula 8, Formula 13, Formula 26, Formula 27, Formula 37, and Formula 41, and further preferably a group remaining after eliminating (2+n5) hydrogen atoms from a ring represented by Formula 1, Formula 37, or Formula 41 from the viewpoint of easy synthesis of raw material monomers.

In Formula (16), m3 and m4 each independently represent an integer of 1 or more.

In Formula (16), examples of the (1+m3+m4) valent organic group represented by $R^4$ may include: a group remaining after eliminating (m3+m4) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m3+m4) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m3+m4) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m3+m4) hydrogen atoms from an amino group having a substituent containing a carbon atom; and a group remaining after eliminating (m3+m4) hydrogen atoms from a silyl group having a substituent containing a carbon atom. Among them, preferred are a group remaining after eliminating (m3+m4) hydrogen atoms from an alkyl group, a group remaining after eliminating (m3+m4) hydrogen atoms from an aryl group, and a group remaining after eliminating (m3+m4) hydrogen atoms from an alkoxy group from the viewpoint of easy synthesis of raw material monomers.

The substituent may be the same substituent shown as an example in the description with respect to $Q^1$. When the substituent is plurally present, the substituents may be the same as or different from each other.

Structural Unit Represented by Formula (17)

In Formula (17), $R^5$ is a monovalent group containing a group represented by Formula (18); $R^6$ is a monovalent group containing a group represented by Formula (19); $Ar^3$ represents a (2+n6+n7) valent aromatic group optionally having a substituent besides $R^5$ and $R^6$; and n6 and n7 represent independently an integer of 1 or more.

The group represented by Formula (18) and the group represented by Formula (19) may be bonded to $Ar^3$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^3$ may have a substituent besides $R^5$ and $R^6$. The substituent may be the same substituent shown as an example in the description with respect to $Q^1$. When the substituent is plurally present, the substituents may be the same as or different from each other.

The substituent, besides $R^5$ and $R^6$, that $Ar^3$ has is, preferably an alkyl group, an alkoxy group, an aryl group, an aryloxy group, a carboxy group, or a substituted carboxy group from the viewpoint of easy synthesis of raw material monomers.

In Formula (17), n6 represents an integer of 1 or more, preferably an integer of from 1 to 4, and more preferably an integer of from 1 to 3.

In Formula (17), n7 represents an integer of 1 or more, preferably an integer of from 1 to 4, and more preferably an integer of from 1 to 3.

Examples of the (2+n6+n7) valent aromatic group represented by $Ar^3$ in Formula (17) may include a (2+n6+n7) valent aromatic hydrocarbon group and a (2+n6+n7) valent aromatic heterocyclic group and among them, preferred is a (2+n6+n7) valent aromatic group containing a carbon atom alone or a carbon atom and one or more atoms selected from the group consisting of a hydrogen atom, a nitrogen atom, and an oxygen atom. Examples of the (2+n6+n7) valent aromatic group may include: a (2+n6+n7) valent group remaining after eliminating (2+n6+n7) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, an imidazole ring, and an oxazole ring; a (2+n6+n7) valent group remaining after eliminating (2+n6+n7) hydrogen atoms from a fused polycyclic aromatic ring formed by fusing two or more rings selected from the group consisting of the monocyclic aromatic rings; a (2+n6+n7) valent group remaining after eliminating (2+n6+n7) hydrogen atoms from an aromatic ring assembly formed by linking two or more aromatic rings selected from the group consisting of the monocyclic aromatic rings and the fused polycyclic aromatic ring systems through a single bond, an ethenylene group, or an ethynylene group; and a (2+n6+n7) valent group remaining after eliminating (2+n6+n7) hydrogen atoms from a crosslinkage-having polycyclic aromatic ring formed by crosslinking two aromatic rings adjacent to each other of the fused polycyclic aromatic ring system or the aromatic ring assembly through a divalent group such as a methylene group, an ethylene group, and a carbonyl group.

Examples of the monocyclic aromatic ring may include rings represented by Formula 1 to Formula 5 and Formula 7 to Formula 10 show as examples in the description with respect to the structural unit represented by Formula (13).

Examples of the fused polycyclic aromatic ring system may include rings represented by Formula 13 to Formula 27 shown as examples in the description with respect to the structural unit represented by Formula (13).

Examples of the aromatic ring assembly may include rings represented by Formula 28 to Formula 36 shown as examples in the description with respect to the structural unit represented by Formula (13).

Examples of the crosslinkage-having polycyclic aromatic ring may include rings represented by Formula 37 to Formula 44 shown as examples in the description with respect to the structural unit represented by Formula (13).

The (2+n6+n7) valent aromatic group is preferably a group remaining after eliminating (2+n6+n7) hydrogen atoms from a ring represented by any of Formula 1 to Formula 5, Formula 7 to Formula 10, Formula 13, Formula 14, Formula 26 to Formula 29, Formula 37 to Formula 39, and Formula 41, more preferably a group remaining after eliminating (2+n6+n7) hydrogen atoms from a ring represented by Formula 1, Formula 37, or Formula 41, and further preferably a group remaining after eliminating (2+n6+n7) hydrogen atoms from a ring represented by Formula 1, Formula 38, or Formula 42 from the viewpoint of easy synthesis of raw material monomers.

In Formula (18), $R^7$ represents a single bond or a (1+m5) valent organic group, and preferably a (1+m5) valent organic group.

In Formula (18), examples of the (1+m5) valent organic group represented by $R^7$ may include: a group remaining after eliminating m5 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m5 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating m5 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m5 hydrogen atoms from an amino group having a substituent containing a carbon atom; and a group remaining after eliminating m5 hydrogen atoms from a silyl group having a substituent containing a carbon atom. Among them, preferred are a group remaining after eliminating m5 hydrogen atoms from an alkyl group, a group remaining after eliminating m5 hydrogen atoms from an aryl group, and a group remaining after eliminating m5 hydrogen atoms from an alkoxy group from the viewpoint of easy synthesis of raw material monomers.

The substituent may be the same substituent shown as an example in the description with respect to $Q^1$. When the substituent is plurally present, the substituents may be the same as or different from each other.

In Formula (18), m5 represents an integer of 1 or more, provided that when $R^7$ is a single bond, m5 represents 1.

In Formula (19), $R^8$ represents a single bond or a (1+m6) valent organic group, and preferably a (1+m6) organic group.

In Formula (19), examples of the (1+m6) valent organic group represented by $R^8$ may include: a group remaining after eliminating m6 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m6 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating m6 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m6 hydrogen atoms from an amino group having a substituent containing a carbon atom; and a group remaining after eliminating m6 hydrogen atoms from a silyl group having a substituent containing a carbon atom. Among them, preferred are a group remaining after eliminating m6 hydrogen atoms from an alkyl group, a group remaining after eliminating m6 hydrogen atoms from an aryl group, and a group remaining after eliminating m6 hydrogen atoms from an alkoxy group from the viewpoint of easy synthesis of raw material monomers.

The substituent may be the same substituent shown as an example in the description with respect to $Q^1$. When the substituent is plurally present, the substituents may be the same as or different from each other.

In Formula (19), m6 represents an integer of 1 or more, with the proviso that when $R^8$ is a single bond, m6 represents 1.

Structural Unit Represented by Formula (20)

In Formula (20), $R^9$ is a monovalent group containing a group represented by Formula (21); $R^{10}$ is a monovalent group containing a group represented by Formula (22); $Ar^4$ represents a (2+n8+n9) valent aromatic group optionally having a substituent besides $R^9$ and $R^{10}$; and n8 and n9 each independently represent an integer of 1 or more.

The group represented by Formula (21) and the group represented by Formula (22) may be bonded to $Ar^4$ either directly or through: an alkylene group having 1 to 50 carbon atoms that may have a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; an oxyalkylene group having 1 to 50 carbon atoms that may have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^4$ may have a substituent besides $R^9$ and $R^{10}$. The substituent may be the same substituent shown as an example in the description with respect to $Q^1$. When the substituent is plurally present, the substituents may be the same as or different from each other.

The substituent, besides $R^9$ and $R^{10}$, that $Ar^4$ has is preferably an alkyl group, an alkoxy group, an aryl group, an aryloxy group, a carboxy group, or a substituted carboxy group from the viewpoint of easy synthesis of raw material monomers.

In Formula (20), n8 represents an integer of 1 or more, preferably an integer of from 1 to 4, and more preferably an integer of from 1 to 3.

In Formula (20), n9 represents an integer of 1 or more, preferably an integer of from 1 to 4, and more preferably an integer of from 1 to 3.

Examples of the (2+n8+n9) valent aromatic group represented by $Ar^4$ in Formula (20) may include a (2+n8+n9) valent aromatic hydrocarbon group and a (2+n8+n9) valent aromatic heterocyclic group and among them, preferred is a (2+n8+n9) valent aromatic group containing a carbon atom alone or a carbon atom and one or more atoms selected from the group consisting of a hydrogen atom, a nitrogen atom, and an oxygen atom. Examples of the (2+n8+n9) valent aromatic group may include: a (2+n8+n9) valent group remaining after eliminating (2+n8+n9) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, and an imidazole ring; a (2+n8+n9) valent group remaining after eliminating (2+n8+n9) hydrogen atoms from a fused polycyclic aromatic ring system formed by fusing two or more rings selected from the group consisting of the monocyclic aromatic rings; a (2+n8+n9) valent group remaining after eliminating (2+n8+n9) hydrogen atoms from an aromatic ring assembly formed by linking two or more aromatic rings selected from the group consisting of the monocyclic aromatic rings and the fused polycyclic aromatic ring systems through a single bond, an ethenylene group, or an ethynylene group; and a (2+n8+n9) valent group remaining after eliminating (2+n8+n9) hydrogen atoms from a crosslinkage-having polycyclic aromatic ring formed by crosslinking two aromatic rings adjacent to each other of the fused polycyclic aromatic ring system or the aromatic ring assembly through a divalent group such as a methylene group, an ethylene group, and a carbonyl group.

Examples of the monocyclic aromatic ring may include rings represented by Formula 1 to Formula 5 and Formula 7 to Formula 10 shown as examples in the description with respect to the structural unit represented by Formula (13).

Examples of the fused polycyclic aromatic ring system may include rings represented by Formula 13 to Formula 27 shown as examples in the description with respect to the structural unit represented by Formula (13).

Examples of the aromatic ring assembly may include rings represented by Formulae 28 to 36 shown as examples in the description with respect to the structural unit represented by Formula (13).

Examples of the crosslinkage-having polycyclic aromatic ring may include rings represented by Formula 37 to Formula 44 shown as examples in the description with respect to the structural unit represented by Formula (13).

The (2+n8+n9) valent aromatic group is preferably a group remaining after eliminating (2+n8+n9) hydrogen atoms from a ring represented by any of Formula 1 to Formula 5, Formula 7 to Formula 10, Formula 13, Formula 14, Formula 26 to Formula 29, Formula 37 to Formula 39, and Formula 41, more preferably a group remaining after eliminating (2+n8+n9) hydrogen atoms from a ring represented by any of Formula 1 to Formula 6, Formula 8, Formula 14, Formula 27, Formula 28, Formula 38, and Formula 42, and further preferably a group remaining after eliminating (2+n8+n9) hydrogen atoms from a ring represented by Formula 1, Formula 37, or Formula 41 from the viewpoint of easy synthesis of raw material monomers.

In Formula (21), $R^{11}$ represents a single bond or a (1+m7) valent organic group, and preferably a (1+m7) valent organic group.

In Formula (21), examples of the (1+m7) valent organic group represented by $R^{11}$ may include: a group remaining after eliminating m7 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m7 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating m7 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m7 hydrogen atoms from an amino group having a substituent containing a carbon atom; and a group remaining after eliminating m7 hydrogen atoms from a silyl group having a substituent containing a carbon atom. Among them, preferred are a group remaining after eliminating m7 hydrogen atoms from an alkyl group, a group remaining after eliminating m7 hydrogen atoms from an aryl group, and a group remaining after eliminating m7 hydrogen atoms from an alkoxy group from the viewpoint of easy synthesis of raw material monomers.

Examples of the substituent may include the same substituents shown as examples in the description with respect to $Q^1$. When the substituent is plurally present, the substituents may be the same as or different from each other.

In Formula (21), m7 represents an integer of 1 or more, provided that when $R^{11}$ is a single bond, m7 represents 1.

In Formula (22), $R^{12}$ represents a single bond or a (1+m8) valent organic group, and preferably a (1+m8) valent organic group.

In Formula (22), examples of the (1+m8) valent organic group represented by $R^{12}$ may include: a group remaining after eliminating m8 hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating m8 hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating m8 hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating m8 hydrogen atoms from an amino group having a substituent containing a carbon atom; and a group remaining after eliminating m8 hydrogen atoms from a silyl group having a substituent containing a carbon atom. Among them, preferred are a group remaining after eliminating m8 hydrogen atoms from an alkyl group, a group remaining after eliminating m8 hydrogen atoms from an aryl group, and a group remaining after eliminating m8 hydrogen atoms from an alkoxy group from the viewpoint of easy synthesis of raw material monomers.

The substituent may be the same substituent shown as an example in the description with respect to $Q^1$. When the substituent is plurally present, the substituents may be the same as or different from each other.

In Formula (22), m8 represents an integer of 1 or more, provided that when $R^{12}$ is a single bond, m8 represents 1.

Examples of Structural Unit Represented by Formula (13)

The structural unit represented by Formula (13) is preferably a structural unit represented by Formula (23) and a structural unit represented by Formula (24) and more preferably a structural unit represented by Formula (24) from the viewpoint of the electron transport characteristic of the obtained ionic polymer.

[Chemical Formula 18]

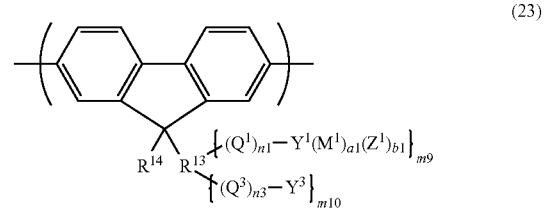

(23)

(In Formula (23), $R^{13}$ represents a (1+m9+m10) valent organic group; $R^{14}$ represents a monovalent organic group; $Q^1$, $Q^3$, $Y^1$, $M^1$, $Z^1$, $Y^3$, n1, a1, b1, and n3 represent the same meanings as described above; m9 and m10 represent independently an integer of 1 or more. When each of $Q^1$, $Q^3$, $Y^1$, $M^1$, $Z^1$, $Y^3$, n1, a1, b1, and n3 is plurally present, a plurality of each $Q^1$, $Q^3$, $Y^1$, $M^1$, $Z^1$, $Y^3$, n1, a1, b1, or n3 may be the same as or different from each other).

In Formula (23), examples of the (1+m9+m10) valent organic group represented by $R^{13}$ may include: a group remaining after eliminating (m9+m10) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m9+m10) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m9+m10) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m9+m10) hydrogen atoms from an amino group having a substituent containing a carbon atom; and a group remaining after eliminating (m9+m10) hydrogen atoms from a silyl group having a substituent containing a carbon atom. Among them, preferred are a group remaining after eliminating (m9+m10) hydrogen atoms from an alkyl group, a group remaining after eliminating (m9+m10) hydrogen atoms from an aryl group, and a group remaining after eliminating (m9+m10) hydrogen atoms from an alkoxy group from the viewpoint of easy synthesis of raw material monomers.

In Formula (23), examples of the monovalent organic group represented by $R^{14}$ may include: a group remaining after eliminating one hydrogen atom from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating one hydrogen atom from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating one hydrogen atom from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating one hydrogen atom from an amino group having a substituent containing a carbon atom; and a group remaining after eliminating one hydrogen atom from a silyl group having a substituent containing a carbon atom. Among them, preferred are a group remaining after eliminating one hydrogen atom from an alkyl group, a group remaining after eliminating one hydrogen atom from an aryl group, and a group remaining after eliminating one hydrogen atom from an alkoxy group from the viewpoint of easy synthesis of raw material monomers.

Examples of the structural unit represented by Formula (23) may include the following structural units.

[Chemical Formula 19]

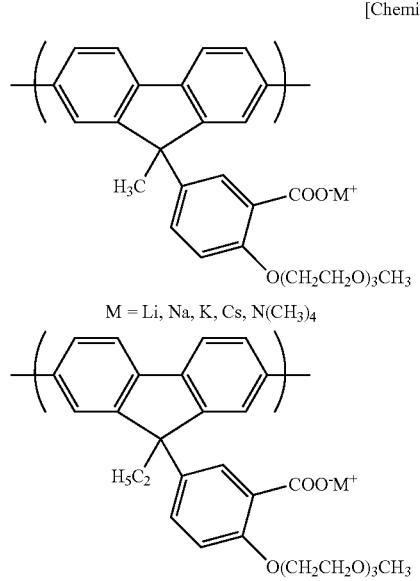

M = Li, Na, K, Cs, N(CH$_3$)$_4$

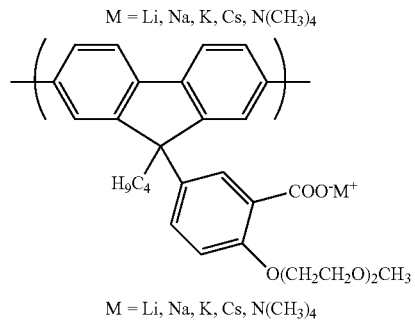

M = Li, Na, K, Cs, N(CH$_3$)$_4$

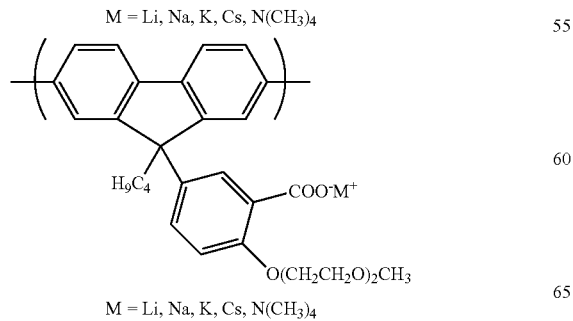

M = Li, Na, K, Cs, N(CH$_3$)$_4$

-continued

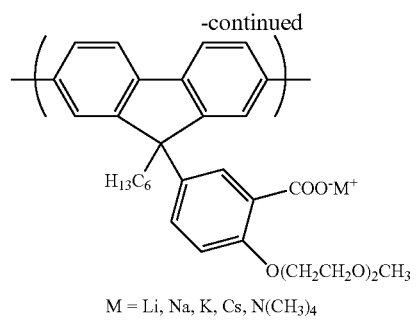

M = Li, Na, K, Cs, N(CH$_3$)$_4$

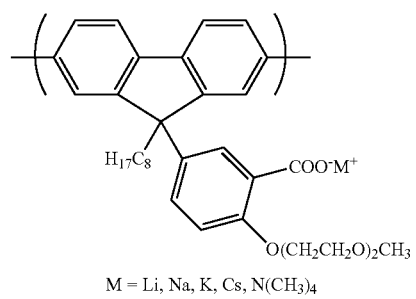

M = Li, Na, K, Cs, N(CH$_3$)$_4$

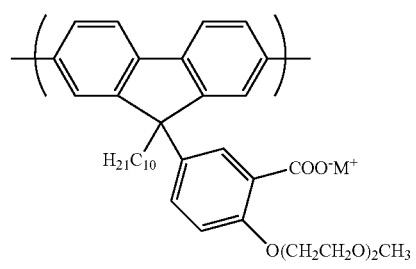

M = Li, Na, K, Cs, N(CH$_3$)$_4$

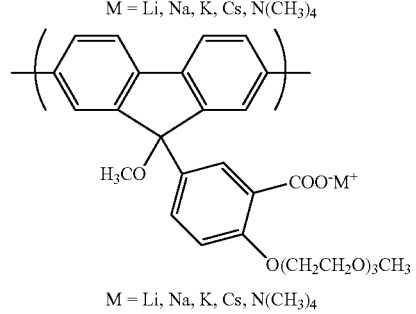

M = Li, Na, K, Cs, N(CH$_3$)$_4$

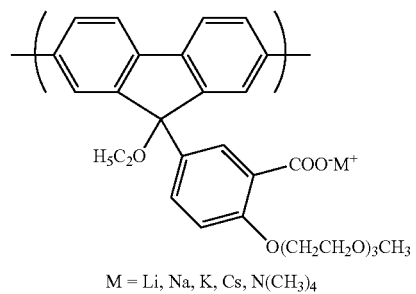

M = Li, Na, K, Cs, N(CH$_3$)$_4$

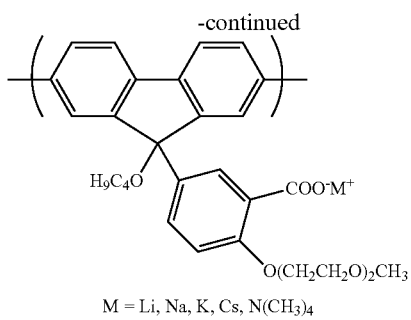

M = Li, Na, K, Cs, N(CH₃)₄

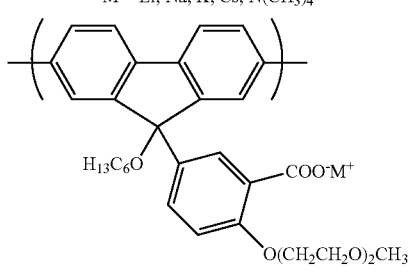

M = Li, Na, K, Cs, N(CH₃)₄

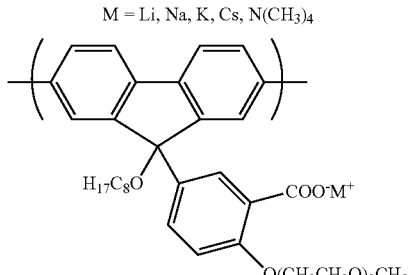

M = Li, Na, K, Cs, N(CH₃)₄

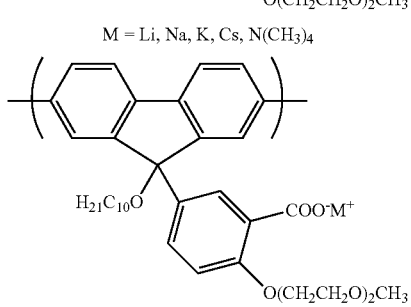

M = Li, Na, K, Cs, N(CH₃)₄

[Chemical Formula 20]

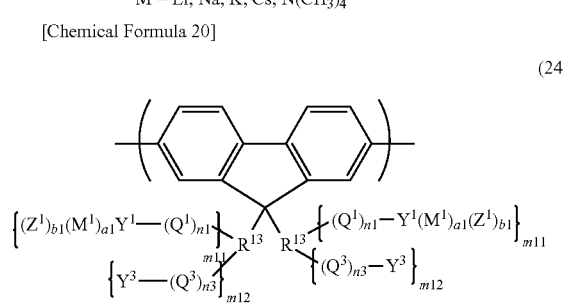
(24)

(In Formula (24), $R^{13}$ represents a (1+m11+m12) valent organic group; $Q^1$, $Q^3$, $M^1$, $Z^1$, $Y^3$, n1, a1, b1, and n3 represent the same meanings as described above; m11 and m12 each independently represent an integer of 1 or more; and when each of $R^{13}$, m11, m12, $Q^1$, $Q^3$, $Y^1$, $M^1$, $Z^1$, $Y^3$, n1, a1, b1, and n3 is plurally present, a plurality of each $R^{13}$, m1, m12, $Q^1$, $Q^3$, $Y^1$, $M^1$, $Z^1$, n1, a1, b1, or n3 may be the same as or different from each other).

In Formula (24), examples of the (1+m11+m12) valent organic group represented by $R^{13}$ may include: a group remaining after eliminating (m11+m12) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m11+m12) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m11+m12) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m11+m12) hydrogen atoms from an amino group having a substituent containing a carbon atom; and a group remaining after eliminating (m11+m12) hydrogen atoms from a silyl group having a substituent containing a carbon atom. Among them, preferred are a group remaining after eliminating (m11+m12) hydrogen atoms from an alkyl group, a group remaining after eliminating (m11+m12) hydrogen atoms from an aryl group, and a group remaining after eliminating (m11+m12) hydrogen atoms from an alkoxy group from the viewpoint of easy synthesis of raw material monomers.

Examples of the structural unit represented by Formula (24) may include the following structural units.

[Chemical Formula 21]

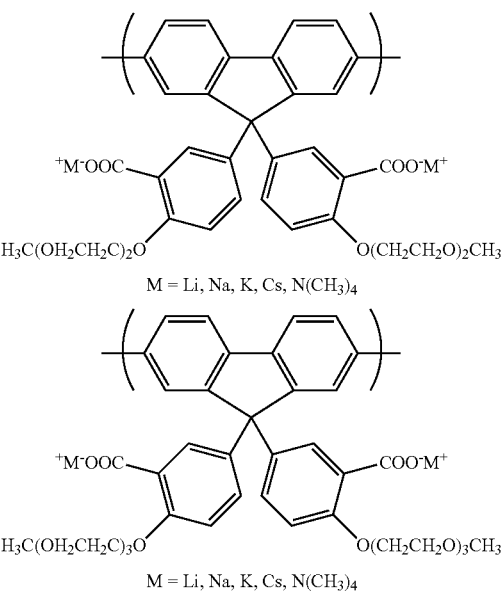

M = Li, Na, K, Cs, N(CH₃)₄

M = Li, Na, K, Cs, N(CH₃)₄

45
-continued
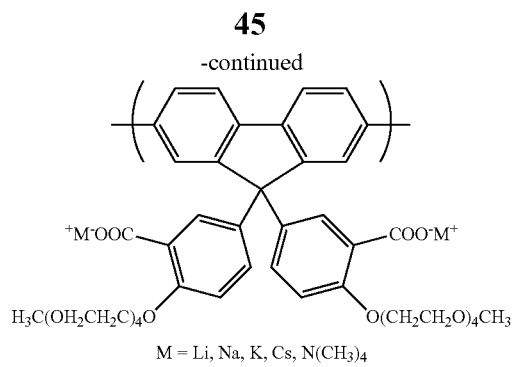
M = Li, Na, K, Cs, N(CH$_3$)$_4$
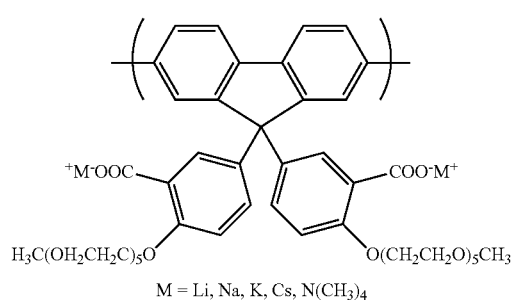
M = Li, Na, K, Cs, N(CH$_3$)$_4$
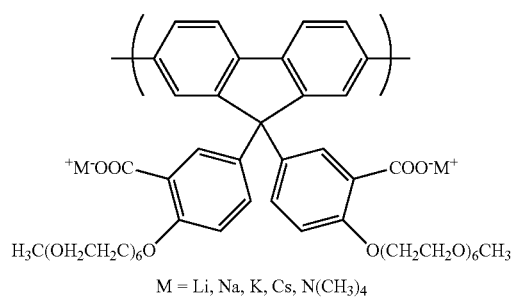
M = Li, Na, K, Cs, N(CH$_3$)$_4$
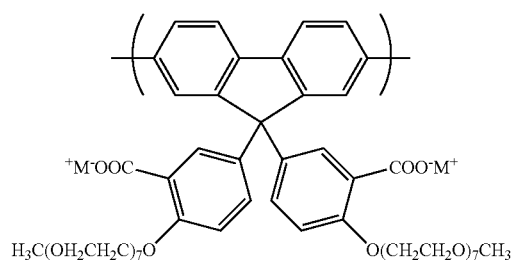
M = Li, Na, K, Cs, N(CH$_3$)$_4$
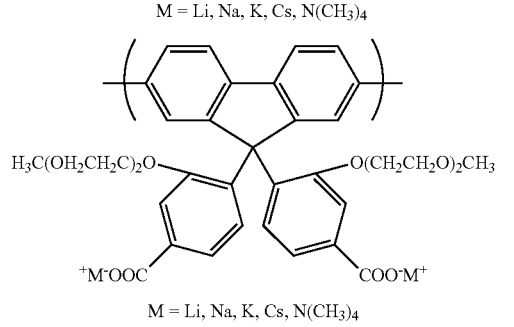
M = Li, Na, K, Cs, N(CH$_3$)$_4$
46
-continued
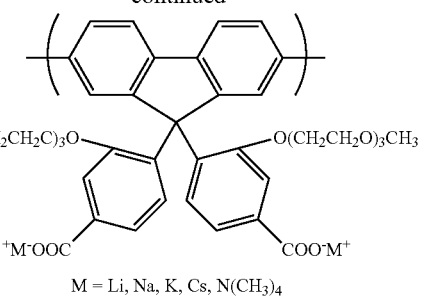
M = Li, Na, K, Cs, N(CH$_3$)$_4$
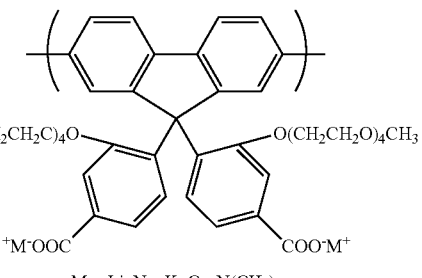
M = Li, Na, K, Cs, N(CH$_3$)$_4$
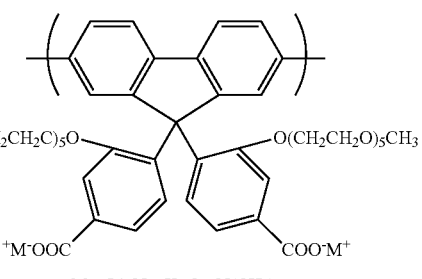
M = Li, Na, K, Cs, N(CH$_3$)$_4$
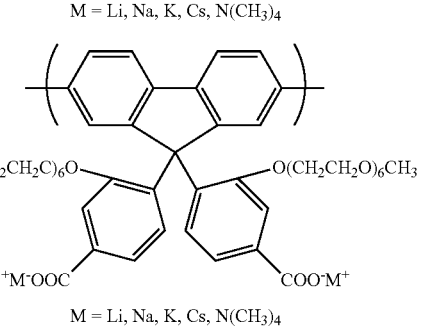
M = Li, Na, K, Cs, N(CH$_3$)$_4$
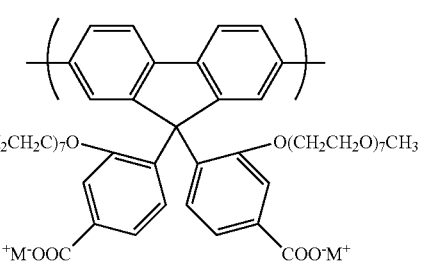
M = Li, Na, K, Cs, N(CH$_3$)$_4$ -continued
[Chemical Formula 22]
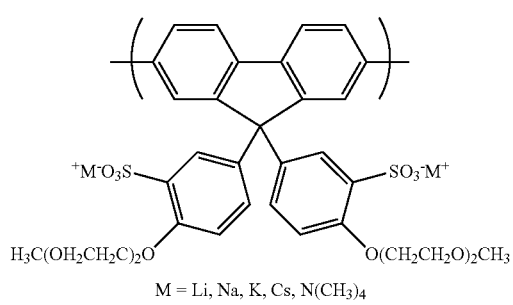
M = Li, Na, K, Cs, N(CH$_3$)$_4$
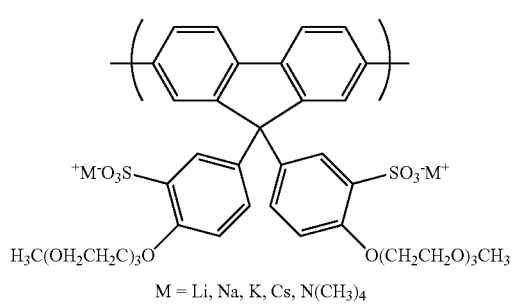
M = Li, Na, K, Cs, N(CH$_3$)$_4$
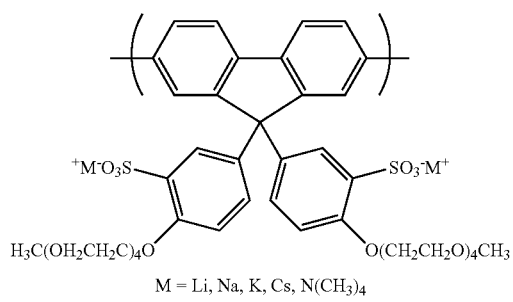
M = Li, Na, K, Cs, N(CH$_3$)$_4$
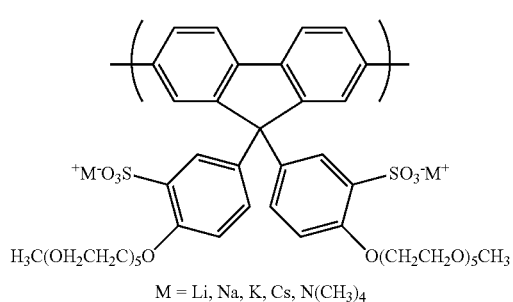
M = Li, Na, K, Cs, N(CH$_3$)$_4$
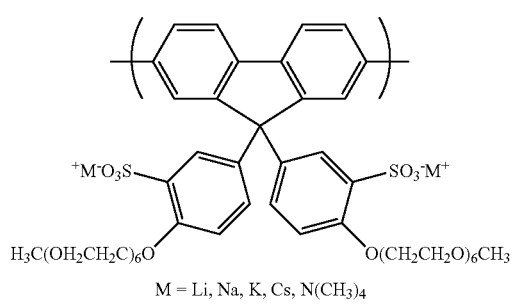
M = Li, Na, K, Cs, N(CH$_3$)$_4$
-continued
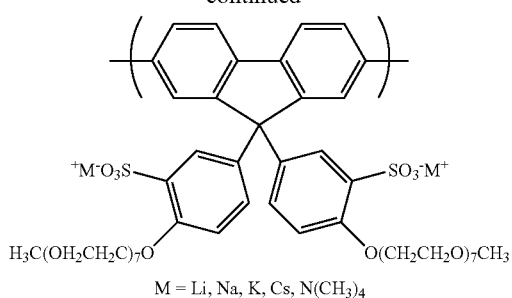
M = Li, Na, K, Cs, N(CH$_3$)$_4$
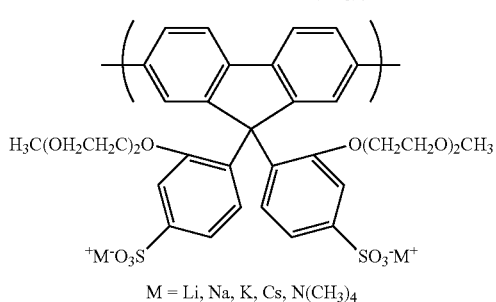
M = Li, Na, K, Cs, N(CH$_3$)$_4$
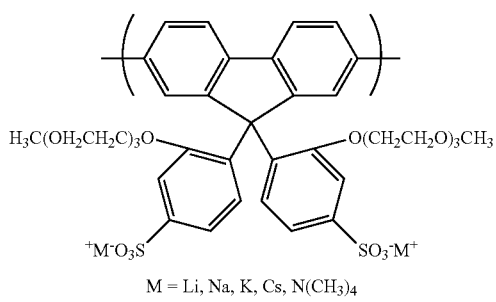
M = Li, Na, K, Cs, N(CH$_3$)$_4$
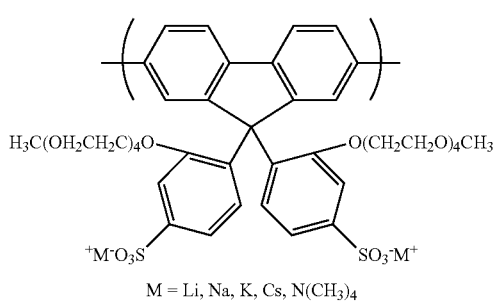
M = Li, Na, K, Cs, N(CH$_3$)$_4$
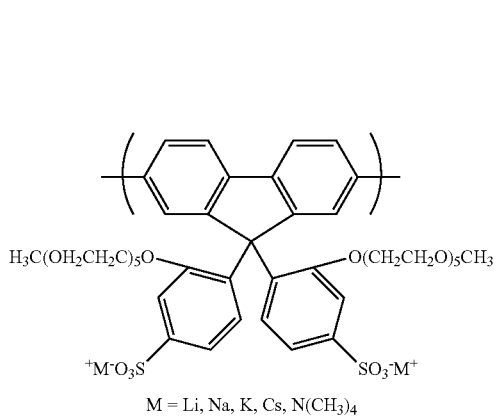
M = Li, Na, K, Cs, N(CH$_3$)$_4$ 49
-continued
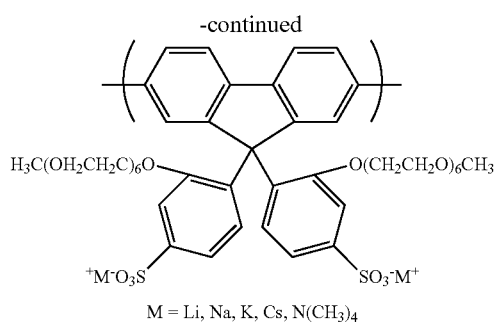
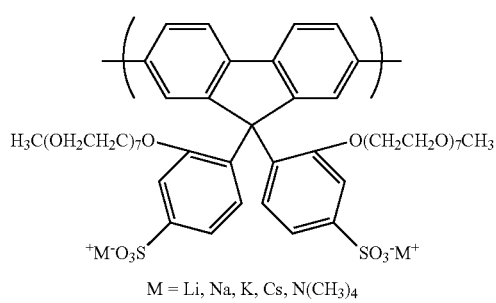
[Chemical Formula 23]
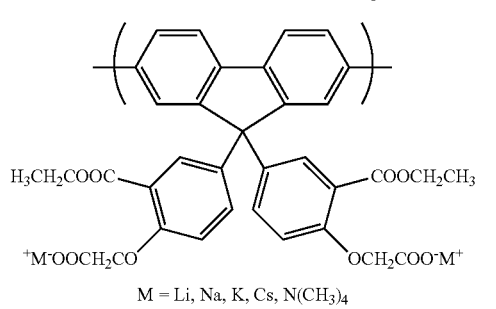
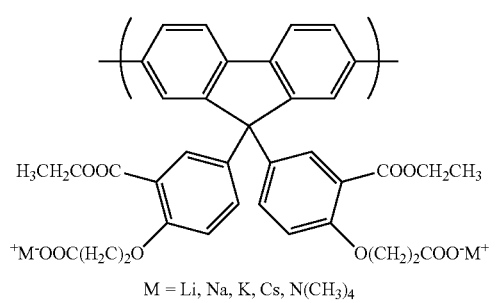
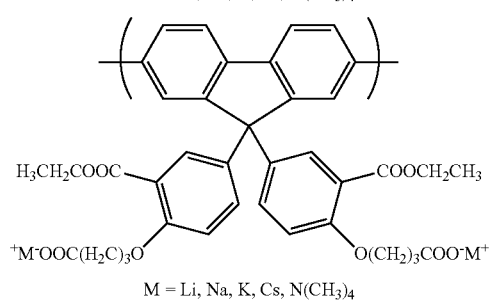
50
-continued
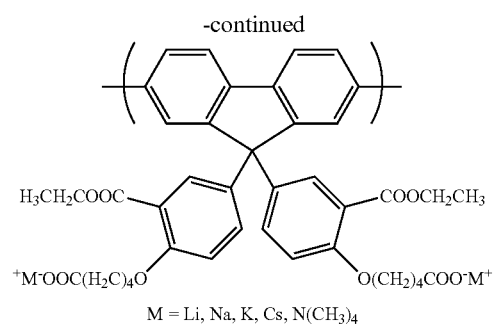
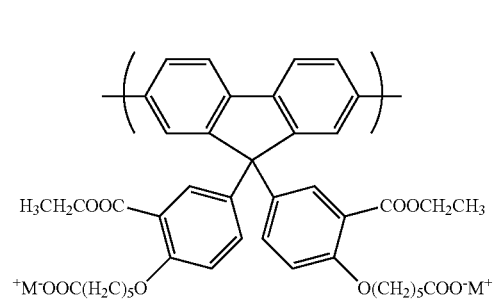
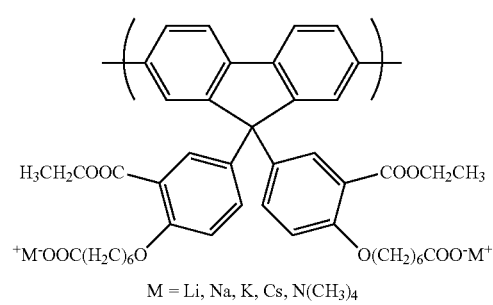
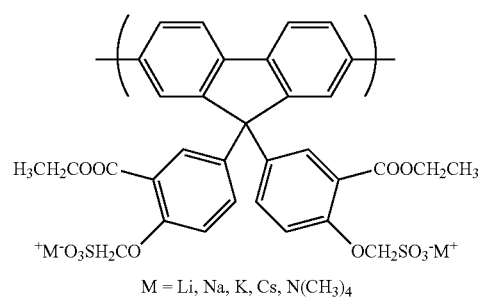
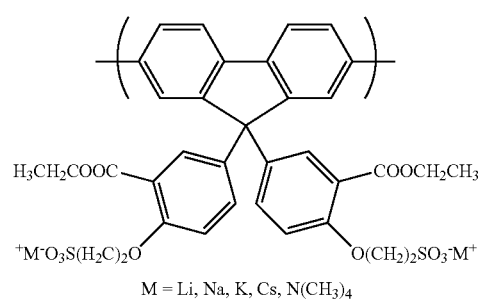

51
-continued
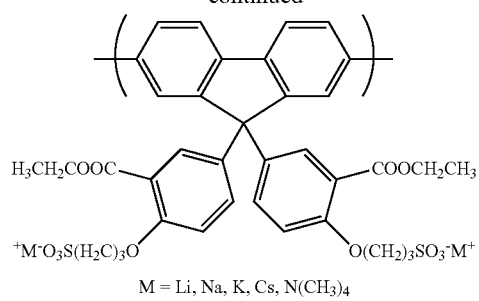
M = Li, Na, K, Cs, N(CH$_3$)$_4$
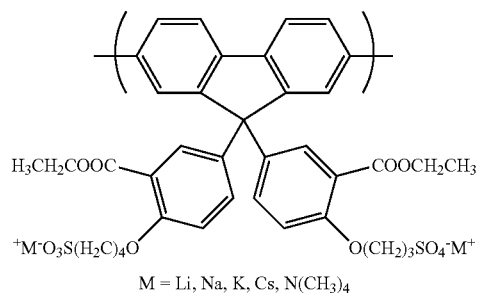
M = Li, Na, K, Cs, N(CH$_3$)$_4$
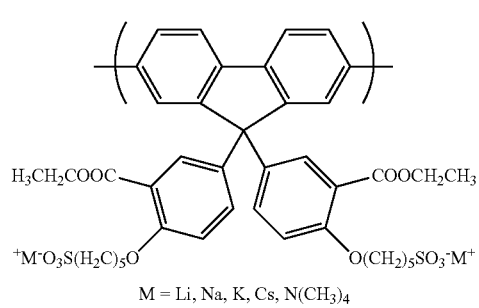
M = Li, Na, K, Cs, N(CH$_3$)$_4$
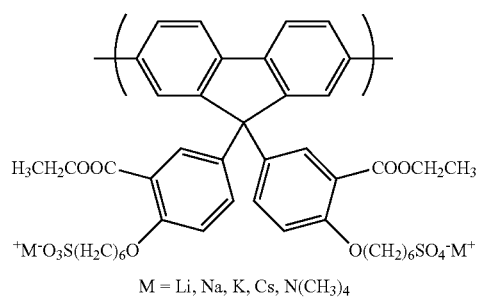
M = Li, Na, K, Cs, N(CH$_3$)$_4$
[Chemical Formula 24]
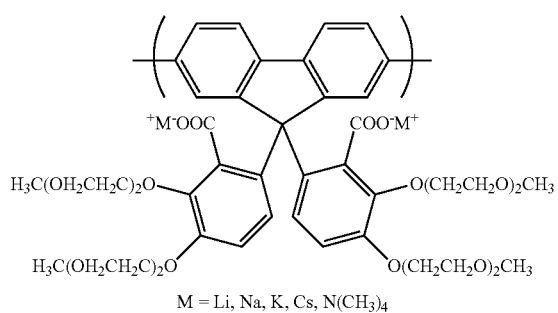
M = Li, Na, K, Cs, N(CH$_3$)$_4$
52
-continued
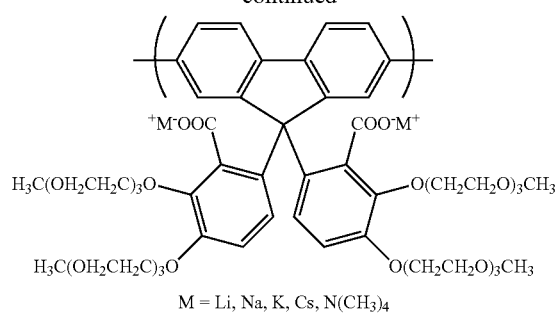
M = Li, Na, K, Cs, N(CH$_3$)$_4$
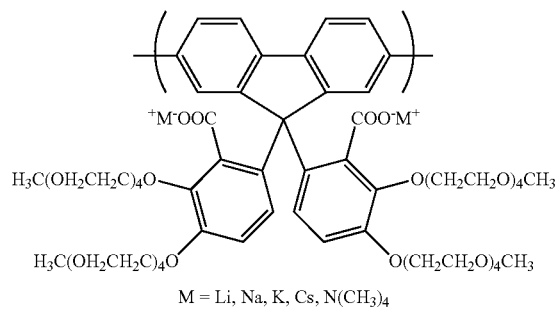
M = Li, Na, K, Cs, N(CH$_3$)$_4$
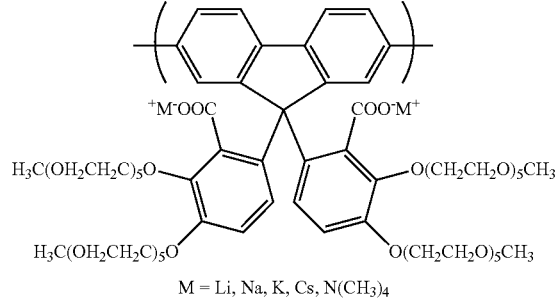
M = Li, Na, K, Cs, N(CH$_3$)$_4$
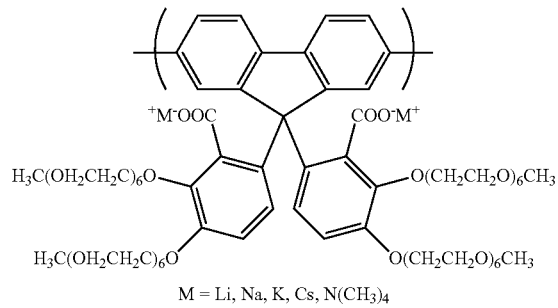
M = Li, Na, K, Cs, N(CH$_3$)$_4$
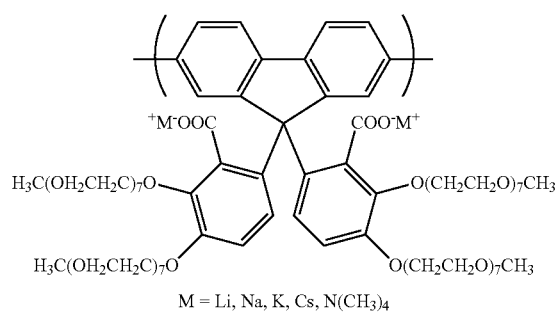
M = Li, Na, K, Cs, N(CH$_3$)$_4$ -continued

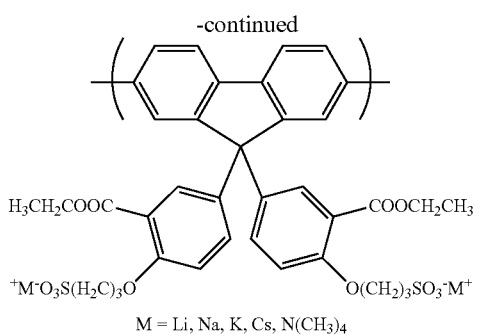

M = Li, Na, K, Cs, N(CH₃)₄

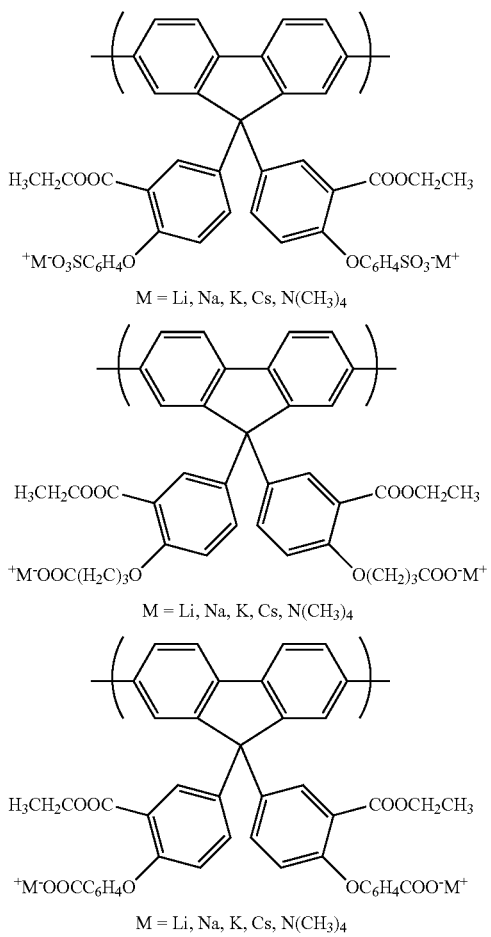

M = Li, Na, K, Cs, N(CH₃)₄

M = Li, Na, K, Cs, N(CH₃)₄

M = Li, Na, K, Cs, N(CH₃)₄

The structural unit represented by Formula (13) is preferably a structural unit represented by Formula (25) from the viewpoint of the durability of the obtained ionic polymer.

[Chemical Formula 25]

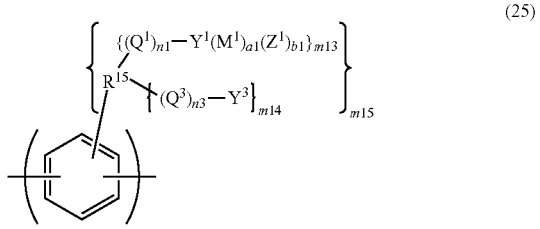

(25)

(In Formula (25), $R^{15}$ represents a (1+m13+m14) valent organic group; $Q^1$, $Q^3$, $Y^1$, $M^1$, $Z^1$, $Y^3$, n1, a1, b1, and n3 represent the same as defined above; and m13, m14, and m15 each independently represent an integer of 1 or more. When each of $R^{15}$, m13, m14, $Q^1$, $Q^3$, $Y^1$, $M^1$, $Z^1$, $Y^3$, n1, a1, b1, and n3 is plurally present, a plurality of each $R^{15}$, m13, m14, $Q^1$, $Q^3$, $Y^1$, $M^1$, $Z^1$, $Y^3$, n1, a1, b1, or n3 may be the same as or different from each other).

In Formula (25), examples of the (1+m13+m14) valent organic group represented by $R^{15}$ may include: a group remaining after eliminating (m13+m14) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m13+m14) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m13+m14) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m13+m14) hydrogen atoms from an amino group having a substituent containing a carbon atom; and a group remaining after eliminating (m13+m14) hydrogen atoms from a silyl group having a substituent containing a carbon atom. Among them, preferred are a group remaining after eliminating (m13+m14) hydrogen atoms from an alkyl group, a group remaining after eliminating (m13+m14) hydrogen atoms from an aryl group, and a group remaining after eliminating (m13+m14) hydrogen atoms from an alkoxy group from the viewpoint of easy synthesis of raw material monomers.

The structural unit represented by Formula (25) may be the following structural units.

[Chemical Formula 26]

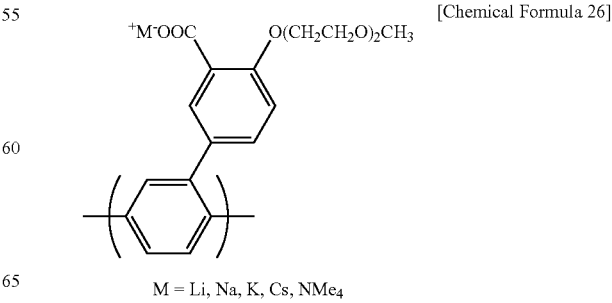

M = Li, Na, K, Cs, NMe₄

-continued
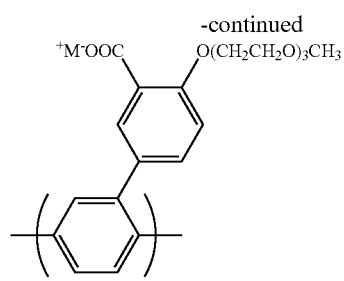
M = Li, Na, K, Cs, NMe$_4$
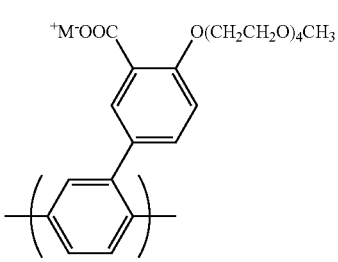
M = Li, Na, K, Cs, NMe$_4$
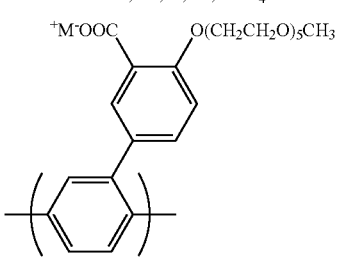
M = Li, Na, K, Cs, NMe$_4$
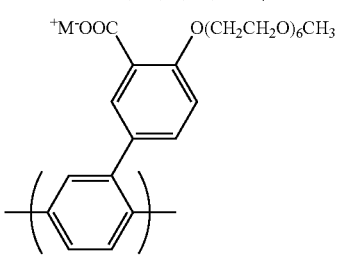
M = Li, Na, K, Cs, NMe$_4$
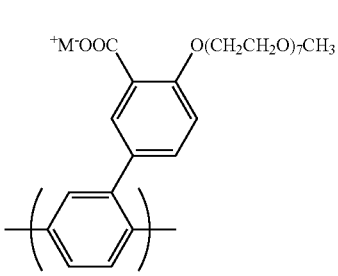
M = Li, Na, K, Cs, NMe$_4$
-continued
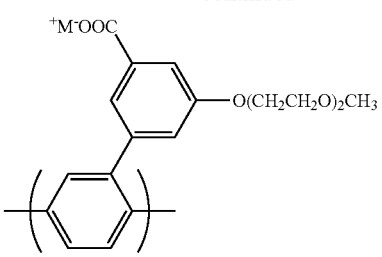
M = Li, Na, K, Cs, NMe$_4$
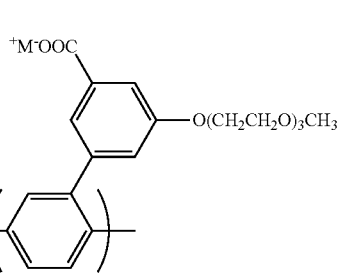
M = Li, Na, K, Cs, NMe$_4$
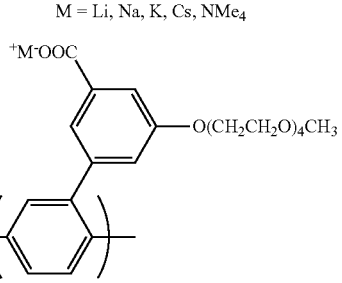
M = Li, Na, K, Cs, NMe$_4$
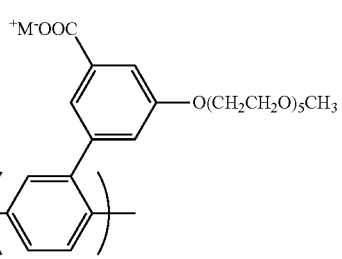
M = Li, Na, K, Cs, NMe$_4$
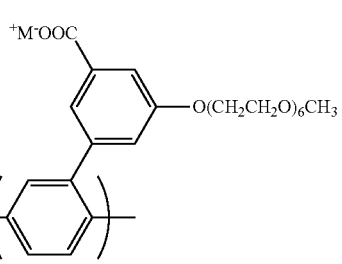
M = Li, Na, K, Cs, NMe$_4$ -continued

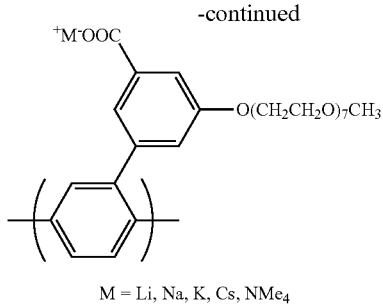

M = Li, Na, K, Cs, NMe₄

Examples of Structural Unit Represented by Formula (15)

The structural unit represented by Formula (15) is preferably a structural unit represented by Formula (26) and a structural unit represented by Formula (27) and more preferably a structural unit represented by Formula (27) from the viewpoint of the electron transport characteristic of the obtained ionic polymer.

[Chemical Formula 27]

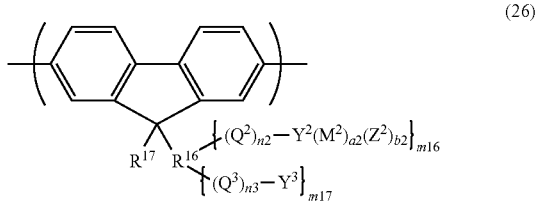

(26)

(In Formula (26), $R^{16}$ represents a (1+m16+m17) valent organic group; $R^{17}$ represents a monovalent organic group; $Q^2$, $Q^3$, $Y^2$, $M^2$, $Z^2$, $Y^3$, n2, a2, b2, and n3 represent the same meanings as described above; and m16 and m17 each independently represent an integer of 1 or more. When each of $Q^2$, $Q^3$, $Y^2$, $M^2$, $Z^2$, $Y^3$, n2, a2, b2, and n3 is plurally present, a plurality of each $Q^2$, $Q^3$, $Y^2$, $M^2$, $Z^2$, $Y^3$, n2, a2, b2, or n3 may be the same as or different from each other).

In Formula (26), examples of the (1+m16+m17) valent organic group represented by $R^{16}$ may include: a group remaining after eliminating (m16+m17) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m16+m17) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m16+m17) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m16+m17) hydrogen atoms from an amino group having a substituent containing a carbon atom; and a group remaining after eliminating (m16+m17) hydrogen atoms from a silyl group having a substituent containing a carbon atom. Among them, preferred are a group remaining after eliminating (m16+m17) hydrogen atoms from an alkyl group, a group remaining after eliminating (m16+m17) hydrogen atoms from an aryl group, and a group remaining after eliminating (m16+m17) hydrogen atoms from an alkoxy group from the viewpoint of easy synthesis of raw material monomers.

In Formula (26), the monovalent organic group represented by $R^a$ may include: a group remaining after eliminating one hydrogen atom from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating one hydrogen atom from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating one hydrogen atom from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating one hydrogen atom from an amino group having a substituent containing a carbon atom; and a group remaining after eliminating one hydrogen atom from a silyl group having a substituent containing a carbon atom. Among them, preferred are a group remaining after eliminating one hydrogen atom from an alkyl group, a group remaining after eliminating one hydrogen atom from an aryl group, and a group remaining after eliminating one hydrogen atom from an alkoxy group from the viewpoint of easy synthesis of raw material monomers.

The structural unit represented by Formula (26) may be the following structural units.

[Chemical Formula 28]

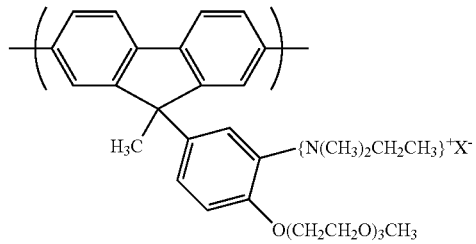

X = F, Cl. Br, I, BPh₄, CF₃SO₃, CH₃COO

59
-continued

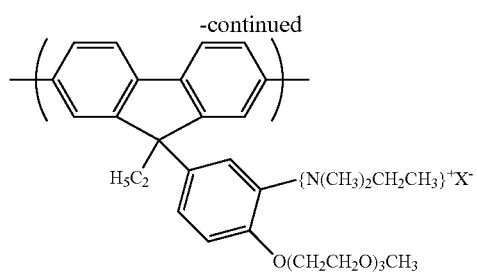

X = F, Cl, Br, I, BPh$_4$, CF$_3$SO$_3$, CH$_3$COO

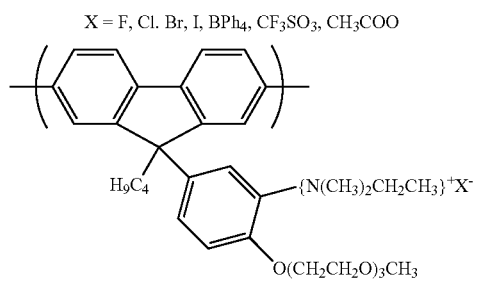

X = F, Cl, Br, I, BPh$_4$, CF$_3$SO$_3$, CH$_3$COO

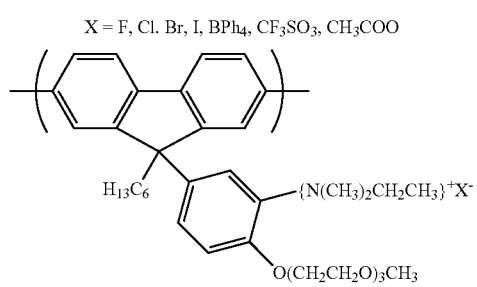

X = F, Cl, Br, I, BPh$_4$, CF$_3$SO$_3$, CH$_3$COO

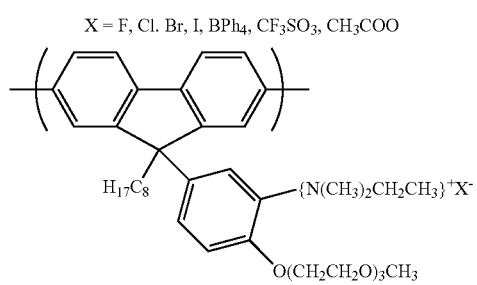

X = F, Cl, Br, I, BPh$_4$, CF$_3$SO$_3$, CH$_3$COO

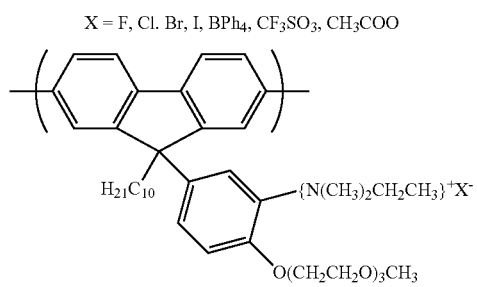

X = F, Cl, Br, I, BPh$_4$, CF$_3$SO$_3$, CH$_3$COO

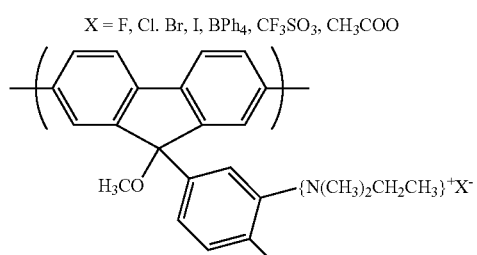

X = F, Cl, Br, I, BPh$_4$, CF$_3$SO$_3$, CH$_3$COO

60
-continued

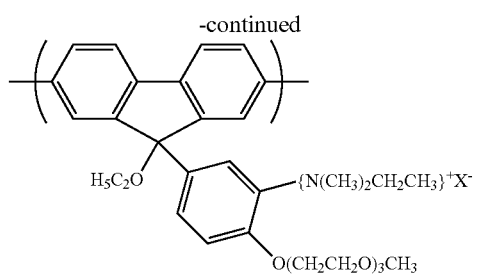

X = F, Cl, Br, I, BPh$_4$, CF$_3$SO$_3$, CH$_3$COO

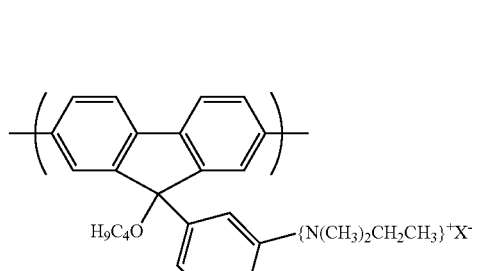

X = F, Cl, Br, I, BPh$_4$, CF$_3$SO$_3$, CH$_3$COO

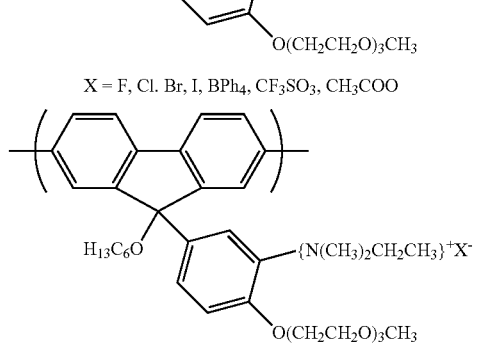

X = F, Cl, Br, I, BPh$_4$, CF$_3$SO$_3$, CH$_3$COO

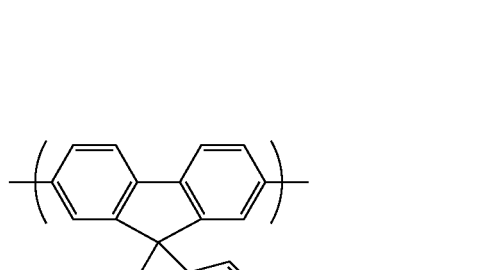

X = F, Cl, Br, I, BPh$_4$, CF$_3$SO$_3$, CH$_3$COO

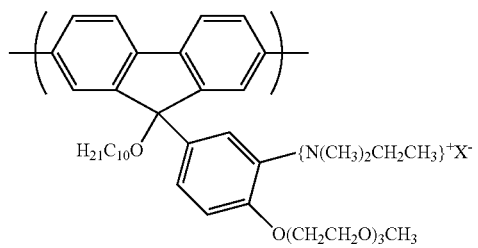

X = F, Cl, Br, I, BPh$_4$, CF$_3$SO$_3$, CH$_3$COO

[Chemical Formula 29]

(27)

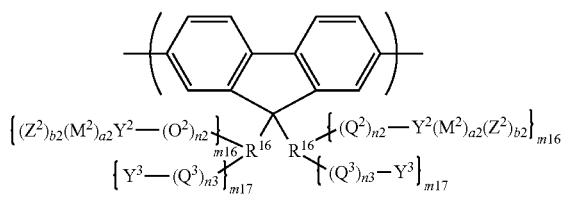

(In Formula (27), $R^{16}$ represents a (1+m16+m17) valent organic group; $Q^2$, $Q^3$, $Y^2$, $M^2$, $Z^2$, $Y^3$, n2, a2, b2, and n3 represent the same meanings as described above; and m16 and m17 each independently represent an integer of 1 or more. When each of $R^{16}$, m16, m17, $Q^2$, $Q^3$, $Y^2$, $M^2$, $Z^2$, $Y^3$, n2, a2, b2, and n3 is plurally present, a plurality of each $R^{16}$, m16, m17, $Q^2$, $Q^3$, $Y^2$, $M^2$, $Z^2$, $Y^3$, n2, a2, b2, or n3 may be the same as or different from each other).

In Formula (27), examples of the (1+m16+m17) valent organic group represented by $R^{16}$ may include: a group remaining after eliminating (m16+m17) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m16+m17) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m16+m17) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m16+m17) hydrogen atoms from an amino group having a substituent containing a carbon atom; and a group remaining after eliminating (m16+m17) hydrogen atoms from a silyl group having a substituent containing a carbon atom. Among them, preferred are a group remaining after eliminating (m16+m17) hydrogen atoms from an alkyl group, a group remaining after eliminating (m16+m17) hydrogen atoms from an aryl group, and a group remaining after eliminating (m16+m17) hydrogen atoms from an alkoxy group from the viewpoint of easy synthesis of raw material monomers.

The structural unit represented by Formula (27) may be the following structural units.

[Chemical Formula 30]

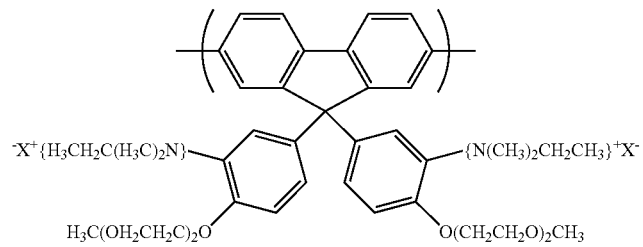

X = F, Cl, Br, I, BPh$_4$, CF$_3$SO$_3$

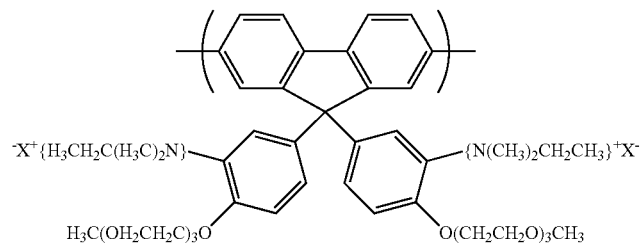

X = F, Cl, Br, I, BPh$_4$, CF$_3$SO$_3$

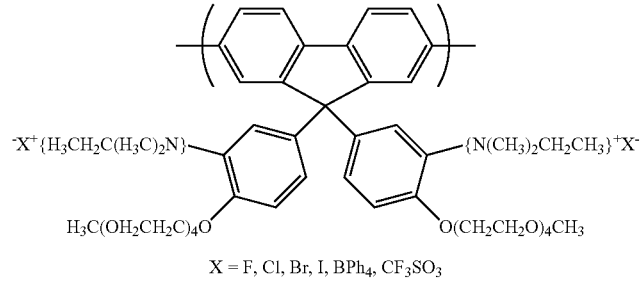

X = F, Cl, Br, I, BPh$_4$, CF$_3$SO$_3$

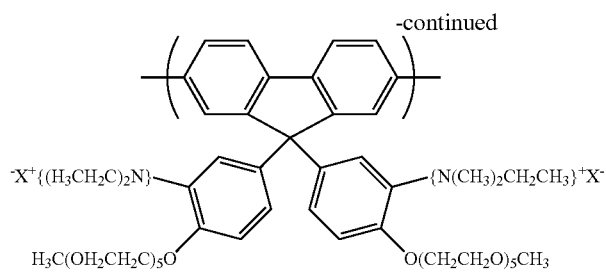
X = F, Cl, Br, I, BPh4, CF3SO3
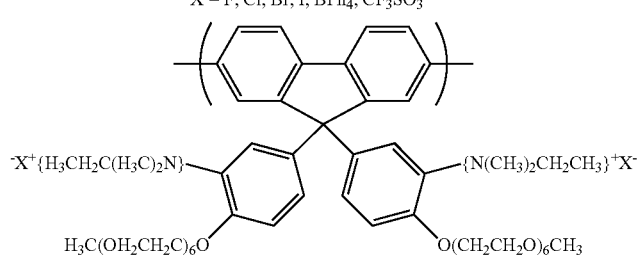
X = F, Cl, Br, I, BPh4, CF3SO3
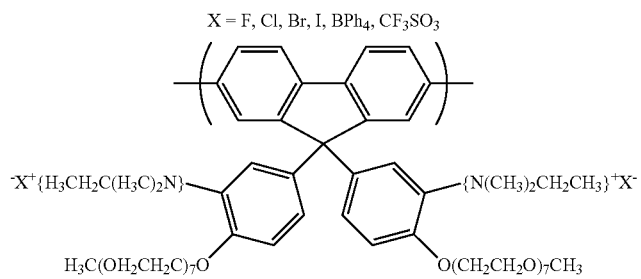
X = F, Cl, Br, I, BPh4, CF3SO3
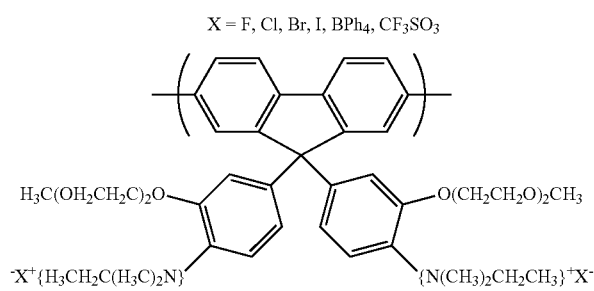
X = F, Cl, Br, I, BPh4, CF3SO3
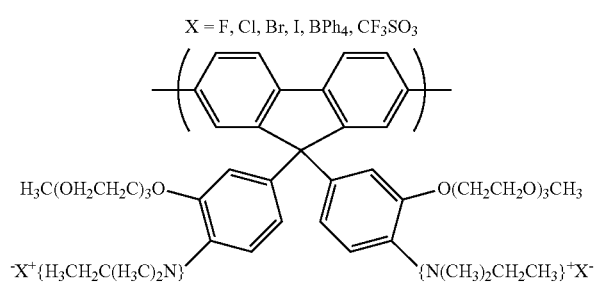
X = F, Cl, Br, I, BPh4, CF3SO3
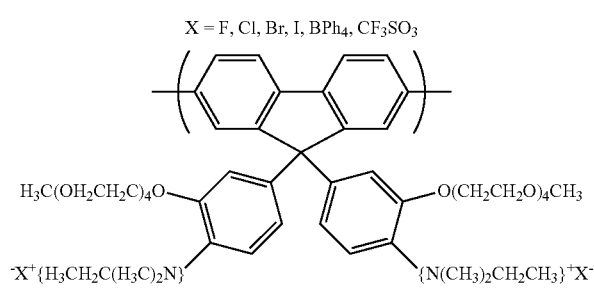
X = F, Cl, Br, I, BPh4, CF3SO3

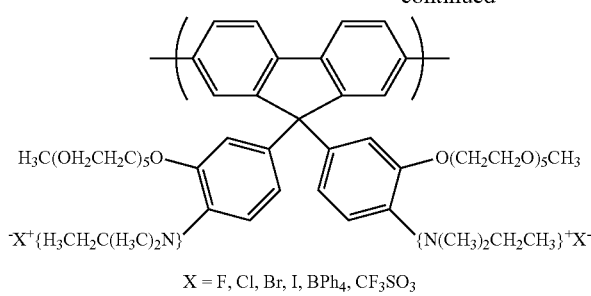
X = F, Cl, Br, I, BPh$_4$, CF$_3$SO$_3$
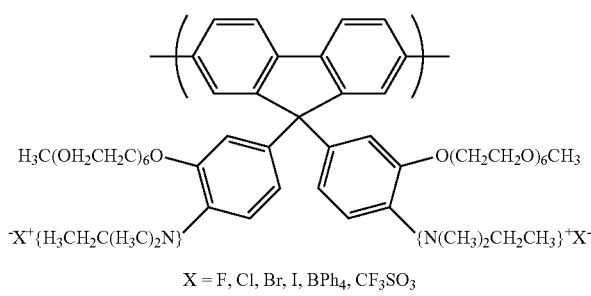
X = F, Cl, Br, I, BPh$_4$, CF$_3$SO$_3$
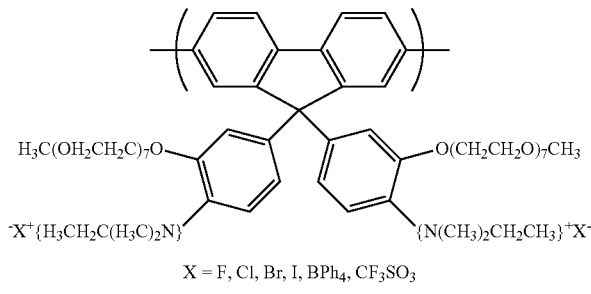
X = F, Cl, Br, I, BPh$_4$, CF$_3$SO$_3$
[Chemical Formula 31]
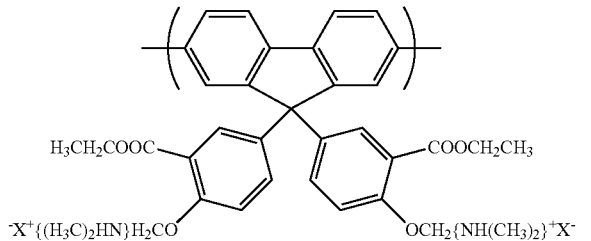
X = F, Cl, Br, I, BPh$_4$, CF$_3$SO$_3$, CH$_3$COO
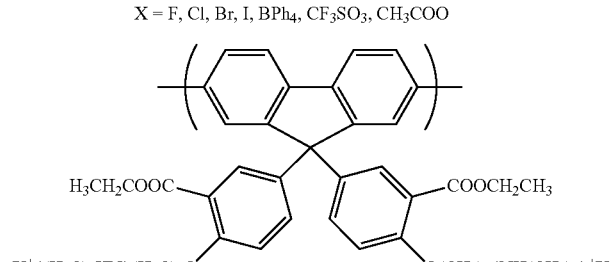
X = F, Cl, Br, I, BPh$_4$, CF$_3$SO$_3$, CH$_3$COO -continued
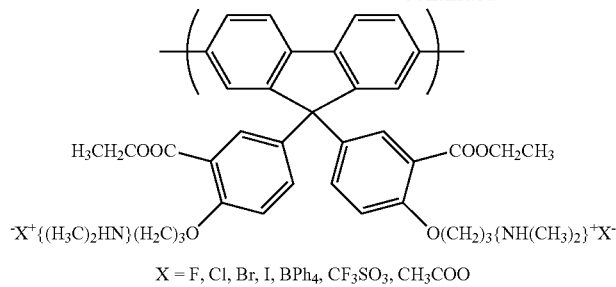
X = F, Cl, Br, I, BPh₄, CF₃SO₃, CH₃COO
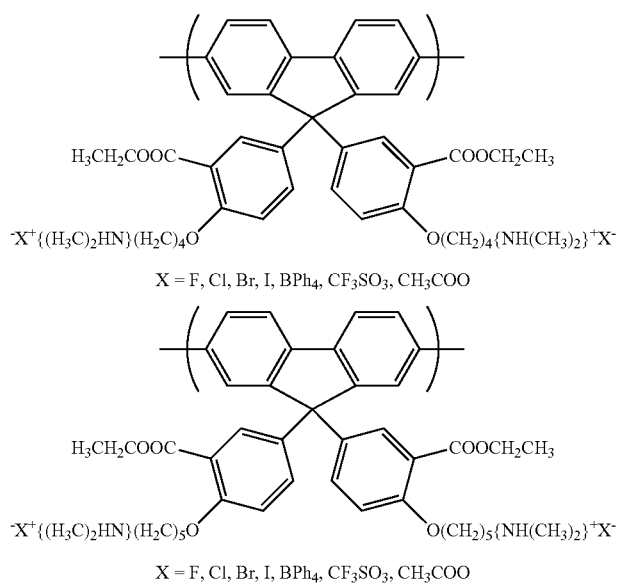
X = F, Cl, Br, I, BPh₄, CF₃SO₃, CH₃COO
X = F, Cl, Br, I, BPh₄, CF₃SO₃, CH₃COO
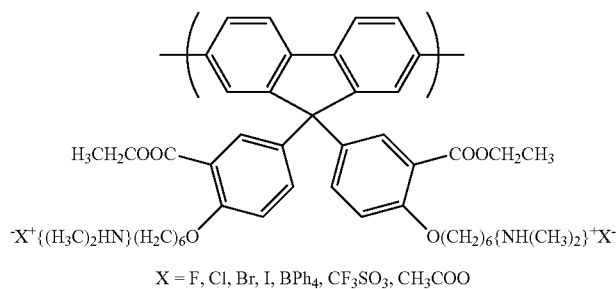
X = F, Cl, Br, I, BPh₄, CF₃SO₃, CH₃COO
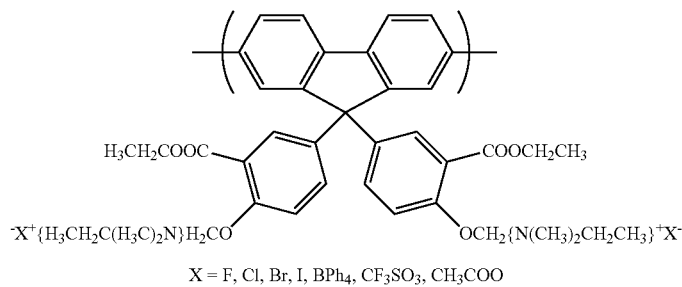
X = F, Cl, Br, I, BPh₄, CF₃SO₃, CH₃COO -continued
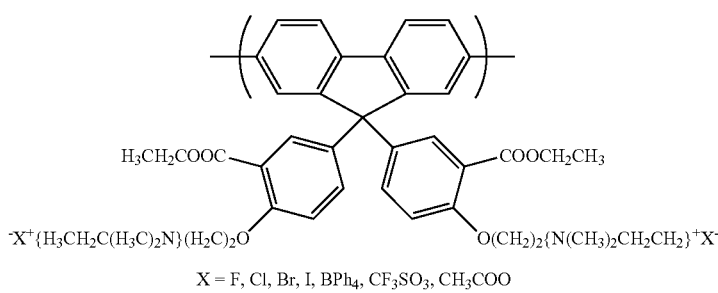
X = F, Cl, Br, I, BPh$_4$, CF$_3$SO$_3$, CH$_3$COO
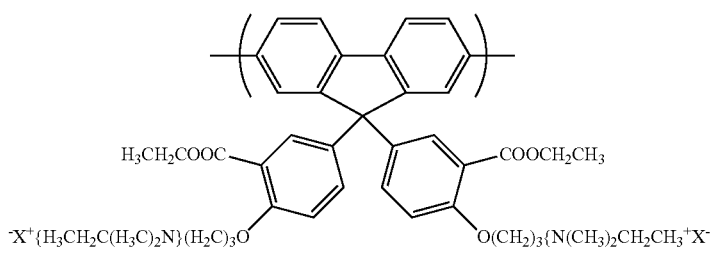
X = F, Cl, Br, I, BPh$_4$, CF$_3$SO$_3$, CH$_3$COO
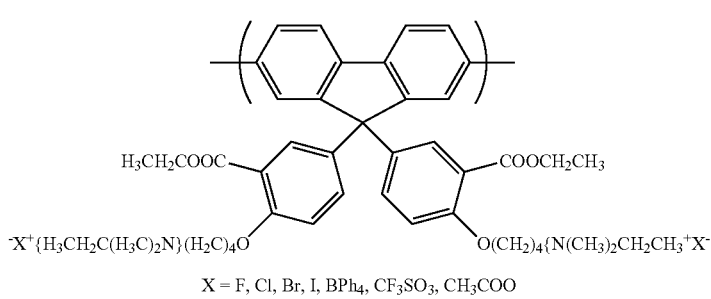
X = F, Cl, Br, I, BPh$_4$, CF$_3$SO$_3$, CH$_3$COO
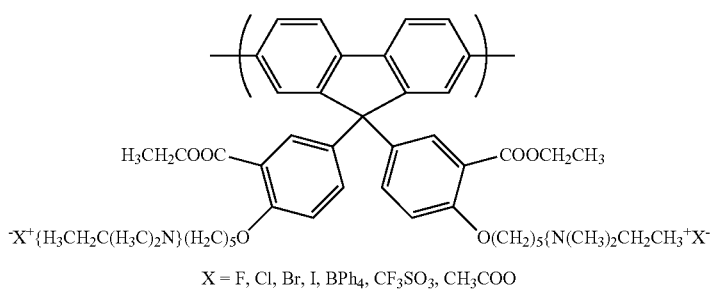
X = F, Cl, Br, I, BPh$_4$, CF$_3$SO$_3$, CH$_3$COO
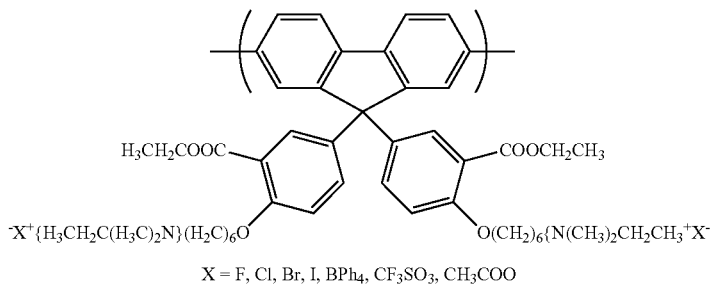
X = F, Cl, Br, I, BPh$_4$, CF$_3$SO$_3$, CH$_3$COO -continued
[Chemical Formula 32]
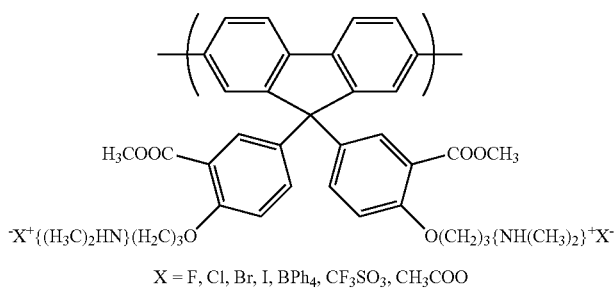
X = F, Cl, Br, I, BPh₄, CF₃SO₃, CH₃COO
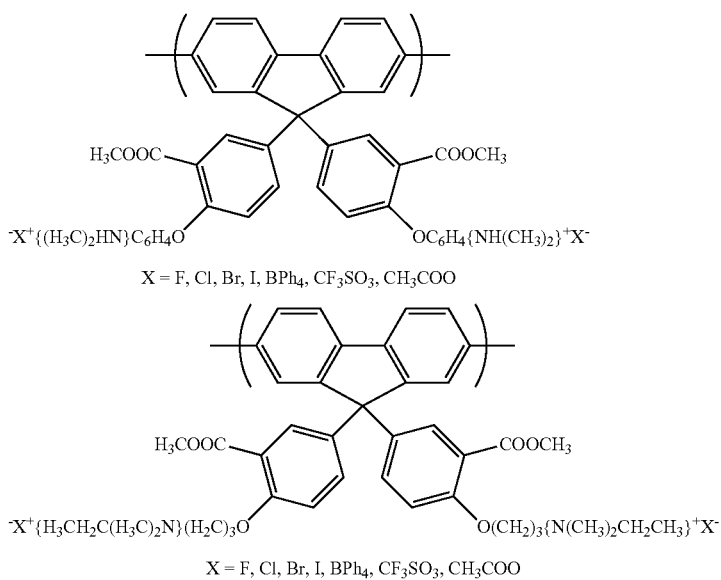
X = F, Cl, Br, I, BPh₄, CF₃SO₃, CH₃COO
X = F, Cl, Br, I, BPh₄, CF₃SO₃, CH₃COO
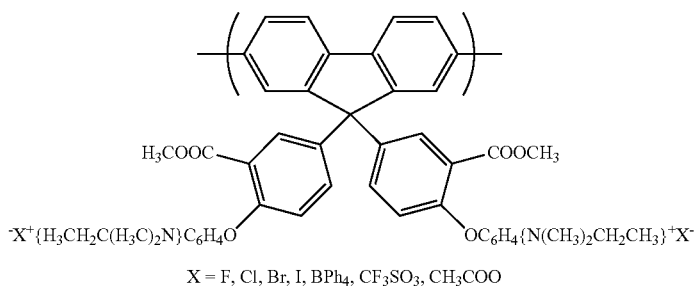
X = F, Cl, Br, I, BPh₄, CF₃SO₃, CH₃COO
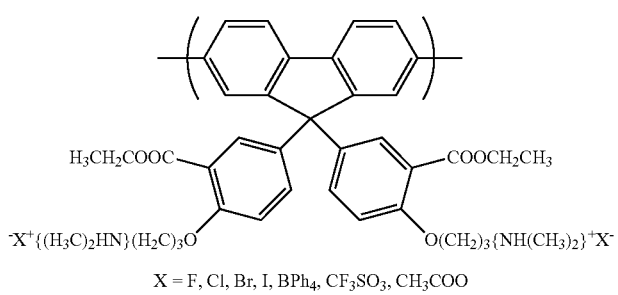
X = F, Cl, Br, I, BPh₄, CF₃SO₃, CH₃COO -continued

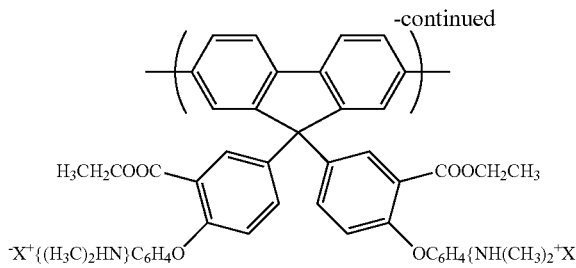

X = F, Cl, Br, I, BPh$_4$, CF$_3$SO$_3$, CH$_3$COO

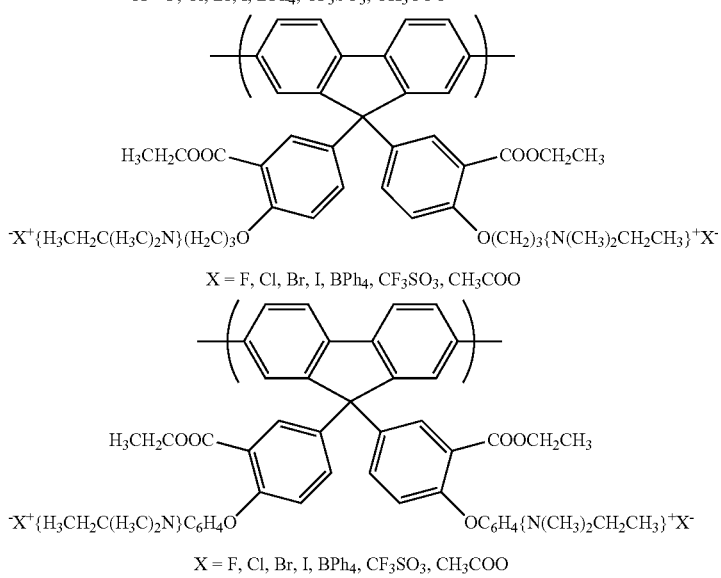

X = F, Cl, Br, I, BPh$_4$, CF$_3$SO$_3$, CH$_3$COO

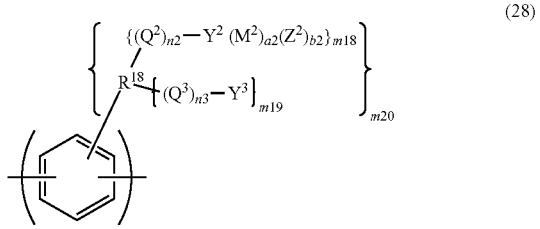

X = F, Cl, Br, I, BPh$_4$, CF$_3$SO$_3$, CH$_3$COO

The structural unit represented by Formula (15) is preferably a structural unit represented by Formula (28) from the viewpoint of the durability of the obtained ionic polymer.

[Chemical Formula 33]

$$\left\{ \begin{array}{c} \{(Q^2)_{n2}-Y^2\,(M^2)_{a2}(Z^2)_{b2}\}_{m18} \\ R^{18} \\ \{(Q^3)_{n3}-Y^3\}_{m19} \end{array} \right\}_{m20} \quad (28)$$

(In Formula (28), $R^{18}$ represents a (1+m18+m19) valent organic group; $Q^2$, $Q^3$, $Y^2$, $M^2$, $Z^2$, $Y^3$, n2, a2, b2, and n3 represent the same meanings as described above; and m18, m19, and m20 each independently represent an integer of 1 or more. When each of $R^{18}$, m18, m19, $Q^2$, $Q^3$, $Y^2$, $M^2$, $Z^2$, $Y^3$, n2, a2, b2, and n3 is plurally present, a plurality of each $R^{18}$, m18, m19, $Q^2$, $Q^3$, $Y^2$, $M^2$, $Z^2$, $Y^3$, n2, a2, b2, or n3 may be the same as or different from each other).

In Formula (28), examples of the (1+m18+m19) valent organic group represented by $R^{18}$ may include: a group remaining after eliminating (m18+m19) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m18+m19) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m18+m19) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m18+m19) hydrogen atoms from an amino group having a substituent containing a carbon atom; and a group remaining after eliminating (m18+m19) hydrogen atoms from a silyl group having a substituent containing a carbon atom. Among them, preferred are a group remaining after eliminating (m18+m19) hydrogen atoms from an alkyl group, a group remaining after eliminating (m18+m19) hydrogen atoms from an aryl group, and a group remaining after eliminating (m18+ m19) hydrogen atoms from an alkoxy group from the viewpoint of easy synthesis of raw material monomers.

The structural unit represented by Formula (28) may be the following structural units.

[Chemical Formula 34]

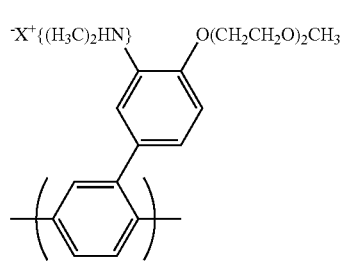

X = F, Cl, Br, I, BPh₄, CF₃SO₃, CH₃COO

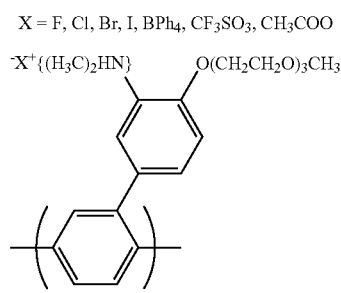

X = F, Cl, Br, I, BPh₄, CF₃SO₃, CH₃COO

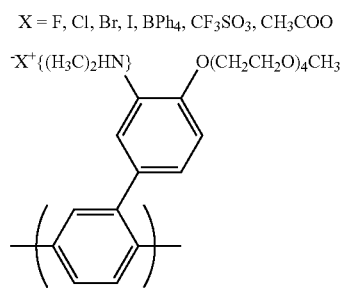

X = F, Cl, Br, I, BPh₄, CF₃SO₃, CH₃COO

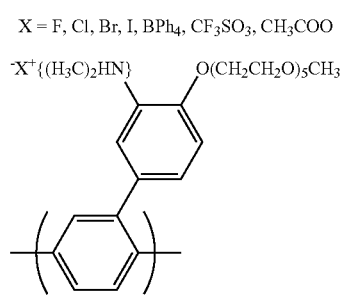

X = F, Cl, Br, I, BPh₄, CF₃SO₃, CH₃COO

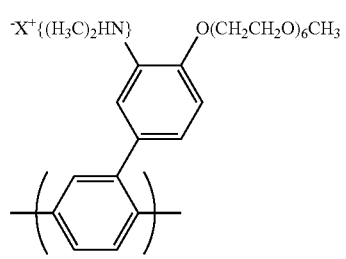

X = F, Cl, Br, I, BPh₄, CF₃SO₃, CH₃COO

-continued

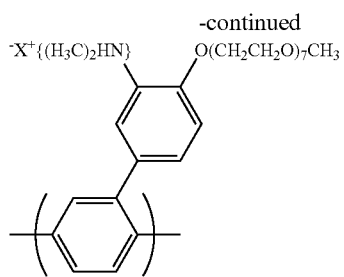

X = F, Cl, Br, I, BPh₄, CF₃SO₃, CH₃COO

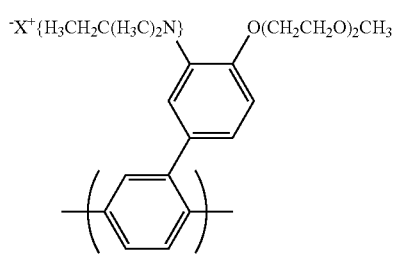

X = F, Cl, Br, I, BPh₄, CF₃SO₃, CH₃COO

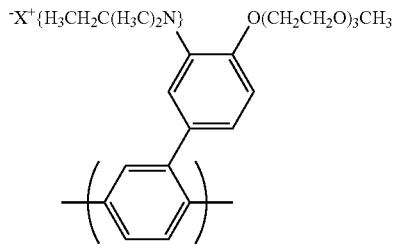

X = F, Cl, Br, I, BPh₄, CF₃SO₃, CH₃COO

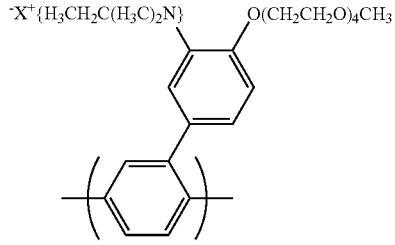

X = F, Cl, Br, I, BPh₄, CF₃SO₃, CH₃COO

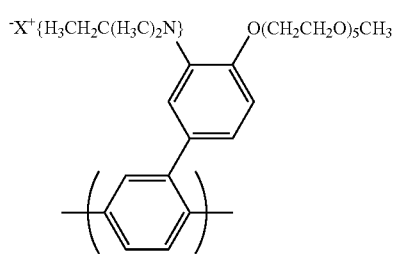

X = F, Cl, Br, I, BPh₄, CF₃SO₃, CH₃COO

-continued
77
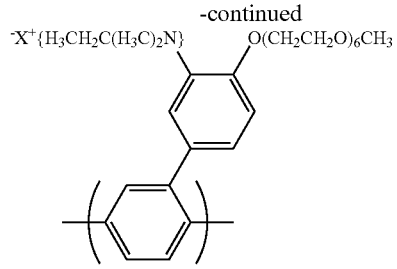
X = F, Cl, Br, I, BPh₄, CF₃SO₃, CH₃COO
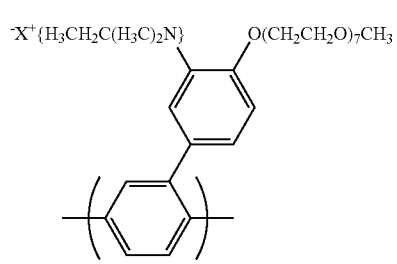
X = F, Cl, Br, I, BPh₄, CF₃SO₃, CH₃COO
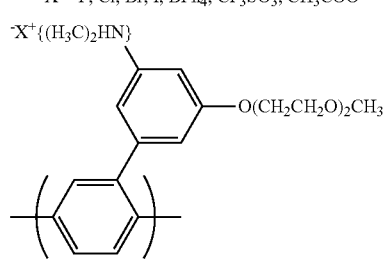
X = F, Cl, Br, I, BPh₄, CF₃SO₃, CH₃COO
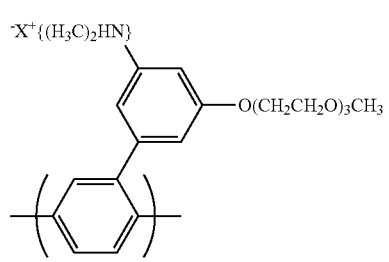
X = F, Cl, Br, I, BPh₄, CF₃SO₃, CH₃COO
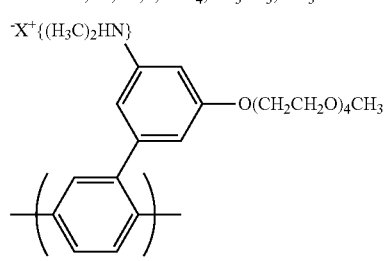
X = F, Cl, Br, I, BPh₄, CF₃SO₃, CH₃COO
-continued
78
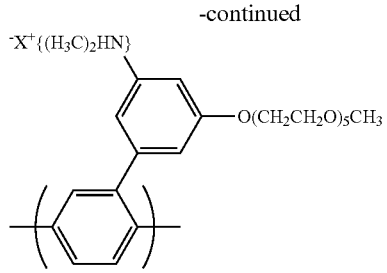
X = F, Cl, Br, I, BPh₄, CF₃SO₃, CH₃COO
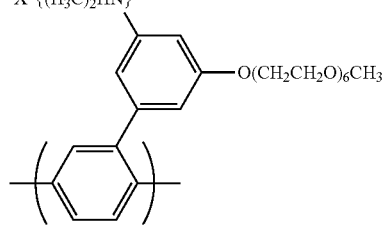
X = F, Cl, Br, I, BPh₄, CF₃SO₃, CH₃COO
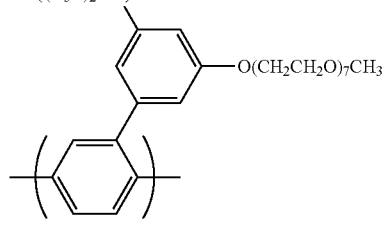
X = F, Cl, Br, I, BPh₄, CF₃SO₃, CH₃COO
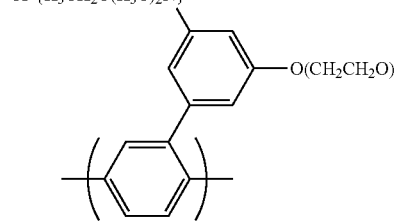
X = F, Cl, Br, I, BPh₄, CF₃SO₃, CH₃COO
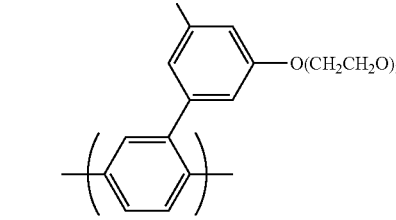
X = F, Cl, Br, I, BPh₄, CF₃SO₃, CH₃COO -continued

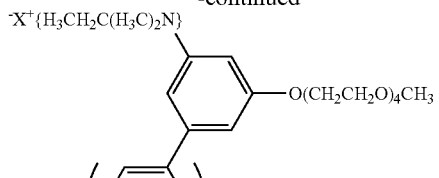

X = F, Cl, Br, I, BPh4, CF3SO3, CH3COO

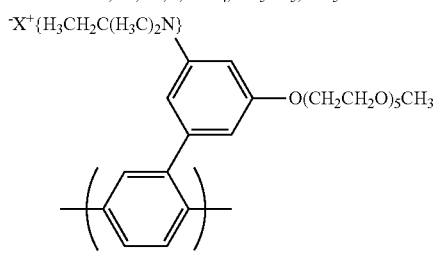

X = F, Cl, Br, I, BPh4, CF3SO3, CH3COO

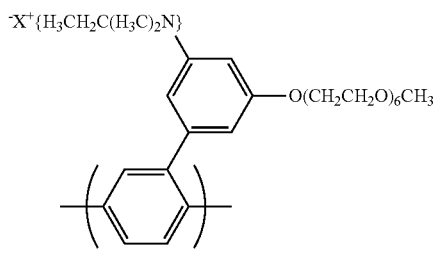

X = F, Cl, Br, I, BPh4, CF3SO3, CH3COO

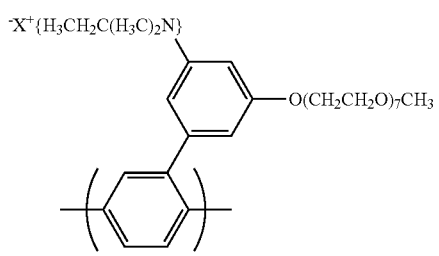

X = F, Cl, Br, I, BPh4, CF3SO3, CH3COO

Examples of Structural Unit Represented by Formula (17)

Examples of the structural unit represented by Formula (17) include preferably a structural unit represented by Formula (29) from the viewpoint of the electron transport characteristic of the obtained ionic polymer.

[Chemical Formula 35]

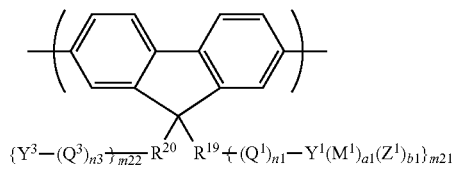

(29)

(In Formula (29), $R^{19}$ represents a single bond or a (1+m21) valent organic group; $R^{20}$ represents a single bond or a (1+m22) valent organic group; $Q^1$, $Q^3$, $Y^1$, $M^1$, $Z^1$, $Y^3$, n1, a1, b1, and n3 represent the same meanings as described above. m21 and m22 each independently represent an integer of 1 or more, provided that when $R^{19}$ is a single bond, m21 represents 1 and when $R^{20}$ is a single bond, m 22 represents 1. When each of $Q^1$, $Q^3$, $Y^1$, $M^1$, $Z^1$, $Y^3$, n1, a1, b1, and n3 is plurally present, a plurality of each $Q^1$, $Q^3$, $Y^1$, $M^1$, $Z^1$, $Y^3$, n1, a1, b1, or n3 may be the same as or different from each other).

In Formula (29), examples of the (1+m21) valent organic group represented by $R^{19}$ may include: a group remaining after eliminating (m21) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m21) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m21) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m21) hydrogen atoms from an amino group having a substituent containing a carbon atom; and a group remaining after eliminating (m21) hydrogen atoms from a silyl group having a substituent containing a carbon atom. Among them, preferred are a group remaining after eliminating (m21) hydrogen atoms from an alkyl group, a group remaining after eliminating (m21) hydrogen atoms from an aryl group, and a group remaining after eliminating (m21) hydrogen atoms from an alkoxy group from the viewpoint of easy synthesis of raw material monomers.

In Formula (29), examples of the (1+m22) valent organic group represented by $R^{20}$ may include: a group remaining after eliminating (m22) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m22) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m22) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m22) hydrogen atoms from an amino group having a substituent containing a carbon atom; and a group remaining after eliminating (m22) hydrogen atoms from a silyl group having a substituent containing a carbon atom. Among them, preferred are a group remaining after eliminating (m22) hydrogen atoms from an alkyl group, a group remaining after eliminating (m22) hydrogen atoms from an aryl group, and a group remaining after eliminating (m22) hydrogen atoms from an alkoxy group from the viewpoint of easy synthesis of raw material monomers.

The structural unit represented by Formula (29) may be the following structural units.

[Chemical Formula 36]

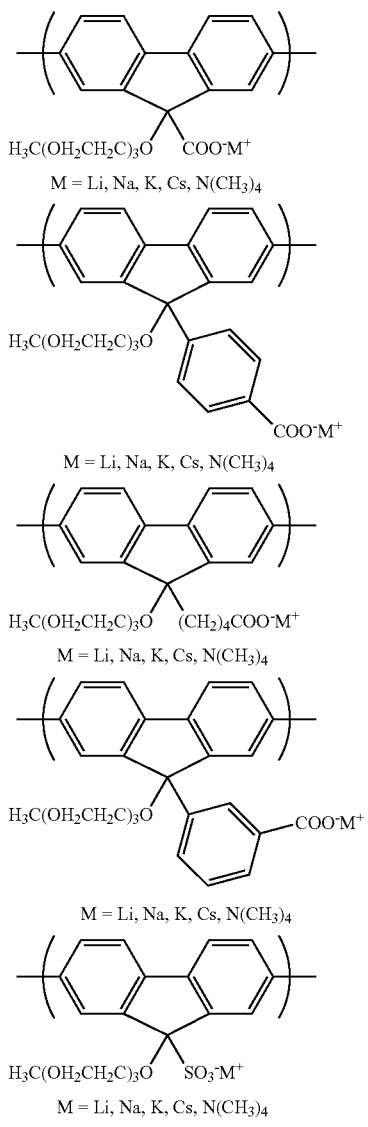

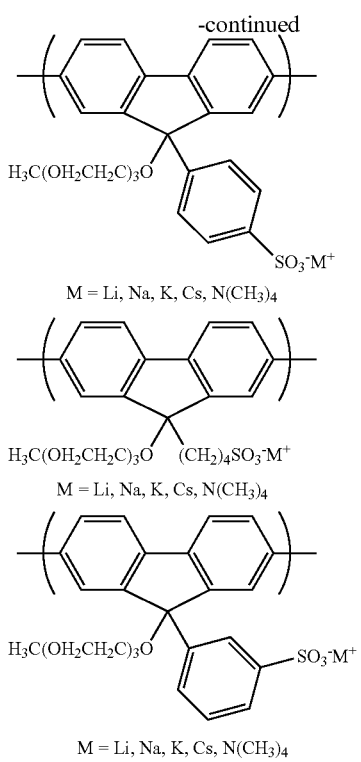

The structural unit represented by Formula (17) is preferably a structural unit represented by Formula (30) from the viewpoint of the durability of the obtained ionic polymer.

[Chemical Formula 37]

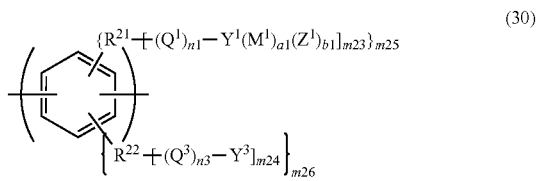

(30)

(In Formula (30), $R^{21}$ represents a single bond or a (1+m23) valent organic group; $R^{22}$ represents a single bond or a (1+m24) valent organic group; $Q^1$, $Q^3$, $Y^1$, $M^1$, $Z^1$, $Y^3$, n1, a1, b1, and n3 represent the same meanings as described above; m23 and m24 each independently represent an integer of 1 or more, provided that when $R^{21}$ is a single bond, m23 represents 1 and when $R^{22}$ is a single bond, m24 represents 1; and m25 and m26 each independently represent an integer of 1 or more. When each of m23, m24, $R^{21}$, $R^{22}$, $Q^1$, $Q^3$, $Y^1$, $M^1$, $Z^1$, $Y^3$, n1, a1, b1, and n3 is plurally present, a plurality of each m23, m24, $R^{21}$, $R^{22}$, $Q^1$, $Q^3$, $Y^1$, $M^1$, $Z^1$, $Y^3$, n1, a1, b1, or n3 may be the same as or different from each other).

In Formula (30), examples of the (1+m23) valent organic group represented by $R^{21}$ may include: a group remaining after eliminating (m23) hydrogen atoms from an alkyl group having 1 to 20 carbon atoms that may have a substituent such as a methyl group, an ethyl group, a propyl group, an isopropyl group, a butyl group, an isobutyl group; a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m23) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m23) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m23) hydrogen atoms from an amino group having a substituent containing a carbon atom; and a group remaining after eliminating (m23) hydrogen atoms from a silyl group having a substituent containing a carbon atom. Among them, preferred are a group remaining after eliminating (m23) hydrogen atoms from an alkyl group, a group remaining after eliminating (m23) hydrogen atoms from an aryl group, and a group remaining after eliminating (m23) hydrogen atoms from an alkoxy group from the viewpoint of easy synthesis of raw material monomers.

In Formula (30), examples of the (1+m24) valent organic group represented by $R^{22}$ may include: a group remaining after eliminating (m24) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m24) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m24) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m24) hydrogen atoms from an amino group having a substituent containing a carbon atom; and a group remaining after eliminating (m24) hydrogen atoms from a silyl group having a substituent containing a carbon atom. Among them, preferred are a group remaining after eliminating (m24) hydrogen atoms from an alkyl group, a group remaining after eliminating (m24) hydrogen atoms from an aryl group, and a group remaining after eliminating (m24) hydrogen atoms from an alkoxy group from the viewpoint of easy synthesis of raw material monomers.

The structural unit represented by Formula (30) may be the following structural units.

[Chemical Formula 38]

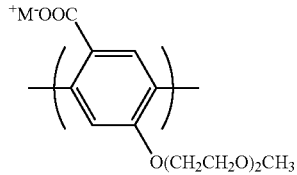

M = Li, Na, K, Cs, NMe$_4$

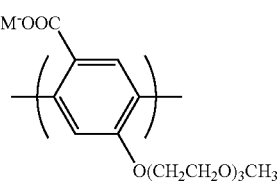

M = Li, Na, K, Cs, NMe$_4$

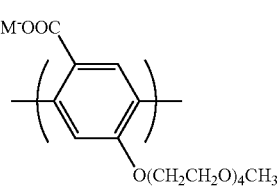

M = Li, Na, K, Cs, NMe$_4$

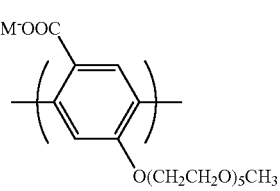

M = Li, Na, K, Cs, NMe$_4$

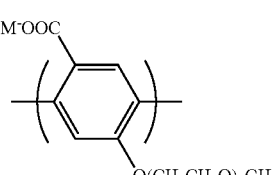

M = Li, Na, K, Cs, NMe$_4$

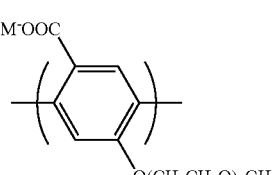

M = Li, Na, K, Cs, NMe$_4$

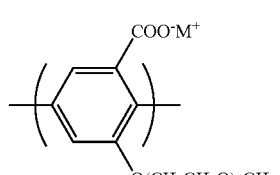

M = Li, Na, K, Cs, NMe$_4$

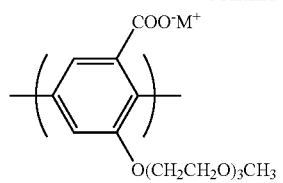
M = Li, Na, K, Cs, NMe₄
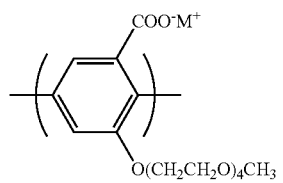
M = Li, Na, K, Cs, NMe₄
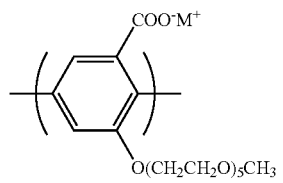
M = Li, Na, K, Cs, NMe₄
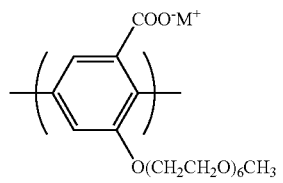
M = Li, Na, K, Cs, NMe₄
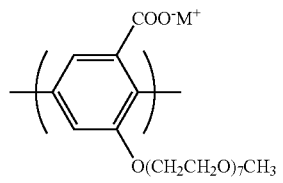
M = Li, Na, K, Cs, NMe₄
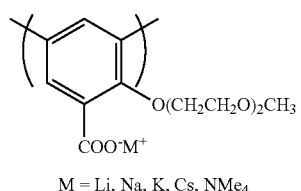
M = Li, Na, K, Cs, NMe₄
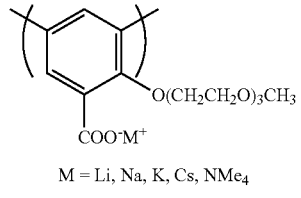
M = Li, Na, K, Cs, NMe₄
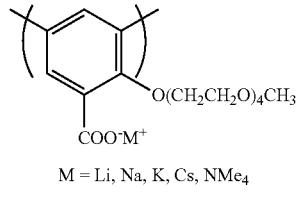
M = Li, Na, K, Cs, NMe₄
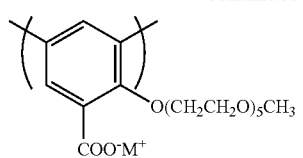
M = Li, Na, K, Cs, NMe₄
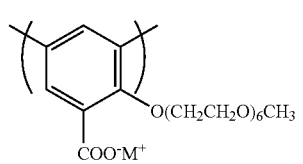
M = Li, Na, K, Cs, NMe₄
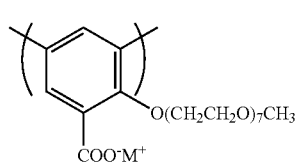
M = Li, Na, K, Cs, NMe₄
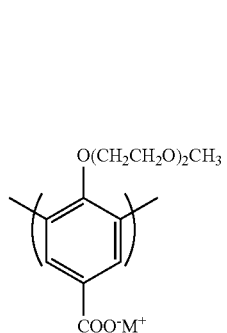
M = Li, Na, K, Cs, NMe₄
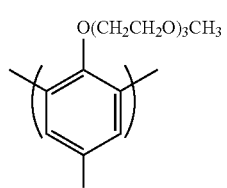
M = Li, Na, K, Cs, NMe₄
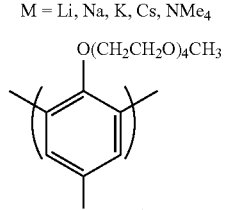
M = Li, Na, K, Cs, NMe₄
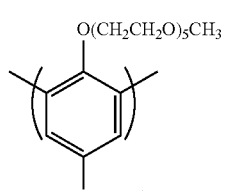
M = Li, Na, K, Cs, NMe₄

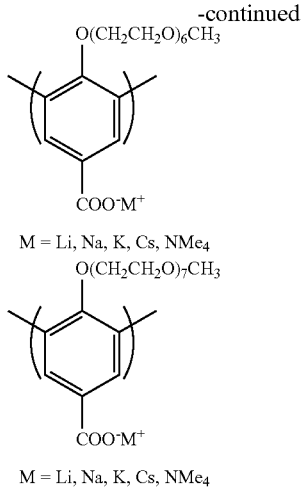

M = Li, Na, K, Cs, NMe₄

M = Li, Na, K, Cs, NMe₄

Examples of Structural Unit Represented by Formula (20)

The structural unit represented by Formula (20) is preferably a structural unit represented by Formula (31) from the viewpoint of the obtained electron transport characteristic.

[Chemical Formula 39]

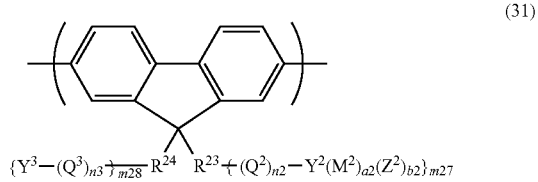

(31)

(In Formula (31), $R^{23}$ represents a single bond or a (1+m27) valent organic group; $R^{24}$ represents a single bond or a (1+m28) valent organic group; $Q^2$, $Q^3$, $Y^2$, $M^2$, $Z^2$, $Y^3$, n2, a2, b2, and n3 represent the same meanings as described above; m27 and m28 each independently represent an integer of 1 or more, provided that when $R^{23}$ is a single bond, m27 represents 1 and when $R^{24}$ is a single bond, m28 represents 1. When each of $Q^2$, $Q^3$, $Y^2$, $M^2$, $Z^2$, $Y^3$, n2, a2, b2, and n3 is plurally present, a plurality of each $Q^2$, $Q^3$, $Y^2$, $M^2$, $Z^2$, $Y^3$, n2, a2, b2, or n3 may be the same as or different from each other).

In Formula (31), examples of the (1+m27) valent organic group represented by $R^{23}$ may include: a group remaining after eliminating (m27) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m27) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m27) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m27) hydrogen atoms from an amino group having a substituent containing a carbon atom; and a group remaining after eliminating (m27) hydrogen atoms from a silyl group having a substituent containing a carbon atom. Among them, preferred are a group remaining after eliminating (m27) hydrogen atoms from an alkyl group, a group remaining after eliminating (m27) hydrogen atoms from an aryl group, and a group remaining after eliminating (m27) hydrogen atoms from an alkoxy group from the viewpoint of easy synthesis of raw material monomers.

In Formula (31), examples of the (1+m28) valent organic group represented by $R^{24}$ may include: a group remaining after eliminating (m28) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m28) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m28) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m28) hydrogen atoms from an amino group having a substituent containing a carbon atom; and a group remaining after eliminating (m28) hydrogen atoms from a silyl group having a substituent containing a carbon atom. Among them, preferred are a group remaining after eliminating (m28) hydrogen atoms from an alkyl group, a group remaining after eliminating (m28) hydrogen atoms from an aryl group, and a group remaining after eliminating (m28) hydrogen atoms from an alkoxy group from the viewpoint of easy synthesis of raw material monomers.

The structural unit represented by Formula (31) may be the following structural units.

[Chemical Formula 40]

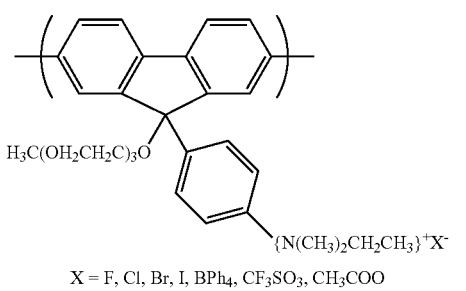

X = F, Cl, Br, I, BPh$_4$, CF$_3$SO$_3$, CH$_3$COO

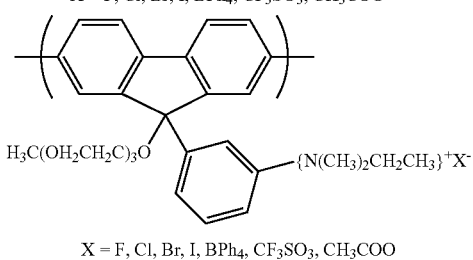

X = F, Cl, Br, I, BPh$_4$, CF$_3$SO$_3$, CH$_3$COO

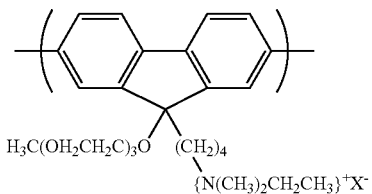

X = F, Cl, Br, I, BPh$_4$, CF$_3$SO$_3$, CH$_3$COO

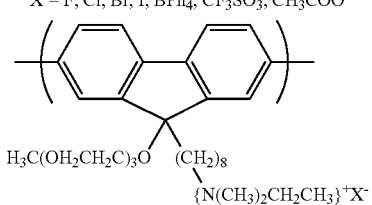

X = F, Cl, Br, I, BPh$_4$, CF$_3$SO$_3$, CH$_3$COO

Examples of the structural unit represented by Formula (20) may be, preferably a structural unit represented by Formula (32) from the viewpoint of the durability of the obtained ionic polymer.

[Chemical Formula 41]

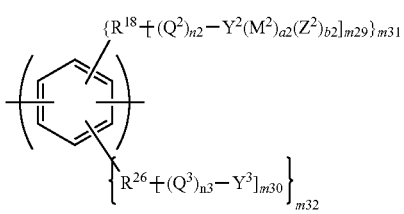

(32)

(In Formula (32), $R^{25}$ represents a single bond or a (1+m29) valent organic group; $R^{26}$ represents a single bond or a (1+m30) valent organic group; $Q^2$, $Q^3$, $Y^2$, $M^2$, $Z^2$, $Y^3$, n2, a2, b2, and n3 represent the same meanings as described above; m29 and m30 each independently represent an integer of 1 or more, provided that when $R^{25}$ is a single bond, m29 represents 1 and when $R^{26}$ is a single bond, m30 represents 1; and m31 and m32 each independently represent an integer of 1 or more. When each of m29, m30, $R^{25}$, $R^{26}$, $Q^2$, $Q^3$, $Y^2$, $M^2$, $Z^2$, $Y^3$, n2, a2, b2, and n3 is plurally present, a plurality of each m29, m30, $R^{25}$, $R^{26}$ $Q^2$, $Q^3$, $Y^2$, $M^2$, $Z^2$, $Y^3$, n2, a2, b2, or n3 may be the same as or different from each other).

In Formula (32), examples of the (1+m29) valent organic group represented by $R^{25}$ may include: a group remaining after eliminating (m29) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m29) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m29) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m29) hydrogen atoms from an amino group having a substituent containing a carbon atom; and a group remaining after eliminating (m29) hydrogen atoms from a silyl group having a substituent containing a carbon atom. Among them, preferred are a group remaining after eliminating (m29) hydrogen atoms from an alkyl group, a group remaining after eliminating (m29) hydrogen atoms from an aryl group, and a group remaining after eliminating (m29) hydrogen atoms from an alkoxy group from the viewpoint of easy synthesis of raw material monomers.

In Formula (32), examples of the (1+m30) valent organic group represented by $R^{26}$ may include: a group remaining after eliminating (m30) hydrogen atoms from an alkyl group having 1 to 20 carbon atoms that may have a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after eliminating (m30) hydrogen atoms from an aryl group having 6 to 30 carbon atoms that may have a substituent such as a phenyl group, a 1-naphthyl group, a 2-naphthyl group, a 1-anthryl group, a 2-anthryl group, a 9-anthryl group, and a group in which at least one hydrogen atom in these groups is substituted with a substituent; a group remaining after eliminating (m30) hydrogen atoms from an alkoxy group having 1 to 50 carbon atoms that may have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after eliminating (m30) hydrogen atoms from an amino group having a substituent containing a carbon atom; and a group remaining after eliminating (m30) hydrogen atoms from a silyl group having a substituent containing a carbon atom. Among them, preferred are a group remaining after eliminating (m30) hydrogen atoms from an alkyl group, a group remaining after eliminating (m30) hydrogen atoms from an aryl group, and a group remaining after eliminating (m30) hydrogen atoms from an alkoxy group from the viewpoint of easy synthesis of raw material monomers.

Examples of the structural unit represented by Formula (32) may include the following structural units.

[Chemical Formula 42]

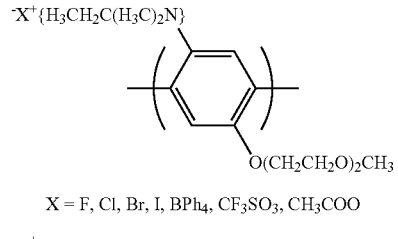

X = F, Cl, Br, I, BPh$_4$, CF$_3$SO$_3$, CH$_3$COO

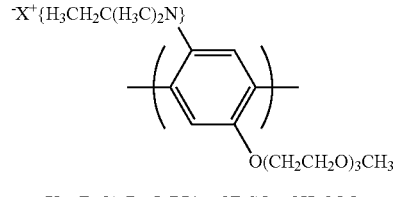

X = F, Cl, Br, I, BPh$_4$, CF$_3$SO$_3$, CH$_3$COO

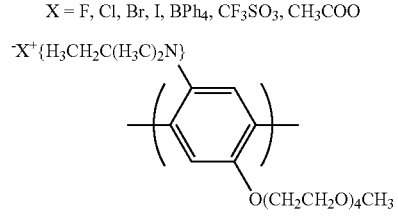

X = F, Cl, Br, I, BPh$_4$, CF$_3$SO$_3$, CH$_3$COO

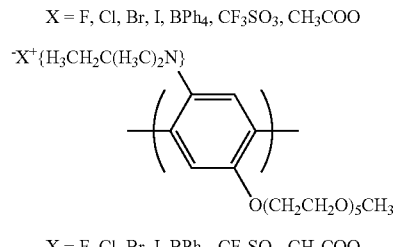

X = F, Cl, Br, I, BPh$_4$, CF$_3$SO$_3$, CH$_3$COO

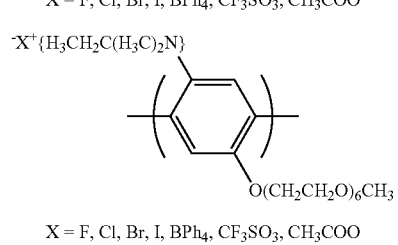

X = F, Cl, Br, I, BPh$_4$, CF$_3$SO$_3$, CH$_3$COO

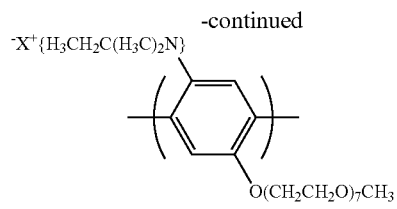

X = F, Cl, Br, I, BPh$_4$, CF$_3$SO$_3$, CH$_3$COO

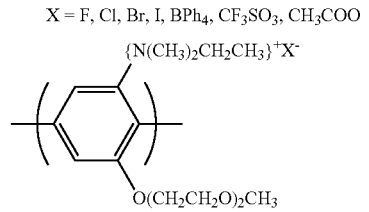

X = F, Cl, Br, I, BPh$_4$, CF$_3$SO$_3$, CH$_3$COO

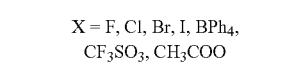
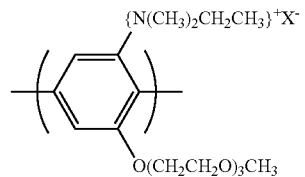

X = F, Cl, Br, I, BPh$_4$, CF$_3$SO$_3$, CH$_3$COO

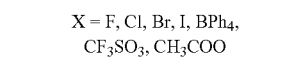
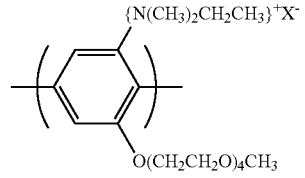

X = F, Cl, Br, I, BPh$_4$, CF$_3$SO$_3$, CH$_3$COO

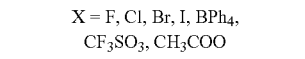
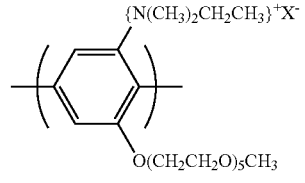

X = F, Cl, Br, I, BPh$_4$, CF$_3$SO$_3$, CH$_3$COO

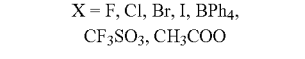
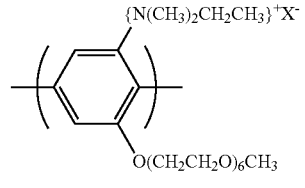

X = F, Cl, Br, I, BPh$_4$, CF$_3$SO$_3$, CH$_3$COO

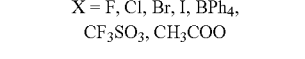
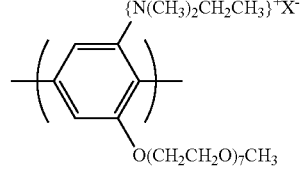

X = F, Cl, Br, I, BPh$_4$, CF$_3$SO$_3$, CH$_3$COO

-continued

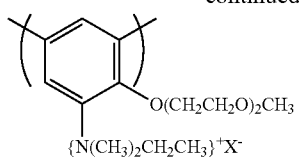

X = F, Cl, Br, I, BPh₄, CF₃SO₃, CH₃COO

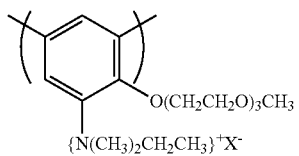

X = F, Cl, Br, I, BPh₄, CF₃SO₃, CH₃COO

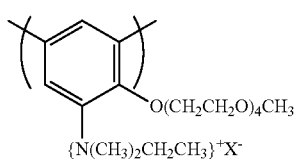

X = F, Cl, Br, I, BPh₄, CF₃SO₃, CH₃COO

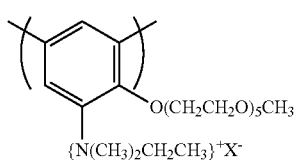

X = F, Cl, Br, I, BPh₄, CF₃SO₃, CH₃COO

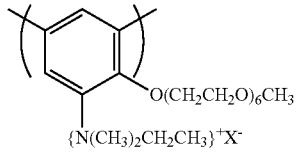

X = F, Cl, Br, I, BPh₄, CF₃SO₃, CH₃COO

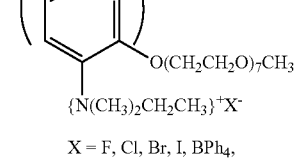

X = F, Cl, Br, I, BPh₄, CF₃SO₃, CH₃COO

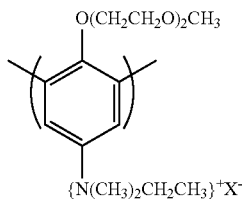

X = F, Cl, Br, I, BPh₄, CF₃SO₃, CH₃COO

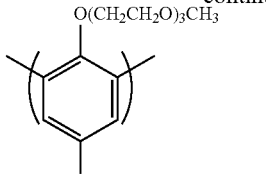

X = F, Cl, Br, I, BPh₄, CF₃SO₃, CH₃COO

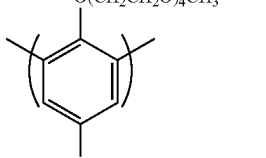

X = F, Cl, Br, I, BPh₄, CF₃SO₃, CH₃COO

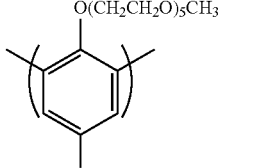

X = F, Cl, Br, I, BPh₄, CF₃SO₃, CH₃COO

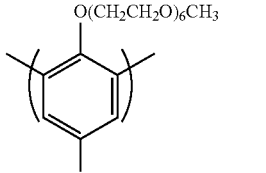

X = F, Cl, Br, I, BPh₄, CF₃SO₃, CH₃COO

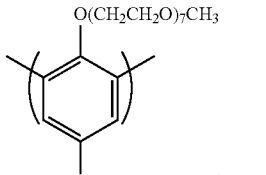

X = F, Cl, Br, I, BPh₄, CF₃SO₃, CH₃COO

Other Structural Units

The ionic polymer used in the present invention may further have one or more types of structural units represented by Formula (33).

[Chemical Formula 43]

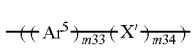

(33)

(In Formula (33), $Ar^5$ represents a divalent aromatic group optionally having a substituent or a divalent aromatic amine residue optionally having a substituent; and X' represents an imino group optionally having a substituent, a silylene group optionally having a substituent, an ethenylene group optionally having a substituent, or an ethynylene group. m33 and m34 each independently represent 0 or 1 and at least one of m33 and m34 is 1).

Examples of the divalent aromatic group represented by $Ar^5$ in Formula (33) may include a divalent aromatic hydrocarbon group and a divalent aromatic heterocyclic group. Examples of the divalent aromatic group may include: a divalent group remaining after eliminating two hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring, and an azadiazole ring; a divalent group remaining after eliminating two hydrogen atoms from a fused polycyclic aromatic ring system formed by fusing two or more rings selected from the group consisting of the monocyclic aromatic rings; a divalent group remaining after eliminating two hydrogen atoms from an aromatic ring assembly formed by linking two or more aromatic rings selected from the group consisting of the monocyclic aromatic rings and the fused polycyclic aromatic ring systems through a single bond, an ethenylene group, or an ethynylene group; and a divalent group remaining after eliminating two hydrogen atoms from a crosslinkage-having polycyclic aromatic ring formed by crosslinking two aromatic rings adjacent to each other of the fused polycyclic aromatic ring system or the aromatic ring assembly through a divalent group such as a methylene group, an ethylene group, a carbonyl group, and an imino group.

In the fused polycyclic aromatic ring system, the number of monocyclic aromatic rings to be fused is further preferably 2 from the viewpoint of the solubility of the ionic polymer, preferably 2 to 4, and more preferably 2 to 3. In the aromatic ring assembly, the number of aromatic rings to be linked is preferably 2 to 4, more preferably 2 to 3, and further preferably 2 from the viewpoint of the solubility of the ionic polymer. In the crosslinkage-having polycyclic aromatic ring, the number of aromatic rings to be crosslinked is preferably 2 to 4, more preferably 2 to 3, and further preferably 2 from the viewpoint of the solubility of the ionic polymer.

Examples of the monocyclic aromatic ring may include the following rings.

[Chemical Formula 44]

45

46

47

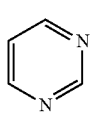
48

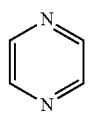
49

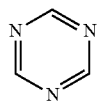
50

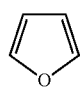
51

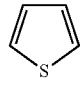
52

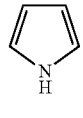
53

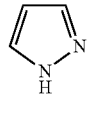
54

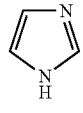
55

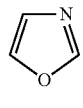
56

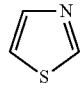
57

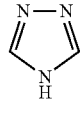
58

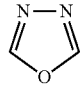
59

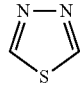
60

Examples of the fused polycyclic aromatic ring system may include the following rings.

[Chemical Formula 45]

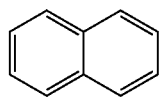
61

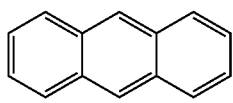 62
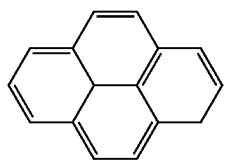 63
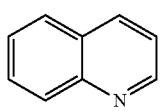 64
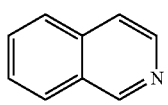 65
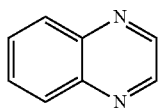 66
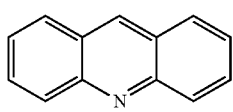 67
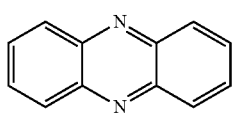 68
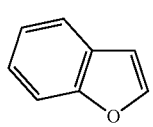 69
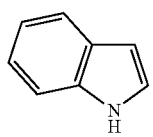 70
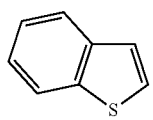 71
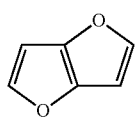 72
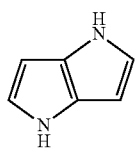 73
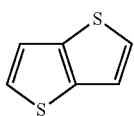 74
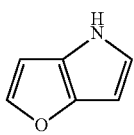 75
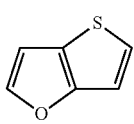 76
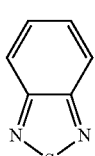 77
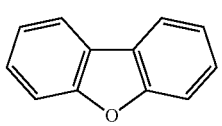 78
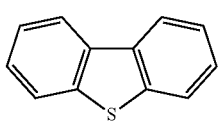 79
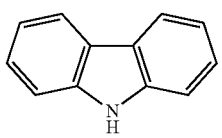 80
Examples of the aromatic ring assembly may include the following rings.
[Chemical Formula 46]
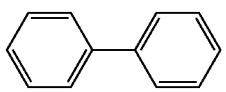 81
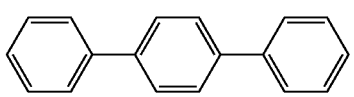 82
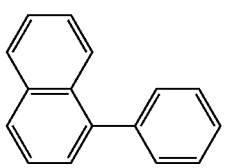 83

-continued

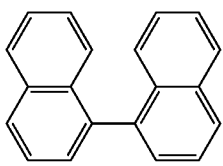84

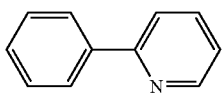85

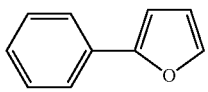86

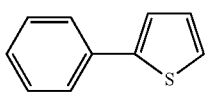87

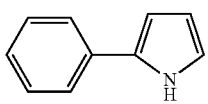88

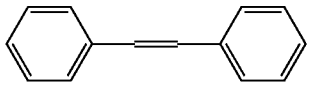89

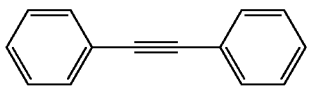90

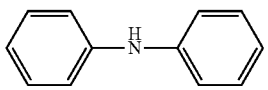91

Examples of the crosslinkage-having polycyclic aromatic ring may include the following rings.

[Chemical Formula 47]

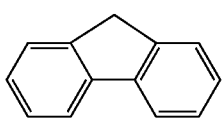92

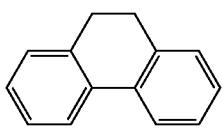93

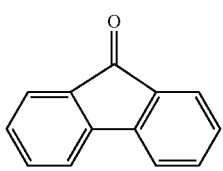94

-continued

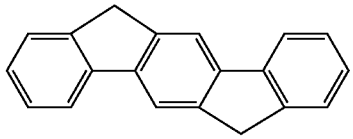95

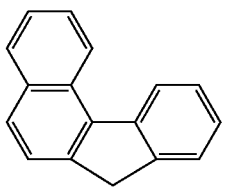96

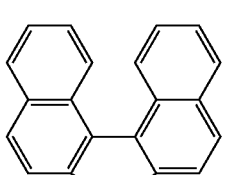97

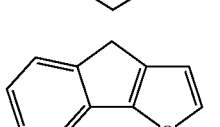98

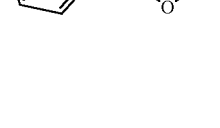99

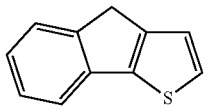100

From the viewpoint of any one of or both of the electron acceptability and the hole acceptability of the ionic polymer, the divalent aromatic group represented by $Ar^5$ is preferably a divalent group remaining after eliminating two hydrogen atoms from a ring represented by Formula 45 to Formula 60, Formula 61 to Formula 71, Formula 77 to Formula 80, Formula 91, Formula 92, Formula 93, or Formula 96, more preferably a divalent group remaining after eliminating two hydrogen atoms from a ring represented by Formula 45 to Formula 50, Formula 59, Formula 60, Formula 77, Formula 80, Formula 91, Formula 92, or Formula 96.

The divalent aromatic group may have a substituent. Examples of the substituent may include the same substituents shown as in the description with respect to $Q^1$.

Examples of the divalent aromatic amine residue represented by $Ar^5$ in Formula (33) may include groups of Formula (34).

[Chemical Formula 48]

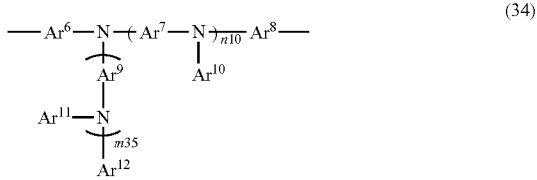

(34)

(In Formula (34), $Ar^6$, $Ar^7$, $Ar^8$, and $Ar^9$ each independently represent an arylene group optionally having a substituent or a divalent heterocyclic group optionally having a substituent; $Ar^{10}$, $Ar^{11}$, and $Ar^{12}$ each independently represent an aryl group optionally having a substituent or a monovalent heterocyclic group optionally having a substituent; and n10 and m35 each independently represent 0 or 1).

The substituent that the arylene group, the aryl group, the divalent heterocyclic group, or the monovalent heterocyclic group may have may be a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amido group, an acid imido group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, and a carboxyl group. The substituent may be also a crosslinkable group such as a vinyl group, an acetylene group, a butenyl group, an acryl group, an arcylate group, an arcylamido group, a methacryl group, a metharcylate group, a metharcylamido group, a vinyl ether group, a vinylamino group, a silanol group, a group having a small ring (such as a cyclopropyl group, a cyclobutyl group, an epoxy group, an oxetane group, a diketene group, and an episulfide group), a lactone group, a lactam group, or a group containing a structure of a siloxane derivative.

When n10 is 0, a carbon atom in $Ar^6$ and a carbon atom in $Ar^8$ may be bonded with each other either directly or through a divalent group such as —O— —S—, and the like.

The aryl group and the monovalent heterocyclic group represented by $Ar^{10}$, $Ar^{11}$, and $Ar^{12}$ are the same as the aryl group and the monovalent heterocyclic group which are described above and show as examples of the substituent.

Examples of the arylene group represented by $Ar^6$, $Ar^7$, $Ar^8$, and $Ar^9$ may include an atomic group remaining after eliminating two hydrogen atoms bonded to a carbon atom making-up an aromatic ring from an aromatic hydrocarbon and examples of the arylene group include a group having a benzene ring, a group having a fused ring, and a group in which two or more independent benzene rings or fused rings are bonded with each other through a single bond or a divalent organic group, for example, an alkenylene group such as a vinylene group. The arylene group has the number of carbon atoms of usually 6 to 60, and preferably 7 to 48. Specific examples of the arylene group may include a phenylene group, a biphenylene group, a $C_{1-17}$ alkoxyphenylene group, a $C_{1-17}$ alkylphenylene group, a 1-naphthylene group, a 2-naphthylene group, a 1-anthrylene group, a 2-anthrylene group, and a 9-anthrylene group. The hydrogen atom in the arylene group may be substituted with a fluorine atom. The relevant fluorine atom-substituted arylene group may be a tetrafluorophenylene group. Among the arylene groups, a phenylene group, a biphenylene group, a $C_{1-12}$ alkoxyphenylene group, and a $C_{1-12}$ alkylphenylene group are preferred.

Examples of the divalent heterocyclic group represented by $Ar^6$, $Ar^7$, $Ar^8$, and $Ar^9$ may include an atomic group remaining after eliminating two hydrogen atoms from a heterocyclic compound. Here, the heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element making-up the ring, among organic compounds having a cyclic structure. The divalent heterocyclic group may have a substituent. The divalent heterocyclic group has the number of carbon atoms of usually 4 to 60, and preferably 4 to 20. Here, the number of carbon atoms of the divalent heterocyclic group does not include the number of carbon atoms of the substituent. Examples of such a divalent heterocyclic group may include a thiophenediyl group, a $C_{1-12}$ alkylthiophenediyl group, a pyrrolediyl group, a furandiyl group, a pyridinediyl group, a $C_{1-12}$ alkylpyridinediyl group, a pyridazinediyl group, a pyrimidinediyl group, a pyrazinediyl group, a triazinediyl group, a pyrrolidinediyl group, a piperidinediyl group, a quinolinediyl group, and an isoquinolinediyl group, and among them, a thiophenediyl group, a $C_{1-12}$ alkylthiophenediyl group, a pyridinediyl group, and a $C_{1-12}$ alkylpyridinediyl group are more preferred.

The ionic polymer containing a divalent aromatic amine residue as a structural unit may further have other structural units. Examples of the other structural unit may include an arylene group such as a phenylene group and a fluorenediyl group. Among these ionic polymers, those containing a crosslinkable group are preferred.

Examples of the divalent aromatic amine residue represented by Formula (34) may include a group remaining after eliminating two hydrogen atoms from aromatic amines represented by Formulae 101 to 110 below.

[Chemical Formula 49]

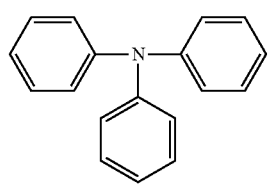

101

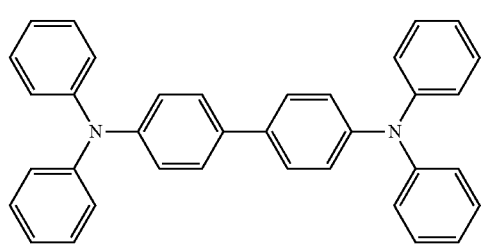

102

103

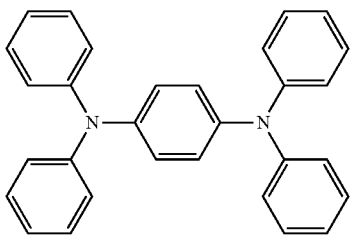

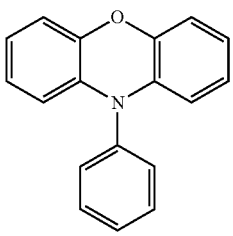

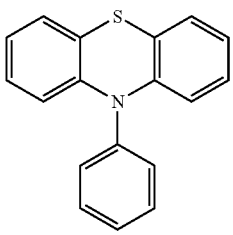

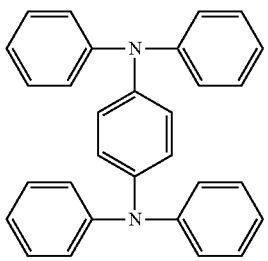

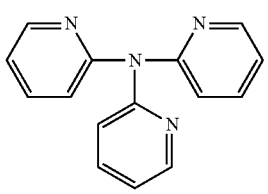

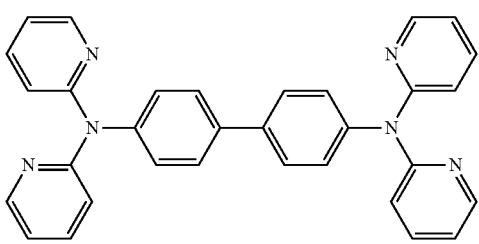

104

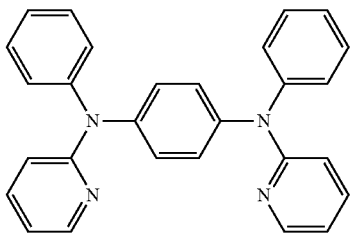

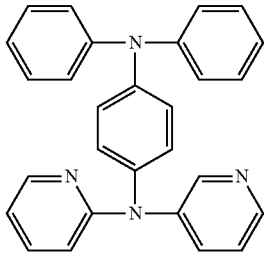

The aromatic amine represented by Formulae 101 to 110 may have a substituent so long as the aromatic amine may generate a divalent aromatic amine residue and the substituent may be the same substituent shown as an example in the description above with respect to $Q^1$. When the substituent is plurally present, the substituents may be the same as or different from each other.

In Formula (33), X' represents an imino group optionally having a substituent, a silylene group optionally having a substituent, an ethenylene group optionally having a substituent, or an ethynylene group. Examples of the substituent that the imino group, the silyl group, or the ethenylene group may have may include: an alkyl group having 1 to 20 carbon atoms such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a 2-ethylhexyl group, a nonyl group, a decyl group, a 3,7-dimethyloctyl group, and a lauryl group; and an aryl group having 6 to 30 carbon atoms such as a phenyl group, a 1-naphthyl group, a 2-naphthyl group, a 1-anthryl group, a 2-anthryl group, and a 9-anthryl group, and when the substituent is plurally present, the substituents may be the same as or different from each other.

From the viewpoint of the stability of the ionic polymer relative to air, moisture, or heat, X' is preferably an imino group, an ethenylene group, or an ethynylene group.

From the viewpoint of the electron acceptability and the hole acceptability of the ionic polymer, it is preferred that m33 is 1 and m34 is 0.

The structural unit represented by Formula (33) is preferably a structural unit represented by Formula (35) from the viewpoint of the electron acceptability of the ionic polymer.

[Chemical Formula 50]

$$\mathrm{-\!\!\!+\!\!Ar^{13}\!\!+\!\!\!-} \qquad (35)$$

(In Formula (35), $Ar^{13}$ represents a pyridinediyl group optionally having a substituent, a pyrazinediyl group optionally having a substituent, a pyrimidinediyl group optionally having a substituent, a pyridazinediyl group optionally having a substituent, or a triazinediyl group optionally having a substituent).

The substituent that a pyridinediyl group may have may be the same substituent shown as an example in the description above with respect to $Q^1$. When the substituent is plurally present, the substituents may be the same as or different from each other.

The substituent that a pyrazinediyl group may have may be the same substituent as the substituent included in the description above with respect to $Q^1$. When the substituent is plurally present, the substituents may be the same as or different from each other.

The substituent that a pyrimidinediyl group may have may be the same substituent shown as an example in the description above with respect to $Q^1$. When the substituent is plurally present, the substituents may be the same as or different from each other.

The substituent that a pyridazinediyl group may have may be the same substituent shown as an example in the description above with respect to $Q^1$. When the substituent is plurally present, the substituents may be the same as or different from each other.

The substituent that a triazinediyl group may have may be the same substituent shown as an example in the description above with respect to $Q^1$. When the substituent is plurally present, the substituents may be the same as or different from each other.

Ratio of Structural Unit

The ratio of the total of the structural unit represented by Formula (13), the structural unit represented by Formula (15), the structural unit represented by Formula (17), and the structural unit represented by Formula (20) that are contained in the ionic polymer used in the present invention is more preferably 30% by mole to 100% by mole based on the number of moles of all structural units contained in the ionic polymer excluding the terminal structural units from the viewpoint of the light-emitting efficacy of the organic EL element.

Terminal Structural Unit

Examples of the terminal structural unit (terminal group) of the ionic polymer used in the present invention may include a hydrogen atom, a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, a lauryl group a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, a laurylthio group, a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_{1-12}$ alkoxyphenyl)amino group, a di($C_{1-12}$ alkoxyphenyl)amino group, a di($C_{1-12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_{1-12}$ alkyl)amino group, a ($C_{1-12}$ alkoxyphenyl-$C_{1-12}$ alkyl)amino group, a ($C_{1-12}$ alkylphenyl-$C_{1-12}$ alkyl)amino group, a di($C_{1-12}$ alkoxyphenyl-$C_{1-12}$ alkyl) amino group, a di($C_{1-12}$ alkylphenyl-$C_{1-12}$ alkyl)amino group, a 1-naphthyl-$C_{1-12}$ alkylamino group, a 2-naphthyl-$C_{1-12}$ alkylamino group, a trimethylsilyl group, a triethylsilyl group, a tripropylsilyl group, a triisopropylsilyl group, an isopropyldimethylsilyl group, an isopropyldiethylsilyl group, a t-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_{1-12}$ alkyl)silyl group, a ($C_{1-12}$ alkoxyphenyl-$C_{1-12}$ alkyl)silyl group, a ($C_{1-12}$ alkylphenyl-$C_{1-12}$ alkyl)silyl group, a (1-naphthyl-$C_{1-12}$ alkyl) silyl group, a (2-naphthyl-$C_{1-12}$ alkyl)silyl group, a (phenyl-$C_{1-12}$ alkyl)dimethylsilyl group, a triphenylsilyl group, a tri(p-xylyl)silyl group, a tribenzylsilyl group, a diphenylmethylsilyl group, a tert-butyldiphenylsilyl group, a dimethylphenylsilyl group, a thienyl group, a $C_{1-12}$ alkylthienyl group, a pyrrolyl group, a furyl group, a pyridyl group, a $C_{1-12}$ alkylpyridyl group, a pyridazinyl group, a pyrimidyl group, a pyrazinyl group, a triazinyl group, a pyrrolidyl group, a piperidyl group, a quinolyl group, an isoquinolyl group, a hydroxy group, a mercapto group, a fluorine atom, a chlorine atom, a bromine atom, and an iodine atom. When the terminal structural unit is plurally present, a plurality of substituents may be the same as or different from each other.

Characteristics of Ionic Polymer

The ionic polymer used in the present invention is preferably a conjugated compound. That the ionic polymer used in the present invention is a conjugated compound means that the ionic polymer contains in the main chain thereof, a region in which multiple bonds (such as double bond, triple bond) or non-covalent electron pairs that a nitrogen atom, an oxygen atom, or the like has are linked through one single bond. When the ionic polymer is a conjugated compound, from the viewpoint of the electron transport characteristic of the conjugated compound, the ionic polymer has a ratio calculated by a formula of {(the number of atoms on the main chain contained in the region in which multiple bonds or non-covalent electron pairs that a nitrogen atom, an oxygen atom, or the like has are linked through one single bond)/(the number of all atoms on the backbone)}×100% of preferably 50% or more, more preferably 60% or more, more preferably 70% or more, more preferably 80% or more, and further preferably 90% or more.

The ionic polymer used in the present invention is preferably a macromolecular compound, more preferably a conjugated macromolecular compound. Here, the macromolecular compound refers to a compound having a number average molecular weight in terms of polystyrene of $1 \times 10^3$ or more. That the ionic polymer used in the present invention is a conjugated macromolecular compound means that the ionic polymer is a conjugated compound and also a macromolecular compound.

From the viewpoint of the film formation characteristic by coating of the ionic polymer used in the present invention, the ionic polymer has a number average molecular weight in terms of polystyrene of preferably $1 \times 10^3$ to $1 \times 10^8$, more preferably $2 \times 10^3$ to $1 \times 10^7$, more preferably $3 \times 10^3$ to $1 \times 10^7$, and further preferably $5 \times 10^3$ to $1 \times 10^7$. From the viewpoint of the purity of the ionic polymer, the ionic polymer has a weight average molecular weight in terms of polystyrene of preferably $1 \times 10^3$ to $5 \times 10^7$, more preferably $1 \times 10^3$ to $1 \times 10^7$, and further preferably $1 \times 10^3$ to $5 \times 10^6$. From the viewpoint of the solubility of the ionic polymer, the ionic polymer has a number average molecular weight in terms of polystyrene of preferably $1 \times 10^3$ to $5 \times 10^5$, more preferably $1 \times 10^3$ to $5 \times 10^4$, and further preferably $1 \times 10^3$ to $3 \times 10^3$. The number average molecular weight and the weight average molecular weight in terms of polystyrene of the ionic polymer used in the present invention may be measured, for example, using gel permeation chromatography (GPC).

From the viewpoint of the purity of the ionic polymer used in the present invention, the number (that is a polymerization degree) of all structural units contained in the ionic polymer excluding the terminal structural unit is preferably 1 or more and 20 or less, more preferably 1 or more and 10 or less, and further preferably 1 or more and 5 or less.

From the viewpoint of the electron acceptability and the hole acceptability of the ionic polymer used in the present invention, the ionic polymer has an orbital energy of the lowest unoccupied molecular orbital (LUMO) of preferably −5.0 eV or more and −2.0 eV or less, more preferably −4.5 eV or more and −2.0 eV or less. From the same viewpoint, the ionic polymer has an orbital energy of the highest occupied molecular orbital (HOMO) of preferably −6.0 eV or more and −3.0 eV or less, more preferably −5.5 eV or more and −3.0 eV or less, provided that the orbital energy of HOMO is lower than the orbital energy of LUMO. The orbital energy of the highest occupied molecular orbital (HOMO) of the ionic polymer is obtained by measuring the ionization potential of the ionic polymer as the orbital energy of HOMO. On the other hand, the orbital energy of the lowest unoccupied molecular orbital (LUMO) of the ionic polymer is obtained by measuring the energy difference between HOMO and LUMO and by calculating the sum of the energy difference and the above-described measured ionization potential as the orbital energy of LUMO. For measuring the ionization potential, a photoelectronic spectrophotometer is used. The energy difference between HOMO and LUMO is obtained from an absorption terminal of the absorption spectrum of the ionic polymer measured using an ultraviolet-visible-near infrared spectrophotometer.

When the polymer used in the present invention is used for an electric field light-emitting element, the polymer is preferably substantially non-luminescent. Here, that a polymer is substantially non-luminescent means as follows. First, an electric field light-emitting element A having a polymer-containing layer is prepared. An electric field light-emitting element 2 having no polymer-containing layer is also prepared. The electric field light-emitting element A and the electric field light-emitting element 2 are different from each other only in that the electric field light-emitting element A has a polymer-containing layer, whereas the electric field light-emitting element 2 has no polymer-containing layer. Next, to the electric field light-emitting element A and the electric field light-emitting element 2, a forward direction voltage is applied to measure a light-emitting spectrum. A wavelength λ giving a maximum peak in the light-emitting spectrum obtained with respect to the electric field light-emitting element 2, is measured. While assuming the light-emitting strength at the wavelength λ as 1, the light-emitting spectrum obtained with respect to the electric field light-emitting element 2 is normalized and is integrated relative to the wavelength to calculate a normalized light-emitting amount $S_0$. While assuming the light-emitting strength at the wavelength λ as 1, also the light-emitting spectrum obtained with respect to the electric field light-emitting element A is normalized and is integrated relative to the wavelength to calculate a normalized light-emitting amount S. When the value calculated by a formula of $(S-S_0)/S_0 \times 100\%$ is 30% or less, that is, when an increment of the normalized light-emitting amount of the electric field light-emitting element A having a polymer-containing layer from the normalized light-emitting amount of the electric field light-emitting element 2 having no polymer-containing layer is 30% or less, the used polymer is regarded as substantially non-luminescent. The value calculated by a formula of $(S-S_0)/S_0 \times 100$ is preferably 15% or less, more preferably 10% or less.

Examples of the ionic polymer containing the group represented by Formula (1) and the group represented by Formula (3) may include: an ionic polymer consisting of a group represented by Formula (23) alone; an ionic polymer consisting of a group represented by Formula (23) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (24) alone; an ionic polymer consisting of a group represented by Formula (24) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (25) alone; an ionic polymer consisting of a group represented by Formula (25) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (29) alone; an ionic polymer consisting of a group represented by Formula (29) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (30) alone; and an ionic polymer consisting of a group represented by Formula (30) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110.

Examples of the ionic polymer containing a group represented by Formula (1) and a group represented by Formula (3) may include the macromolecular compounds below.

Among these macromolecular compounds, in macromolecular compounds represented by a formula in which two types of structural unit are delimited by the slash "/", the ratio of the left structural unit is p % by mole and the ratio of the right structural unit is (100-p) % by mole, and these structural units are arranged at random. In the formulae below, n represents the degree of a polymerization.

[Chemical Formula 51]

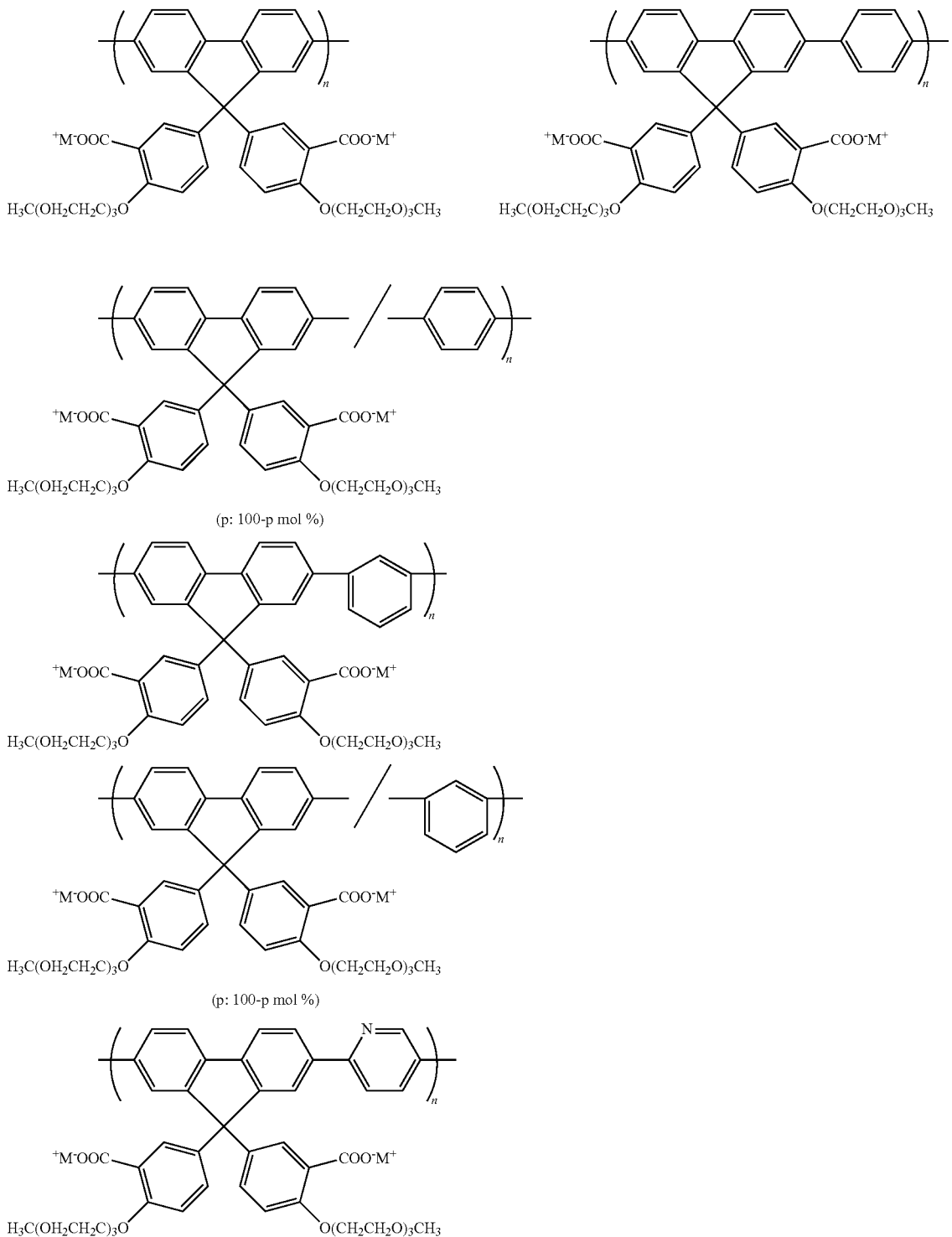

-continued
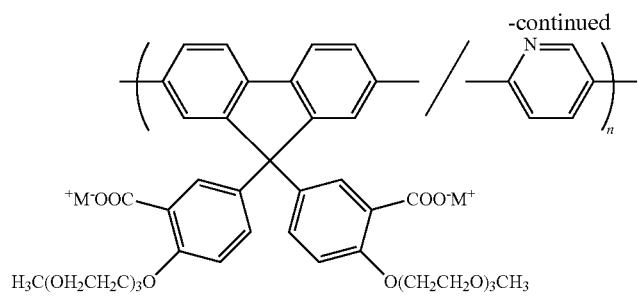
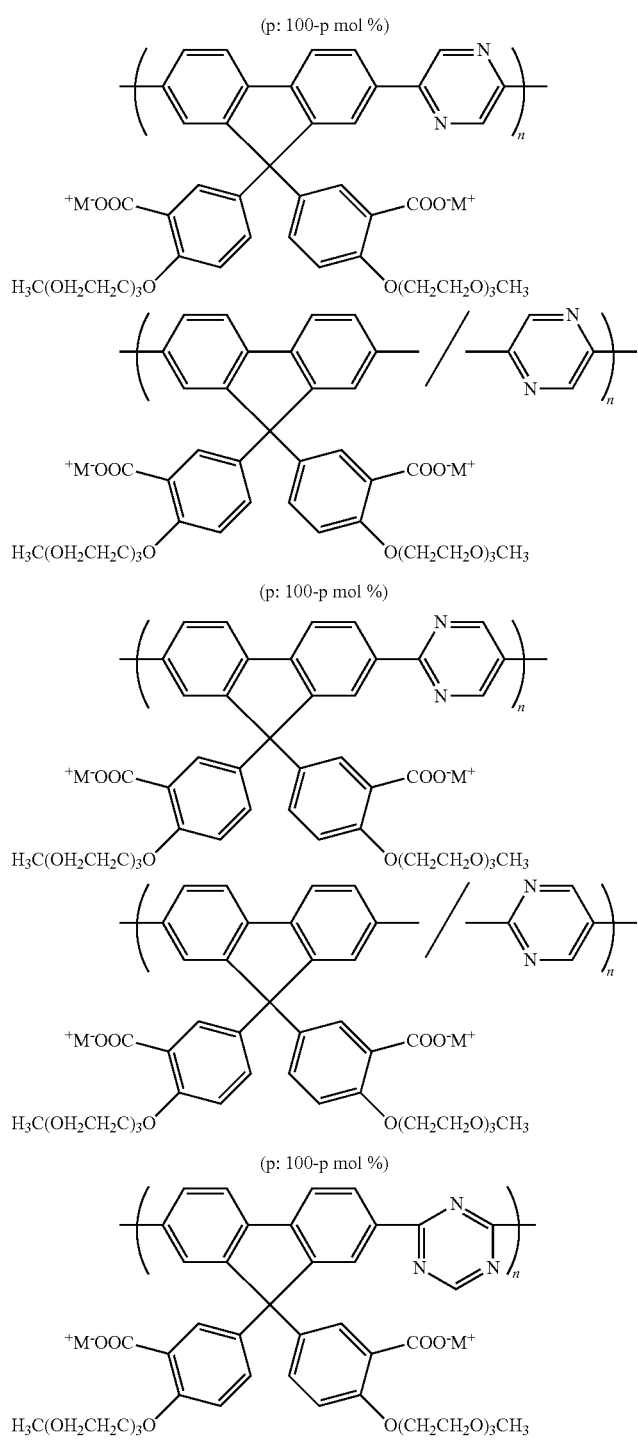

-continued
[Chemical Formula 52]
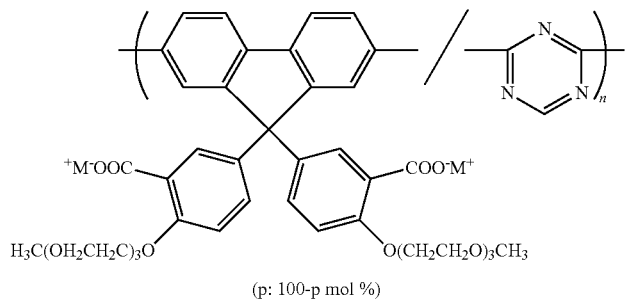
(p: 100-p mol %)
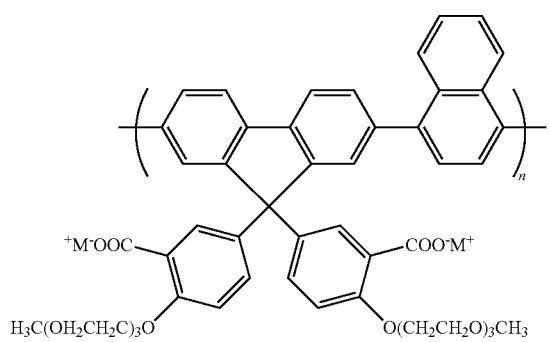
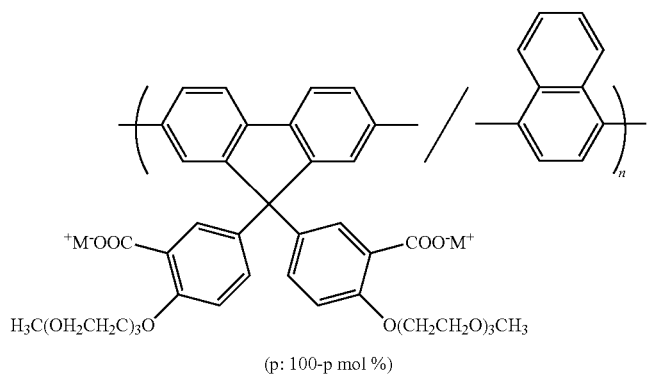
(p: 100-p mol %)
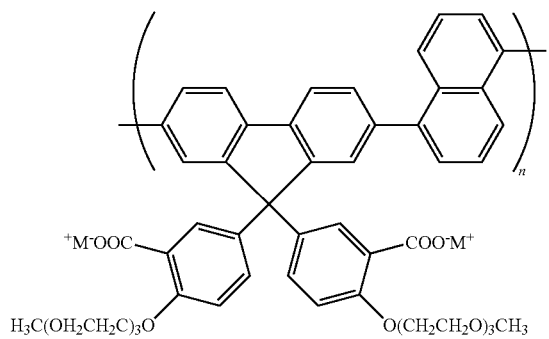

-continued
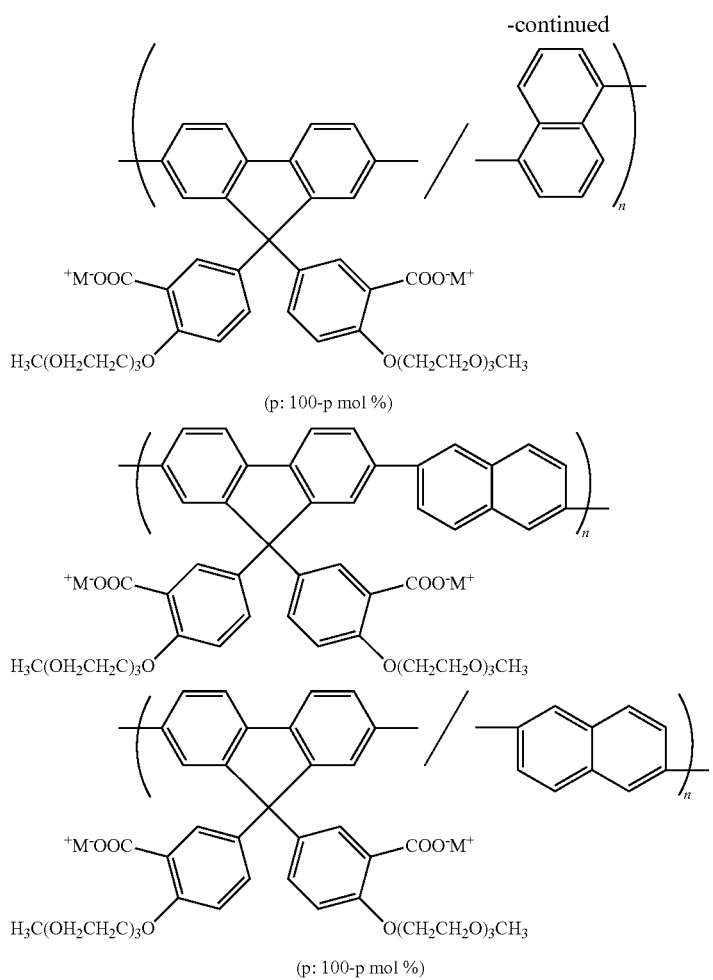
(p: 100-p mol %)
(p: 100-p mol %)
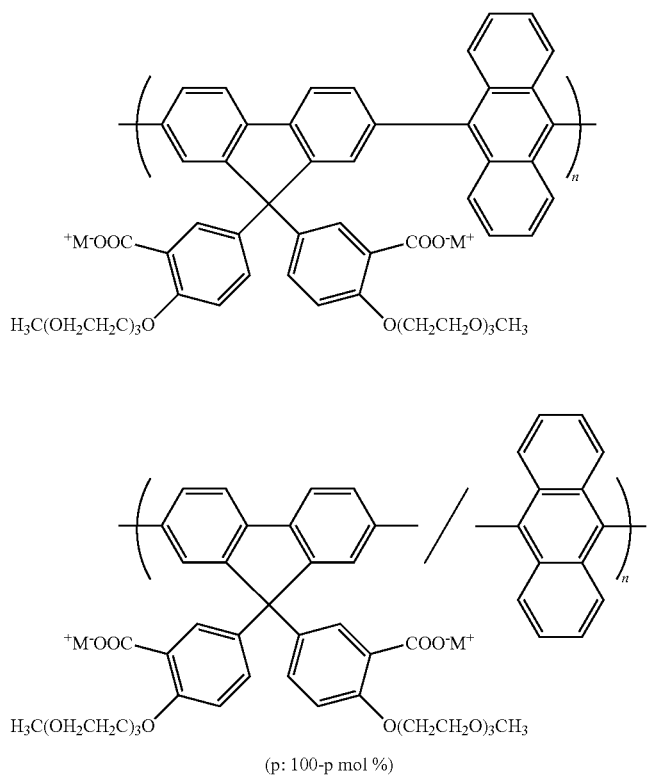
(p: 100-p mol %)

-continued
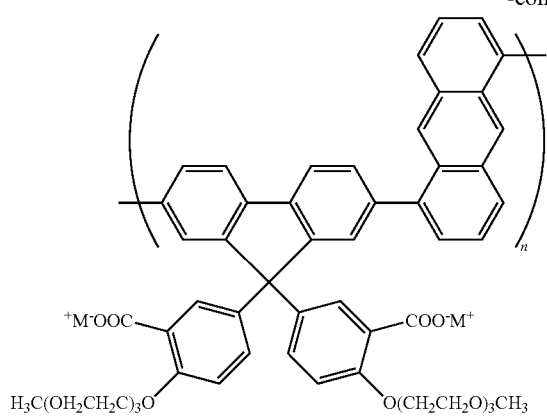
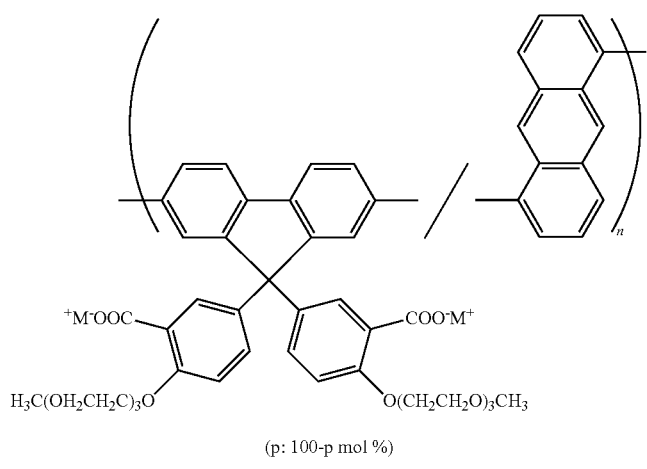
(p: 100-p mol %)
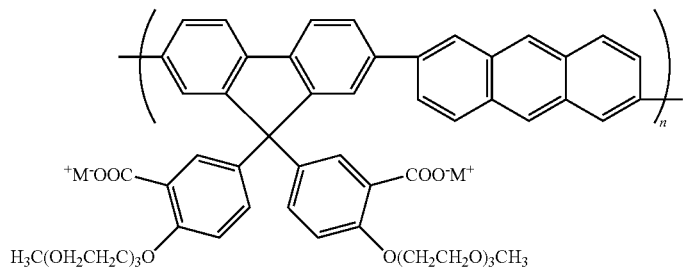
[Chemical Formula 53]
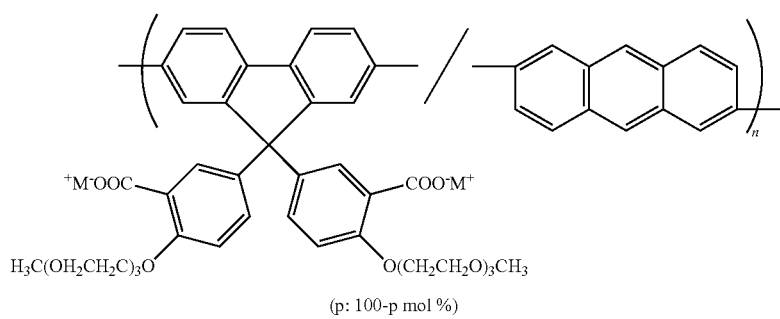
(p: 100-p mol %)

-continued
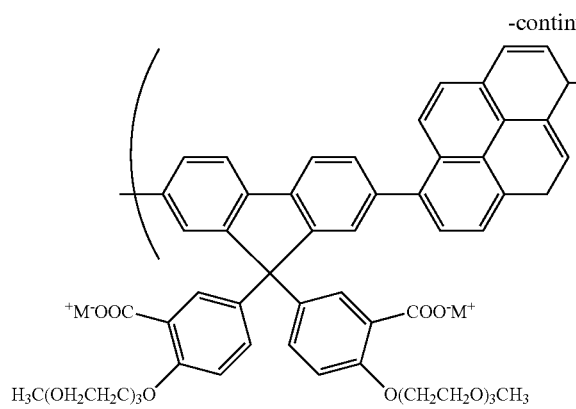
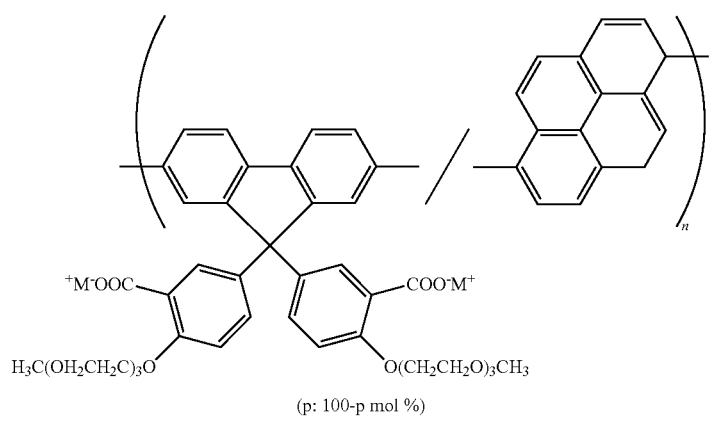
(p: 100-p mol %)
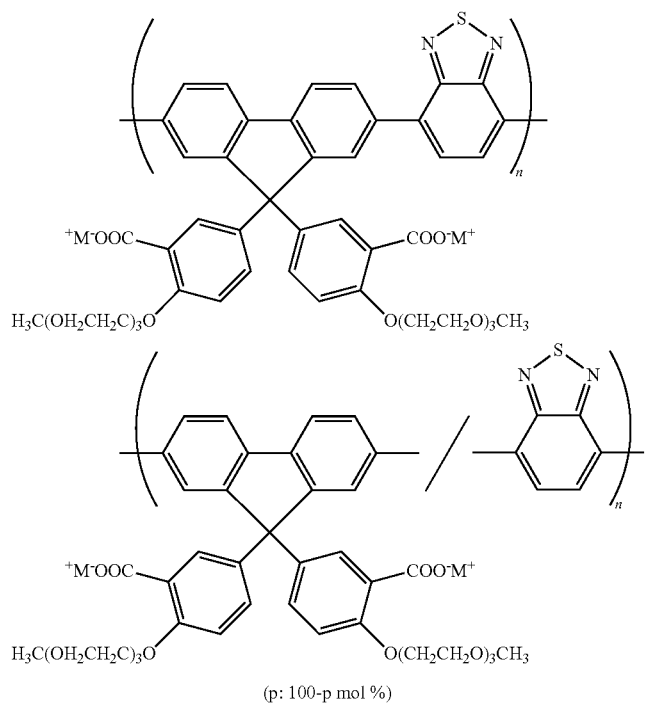
(p: 100-p mol %)

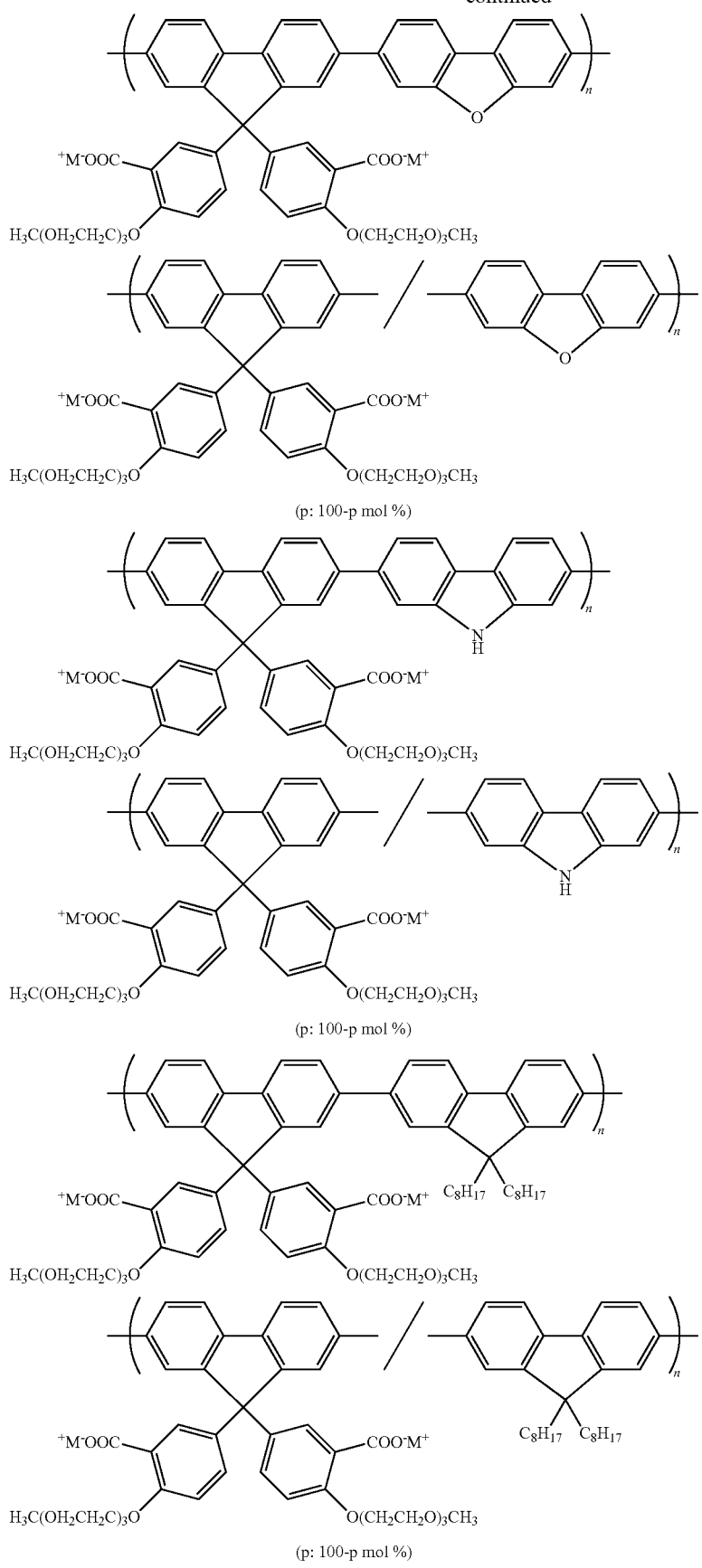

-continued
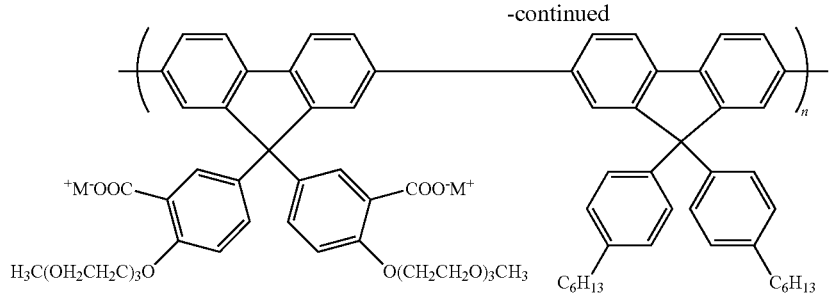
[Chemical Formula 54]
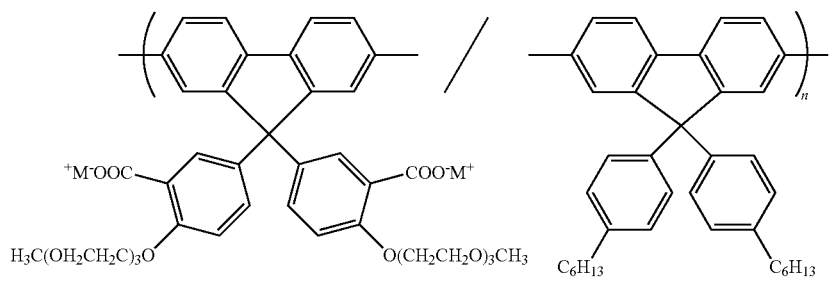
(p: 100-p mol %)
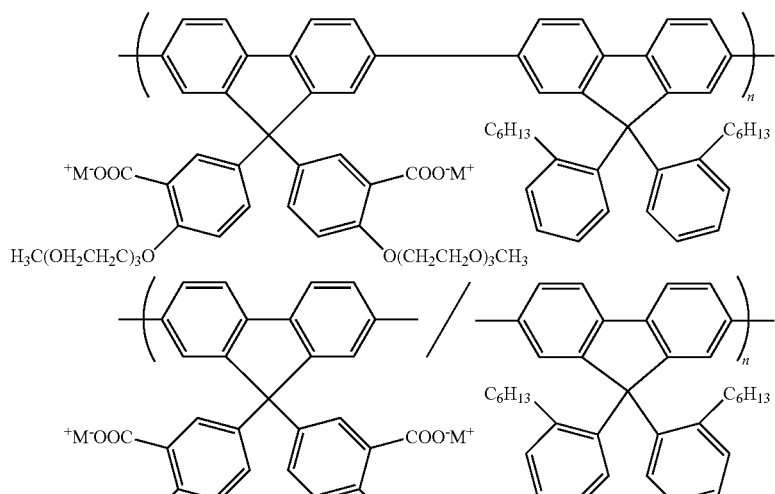
(p: 100-p mol %)
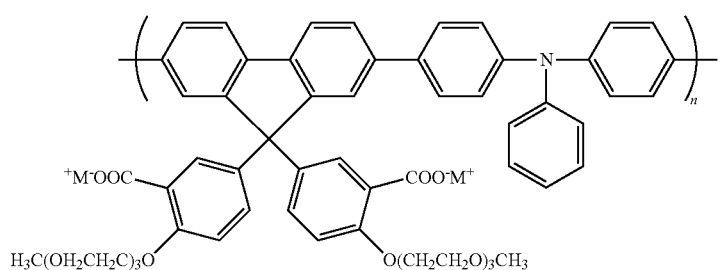

-continued
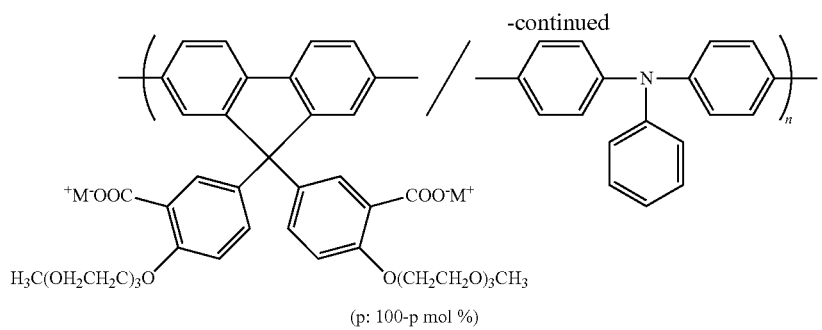
(p: 100-p mol %)
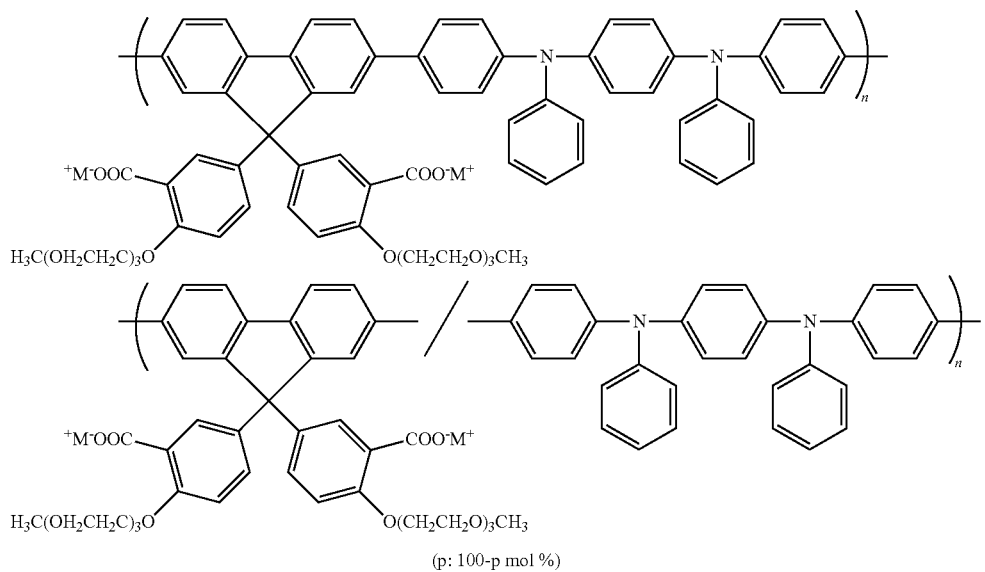
(p: 100-p mol %)
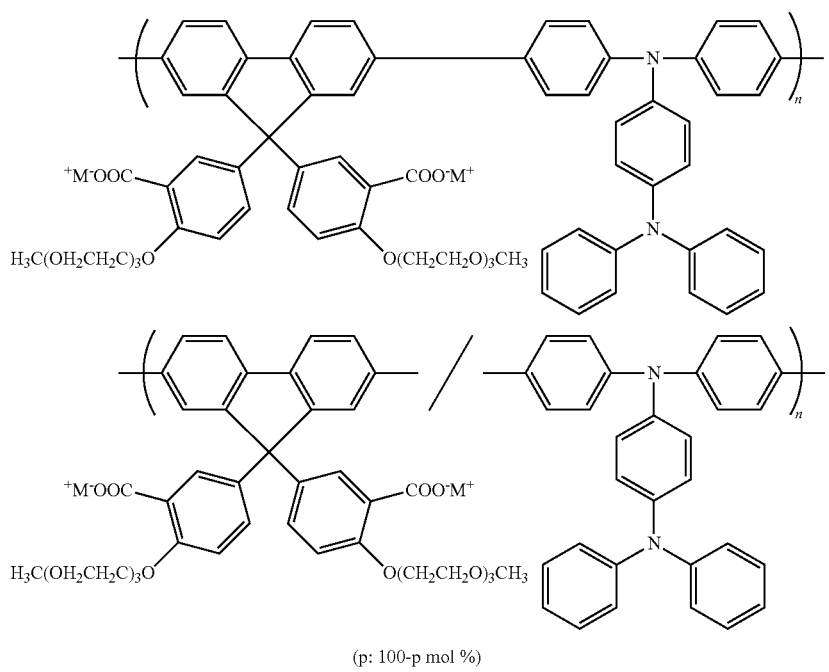
(p: 100-p mol %)

[Chemical Formula 55]
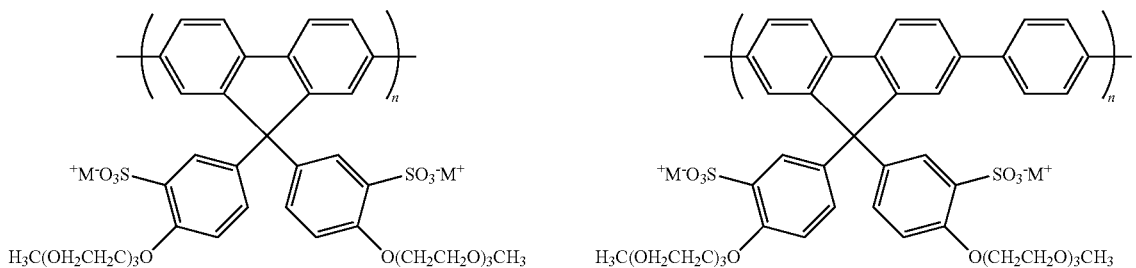
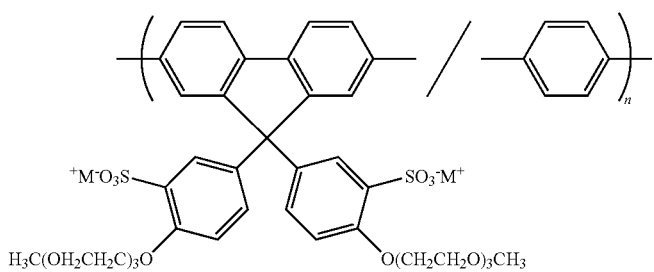
(p: 100-p mol %)
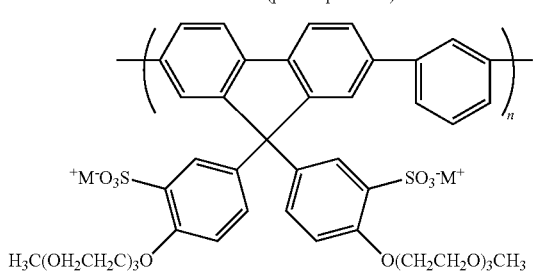
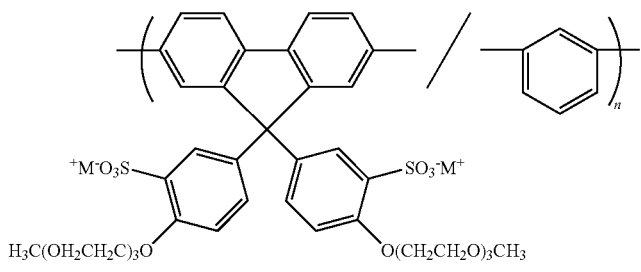
(p: 100-p mol %)
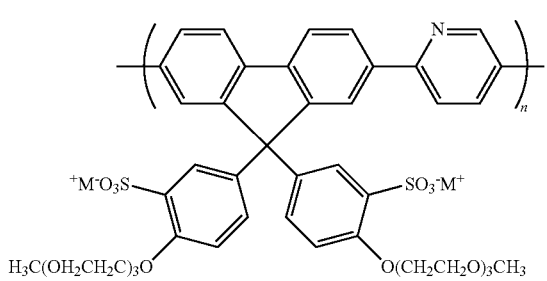

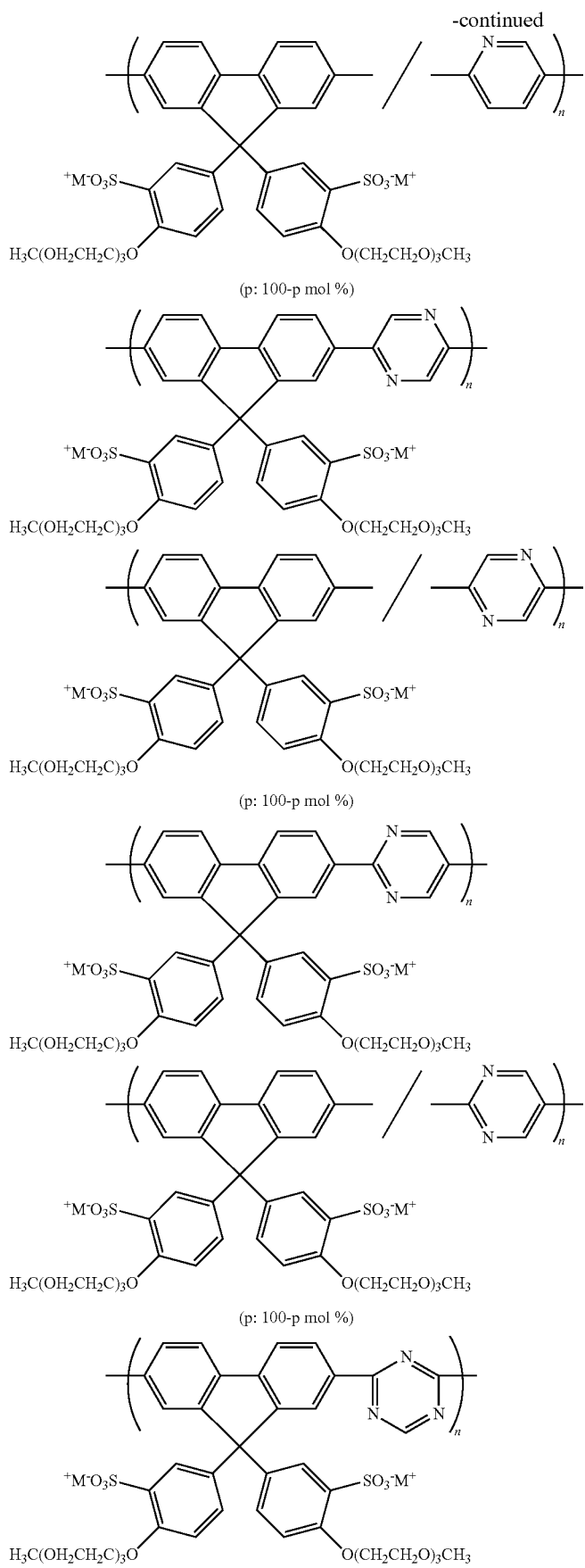

[Chemical Formula 56]
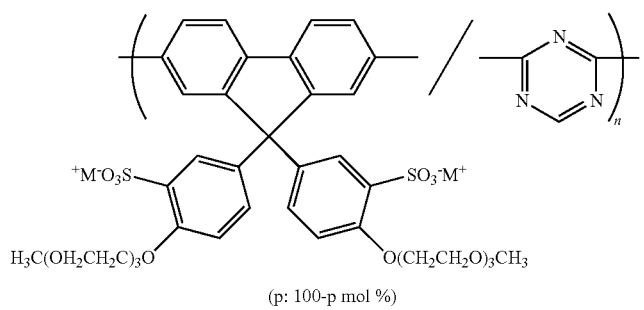
(p: 100-p mol %)
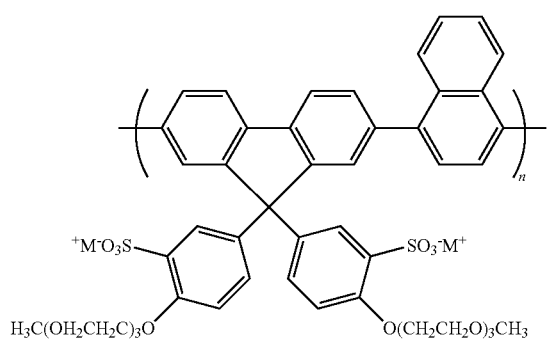
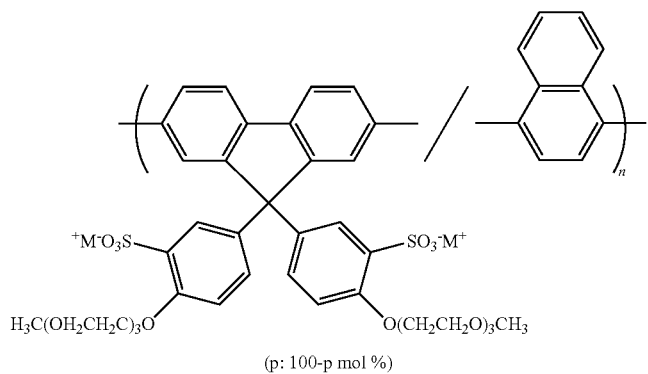
(p: 100-p mol %)
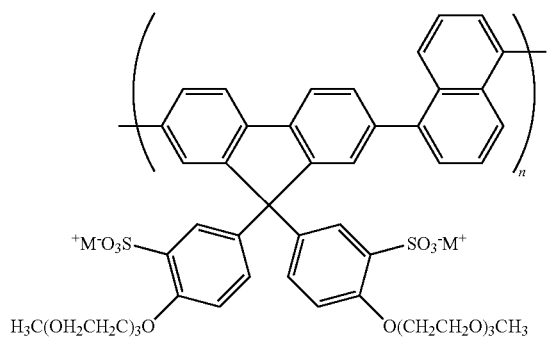

-continued
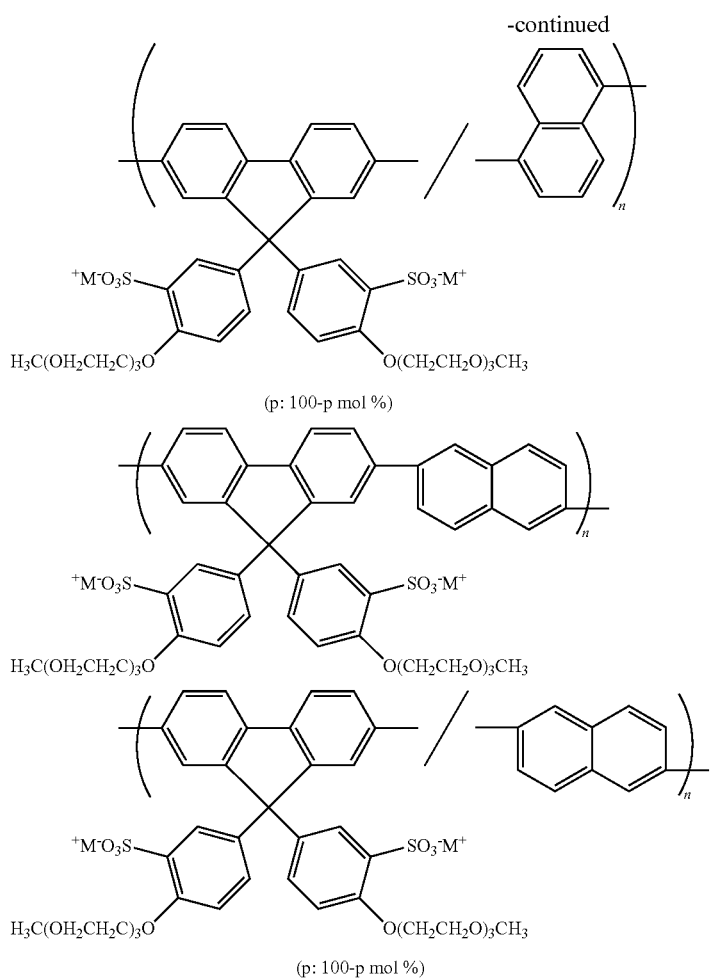
(p: 100-p mol %)
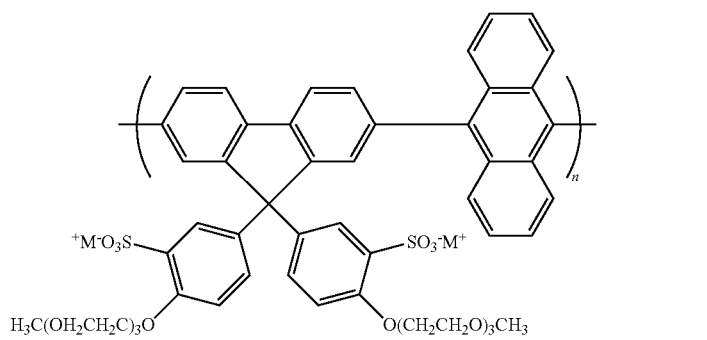
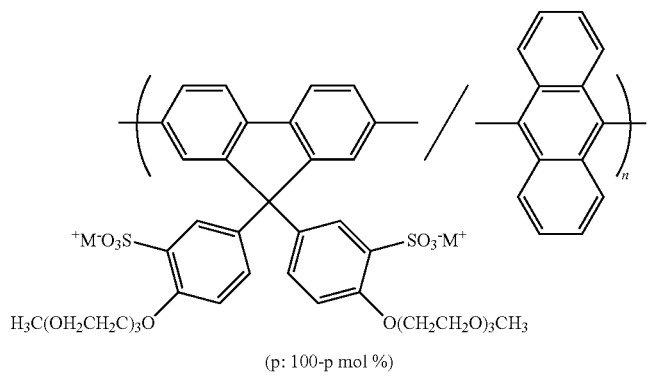
(p: 100-p mol %)

-continued
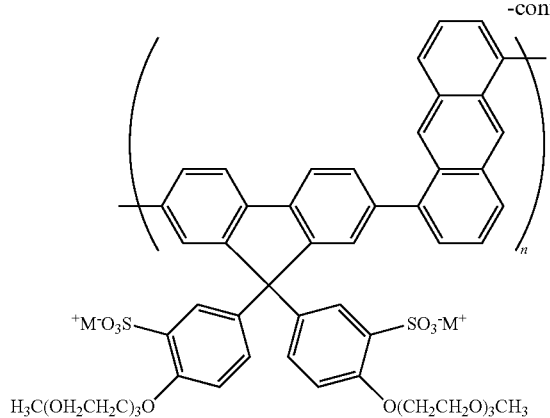
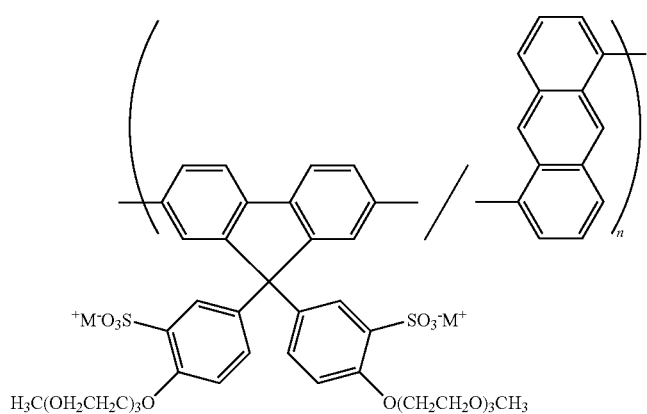
(p: 100-p mol %)
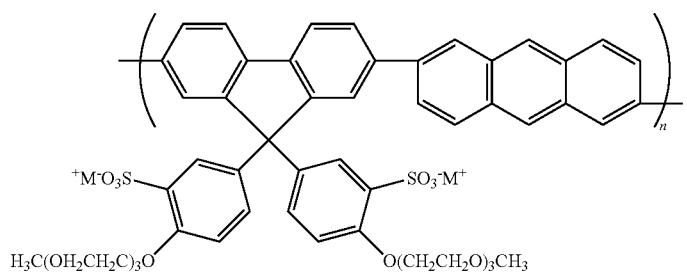
[Chemical Formula 57]
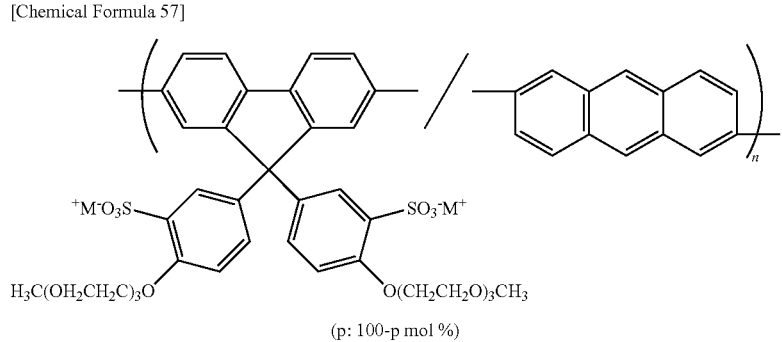
(p: 100-p mol %)

-continued
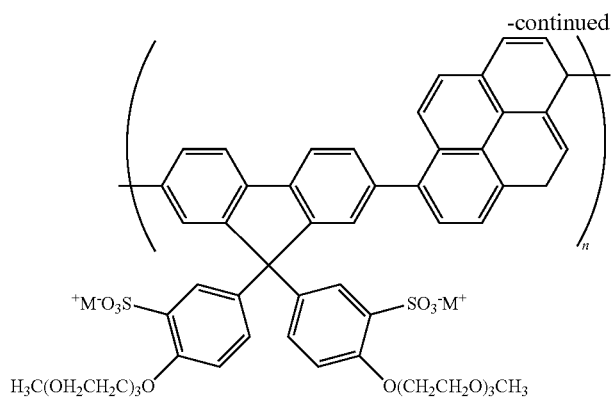
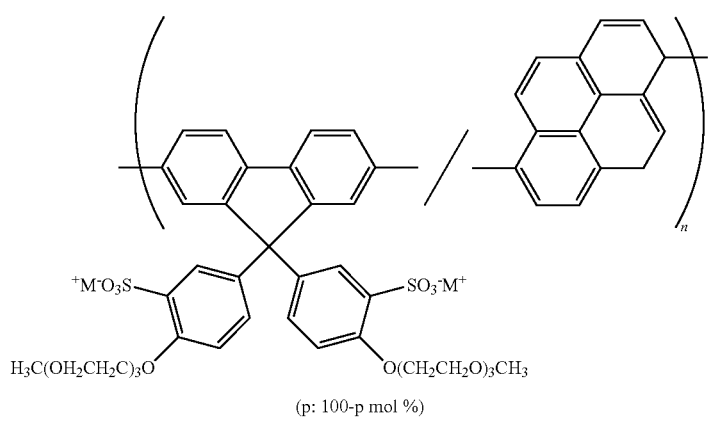
(p: 100-p mol %)
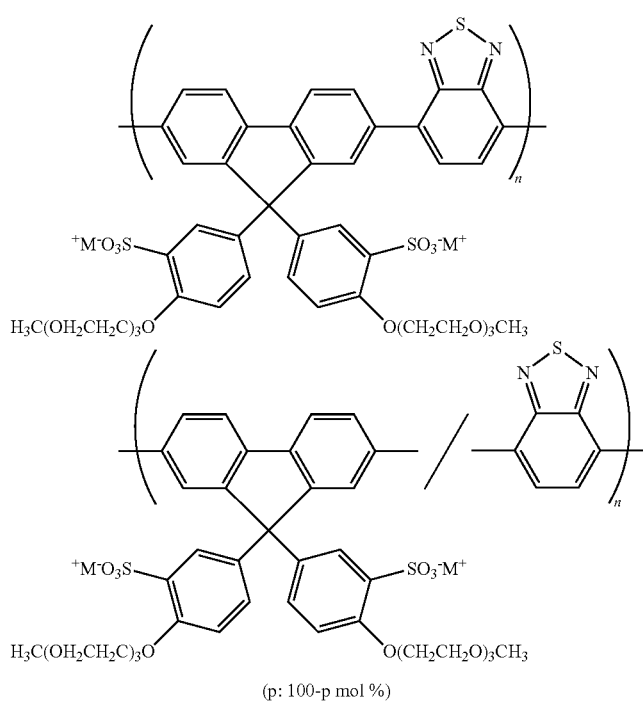
(p: 100-p mol %)

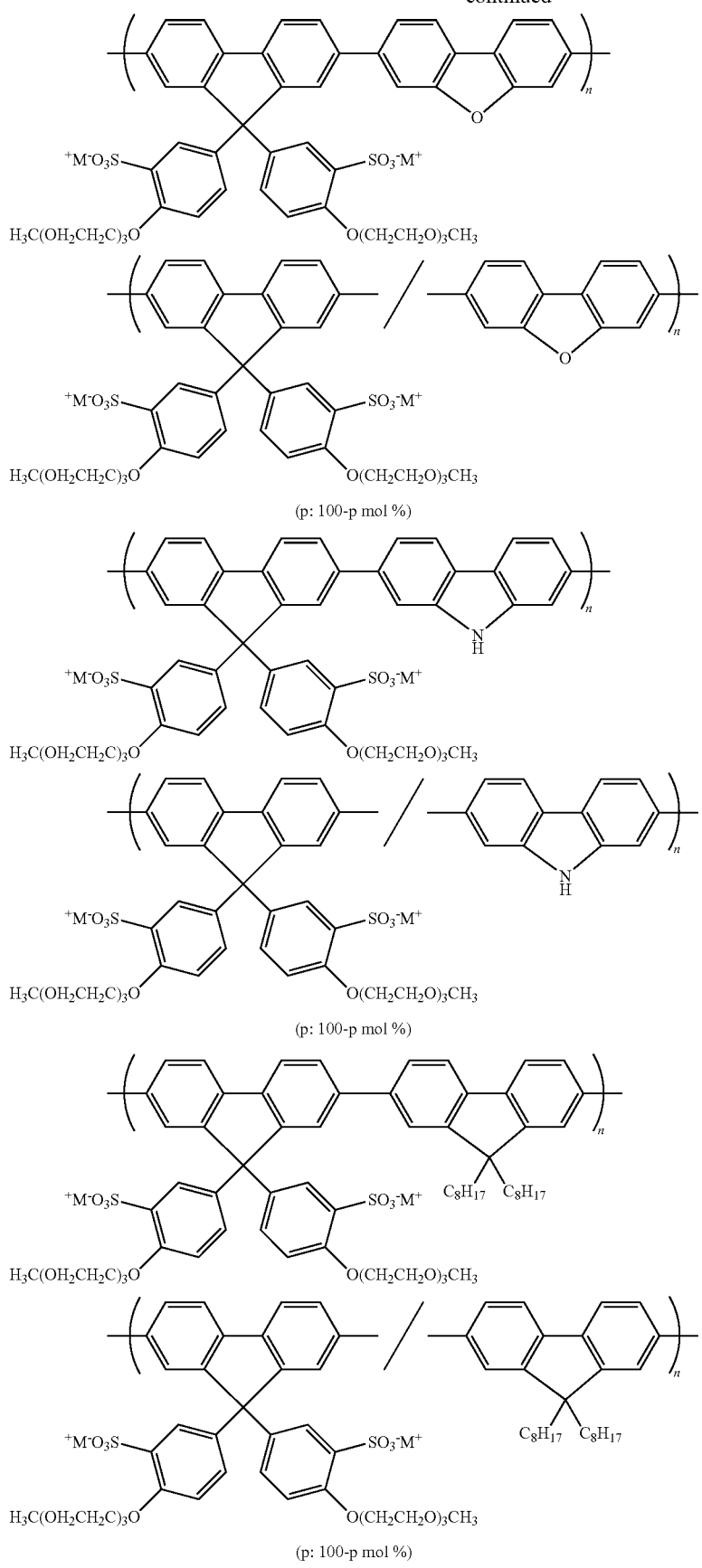

-continued
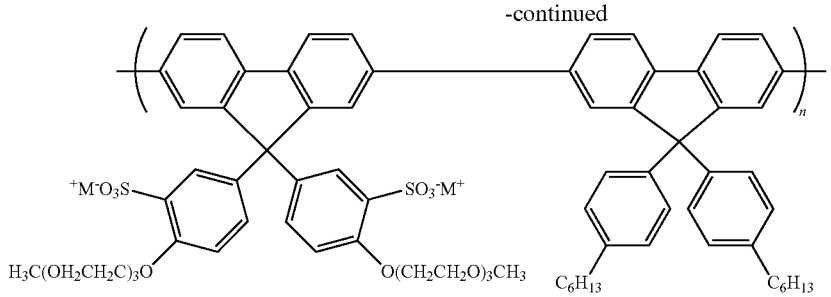
[Chemical Formula 58]
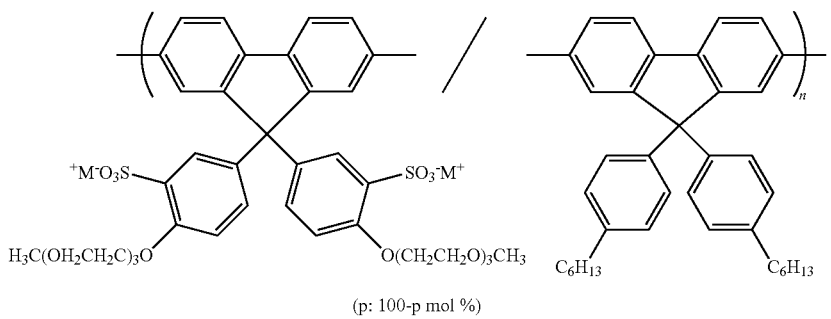
(p: 100-p mol %)
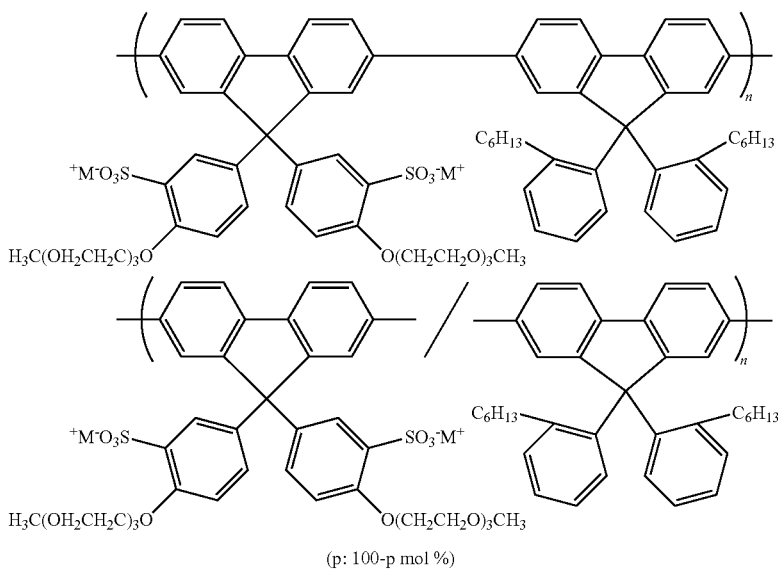
(p: 100-p mol %)
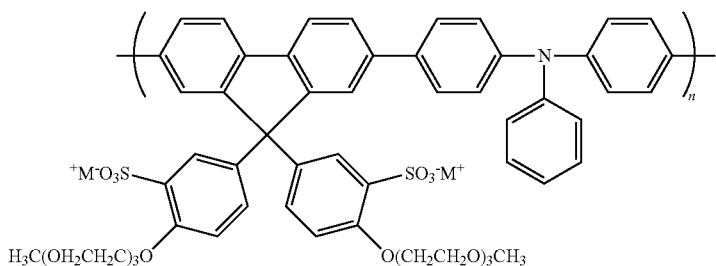

-continued

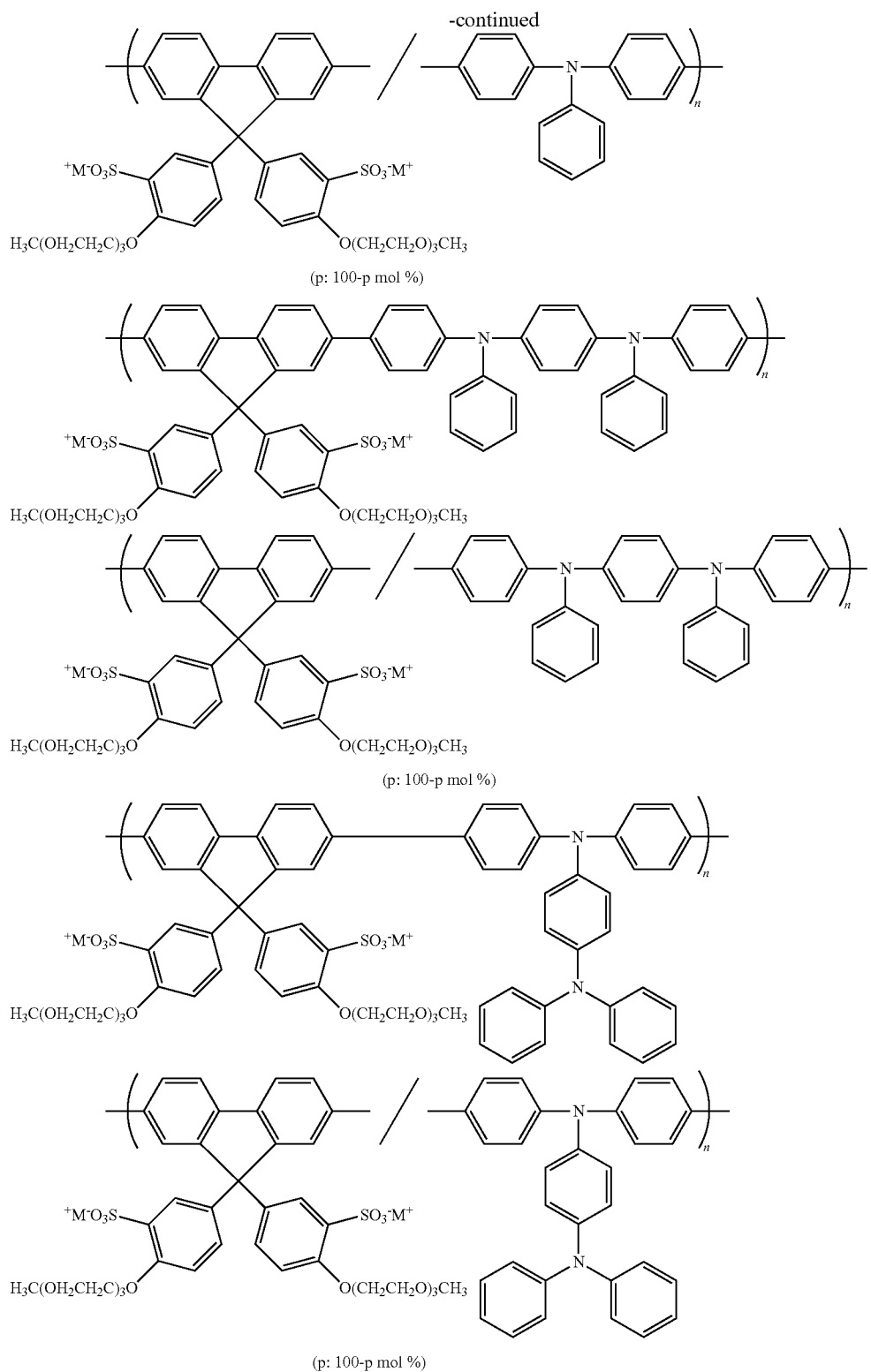

M = Li, Na, K, Cs (In formulae, p represents a number of from 15 to 100).

Examples of the ionic polymer containing a group represented by Formula (2) and a group represented by Formula (3) may include: an ionic polymer consisting of a group represented by Formula (26) alone; an ionic polymer consisting of a group represented by Formula (26) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (27) alone; an ionic polymer consisting of a group represented by Formula (27) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (28) alone; an ionic polymer consisting of a group represented by Formula (28) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (31) alone; an ionic polymer consisting of a group represented by Formula (31) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110; an ionic polymer consisting of a group represented by Formula (32) alone; and an ionic polymer consisting of a group represented by Formula (32) and one or more groups selected from the group consisting of groups remaining after eliminating two hydrogen atoms from groups represented by Formula 45 to Formula 50, Formula 59, Formula 60, Formula 77, Formula 80, Formula 91, Formula 92, Formula 96, and Formula 101 to Formula 110.

Examples of the ionic polymer containing a group represented by Formula (2) and a group represented by Formula (3) may include the macromolecular compounds below. Among these macromolecular compounds, in macromolecular compounds represented by a formula in which two types of structural unit are delimited by the slash "/", the ratio of the left structural unit is p % by mole and the ratio of the right structural unit is (100-p) % by mole, and these structural units are arranged at random. In the formulae below, n represents the degree of a polymerization.

[Chemical Formula 59]

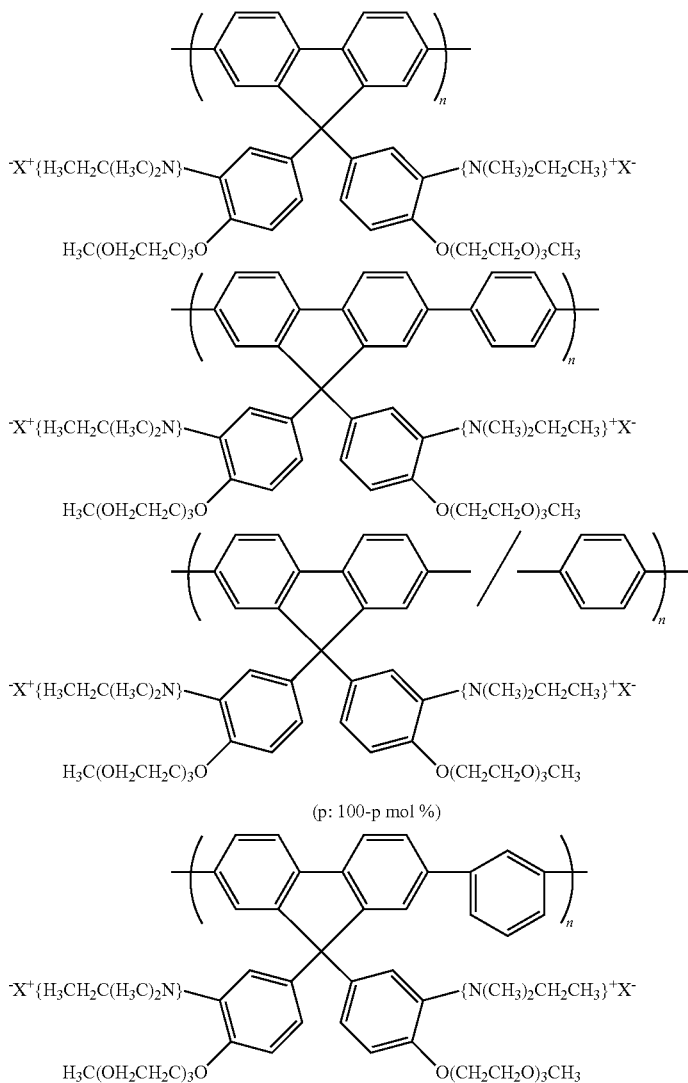

-continued
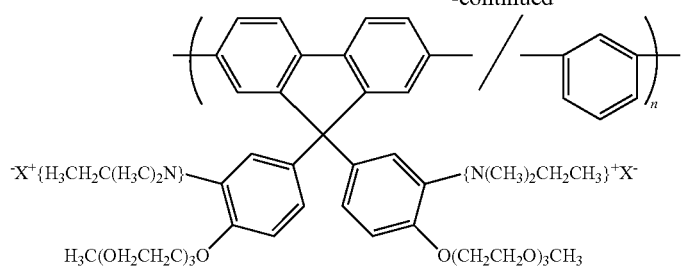
(p: 100-p mol %)
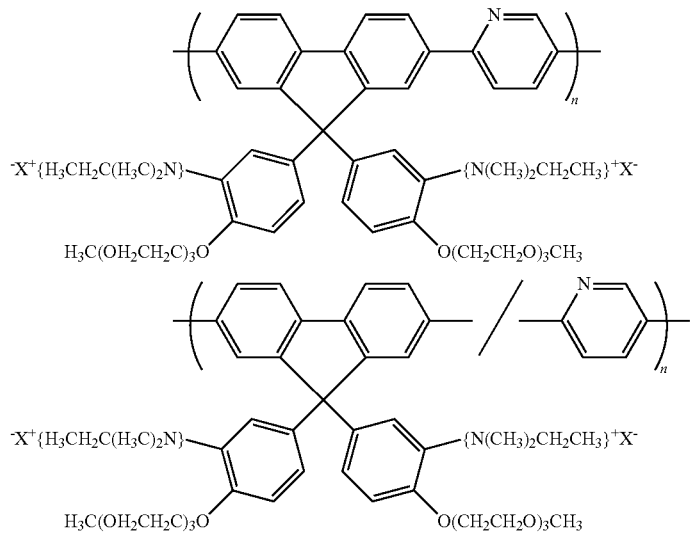
(p: 100-p mol %)
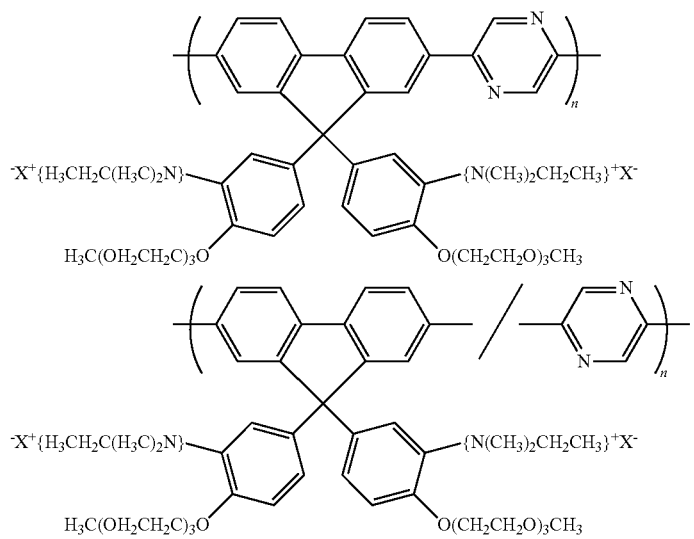
(p: 100-p mol %)
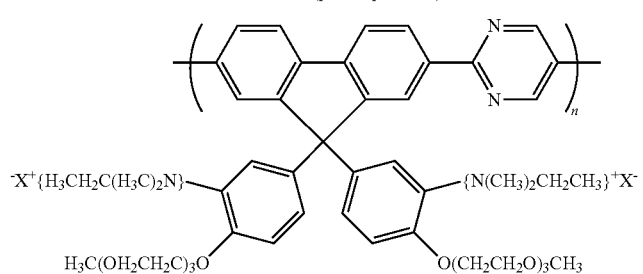

-continued
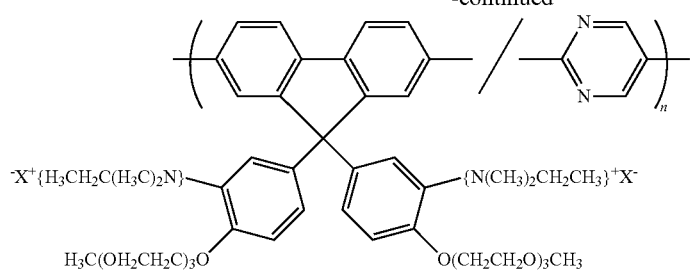
(p: 100-p mol %)
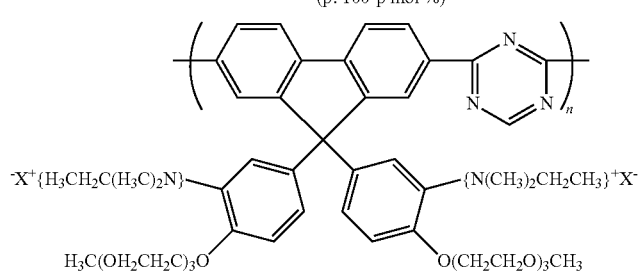
[Chemical Formula 60]
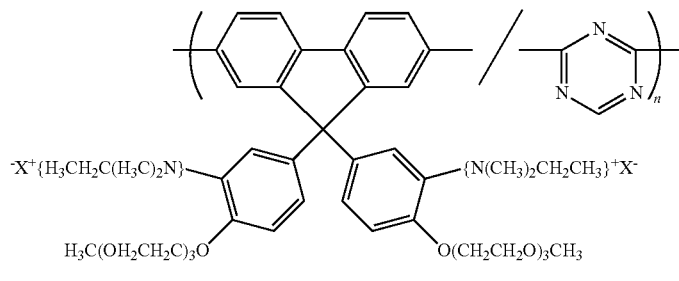
(p: 100-p mol %)
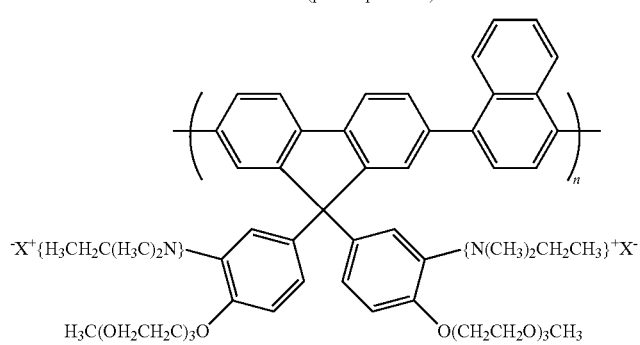
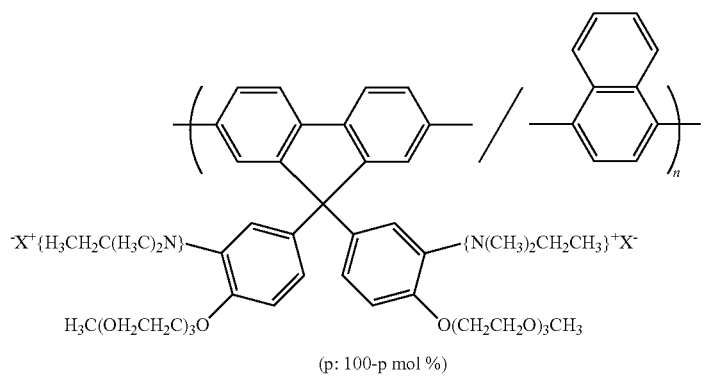
(p: 100-p mol %)

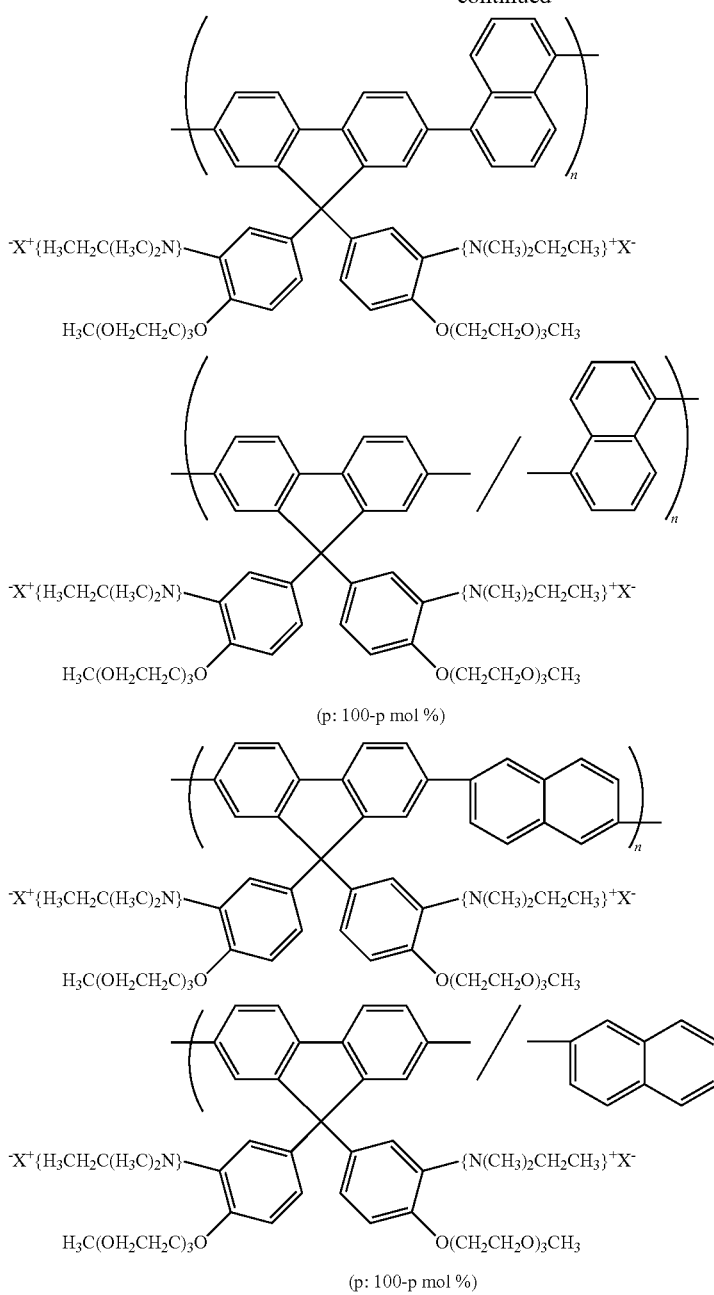
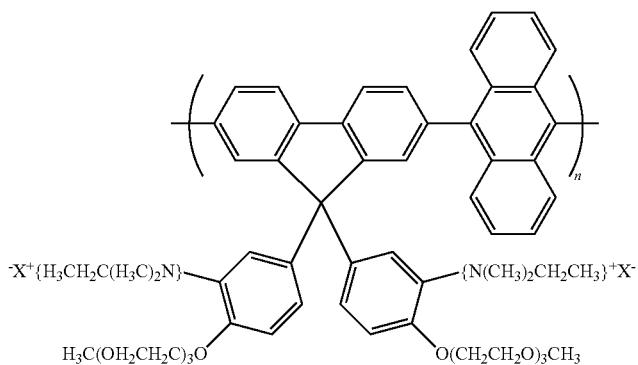

-continued
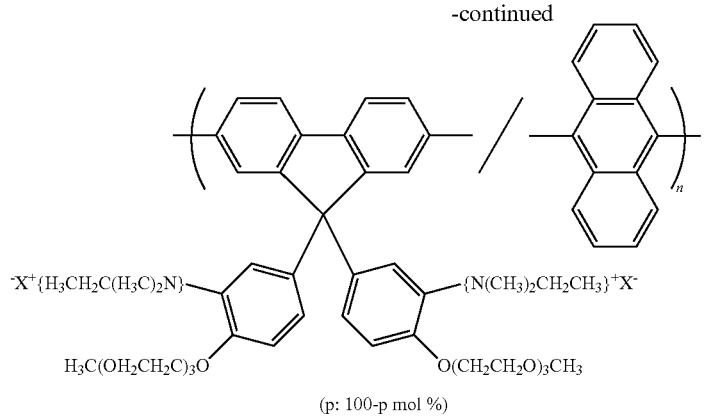
(p: 100-p mol %)
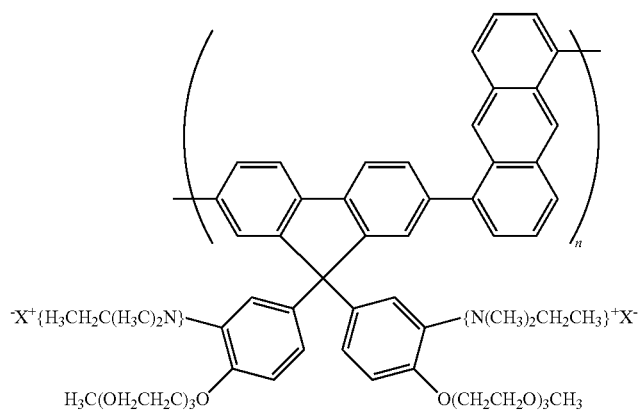
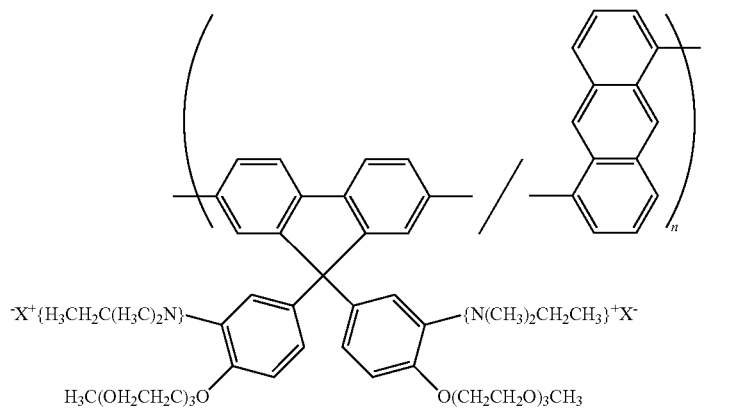
(p: 100-p mol %)
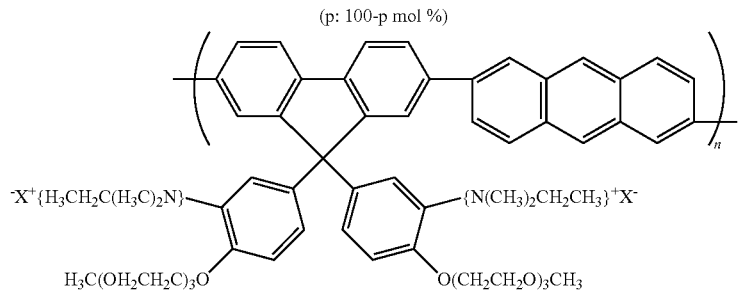

[Chemical Formula 61]
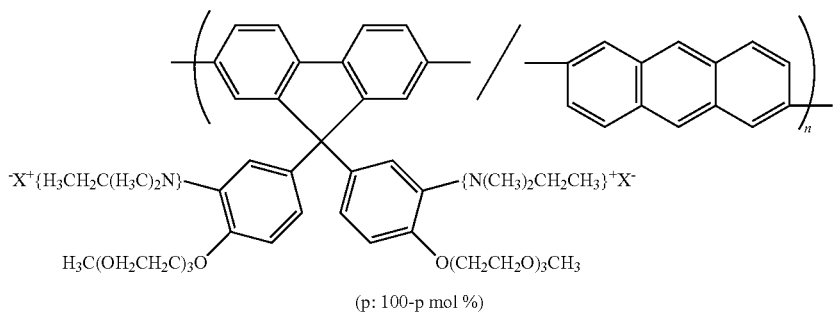
(p: 100-p mol %)
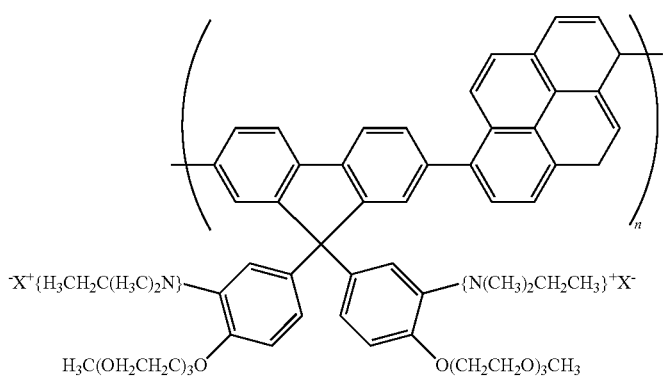
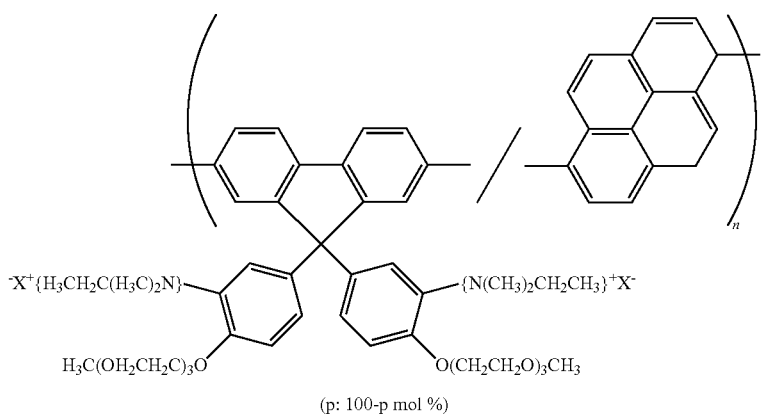
(p: 100-p mol %)
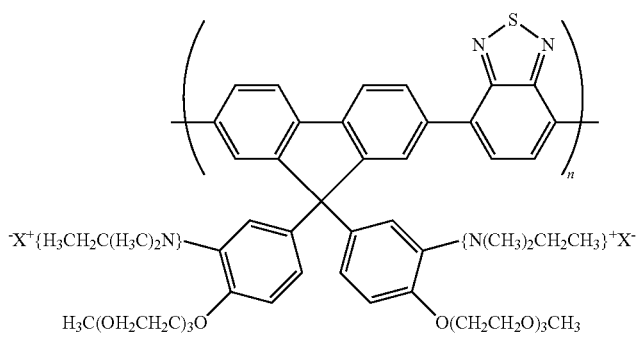

-continued
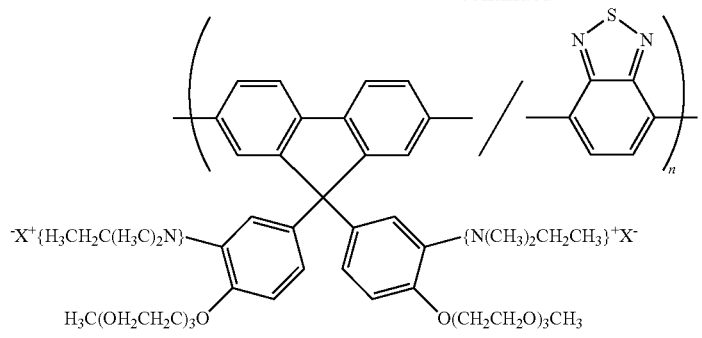
(p: 100-p mol %)
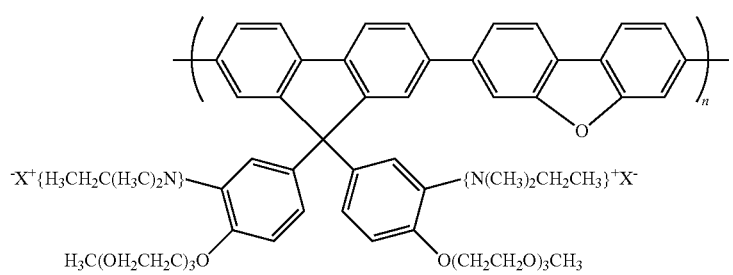
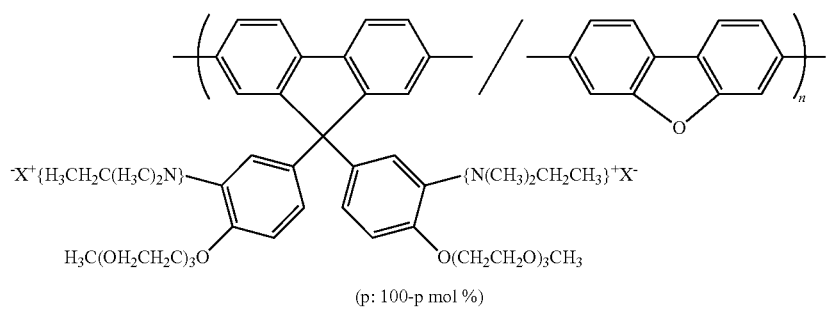
(p: 100-p mol %)
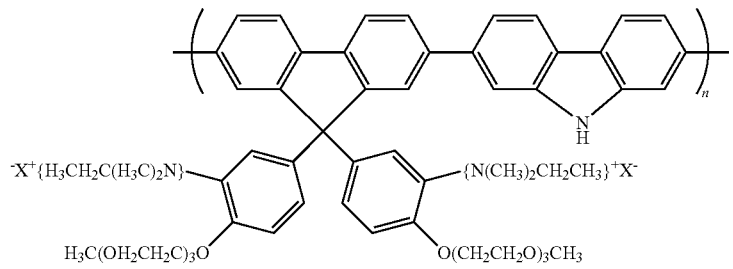
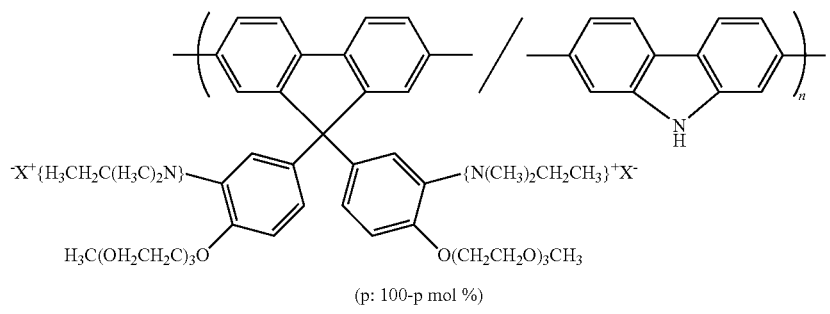
(p: 100-p mol %)

-continued
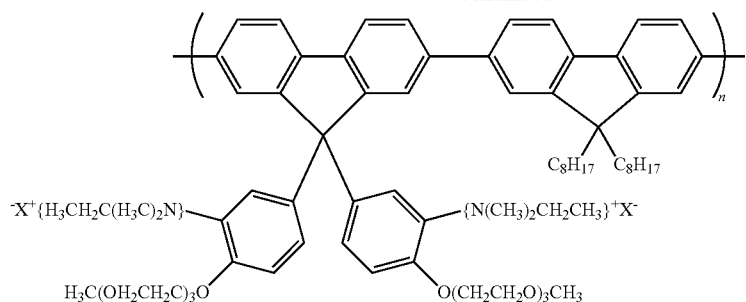
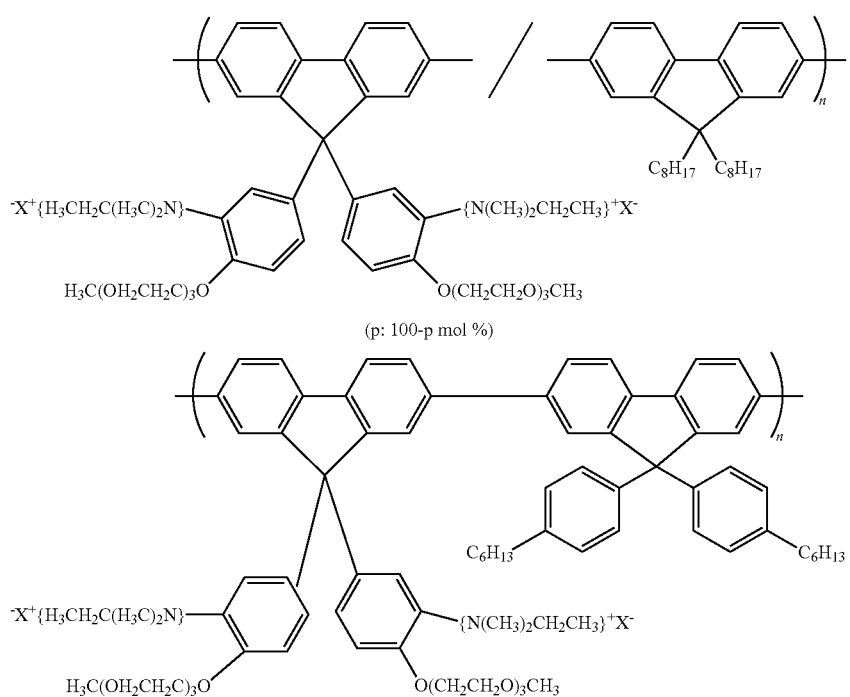
(p: 100-p mol %)
[Chemical Formula 62]
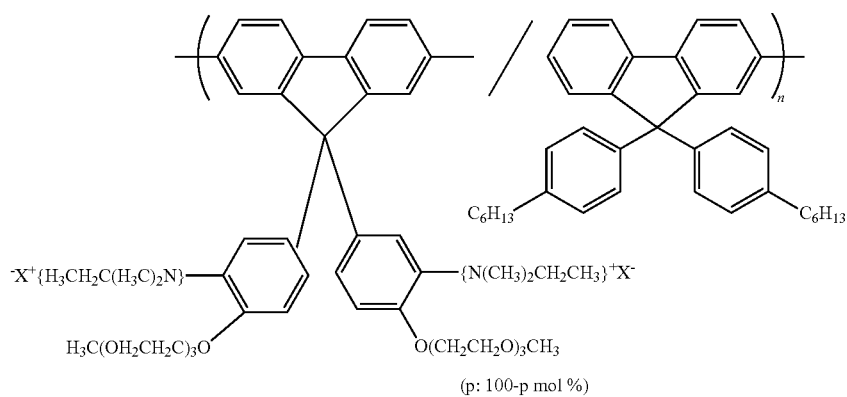
(p: 100-p mol %)

-continued
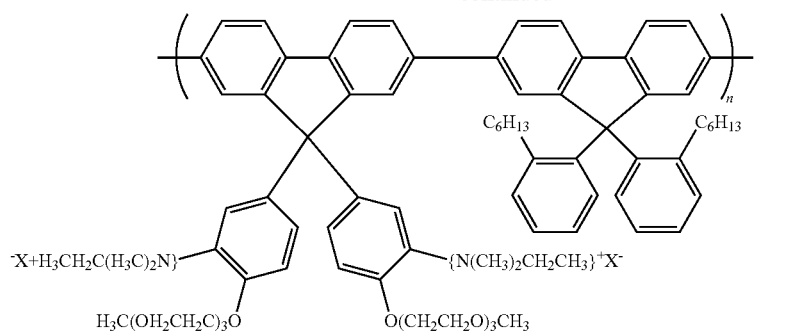
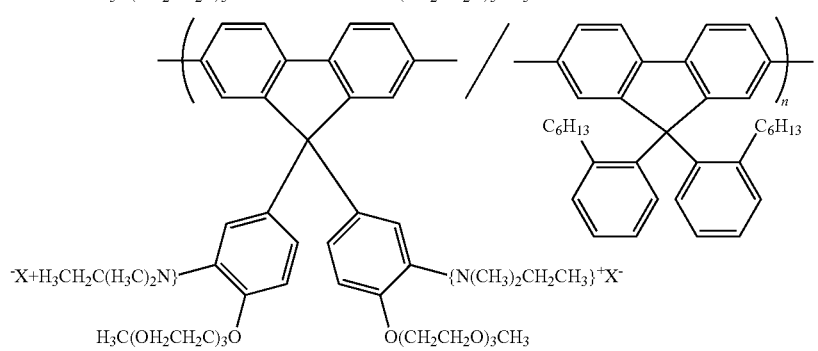
(p: 100-p mol %)
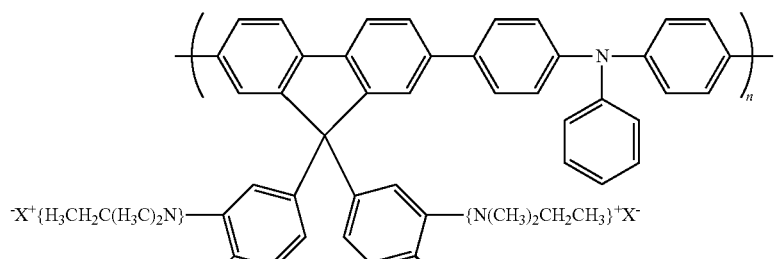
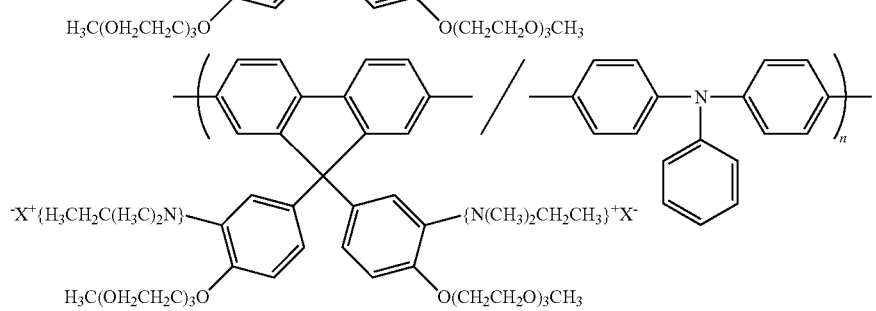
(p: 100-p mol %)
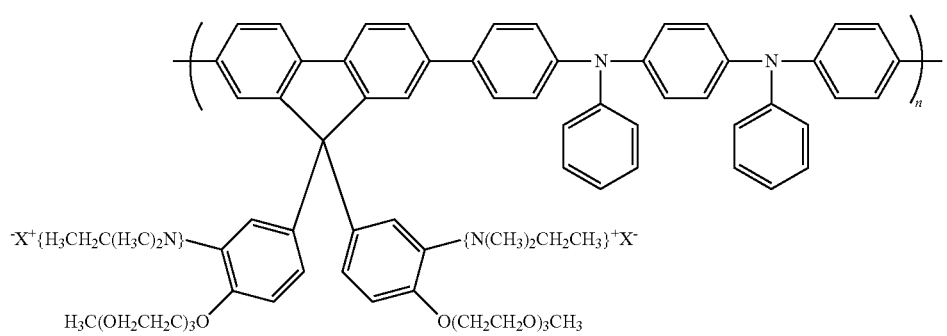

-continued

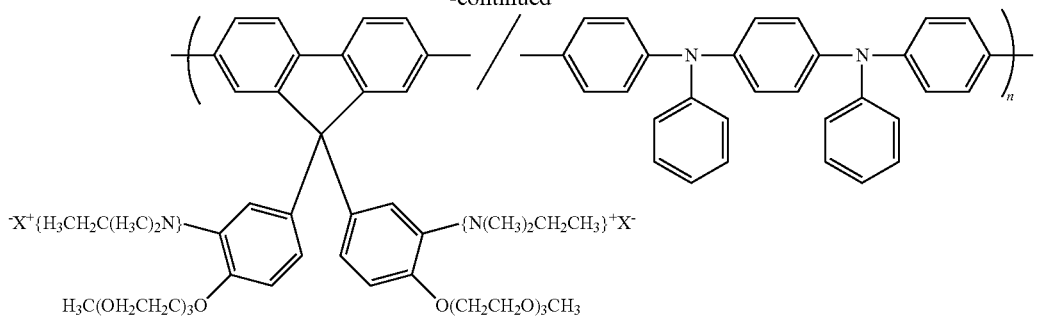

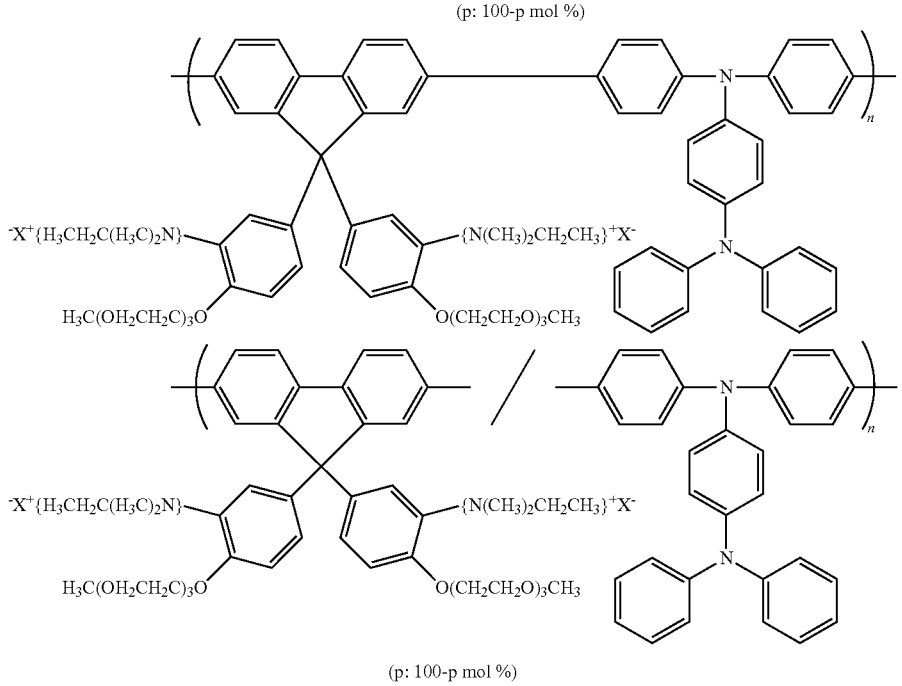

(p: 100-p mol %)

X = F, Cl, Br, I, BPh₄, CF₃SO₃, CH₃COO (In formulae, p represents a number of from 15 to 100).

Method for Preparing Ionic Polymer

Next, a method for preparing the ionic polymer used in the present invention is described. Examples of a preferred method for preparing the ionic polymer used in the present invention may include a method comprising: selecting as one of the raw materials, for example, a compound represented by Formula (36) below to be used, particularly containing in the reaction mixture as an essential raw material, at least one type of a compound in which -$A_a$- in General Formula (36) is a structural unit represented by Formula (13), a compound in which -$A_a$- is a structural unit represented by Formula (15), a compound in which -$A_a$- is a structural unit represented by Formula (17), and a compound in which -$A_a$- is a structural unit represented by Formula (20), particularly; and subjecting the reaction mixture to the condensation-polymerization.

$$Y^4\text{-}A_a\text{-}Y^5 \quad (36)$$

(In Formula (36), $A_a$ represents a repeating unit containing one or more types of groups selected from the group consisting of a group represented by Formula (1) and a group represented by Formula (2) and one or more types of groups represented by Formula (3); and $Y^4$ and $Y^5$ each independently represent a group involved in the condensation-polymerization).

When in the ionic polymer used in the present invention, a structural unit besides -$A_a$- is contained together with a structural unit represented by -$A_a$- in Formula (36), a compound having two substituents to be involved in the condensation-polymerization that becomes another structural unit besides -$A_a$- is used and may be allowed to coexist with a compound represented by Formula (36) to be subjected to the condensation-polymerization.

Examples of the compound having two condensation-polymerizable substituents used for containing such another structural unit include compounds represented by Formula (37). Thus, by subjecting to the condensation-polymerization, a compound represented by Formula (37) in addition to a compound represented by $Y^4\text{-}A_a\text{-}Y^5$, an ionic polymer further having a structural unit represented by -$A_b$- used in the present invention may be prepared.

$$Y^6\text{-}A_b\text{-}Y^7 \quad (37)$$

(In Formula (37), $A_b$ is a structural unit represented by General Formula (33) or a structural unit represented by General Formula (35); and $Y^6$ and $Y^7$ each independently represent a group involved in the condensation-polymerization).

Examples of such a group ($Y^4$, $Y^5$, $Y^6$, and $Y^7$) involved in the condensation-polymerization may include a hydrogen atom, a halogen atom, an alkyl sulfonate group, an aryl sulfonate group, an arylalkyl sulfonate group, a boric acid ester residue, a sulfonium methyl group, a phosphonium methyl group, a phosphonate methyl group, a monohalogenated methyl group, —B(OH)$_2$, a formyl group, a cyano group, and a vinyl group.

Examples of the halogen atom capable of being selected as such a group involved in the condensation-polymerization may include a fluorine atom, a chlorine atom, a bromine atom, and an iodine atom.

Examples of the alkyl sulfonate group capable of being selected as the group involved in the condensation-polymerization may include a methane sulfonate group, an ethane sulfonate group, and a trifluoromethane sulfonate group, and examples of the aryl sulfonate group capable of being selected as the group involved in the condensation-polymerization may include a benzene sulfonate group and a p-toluene sulfonate group.

Examples of the arylalkyl sulfonate group capable of being selected as the group involved in the condensation-polymerization may include a benzyl sulfonate group.

Examples of the boric acid ester residue capable of being selected as the group involved in the condensation-polymerization may include the groups represented by formulae below.

[Chemical Formula 63]

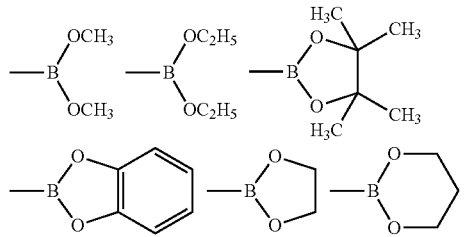

Moreover, examples of the sulfoniummethyl group capable of being selected as the group involved in the condensation-polymerization may include a group represented by a formula:

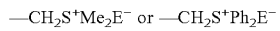

wherein E represents a halogen atom and Ph represents a phenyl group, which are the same also hereinafter.

Examples of the phosphoniummethyl group capable of being selected as the group involved in the condensation-polymerization may include a group represented by a formula:

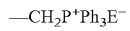

wherein E represents a halogen atom.

Examples of the phosphonate methyl group capable of being selected as the group involved in the condensation-polymerization include a group represented by a formula:

wherein $R^d$ represents an alkyl group, an aryl group, or an arylalkyl group.

Moreover, examples of the monohalogenated methyl group capable of being selected as the group involved in the condensation-polymerization may include a methyl fluoride group, a methyl chloride group, a methyl bromide group, and a methyl iodide group.

Moreover, the group preferred as the group involved in the condensation-polymerization varies depending on the type of the polymerization reaction. Examples of the group preferred as the group involved in the condensation-polymerization may include, when a 0 valent nickel complex for the Yamamoto coupling reaction, for example, is used, a halogen atom, an alkyl sulfonate group, an aryl sulfonate group, and an arylalkyl sulfonate group. When a nickel catalyst or a palladium catalyst for the Suzuki coupling reaction, for example, is used, suitable examples may include an alkyl sulfonate group, a halogen atom, a boric acid ester residue, and —B(OH)$_2$, and the like. When an oxidation polymerization is performed either with an oxidant or electrochemically, suitable examples may include a hydrogen atom.

To prepare the ionic polymer used in the present invention, adopted may be, for example, a polymerization method comprising: dissolving, if necessary, a compound (monomer) represented by General Formula (36) or (37) having the groups involved in the condensation-polymerization in a plurality in an organic solvent; and subjecting the resultant solution to the reaction at a temperature that is a melting point of the organic solvent or higher and a boiling point of the organic solvent or lower using an alkali or an appropriate catalyst. As such a polymerization method, adopted may be publicly known methods described in, for example, "Organic Reactions, vol. 14, pp. 270-490 (1965), published by John Wiley & Sons, Inc.", "Organic Syntheses, Collective Volume VI, pp. 407-411 (1988), published by John Wiley & Sons, Inc.", "Chemical Review (Chem. Rev.), vol. 95, p. 2457 (1995)", "Journal of Organometallic Chemistry (J. Organomet. Chem.), vol. 576, p. 147 (1999)", and "Macromolecular Chemistry, Macromolecular Symposium (Macromol. Chem., Macromol. Symp.) vol. 12, p. 229 (1987)".

To prepare the ionic polymer used in the present invention, according to the group involved in the condensation-polymerization, a known condensation-polymerization reaction may be adopted. Examples of such a polymerization method may include: a method for polymerizing the relevant monomer by the Suzuki coupling reaction; a method for polymerizing the relevant monomer by the Grignar reaction; a method for polymerizing the relevant monomer by a Ni(0) complex; a method for polymerizing the relevant monomer by an oxidant such as FeCl$_3$; a method for polymerizing the relevant monomer by an electrochemical oxidation polymerization; and a method for polymerizing the relevant monomer by a decomposition of an intermediate polymer having an appropriate leaving group. Among such polymerization reactions, the method for polymerizing by the Suzuki coupling reaction, the method for polymerizing by the Grignard reaction, and the method for polymerizing by a nickel 0 valent complex are preferred in terms of easy control of the structure of the obtained ionic polymer.

One embodiment of the preferred method for preparing the ionic polymer used in the present invention is a method for preparing the ionic polymer comprising: using raw material monomers having as the group involved in the condensation-polymerization, a group selected from the group consisting of a halogen atom, an alkyl sulfonate group, an aryl sulfonate group, and an arylalkyl sulfonate group; and subjecting the raw material monomers to the condensation-polymerization in the presence of a nickel 0 valent complex. Examples of the raw material monomers used for such a method may include a dihalogenated compound, a bis(alkyl sulfonate) compound, a bis(aryl sulfonate) compound, a bis(arylalkyl sulfonate) compound, a halogen-alkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound, and an aryl sulfonate-arylalkyl sulfonate compound.

Another embodiment of the preferred method for preparing the ionic polymer is a method for preparing the ionic polymer comprising: using raw material monomers having as the group involved in the condensation-polymerization, a group selected from the group consisting of a halogen atom, an alkyl sulfonate group, an aryl sulfonate group, an arylalkyl sulfonate group, —B(OH)$_2$, and a boric acid ester residue, the raw material monomers in which the ratio (K/J) of the total (J) of the number of moles of a halogen atom, an alkyl sulfonate group, an aryl sulfonate group, and an arylalkyl sulfonate group that all raw material monomers have and the total (K) of the number of moles of —B(OH)$_2$ and a boric acid ester residue that all raw material monomers have, is substantially 1 (usually, K/J is in a range of 0.7 to 1.2); and subjecting the raw material monomers to the condensation-polymerization in the presence of a nickel catalyst or a palladium catalyst.

The organic solvent varies depending on the used compounds and the used reaction. As the organic solvent an organic solvent subjected thoroughly to deoxygenation treatment is preferably used generally in order to suppress a side reaction. When the ionic polymer is prepared, the reaction is preferably progressed using such an organic solvent in an inert gas atmosphere. The organic solvent is preferably subjected also to a dehydration treatment like to the deoxygenation treatment, provided that this may not be the case for the reaction in a two-phase system with water such as the Suzuki coupling reaction.

Examples of such an organic solvent may include: a saturated hydrocarbon such as pentane, hexane, heptane, octane, and cyclohexane; an unsaturated hydrocarbon such as benzene, toluene, ethylbenzene, and xylene; a halogenated saturated hydrocarbon such as carbon tetrachloride, chloroform, dichloromethane, chlorobutane, bromobutane, chloropentane, bromopentane, chlorohexane, bromohexane, chlorocyclohexane, and bromocyclohexane; a halogenated unsaturated hydrocarbon such as chlorobenzene, dichlorobenzene, and trichlorobenzene; alcohols such as methanol, ethanol, propanol, isopropanol, butanol, and tert-butyl alcohol; carboxylic acids such as formic acid, acetic acid, and propionic acid; ethers such as dimethyl ether, diethyl ether, methyl tert-butyl ether, tetrahydrofuran, tetrahydropyran, and dioxane; amines such as trimethylamine, triethylamine, N,N,N',N'-tetramethylethylenediamine, and pyridine; and amides such as N,N-dimethylformamide, N,N-dimethylacetamide, N,N-diethylacetamide, and N-methylmorpholine oxide. These organic solvents may be used individually or in combination of two or more types of these. Among such organic solvents, from the viewpoint of the reactivity, ethers are more preferred, tetrahydrofuran and diethyl ether are further preferred, and from the viewpoint of the reaction rate, toluene and xylene are preferred.

Upon preparing the ionic polymer, in order to react the raw material monomers, an alkali or an appropriate catalyst is preferably added. Such an alkali or a catalyst may be selected according to the adopted polymerization method. Such an alkali and a catalyst are preferably those capable of being thoroughly dissolved in the solvent used for the reaction. Examples of the method for mixing the alkali or the catalyst may include a method in which while stirring the reaction mixture in an inert gas atmosphere such as argon and nitrogen, a solution of the alkali or the catalyst is slowly added thereto and a method in which the reaction mixture is slowly added to a solution of the alkali or the catalyst.

In the ionic polymer used in the present invention, when a polymerization-active group as it is remains at the position of a terminal group, there is such a probability that the light-emitting characteristics and the life characteristics of the obtained light-emitting element might lower, so that the terminal group may also be protected with a stable group. Thus, in the case where the terminal group is protected with a stable group, when the ionic polymer used in the present invention is a conjugated compound, the ionic polymer has preferably a conjugated bond in continuity from a conjugated structure of the main chain of the ionic polymer. Examples of such a structure may include a structure in which the terminal group is bonded with an aryl group or a heterocyclic group through a carbon-carbon bond. Examples of such a stable group for protecting the terminal group may include a substituent such as a monovalent aromatic compound group represented by a structural formula of [Chemical Formula 10] in JP 9-45478 A.

Another preferred method for preparing an ionic polymer containing a structural unit represented by Formula (1) may be a method in which at a first step, an ionic polymer having no cation is polymerized and at a second step, an ionic polymer containing a cation is prepared from the ionic polymer. The method for polymerizing the ionic polymer having no cation at the first step may be the above-described condensation-polymerization reaction. The reaction at the second step may be a hydrolysis reaction with a metal hydroxide, an alkylammonium hydroxide, or the like.

Another preferred method for preparing an ionic polymer containing a group represented by Formula (2) may be a method in which at a first step, an ionic polymer having no ion is polymerized and at a second step, an ionic polymer containing an ion is prepared from the ionic polymer. The method for polymerizing the ionic polymer having no ion at the first step may be the above-described condensation-polymerization reaction. The reaction at the second step may be a reaction for converting an amine into a quaternary ammonium salt using a halogenated alkyl and a halogen abstraction reaction by $SbF_5$.

The ionic polymer used in the present invention is excellent in generating electric charges, whereby an element emitting light with a high brightness may be obtained.

Examples of the method for forming a layer containing the ionic polymer may include a method for film-forming using a solution containing the ionic polymer.

As the solvents used for such film-forming from a solution, among the solvents such as alcohols, ethers, esters, nitrile compounds, nitro compounds, halogenated alkyls, halogenated aryls, thiols, sulfides, sulfoxides, thioketones, amides, and carboxylic acids except water, preferred are solvents having a solubility parameter of 9.3 or more. Examples of the solvent (a value in each parenthesis represents the value of solubility parameter of each solvent) may include methanol (12.9), ethanol (11.2), 2-propanol (11.5), 1-butanol (9.9), tert-butyl alcohol (10.5), acetonitrile (11.8), 1,2-ethandiol (14.7), N,N-dimethylformamide (11.5), dimethylsulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and a solvent mixture of these solvents. Here, the solvent mixture prepared by mixing two types of solvents (solvent 1 and solvent 2) is described as follows. The solubility parameter ($\delta_m$) of the solvent mixture is to be obtained according to an equation: $\delta_m = \delta_1 \times \varphi_1 + \delta_2 \times \varphi_2$ ($\delta_1$ is the solubility parameter of the solvent 1; $\varphi_1$ is the volume fraction of the solvent 1; $\delta_2$ is the solubility parameter of the solvent 2; and $\varphi_2$ is the volume fraction of the solvent 2).

The optimal value of the thickness of the layer containing the ionic polymer varies depending on the used ionic polymer. The thickness of the layer containing the ionic polymer may be selected so that the driving voltage and the light-emitting efficacy will be moderate values. The thickness of the layer containing the ionic polymer needs to be large enough to cause no pin hole. From the viewpoint of reducing the driving voltage of the element, the layer containing the ionic polymer has a thickness of preferably 1 nm to 1 µm, more preferably 2 nm to 500 nm, and further preferably 2 nm to 200 nm. From the viewpoint of protecting the light-emitting layer, the thickness of the layer containing the ionic polymer is preferably 5 nm to 1 µm.

(Electron Injection Layer)

The electron injection layer is a layer having a function of improving the electron injection efficiency from the cathode 34 or the charge generation layer 70. The electron injection layer 44 formed between the xth light-emitting layer 50 arranged closest to the cathode 34 among the light-emitting layers 50 and the cathode 34, that is, the electron injection layer 44 formed in the xth light-emitting unit 80 has a function of improving the electron injection efficiency from the cathode 34. The electron injection layers formed in the light-emitting units 80 other than the xth light-emitting unit 80 have a function of improving the electron injection efficiency from the charge generation layer 70. The electron injection layer 44 formed in the xth light-emitting unit 80 contains the ionic polymer for improving the electron injection efficiency to the light-emitting layers. This electron injection layer 44 is provided so as to come into contact with the cathode 34. The electron injection layers 44 may be formed by a coating method using a coating liquid in which the ionic polymer is dissolved in any suitable solvent. The ionic polymer making up at least part of the charge generation layer 70 and the ionic polymer making up each electron injection layers 44 are compounds that are the same as or different from each other. The electron injection layer is not limited to the ionic polymer and may be made up of publicly known electron injection material.

Examples of the coating method may include a spin coating method, a casting method, a microgravure coating method, a gravure coating method, a bar coating method, a roll coating method, a wire bar coating method, a dip coating method, a spray coating method, a screen printing method, a flexo printing method, an offset printing method, and an inkjet printing method.

(Charge Generation Layer)

The charge generation layer 70 is a layer generating a hole and an electron by applying an electric field. The charge generation layer 70 is made up of the ionic polymer contained. The charge generation layer 70 is made up of (1) a single layer body consisting of a single layer or (2) a layered body formed by stacking a plurality of layers.

When the charge generation layer 70 is made up of a single layer, the embodiments of the material contained in the charge generation layer 70 are as follows:

(i) containing an ionic polymer having in one polymer, a moiety generating an electron by applying the electric field and a moiety generating a hole by applying the electric field,
(ii) containing an ionic polymer generating an electron by applying the electric field and an ionic polymer of a type different from the type of the ionic polymer, which generates a hole by applying the electric field,
(iii) containing an ionic polymer generating an electron by applying the electric field and another functional constituent generating a hole by applying the electric field, and
(iv) containing another functional constituent generating an electron by applying the electric field and an ionic polymer generating a hole by applying the electric field.

"Another functional constituent" is a material made of a material different from the "ionic polymer" according to the present invention and having a characteristic of being difficult to be degraded even in the atmosphere like the "ionic polymer" according to the present invention.

When the charge generation layer 70 is made up of a plurality of layers, the charge generation layer 70 is preferably made up of the electron generation layer 72 generating an electron by applying the electric field and the hole generation layer 74 generating a hole by applying the electric field.

In this case, the ionic polymer is a polymer generating an electron or a hole by applying the electric field and is contained in at least any one of the electron generation layer 72 and the hole generation layer 74.

The embodiments of the material contained in the electron generation layer 72 and the hole generation layer 74 are as follows:

(i) the electron generation layer 72 contains the ionic polymer generating an electron by applying the electric field and the hole generation layer 74 contains the ionic polymer generating a hole by applying the electric field,
(ii) the electron generation layer 72 contains the ionic polymer having a function of generating an electron by applying the electric field and the hole generation layer 74 contains another functional constituent having a function of generating a hole by applying the electric field, and
(iii) the electron generation layer 72 contains another functional constituent having a function of generating an electron by applying the electric field and the hole generation layer 74 contains the ionic polymer having a function of generating a hole by applying the electric field.

(First Substrate and Second Substrate)

The first substrate 22 and the second substrate 24 may be each a rigid substrate, a flexible substrate, or a film. By using such a flexible substrate or film, a flexible organic EL element as a whole may be achieved.

As at least any one of the first substrate 22 and the second substrate 24, a substrate exhibiting optical transparency is used. When light is taken out through one of the first substrate 22 and the second substrate 24, an opaque substrate may be used as the other substrate.

In the present specification, "light" means an electromagnetic wave in a wavelength range of 1 nm to around 1 mm. "Exhibiting optical transparency" means at least a part of the light having a prescribed wavelength and entering the member is emitted from the member. The first substrate 22 preferably exhibits optical transparency relative to visible light. "Visible light" means an electromagnetic wave in a wavelength range perceivable by the human eyes. Visible light has generally a wavelength of around 360 nm to 830 nm. Higher optical transparency is preferred for members exhibiting optical transparency. The optical transparency is, for example 10% or more, preferably 25% or more, and more preferably 50% or more.

As the first substrate 22 and the second substrate 24, an insulating substrate exhibiting optical transparency may be used, and a glass substrate may be used, for example. As the first substrate 22 and the second substrate 24, a quartz substrate and a plastic substrate may also be used.

As the first substrate 22 and the second substrate 24, elongated substrates may be used. These substrates are not limited as long as they are insulating films capable of being rolled up in a roll shape. A film made of a colorless and transparent resin material is preferably used. Examples of the resin material used for such elongated substrates may include: polyether sulfon (PES); a polyester resin such as polyethylene terephthalate (PET) and polyethylene naphthalate (PEN); a polyolefin resin such as polyethylene (PE), polypropylene (PP), and cyclic polyolefin; a polyamide resin; a polycarbonate resin; a polystyrene resin; a polyvinyl alcohol resin; a saponified product of an ethylene-vinyl acetate copolymer; a polyacrylonitrile resin; an acetal resin; a polyimide resin; and an epoxy resin.

Among these resin materials, a polyester resin and a polyolefin resin are preferred and polyethylene terephthalate and polyethylene naphthalate are particularly preferred, because these resins have high heat resistance and a small linear expansion coefficient and the cost for preparing these resins is low. These resin materials may be used individually or in combination of two or more types of these.

The thickness of each of the first substrate 22 and the second substrate 24 is not particularly limited. The thickness of each of the first substrate 22 and the second substrate 24 may be set as appropriate in view of the stability during the manufacturing step, for example. The thickness of each of the first substrate 22 and the second substrate 24 is preferably in a range of 5 µm to 500 µm, more preferably in a range of 50 µm to 200 µm, particularly preferably in a range of 50 µm to 100 µm.

As the first substrate 22 and the second substrate 24, substrates made of the same material are preferably selected. By preparing the first substrate 22 and the second substrate 24 as substrates made of the same material, these substrates have the same physical characteristics such as linear expansion coefficient, so that at the manufacturing step, stresses occurring in the first substrate 22 and the second substrate 24 negate with each other, whereby a warp may be prevented or reduced. The stress applied to the organic EL element 10 may be therefore effectively reduced.

(Anode and Cathode)

An electrode (at least one of the anode 32 and the cathode 34) in a lighting side for taking out light emitted from the light-emitting layer 50 is prepared as an electrode exhibiting optical transparency. As the electrode exhibiting optical transparency, a metal oxide film, a metal thin film, and the like are used. As the electrode exhibiting optical transparency, for example, used is a thin film containing indium oxide, zinc oxide, tin oxide, indium tin oxide (ITO), indium zinc oxide (IZO), gold, platinum, silver, copper, or the like. The electrode exhibiting optical transparency is preferably formed particularly using a thin film containing ITO, IZO, or tin oxide.

The material for an opaque electrode that may not have optical transparency is preferably a material having a small work function and injecting easily an electron into the light-emitting layer. It is preferred that as the material for an opaque electrode, a material having a high electric conductivity is used. A configuration in which light emitted from the light-emitting layer 50 is reflected to the lighting side is preferred.

As the opaque electrode, a metal such as an alkali metal, an alkaline earth metal, a transition metal, and a metal of the XIII Group in the Periodical Table may be used. Specifically, the material for the opaque electrode may be a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; an alloy of two or more of these metals; an alloy of one or two or more of these metals with one or two or more of gold, silver, platinum, copper, manganese, titanium, cobalt, nickel, tungsten, and tin; or graphite or a compound in which an atom of the above-described metals is arranged in an interlayer of graphite.

Examples of the alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

For the formation of the cathode 34, any suitable forming method such as a deposition method may be selected according to the selected material. The cathode 34 may also be formed by a coating method using a coating liquid in the same manner as the forming of the electron injection layer as described above.

A conductive material capable of being suitably utilized when the cathode 34 is formed by a coating method may be a conductive macromolecular material. As the conductive macromolecular material, a macromolecular material containing ethylenedioxythiophene is preferred. Specifically a mixed material of 3,4-polyethylenedioxythiophene (PEDOT) used also as a forming material of a hole injection layer and polystyrenesulfonic acid (PSS) (mixing ratio: PEDOT:PSS=1:20)[manufactured by Bayer AG; trade name: Baytron-p] is preferably used. A liquid in which such a conductive macromolecular material is dispersed in a solvent may be used. As this liquid, preferred is a liquid in which 3,4-polyethylenedioxythiophene is dispersed in polystyrenesulfonic acid as a dispersion medium.

In this case, 3,4-polyethylenedioxythiophene is dispersed in polystyrenesulfonic acid as a dispersion medium to produce a liquid. A solution in which the liquid is further dissolved in a polar solvent, such as water and isopropyl alcohol, is preferably used as the coating liquid.

As the conductive material making up the cathode 34, instead of the above-described conductive macromolecular material or together with the conductive macromolecular material, a metal fine particle having conductivity may also be used. When the cathode 34 is made of a mixed material of a conductive macromolecular compound with a metal fine particle, by subjecting the cathode 34 to heating at a relatively low temperature, the conductivity of the cathode 34 becomes possible to be secured. As the metal fine particle, gold, silver, aluminum, and the like are preferably used. Besides the metal fine particle such as gold, silver, and aluminum, a carbon paste and a mixture of a carbon paste and a metal fine particle are preferably used.

When the metal fine particle is adopted as the conductive material, a polar solvent such as water, methanol, ethanol, propanol, isopropyl alcohol (IPA), and dimethyl ketone may be preferably used.

The thickness of the cathode 34 may be selected as appropriate in view of the electric conductivity and the durability. The thickness of the cathode 34 is, for example 10 nm to 10 μm, preferably 20 nm to 1 μm, more preferably 50 nm to 500 nm.

(Light-Emitting Layer)

Next, the light-emitting layer 50 is described. Known as the material making up the light-emitting layer 50 are a fluorescence emission type (singlet transition) and a phosphorescence emission type (triplet transition) and both of them may be used. The light-emitting layer 50 may be formed, for example, by a deposition method or a coating method. As the material for the light-emitting layer, both a low molecular material and a macromolecular material may be utilized. Particularly, because the macromolecular material is easily dissolved in a solvent, the macromolecular material may be suitably applied to a coating liquid in which a light-emitting material is dissolved in a solvent. Accordingly, as the material for the light-emitting layer, the macromolecular-based material capable of being applied to a simple coating method in the same manner as the forming of the electron injection layer described above is preferred. Macromolecule in the present specification means having a number average molecular weight in terms of polystyrene of $10^3$ or more, usually having a number average molecular weight in terms of polystyrene of $10^8$ or less.

The light-emitting layer 50 is formed with containing an organic substance emitting at least one light among a fluorescence and a phosphorescence or containing the organic substance and a dopant. Examples of the light-emitting material making up mainly the light-emitting layer 50 may include the materials below.

(Coloring Material)

Examples of the coloring material may include polymerized products of a cyclopentamine derivative, a tetraphenylbutadiene derivative compound, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a quinacridone derivative, a coumarin derivative, and a pyrazoline dimer.

(Metal Complex Material)

The metal complex material may be polymerized products of a metal complex having as a central metal, aluminum, zinc, beryllium, or a rare earth metal such as terbium, europium, and dysprosium and having as a ligand, oxadiazole, thiazole, phenylpyridine, phenylbenzimidazole, a quinoline structure, or the like.

The metal complex material may be polymerized products of a metal complex having light emission from a triplet excitation state such as an iridium complex and a platinum complex, an aluminum-quinolinole complex, a benzoquinolinole-beryllium complex, a benzoxazolyl-zinc complex, a benzothiazole-zinc complex, an azomethyl-zinc complex, a porphyrin-zinc complex, or an europium complex.

The macromolecular material may be a poly-p-phenylenevinylene derivative, a polythiophene derivative, a poly-p-phenylene derivative, a polysilane derivative, a polyacetylene derivative, a polyfluorene derivative, or a polyvinylcarbazole derivative.

(Dopant Material)

The light-emitting material making up the light-emitting layer may further contain besides the above-described light-emitting materials, for example, a dopant material for the purpose of enhancing the light-emitting efficacy and changing the light-emitting wavelength. Examples of the dopant material may include a perylene derivative, a coumarin derivative, a rubrene derivative, a quinacridone derivative, a squarylium derivative, a porphyrin derivative, styryl dye, a tetracene derivative, a pyrazolone derivative, decacyclene, and phenoxazone.

(Prescribed Layer)

In the embodiment illustrated in FIG. 1, the organic EL element 10 has in addition to the light-emitting layer 50 and the charge generation layer 70, a prescribed layer such as the hole injection layer 42a, the hole transport layer 42b, and the electron injection layer 44. However, the organic EL element of the present invention is not limited to this configuration example.

One example of the prescribed layer and the light-emitting unit comprising the prescribed layer will now be described.

In each light-emitting unit 80, examples of the layer arranged closer to the cathode 34 than the light-emitting layer 50 may include the electron injection layer 44, the electron transport layer, and the hole block layer. In one light-emitting unit 80, when the electron transport layer is provided as a layer besides the electron injection layer 44, a layer arranged closer to the cathode 34 is called the electron injection layer and a layer arranged closer to the light-emitting layer 50 is called the electron transport layer.

In each light-emitting unit 80, examples of the layer arranged closer to the anode 32 than the light-emitting layer 50 may include the hole injection layer, the hole transport layer, and the electron block layer. In one light-emitting unit 80, when both of hole injection layer and the hole transport layer are provided, a layer arranged closer to the anode 32 is called the hole injection layer and a layer arranged closer to the light-emitting layer 50 is called the hole transport layer.

The hole injection layer 42a and the electron injection layer 44 may be named generically "charge injection layer". The hole transport layer 42b and the electron transport layer may be named generically "charge transport layer".

One specific example of the layer configuration of each light-emitting unit is shown as follows.

a) Light-emitting layer
b) Hole injection layer/Light-emitting layer
c) Hole injection layer/Hole transport layer/Light-emitting layer
d) Hole injection layer/Hole transport layer/Light-emitting layer/Electron injection layer
e) Hole injection layer/Hole transport layer/Light-emitting layer/Electron transport layer/Electron injection layer
f) Light-emitting layer/Electron injection layer
g) Light-emitting layer/Electron transport layer/Electron injection layer
h) Hole injection layer/Light-emitting layer/Electron injection layer
i) Hole injection layer/Light-emitting layer/Electron transport layer/Electron injection layer
(the symbol "/" means that two layers sandwiching the symbol "/" are arranged so as to come into contact with each other).

In the light-emitting units of a) to i), the anode is arranged in the left side and the cathode is arranged in the right side. The layer configurations of the light-emitting unit being plurally present may be the same as or different from each other.

The organic EL element 10 may further comprise an insulation layer having a film thickness of around 2 nm or less adjacent to the electrode for enhancing the adhesion with the electrode and improving electric charge injection from the electrode, and for enhancing the adhesion of the interface and preventing the intermixing, in the organic EL element 10, a thin buffer layer may be inserted between the layers adjacent to each other.

The specific configuration of each functional layer will now be described.

(Hole Injection Layer)

The hole injection layer is a layer having a function of improving the hole injection efficiency from the anode 32 or the charge generation layer 70. Examples of the hole injection material making up the hole injection layer may include a phenylamine compound, a star-burst type amine compound, a phthalocyanine compound, an oxide such as vanadium oxide, molybdenum oxide, ruthenium oxide, and aluminum oxide, amorphous carbon, polyaniline, and a polythiophene derivative.

The hole injection layer may be film-formed, by a coating method for applying a coating liquid in which the hole injection material is dissolved in a solvent. As the solvent, any suitable solvent may be used under such a condition that the solvent may dissolve the forming materials of the hole injection layer.

Examples of the solvent may include: water; a chlorine solvent such as chloroform, methylene chloride, and dichloroethane; an ether solvent such as tetrahydrofuran; an aromatic hydrocarbon solvent such as toluene and xylene; a ketone solvent such as acetone and methyl ethyl ketone; and an ester solvent such as ethyl acetate, butyl acetate, and ethylcellosolve acetate.

The hole injection layer may be formed through the coating methods described above.

The optimal value of the thickness of the hole injection layer varies depending on the used material. The thickness of the hole injection layer may be any suitable thickness under such a condition that at least no pin hole will be formed and the driving voltage and the light-emitting efficacy will be moderate values. When the thickness of the hole injection layer is excessively large, the driving voltage of the element increases. Therefore, the thickness of the hole injection layer is, for example 1 nm to 1 μm, preferably 2 nm to 500 nm, and more preferably 5 nm to 200 nm.

(Hole Transport Layer)

The hole transport layer has a function of improving the hole injection from the anode, the hole injection layer, the charge generation layer, or the hole transport layer closer to the anode. Examples of the hole transport material making up the hole transport layer may include polyvinylcarbazole or derivatives thereof, polysilane or derivatives thereof, a polysiloxane derivative having an aromatic amine in side chains or the backbone thereof, a pyrazoline derivative, an arylamine derivative, a stilbene derivative, a triphenyldiamine derivative, polyaniline or derivatives thereof, polythiophene or derivatives thereof, polyarylamine or derivatives thereof, polypyrrole or derivatives thereof, poly(p-phenylenevinylene) or derivatives thereof, and poly(2,5-thienylenevinylene) or derivatives thereof.

Among them, as the hole transport material, used may be a macromolecular hole transport material such as polyvinylcarbazole or derivatives thereof, polysilane or derivatives thereof, a polysiloxane derivative having an aromatic amine in side chains or the backbone thereof, polyaniline or derivatives thereof, polythiophene or derivatives thereof, polyarylamine or derivatives thereof, poly(p-phenylenevinylene) or derivatives thereof, and poly(2,5-thienylenevinylene) or derivatives thereof. As the hole transport material, polyvinylcarbazole or derivatives thereof, polysilane or derivatives thereof, and a polysiloxane derivative having an aromatic amine in side chains or the main chain thereof are further preferred. When a low molecular hole transport material is used, the low molecular hole transport material is preferably dispersed in a macromolecular binder to be used.

In the case where a low molecular hole transport material is used, the forming method of the hole transport layer may be a coating method using a mixed solution of the low molecular hole transport material with a macromolecular binder. In the case where a macromolecular hole transport material is used, the forming method of the hole transport layer may be a coating method using a solution.

The solvent used in the coating method may be a solvent capable of dissolving the hole transport material. Examples of the solvent used in the coating method may include: a chlorine solvent such as chloroform, methylene chloride, and dichloroethane; an ether solvent such as tetrahydrofuran; an aromatic hydrocarbon solvent such as toluene and xylene; a ketone solvent such as acetone and methyl ethyl ketone; and an ester solvent such as ethyl acetate, butyl acetate, and ethylcellosolve acetate.

As the coating method, the method the same as that for forming the electron injection layer described above may be used.

As the macromolecular binder to be mixed with, a macromolecular binder that does not inhibit the electric charge transport is preferred and a macromolecular binder having a weak absorption of visible light is preferred to be used. Examples of such a macromolecular binder may include polycarbonate, polyacrylate, polymethyl acrylate, polymethyl methacrylate, polystyrene, polyvinyl chloride, and polysiloxane.

The thickness of the hole transport layer is selected so that no pin hole will be formed and the driving voltage and the light-emitting efficacy will be moderate values. The optimal value thereof varies depending on the used material. When the thickness of the hole transport layer is excessively large, the driving voltage of the organic EL element might increase. Therefore, the thickness of the hole transport layer is, for example 1 nm to 1 μm, and preferably 2 nm to 500 nm, further preferably nm to 200 nm.

<Electron Transport Layer>

The electron transport layer is a layer having the function of improving the electron injection from the cathode 34 or the electron injection layer 44 or the electron transport layer closer to the cathode 34. Examples of the electron transport material making up the electron transport layer may include an oxadiazole derivative, anthraquinodimethane or derivatives thereof, benzoquinone or derivatives thereof, naphthoquinone or derivatives thereof, anthraquinone or derivatives thereof, tetracyanoanthraquinodimethane or derivatives thereof, a fluorenone derivative, diphenyldicyanoethylene or derivatives thereof, a diphenoquinone derivative, a metal complex of 8-hydroxyquinoline or derivatives thereof, polyquinoline or derivatives thereof, polyquinoxaline or derivatives thereof, and polyfluorene or derivatives thereof.

Among them, as the electron transport material, an oxadiazole derivative, benzoquinone or derivatives thereof, anthraquinone or derivatives thereof, a metal complex of 8-hydroxyquinoline or derivatives thereof, polyquinoline or derivatives thereof, polyquinoxaline or derivatives thereof, and polyfluorene or derivatives thereof are preferred, and 2-(4-biphenylyl)-5-(4-tert-butylphenyl)-1,3,4-oxadiazole, benzoquinone, anthraquinone, tris(8-quinolinol) aluminum, and polyquinoline are further preferred.

Examples of the method for forming the electron transport layer when a low molecular electron transport material is used may include a vacuum deposition method from a powder and a method by film-forming from a solution or a molten state. The method for forming the electron transport layer when a macromolecular electron transport material is used may be a method by film-forming from a solution or a molten state. In the film-forming from a solution or a molten state, a macromolecular binder may be further used in combination. The method for film-forming the electron transport layer from a solution may be the coating methods described above.

The optimal value of the thickness of the electron transport layer varies depending on the used material. The thickness of the electron transport layer needs to be large enough at least to cause no pinhole. The thickness may be selected so that the driving voltage and the light-emitting efficacy will be moderate values. When the thickness of the electron transport layer is excessively large, the driving voltage of the element might increase. Therefore, the thickness of the electron transport layer is, for example 1 nm to 1 μm, preferably 2 nm to 500 nm, and more preferably 5 nm to 200 nm.

<Electron Block Layer>

The electron block layer is a layer having the function of blocking the electron transport. When at least one of the hole injection layer 42a and the hole transport layer 42b has the function of blocking the electron transport, these layers may serve also as the electron block layer. That the electron block layer has the function of blocking the electron transport may be confirmed, for example, by manufacturing an element passing through a hole current alone; and confirming the blocking effect from a decrease of the current value thereof.

<Hole Block Layer>

The hole block layer is a layer having the function of blocking the hole transport. When at least one of the electron injection layer and the electron transport layer has the function of blocking the hole transport, these layers may serve also as the hole block layer. That the hole block layer has the function of blocking the hole transport may be confirmed, for example, by manufacturing an element passing through a hole current alone; and confirming the blocking effect from a decrease of the current value thereof.

<Method for Manufacturing Organic EL Element>

As the method for manufacturing the organic EL element of the present invention, the method for manufacturing the organic EL element 10 having the structure as described above is described with reference to FIG. 1. When the layers making up the organic EL element 10 of the present invention are formed by the coating method using a coating liquid, the coating step is performed in an atmosphere at around normal atmospheric pressure, for example in an inert gas atmosphere, such as argon gas and nitrogen gas, or in the atmosphere.

Here, "the atmosphere" means an atmosphere allowing containing moisture and oxygen. Specifically, "the atmosphere" includes an unadjusted atmosphere at normal temperature and under normal pressure, and further includes an atmosphere adjusted with respect to the temperature, the pressure, the constituent, and the like while allowing containing moisture and oxygen. This "adjusted atmosphere" includes an atmosphere that is subjected to a treatment of adjusting the constituent such as nitrogen, hydrogen, oxygen, and carbon dioxide under such a condition that the manufacturing method of the present invention including "coating" may be performed and a treatment of adjusting the ratio of these constituents, and in which the cleanliness with respect to floating fine particles and floating microbes may be adjusted and furthermore, an environmental condition such as the temperature, the humidity, and the pressure may be adjusted under such a condition that the manufacturing method of the present invention including "coating" may be performed. The pressure of "the atmosphere" is usually normal pressure of 1,013 hPa±100 hPa.

The method for manufacturing the organic EL element of the present embodiment comprises a charge generation layer forming step of forming the charge generation layer by a coating method using a coating liquid containing the ionic polymer.

Specifically, the method for forming the organic EL element of the present embodiment comprises:

a step of preparing a first substrate on which one electrode out of an anode and a cathode is formed;

a light-emitting unit forming step of forming a light-emitting unit comprising a light-emitting layer;

a charge generation layer forming step of forming a charge generation layer by a coating method using a coating liquid containing an ionic polymer; and a step of forming the other electrode out of the anode and the cathode, in which the light-emitting unit forming step is performed in a plurality of times, and the charge generation layer forming step is performed between the light-emitting unit forming step and the light-emitting unit forming step.

By performing the charge generation layer forming step between the light-emitting unit forming step and the light-emitting unit forming step, the charge generation layer is formed between the light-emitting units adjacent to each other.

In an embodiment below, described is an embodiment in which an organic EL element is prepared by sequentially stacking each constituent in order from an anode among the constituents making up the organic EL element on the first substrate and by forming a cathode finally. The organic EL element may be prepared also by sequentially stacking each constituent in a reverse stacking order from the above-described stacking order in order from the cathode on the first substrate and by forming the anode finally.

First, the first substrate 22 is prepared and on one side of the first substrate 22 in the thickness direction thereof, a film of a conductive material is formed, followed by patterning the resultant film by a photolithography step and a patterning step following the photolithography step such as an etching step, thus forming the anode 32. This step may be a step of forming the anode 32 by obtaining a substrate in which a film of a conductive material is film-formed on the first substrate 22 beforehand and performing the patterning step.

(Step of Forming Light-Emitting Unit)

Next, on the anode 32, the first light-emitting unit 80 is formed. In the present embodiment, the hole injection layer 42a is formed so as to come into contact with the anode 32 and furthermore, the hole transport layer 42b is formed so as to come into contact with the hole injection layer 42a. Then, the first light-emitting layer 50 is formed so as to come into contact with the hole transport layer 42b. These hole injection layer 42a, hole transport layer 42b, and first light-emitting layer 50 may be formed as a layer by a method comprising: preparing a coating liquid using a suitable solvent corresponding to the selected material; forming a coating film by a coating method for applying the coating liquid; and subjecting the resultant coating film to heating treatment.

(Charge Generation Layer Forming Step)

Next, the charge generation layer 70 is formed so as to come into contact with the first light-emitting unit 80. The embodiment of the charge generation layer 70 comprises (1) an embodiment comprising a single layer and (2) an embodiment comprising a plurality of layers comprising the electron generation layer 72 and the hole generation layer 74. Each embodiment will be described by dividing the description into some cases.

(1) Formation of Charge Generation Layer 70 Comprising Single Layer

In this case, (i) a charge generation layer 70 comprising a single layer containing an ionic polymer having in one polymer, a moiety generating an electron by applying the electric field and a moiety generating a hole by applying the electric field, is formed, (ii) a charge generation layer 70 comprising a single layer containing: the ionic polymer having electron injection characteristic of generating an electron by applying the electric field; and an ionic polymer of a type different from the type of the above-described ionic polymer, which has hole injection characteristic of generating a hole by applying the electric field, is formed, (iii) a charge generation layer 70 comprising a single layer containing: the ionic polymer having electron injection characteristic of generating an electron by applying the electric field; and another functional constituent having hole injection characteristic of generating a hole by applying the electric field, is formed, or (iv) a charge generation layer 70 comprising a single layer containing: another functional constituent having electron injection characteristic of generating an electron by applying the electric field; and the ionic polymer having hole injection characteristic of generating a hole by applying the electric field, is formed.

(2) Formation of Charge Generation Layer 70 Comprising Electron Generation Layer 72 and Hole Generation Layer 74

In this case, (i) the electron generation layer 72 is formed with a material containing the ionic polymer generating an electron by applying the electric field and the hole generation layer 74 is formed with a material containing the ionic polymer generating a hole by applying the electric field, (ii) the electron generation layer 72 is formed with a material containing the ionic polymer generating an electron by applying the electric field and the hole generation layer 74 is formed with a material containing another constituent having a function of generating a hole by applying the electric field, or (iii) the electron generation layer 72 is formed with a material containing another constituent generating an electron by applying the electric field and the hole generation layer 74 is formed with a material containing the ionic polymer generating a hole by applying the electric field.

In FIG. 1, the charge generation layer 70 consisting of the electron generation layer 72 and the hole generation layer 74 is illustrated.

The charge generation layer 70 is formed so as to come into contact with the first light-emitting unit and then, by repeating alternately the light-emitting unit forming step and the charge generation layer forming step, the light-emitting unit and the charge generation layer are sequentially and repeatedly layered. At the end of the repeating, the light-emitting layer forming step is performed, thus forming the xth light-emitting unit. As described above, in the embodiment illustrated in FIG. 1, among all the light-emitting units 80, the light-emitting units 80 remaining after excluding the first and xth light-emitting units 80 are made up of the light-emitting layer 50 alone, so that at the step of forming the remaining light-emitting units, the light-emitting layer 50 alone is formed.

When the charge generation layer is formed, the top layer of the light-emitting unit is exposed to a coating liquid for forming the charge generation layer. Therefore, the top layer of the light-emitting unit exposed to the coating liquid is preferably formed with a material that is difficult to be dissolved in a coating liquid used for forming the charge generation layer. For example, when the charge generation layer is formed using a coating liquid prepared by dissolving the ionic polymer in a polar solvent, the top layer is preferably formed with a material that is dissolved in a nonpolar solvent and is difficult to be dissolved in a polar solvent. The light-emitting layer is generally made up of a material that is dissolved in a nonpolar solvent and is difficult to be dissolved in a polar solvent, so that in the case where the charge generation layer is formed using a coating liquid prepared by dissolving the ionic polymer in a polar solvent, when the charge generation layer is formed, the light-emitting layer may be prevented from being re-dissolved in the coating liquid.

At the light-emitting unit forming step for forming the xth light-emitting unit, first, as described above, the xth light-emitting layer is formed on the charge generation layer 70.

(Formation of Electron Injection Layer)

Next, the electron injection layer 44 is formed so as to come into contact with the xth light-emitting layer 50. The formation of the electron injection layer 44 may be performed, as described above, by a coating method for applying a coating liquid containing the ionic polymer having a function of improving the electron injection efficiency.

First, the coating liquid containing the ionic polymer is prepared. As the solvent for preparing the coating liquid, a polar solvent such as methanol and ethanol may be used. By using such a polar solvent, as described above, the light-emitting layer may be prevented from being re-dissolved in the coating liquid for forming the electron injection layer 44.

The coating liquid containing the ionic polymer is applied onto the surface of the xth light-emitting layer 50. Like in the case of the hole injection layer, the hole transport layer, the light-emitting layer 50, and the charge generation layer 70 described above, as the coating method, a spin coating method and moreover, a printing method may be used.

By subjecting the coating film of the applied coating liquid containing the ionic polymer to heating treatment, the electron injection layer 44 is formed. The temperature for this step is preferably 150° C. or less from the viewpoint of maintaining the function of the light-emitting layer 50.

(Formation of Cathode)

Next, on the formed electron injection layer 44, the cathode 34 is formed. For the formation of the cathode 34, although any suitable forming method corresponding to the selected material such as a deposition method may be selected, like in the case of the formation of the hole injection layer, the hole transport layer, the light-emitting layer 50, the charge generation layer 70, and the electron injection layer 44 described above, the cathode 34 may be formed also by a coating method using a coating liquid.

As the method for forming the cathode 34 by the coating method, a method for applying a coating liquid in which a cathode material is dispersed in a solvent or a dispersion medium, a method for transferring a layer of a coating liquid formed on another supporting substrate, and the like are preferred.

The formation of the cathode 34 by a coating method is performed by applying the coating liquid onto an exposed surface of the electron injection layer 44. The application of the coating liquid is preferably performed by a spin coating method, an inkjet method, or the like. Then, by subjecting the applied coating film to heating treatment, the cathode 34 may be formed. The temperature for subjecting the cathode 34 to heating treatment is preferably 150° C. or less, like the temperature for subjecting the electron injection layer 44 to heating treatment. When as the conductive material, PEDOT/PSS is used, the cathode 34 may be subjected to heating treatment under conditions of at 100° C. and for around 10 minutes, whereby the damage against the light-emitting layer 50 may be prevented.

Next, by using the second substrate 24, the layered structure is sealed. This sealing step may be performed by joining the second substrate 24 to a side of the cathode 34 of the layered structure in which the layers up to the cathode 34 are formed, using any suitable sealing member such as a thermocurable resin and an ultraviolet ray-curable resin.

Through these steps, the organic EL element 10 is manufactured.

Through the method for forming the organic EL element of the present invention, as the material for the charge generation layer 70 and moreover, the electron injection layer 44, the ionic polymer, which is difficult to be degraded and less lowers the function thereof even when exposed to moisture and oxygen in the atmosphere, is used, so that the step of forming these layers may be performed in an atmosphere different from a vacuum atmosphere such as an atmosphere at around normal atmospheric pressure, an inert gas atmosphere, and further, the atmosphere. Therefore, a large-scaled equipment such as a vacuum chamber is unnecessary, so that there may be obtained remarkable effects such as capable of extremely simplifying the step of manufacturing the organic EL element and capable of remarkably reducing the manufacturing cost.

EXAMPLES

With reference to some examples, the present invention will now be described in greater details. Examples below should not be construed as limiting the scope of the present invention.

The weight average molecular weight (Mw) and the number average molecular weight (Mn) were measured using gel permeation chromatography (GPC) (manufactured by Tosoh Corporation: HLC-8220GPC) as the weight average molecular weight and the number average molecular weight in terms of polystyrene. The sample to be measured was dissolved in tetrahydrofuran so as to have a concentration of about 0.5% by weight and 50 μL of the resultant solution was injected into GPC. Moreover, as the mobile phase of GPC, tetrahydrofuran was used and the mobile phase was flowed at a flow rate of 0.5 mL/min. The structural analysis of the polymer was performed by a $^1$H-NMR analysis using 300 MHz NMR spectrometer (manufactured by Varian Inc.). The measurement was performed by dissolving the sample in a deuterated solvent (a solvent in which a hydrogen atom in a solvent molecule is substituted with a deuterium atom) capable of dissolving the sample so as to have a concentration of 20 mg/mL. The orbital energy of the highest occupied molecular orbital (HOMO) of the polymer was obtained by measuring the ionization potential of the polymer as the orbital energy of HOMO. On the other hand, the orbital energy of the lowest unoccupied molecular orbital (LUMO) of the polymer was obtained by measuring the energy difference between HOMO and LUMO and by calculating the sum of the energy difference and the above-described measured ionization potential as the orbital energy of LUMO. For measuring the ionization potential, a photoelectronic spectrophotometer (RIKEN KEIKI Co., Ltd.: AC-2) was used. The energy difference between HOMO and LUMO is obtained from an absorption terminal of the absorption spectrum of the polymer measured using an ultraviolet-visible-near infrared spectrophotometer (manufactured by Varian Inc.: Cary 5E).

Reference Example 1

Synthesis of 2,7-dibromo-9,9-bis[3-ethoxycarbonyl-4-[2-[2-(2-methoxyethoxy)ethoxy]ethoxy]phenyl]-fluorene (compound A)

2,7-dibromo-9-fluorenone (52.5 g), ethyl salicylate (154.8 g), and mercapto acetic acid (1.4 g) were charged into a 300 mL flask and an atmosphere in the flask was purged with nitrogen (hereinafter, "the atmosphere in the flask was purged with nitrogen" may be described as only "was purged with nitrogen"). Methanesulfonic acid (630 mL) was then added to this and the resultant reaction mixture was stirred at 75° C. all night. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered. The resultant solid (62.7 g), 2-[2-(2-methoxyethoxy)ethoxy]-p-toluene sulfonate (86.3 g), potassium carbonate (62.6 g), and 18-crown-6 (7.2 g) were dissolved in N,N-dimethylformamide (DMF) (670 mL) and the resultant reaction solution was transferred into a flask and was stirred at 105° C. all night. The resultant reaction mixture was left to be cooled down to room temperature and into the flask, ice water was added, followed by stirring the resultant reaction mixture for 1 hour. To the reaction mixture, chloroform (300 mL) was added to subject the resultant reaction mixture to phase-separation extraction and the resultant extract was concentrated, thus obtaining 2,7-dibromo-9,9-bis[3-ethoxycarbonyl-4-[2-[2-(2-methoxyethoxy)ethoxy]ethoxy]phenyl]-fluorene (compound A) (51.2 g).

[Chemical Formula 64]

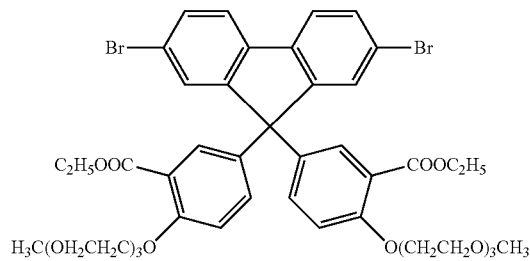

Compound A

Reference Example 2

Synthesis of 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B)

In a nitrogen atmosphere, the compound A (15 g), bis(pinacolate)diboron (8.9 g), [1,1'-bis(diphenylphosphino)ferrocene]dichloropalladium (II)dichloromethane complex (0.8 g), 1,1'-bis(diphenylphosphino)ferrocene (0.5 g), potassium acetate (9.4 g), and dioxane (400 mL) were mixed and the resultant reaction mixture was heated to 110° C. to heating-reflux the reaction mixture for 10 hours. The reaction mixture was left to be cooled down and was filtered and the filtrate was concentrated under reduced pressure. The reaction mixture was washed with methanol for three times. The precipitate was dissolved in toluene and to the resultant solution, an activated carbon was added, followed by stirring the resultant mixture. Then, the mixture was filtered and the filtrate was concentrated under reduced pressure, thus obtaining 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B) (11.7 g).

[Chemical Formula 65]

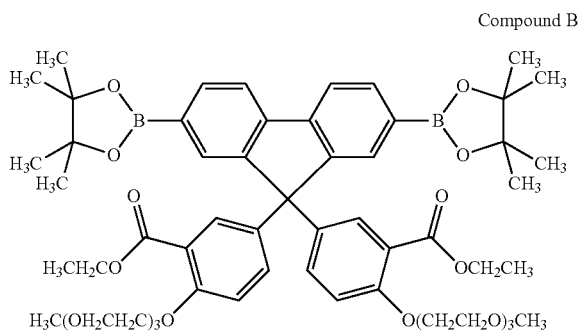

Compound B

Reference Example 3

Synthesis of poly[9,9-bis[3-ethoxycarbonyl-4-[2-[2-(2-methoxyethoxy)ethoxy]ethoxy]phenyl]-fluorene] (polymer A)

In an inert atmosphere, the compound A (0.55 g), the compound B (0.61 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 8 hours. To the reaction mixture, 4-tert-butyl-phenylboronic acid (0.01 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. Then, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrate was dropped into methanol (200 mL), followed by filtering and drying a deposited solid. The yield of obtained poly[9,9-bis[3-ethoxycarbonyl-4-bis[2-[2-(2-methoxyethoxy)ethoxy]ethoxy]phenyl]-fluorene] (polymer A) was 520 mg.

The number average molecular weight in terms of polystyrene of the polymer A was $5.2 \times 10^4$. The polymer A contains a structural unit represented by Formula (A).

[Chemical Formula 66]

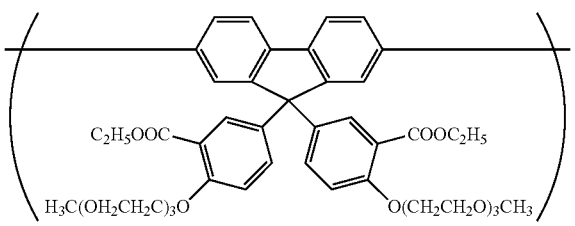

(A)

Experiment Example 1

Synthesis of Cesium Salt of Polymer A

The polymer A (200 mg) was charged into a 100-mL flask and an atmosphere in the flask was purged with nitrogen. Into the flask, tetrahydrofuran (20 mL) and ethanol (20 mL) were added and the temperature of the resultant reaction mixture was elevated to 55° C. To the resultant reaction mixture, an aqueous solution prepared by dissolving cesium hydroxide (200 mg) in water (2 mL) was added and the resultant reaction mixture was stirred at 55° C. for 6 hours. The reaction mixture was cooled down to room temperature and therefrom, the reaction solvent was distilled off under reduced pressure. A generated solid was washed with water and was dried under reduced pressure, thus obtaining a light yellow solid (150 mg). From the NMR spectrum of the solid, it was confirmed that a signal ascribed to an ethyl group in an ethyl ester moiety in the polymer A disappeared completely. The obtained polymer A cesium salt is called a conjugated macromolecular compound 1. The conjugated macromolecular compound 1 contains a structural unit represented by Formula (B) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 1 was −5.5 eV and the orbital energy of LUMO of the conjugated macromolecular compound was −2.7 eV.

[Chemical Formula 67]

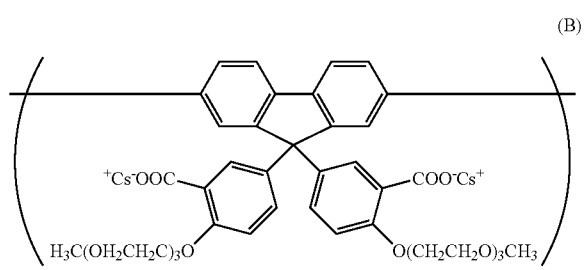

(B)

Experiment Example 2

Synthesis of Potassium Salt of Polymer A

The polymer A (200 mg) was charged into a 100-mL flask and an atmosphere in the flask was purged with nitrogen. Tetrahydrofuran (20 mL) and methanol (10 mL) were mixed with the polymer A. To the reaction mixture, an aqueous solution prepared by dissolving potassium hydroxide (400 mg) in water (2 mL) was added and the resultant reaction mixture was stirred at 65° C. for 1 hour. To the reaction mixture, 50 mL of methanol was added and furthermore, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (131 mg). From the NMR spectrum of the solid, it was confirmed that a signal ascribed to an ethyl group in an ethyl ester moiety in the polymer A disappeared completely. The obtained polymer A potassium salt is called a conjugated macromolecular compound 2. The conjugated macromolecular compound 2 contains a structural unit represented by Formula (C) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 2 was −5.5 eV and the orbital energy of LUMO of the conjugated macromolecular compound 2 was −2.7 eV.

[Chemical Formula 68]

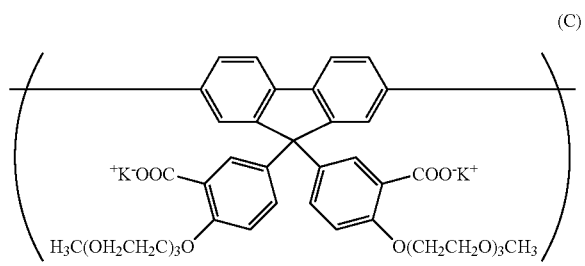

(C)

Experiment Example 3

Synthesis of Sodium Salt of Polymer A

The polymer A (200 mg) was charged into a 100-mL flask and an atmosphere in the flask was purged with nitrogen. Tetrahydrofuran (20 mL) and methanol (10 mL) were mixed with the polymer A. To the resultant reaction mixture, an aqueous solution prepared by dissolving sodium hydroxide (260 mg) in water (2 mL) was added and the resultant reaction mixture was stirred at 65° C. for 1 hour. To the reaction mixture, 30 mL of methanol was added and furthermore, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (123 mg). From the NMR spectrum of the solid, it was confirmed that a signal ascribed to an ethyl group in an ethyl ester moiety in the polymer A disappeared completely. The obtained polymer A sodium salt is called a conjugated macromolecular compound 3. The conjugated macromolecular compound 3 contains a structural unit represented by Formula (D) ("the ratio of a structural unit containing one or more groups selected from the group consisting of a group represented by Formula (1) and a group represented by Formula (2) and one or more groups represented by Formula (3) in all structural units" and "the ratio of the structural units represented by Formulae (13), (15), (17), and (20) in all structural units" are 100% by mole). The orbital energy of HOMO of the conjugated macromolecular compound 3 was −5.6 eV and the orbital energy of LUMO of the conjugated macromolecular compound 3 was −2.8 eV.

[Chemical Formula 69]

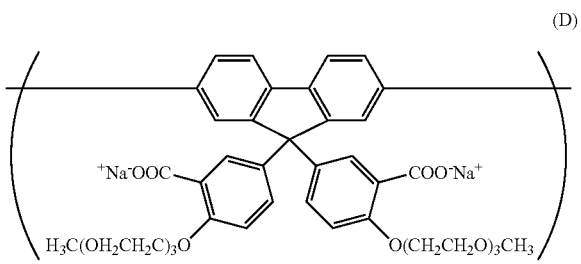

(D)

Experiment Example 4

Synthesis of Ammonium Salt of Polymer A

The polymer A (200 mg) was charged into a 100-mL flask inside of which was then purged with nitrogen. Tetrahydrofuran (20 mL) and methanol (15 mL) were mixed with the polymer A. To the resultant reaction mixture, an aqueous solution prepared by dissolving tetramethylammonium hydroxide (50 mg) in water (1 mL) was added and the resultant reaction mixture was stirred at 65° C. for 6 hours. To the reaction mixture, an aqueous solution prepared by dissolving tetramethylammonium hydroxide (50 mg) in water (1 mL) was added and furthermore, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (150 mg). From the NMR spectrum of the solid, it was confirmed that a signal ascribed to an ethyl group in an ethyl ester moiety in the polymer A disappeared by 90%. The obtained polymer A ammonium salt is called a conjugated macromolecular compound 4. The conjugated macromolecular compound 4 contains a structural unit represented by Formula (E) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 90% by mole). The orbital energy of HOMO of the conjugated macromolecular compound 4 was −5.6 eV and the orbital energy of LUMO of the conjugated macromolecular compound 4 was −2.8 eV.

[Chemical Formula 70]

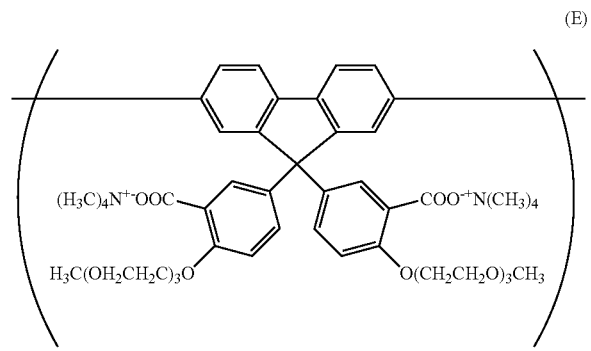

(E)

(10 mL), and a 2M sodium carbonate aqueous solution (10 mL) were mixed and the resultant reaction mixture was heated to 80° C. The reaction mixture was subjected to the reaction for 3.5 hours. Then, to the reaction mixture, p-bromotoluene (0.68 g) was added and the resultant reaction mixture was further subjected to the reaction for 2.5 hours. After the completion of the reaction, the reaction mixture was cooled down to room temperature and to the reaction mixture, ethyl acetate 50 mL/distilled water 50 mL was added, followed by removing the aqueous phase. To the reaction mixture, 50 mL of distilled water was then added again and the aqueous phase was removed. To the reaction mixture, magnesium sulfate as a drying agent was added and insoluble matters were filtered, followed by removing the organic solvent. Then, the resultant residue was dissolved in 10 mL of THF again and to the resultant solution, 2 mL of saturated sodium diethyldithiocarbamate water was added. The resultant reaction mixture was stirred for 30 minutes and therefrom, the organic solvent was removed. The resultant residue was passed through an alumina column (eluent: hexane:ethyl acetate=1:1, v/v) to purify the residue. A deposited precipitate was filtered and the precipitate was dried under reduced pressure for 12 hours, thus obtaining 524 mg of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (polymer B).

The number average molecular weight in terms of polystyrene of the polymer B was $2.0 \times 10^3$. The polymer B is represented by Formula (F).

[Chemical Formula 71]

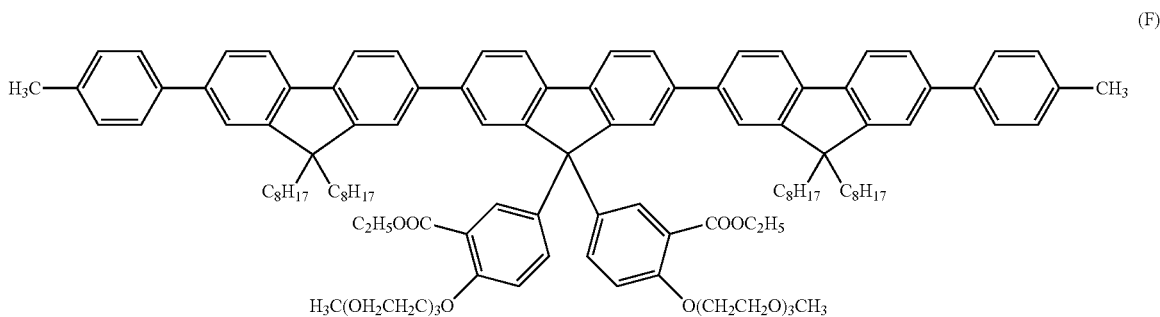

(F)

Reference Example 4

Synthesis of 2,7-bis[7-(4-methylphenyl)-9,9-dioctyl-fluorene-2-yl]-9,9-bis[3-ethoxycarbonyl-4-[2-[2-(2-methoxyethoxy)ethoxy]ethoxy]phenyl]-fluorene (polymer B)

In an inert atmosphere, the compound A (0.52 g), 2,7-bis(1,3,2-dioxaborolan-2-yl)-9,9-dioctylfluorene (1.29 g), (triphenylphosphine)palladium (0.0087 g), methyltrioctylammonium chloride (manufactured by Aldrich Corp.; trade name: Aliquat 336 (registered trade mark)) (0.20 g), toluene Experiment Example 5

Synthesis of Cesium Salt of Polymer B

The polymer B (262 mg) was charged into a 100-mL flask and an atmosphere in the flask was purged with argon. Into the flask, tetrahydrofuran (10 mL) and methanol (15 mL) were added and the temperature of the resultant reaction mixture was elevated to 55° C. To the reaction mixture, an aqueous solution prepared by dissolving cesium hydroxide (341 mg) in water (1 mL) was added and the resultant reaction mixture was stirred at 55° C. for 5 hours. The reaction mixture was cooled down to room temperature and therefrom, the reaction solvent was distilled off under reduced pressure. A generated solid was washed with water and was dried under reduced pressure, thus obtaining a light yellow solid (250 mg). From the NMR spectrum of the solid, it was confirmed that a signal ascribed to an ethyl group in an ethyl ester moiety disappeared completely. The obtained polymer B cesium salt is called a conjugated macromolecular compound 5. The conjugated macromolecular compound 5 is represented by Formula (G) ("the ratio of a structural unit containing one or more groups selected from the group consisting of a group represented by Formula (1) and a group represented by Formula (2) and one or more groups represented by Formula (3) in all structural units" and "the ratio of the structural units represented by Formulae (13), (15), (17), and (20) in all structural units" are calculated by rounding off to one decimal place as 33.3% by mole). The orbital energy of HOMO of the conjugated macromolecular compound 5 was −5.6 eV and the orbital energy of LUMO of the conjugated macromolecular compound 5 was −2.6 eV.

To the reaction mixture, phenylboronic acid (0.01 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. After the reaction mixture was dropped into 300 mL of methanol and the resultant reaction mixture was stirred for 1 hour, a deposited precipitate was filtered and the precipitate was dried under reduced pressure for 2 hours, followed by dissolving the precipitate in 20 mL of tetrahydrofuran. After the resultant reaction solution was dropped into a solvent mixture of 120 mL of methanol and 50 mL of a 3% by weight acetic acid aqueous solution and the resultant reaction mixture was stirred for 1 hour, a deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the

[Chemical Formula 72]

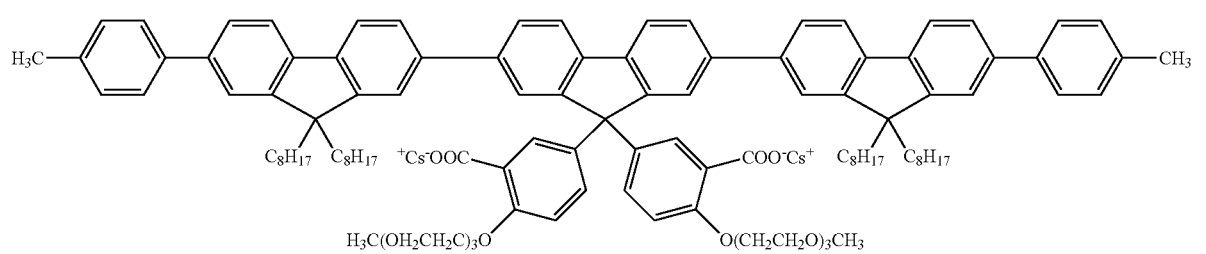

(G)

Reference Example 5

Synthesis of Polymer C

In an inert atmosphere, the compound A (0.40 g), the compound B (0.49 g), N,N'-bis(4-bromophenyl)-N,N'-bis(4-tert-butyl-2,6-dimethylphenyl)-1,4-phenylenediamine (35 mg), (triphenylphosphine)palladium (8 mg), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 8 hours.

resultant solution was passed through an alumina column and a silica gel column to purify the solution. After the tetrahydrofuran solution recovered from the column was concentrated, the concentrated tetrahydrofuran solution was dropped into methanol (200 mL), followed by filtering and drying a deposited solid. The yield of the obtained polymer C was 526 mg.

The number average molecular weight in terms of polystyrene of the polymer C was $3.6 \times 10^4$. The polymer C contains a structural unit represented by Formula (H).

Here, N,N'-bis(4-bromophenyl)-N,N'-bis(4-tert-butyl-2,6-dimethylphenyl)-1,4-phenylenediamine may be synthesized, for example, by a method described in JP 2008-74917 A.

[Chemical Formula 73]

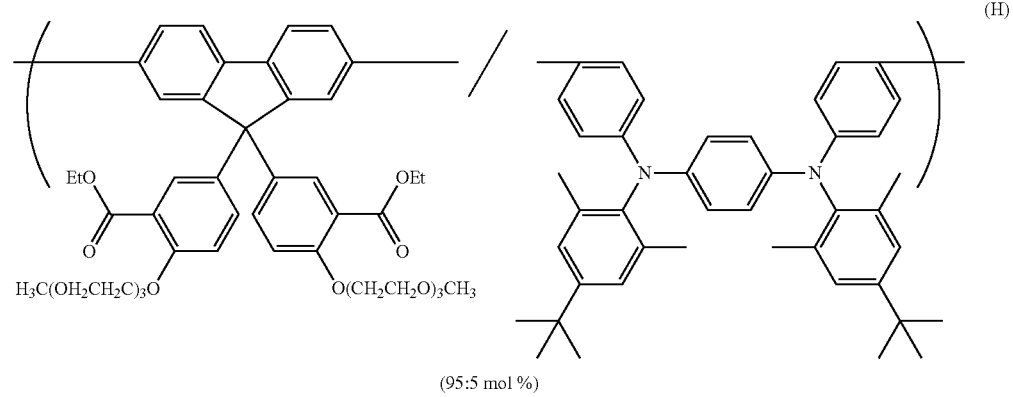

(H)

(95:5 mol %)

Experiment Example 6

Synthesis of Cesium Salt of Polymer C

The polymer C (200 mg) was charged into a 100-mL flask and an atmosphere in the flask was purged with nitrogen. Into the flask, tetrahydrofuran (20 mL) and methanol (20 mL) were added and the resultant reaction mixture was mixed. To the reaction mixture, an aqueous solution prepared by dissolving cesium hydroxide (200 mg) in water (2 mL) was added and the resultant reaction mixture was stirred at 65° C. for 1 hour. To the reaction mixture, 30 mL of methanol was added and moreover, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (150 mg). From the NMR spectrum of the solid, it was confirmed that a signal ascribed to an ethyl group in an ethyl ester moiety in the polymer C disappeared completely. The obtained polymer C cesium salt is called a conjugated macromolecular compound 6. The conjugated macromolecular compound 6 contains a structural unit represented by Formula (I) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 95% by mole). The orbital energy of HOMO of the conjugated macromolecular compound 6 was −5.3 eV and the orbital energy of LUMO of the conjugated macromolecular compound 6 was −2.6 eV.

(0.009 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 2 hours. To the reaction mixture, phenylboronic acid (0.004 g) was added and the resultant reaction mixture was refluxed for 6 hours. Next, a sodium diethyldithiocarbamate aqueous solution (10 mL, concentration: 0.05 g/mL) was added and the resultant reaction mixture was stirred for 2 hours. After the reaction mixture was dropped into 300 mL of methanol and the resultant reaction mixture was stirred for 1 hour, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrated tetrahydrofuran solution was dropped into methanol (200

[Chemical Formula 74]

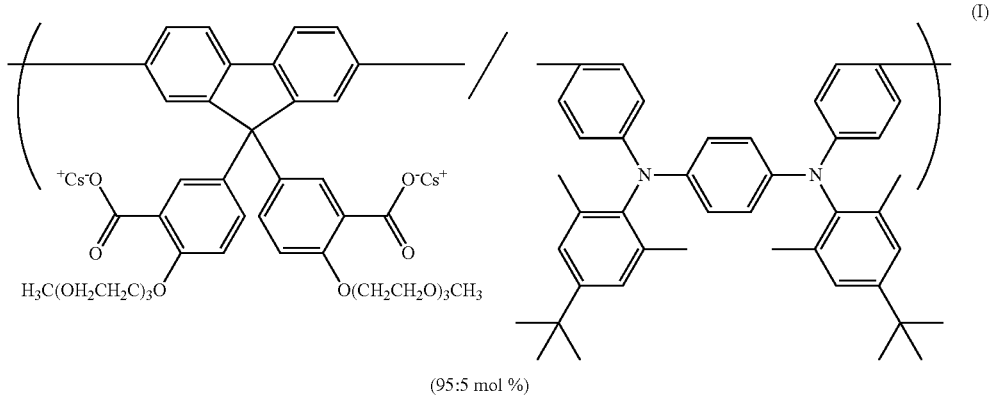

(95:5 mol %)

Reference Example 6

Synthesis of Polymer D

In an inert atmosphere, the compound A (0.55 g), the compound B (0.67 g), N,N'-bis(4-bromophenyl)-N,N'-bis(4-tert-butyl-2,6-dimethylphenyl)-1,4-phenylenediamine (0.038 g), 3,7-dibromo-N-(4-n-butylphenyl)phenoxazine mL), followed by filtering and drying a deposited solid. The yield of the obtained polymer D was 590 mg.

The number average molecular weight in terms of polystyrene of the polymer D was $2.7 \times 10^4$. The polymer D contains a structural unit represented by Formula (J).

Here, 3,7-dibromo-N-(4-n-butylphenyl)phenoxazine was synthesized through a method described in JP 2007-70620 A (or referring to a method described in JP 2004-137456 A).

[Chemical Formula 75]

(J)

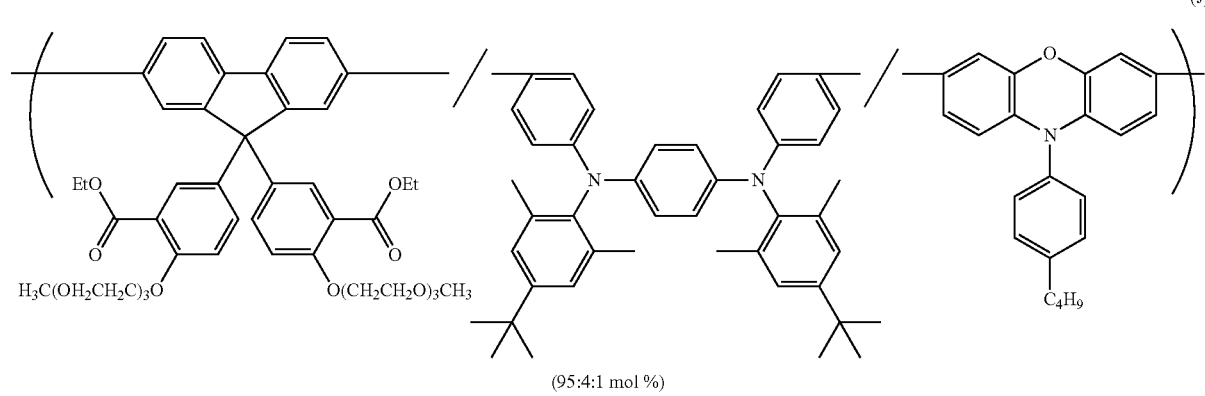

(95:4:1 mol %)

Experiment Example 7

Synthesis of Cesium Salt of Polymer D

The polymer D (200 mg) was charged into a 100-mL flask inside of which was then purged with nitrogen. Tetrahydrofuran (15 mL) and methanol (10 mL) were mixed with the polymer D. To the reaction mixture, an aqueous solution prepared by dissolving cesium hydroxide (360 mg) in water (2 mL) was added and the resultant reaction mixture was stirred at 65° C. for 3 hours. To the reaction mixture, 10 mL of methanol was added and furthermore, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (210 mg). From the NMR spectrum of the solid, it was confirmed that a signal ascribed to an ethyl group in an ethyl ester moiety in the polymer D disappeared completely. The obtained polymer D cesium salt is called a conjugated macromolecular compound 7. The conjugated macromolecular compound 7 contains a structural unit represented by Formula (K) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 90% by mole). The orbital energy of HOMO of the conjugated macromolecular compound 7 was −5.3 eV and the orbital energy of LUMO of the conjugated macromolecular compound 7 was −2.4 eV.

[Chemical Formula 76]

(K)

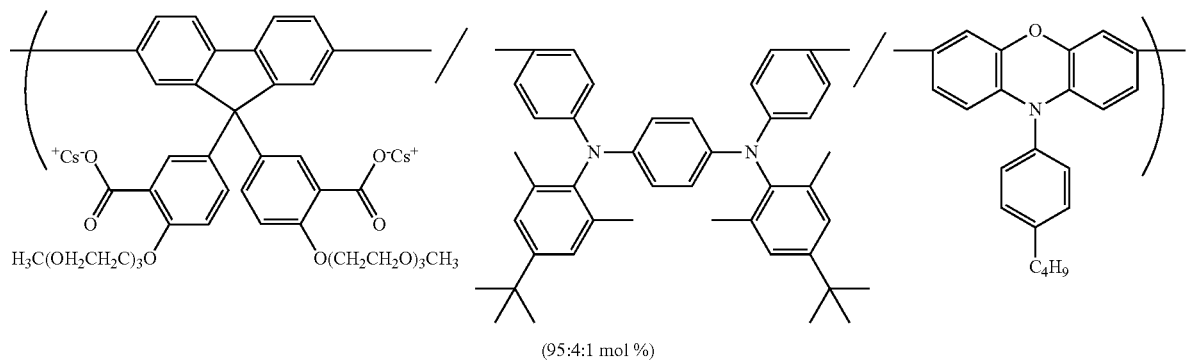

(95:4:1 mol %)

Reference Example 7

Synthesis of Polymer E

In an inert atmosphere, the compound A (0.37 g), the compound B (0.82 g), 1,3-dibromobenzene (0.09 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 7 hours. To the reaction mixture, phenylboronic acid (0.002 g) was added and the resultant reaction mixture was refluxed for 10 hours. Next, a sodium diethyldithiocarbamate aqueous solution (10 mL, concentration: 0.05 g/mL) was added and the resultant reaction mixture was stirred for 1 hour. The resultant reaction mixture was dropped into 300 mL of methanol and the resultant reaction mixture was stirred for 1 hour. A deposited precipitate was filtered and the precipitate was dried under reduced pressure for 2 hours, followed by dissolving the precipitate in 20 mL of tetrahydrofuran. After the resultant reaction solution was dropped into a solvent mixture of 120 mL of methanol and 50 mL of a 3% by weight acetic acid aqueous solution and the resultant reaction mixture was stirred for 1 hour, a deposited precipitate was filtered and the precipitate was dissolved in 20 mL of tetrahydrofuran. After the thus obtained reaction solution was dropped into 200 mL of methanol and the resultant reaction mixture was stirred for 30 minutes, a deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrate was dropped into methanol (200 mL), followed by filtering and drying a deposited solid. The yield of the obtained solid (polymer E) was 293 mg.

The number average molecular weight in terms of polystyrene of the polymer E was $1.8 \times 10^4$. The polymer E consists of a structural unit represented by Formula (L).

[Chemical Formula 77]

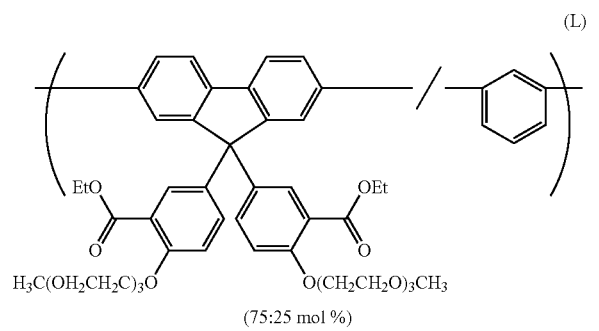

(L)

(75:25 mol %)

Experiment Example 8

Synthesis of Cesium Salt of Polymer E

The polymer E (200 mg) was charged into a 100-mL flask and an atmosphere in the flask was purged with nitrogen. In the flask, tetrahydrofuran (10 mL) and methanol (5 mL) were mixed with the polymer E. To the resultant reaction mixture, an aqueous solution prepared by dissolving cesium hydroxide (200 mg) in water (2 mL) was added and the resultant reaction mixture was stirred at 65° C. for 2 hours. To the reaction mixture, 10 mL of methanol was added and furthermore, the resultant reaction mixture was stirred at 65° C. for 5 hours. The reaction mixture was cooled down to room temperature and therefrom, the reaction solvent was distilled off under reduced pressure. A generated solid was washed with water and was dried under reduced pressure, thus obtaining a light yellow solid (170 mg). From the NMR spectrum of the solid, it was confirmed that a signal ascribed to an ethyl group in an ethyl ester moiety in the polymer E disappeared completely. The obtained polymer E cesium salt is called a conjugated macromolecular compound 8. The conjugated macromolecular compound 8 contains a structural unit represented by Formula (M) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 75% by mole). The orbital energy of HOMO of the conjugated macromolecular compound 8 was −5.6 eV and the orbital energy of LUMO of the conjugated macromolecular compound 8 was −2.6 eV.

[Chemical Formula 78]

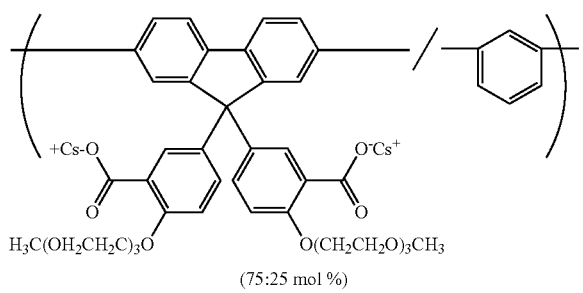

(M)

(75:25 mol %)

Reference Example 8

Synthesis of Polymer F

In an inert atmosphere, the compound B (1.01 g), 1,4-dibromo-2,3,5,6-tetrafluorobenzene (0.30 g), (triphenylphosphine)palladium (0.02 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 4 hours. To the reaction mixture, phenylboronic acid (0.002 g) was added and the resultant reaction mixture was refluxed for 4 hours. Next, to the reaction mixture, a sodium diethyldithiocarbamate aqueous solution (10 mL, concentration: 0.05 g/mL) was added and the resultant reaction mixture was stirred for 1 hour. After the resultant mixture was dropped into 300 mL of methanol and the resultant reaction mixture was stirred for 1 hour, a deposited precipitate was filtered and the precipitate was dried under reduced pressure for 2 hours, followed by dissolving the precipitate in 20 mL of tetrahydrofuran. After the resultant reaction solution was dropped into a solvent mixture of 120 mL of methanol and 50 mL of a 3% by weight acetic acid aqueous solution and the resultant reaction mixture was stirred for 1 hour, a deposited precipitate was filtered and the precipitate was dissolved in 20 mL of tetrahydrofuran. After the thus obtained reaction solution was dropped into 200 mL of methanol and the resultant reaction mixture was stirred for 30 minutes, a deposited precipitate was filtered, thus obtaining a solid. The obtained solid was dissolved in a solvent mixture of tetrahydrofuran/ethyl acetate (1/1 (volume ratio)) and the resultant solution was passed through an alumina column and a silica gel column to purify the solution. After the tetrahydrofuran solution recovered from the column was concentrated, the solution was dropped into methanol (200 mL), followed by filtering and drying a deposited solid. The yield of the obtained polymer E was 343 mg.

The number average molecular weight in terms of polystyrene of the polymer F was $6.0 \times 10^4$. The polymer F consists of a structural unit represented by Formula (N).

[Chemical Formula 79]

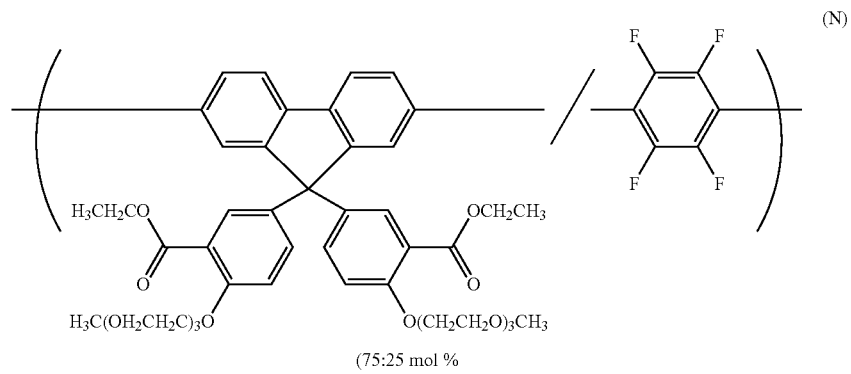

(75:25 mol %)

Experiment Example 9

Synthesis of Cesium Salt of Polymer F

The polymer F (150 mg) was charged into a 100-mL flask and an atmosphere in the flask was purged with nitrogen. Into the flask, tetrahydrofuran (10 mL) and methanol (5 mL) were added and mixed with the polymer F. To the reaction mixture, an aqueous solution prepared by dissolving cesium hydroxide (260 mg) in water (2 mL) was added and the resultant reaction mixture was stirred at 65° C. for 2 hours. To the reaction mixture, 10 mL of methanol was added and furthermore, the resultant reaction mixture was stirred at 65° C. for 5 hours. The reaction mixture was cooled down to room temperature and therefrom, the reaction solvent was distilled off under reduced pressure. A generated solid was washed with water and was dried under reduced pressure, thus obtaining a light yellow solid (130 mg). From the NMR spectrum of the solid, it was confirmed that a signal ascribed to an ethyl group in an ethyl ester moiety in the polymer E disappeared completely. The obtained polymer F cesium salt is called a conjugated macromolecular compound 9. The conjugated macromolecular compound 9 contains a structural unit represented by Formula (O) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 75% by mole). The orbital energy of HOMO of the conjugated macromolecular compound 9 was −5.9 eV and the orbital energy of LUMO of the conjugated macromolecular compound 9 was −2.8 eV.

[Chemical Formula 80]

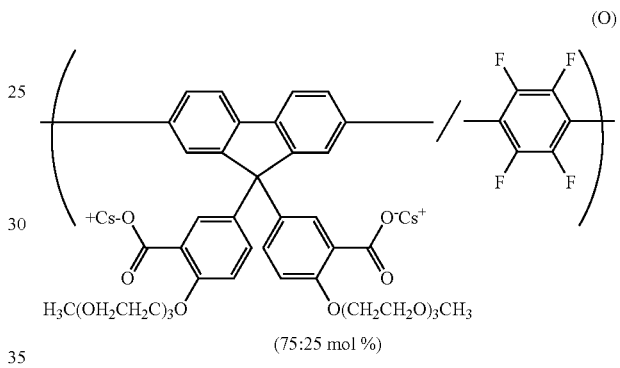

(75:25 mol %)

Reference Example 9

In an inert atmosphere, 2-[2-(2-methoxyethoxy)ethoxy]-p-toluene sulfonate (11.0 g), triethylene glycol (30.0 g), and potassium hydroxide (3.3 g) were mixed and the resultant reaction mixture was heated and stirred at 100° C. for 18 hours. The reaction mixture was left to be cooled down, was charged into water (100 mL), and was subjected to phase-separation extraction with chloroform, followed by concentrating the extract. The concentrated extract was subjected to the Kugel-Rhor distillation (10 mm Torr, 180° C.), thus obtaining 2-(2-(2-(2-(2-(2-methoxyethoxy)-ethoxy)-ethoxy)-ethoxy)-ethoxy)ethanol (6.1 g).

Reference Example 10

In an inert atmosphere, 2-(2-(2-(2-(2-(2-methoxyethoxy)-ethoxy)-ethoxy)-ethoxy)-ethoxy)ethanol (8.0 g), sodium hydroxide (1.4 g), distilled water (2 mL), and tetrahydrofuran (2 mL) were mixed and the resultant reaction mixture was ice-cooled. Into the reaction mixture, a solution of p-tosyl chloride (5.5 g) in tetrahydrofuran (6.4 mL) was dropped over 30 minutes and after the dropping, the temperature of the reaction mixture was elevated to room temperature, followed by stirring the reaction mixture for 15 hours. To the reaction mixture, distilled water (50 mL) was added and the resultant reaction mixture was neutralized with a 6M sulfuric acid, followed by subjecting the reaction mixture to phase-separation extraction with chloroform. The extract was concentrated, thus obtaining 2-(2-(2-(2-(2-(2-methoxyethoxy)-ethoxy)-ethoxy)-ethoxy)-ethoxy)p-toluene sulfonate (11.8 g).

Reference Example 11

Synthesis of 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (compound C)

2,7-dibromo-9-fluorenone (127.2 g), ethyl salicylate (375.2 g), and mercaptoacetic acid (3.5 g) were charged into a 300-mL flask and an atmosphere in the flask was purged with nitrogen. Into the flask, methanesulfonic acid (1420 mL) was added and the resultant reaction mixture was stirred at 75° C. all night. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered, thus obtaining a solid (167.8 g). The obtained solid (5 g), 2-(2-(2-(2-(2-(2-methoxyethoxy)-ethoxy)-ethoxy-ethoxy-ethoxy)p-toluene sulfonate (10.4 g), potassium carbonate (5.3 g), and 18-crown-6 (0.6 g) were dissolved in N,N-dimethylformamide (DMF) (100 mL) and the resultant reaction solution was transferred into a flask and was stirred at 105° C. for 4 hours. The resultant reaction mixture was left to be cooled down to room temperature and was charged into ice water and the resultant reaction mixture was stirred for 1 hour. To the reaction mixture, chloroform (300 mL) was added to subject the resultant reaction mixture to phase-separation extraction and the resultant extract was concentrated. The concentrate was dissolved in ethyl acetate and the resultant solution was passed through an alumina column, followed by concentrating the solution, thus obtaining 2,7-dibromo-9,9-bis[3-ethoxycarbonyl-4-[2-(2-(2-(2-(2-methoxyethoxy)-ethoxy)-ethoxy)-ethoxy)-ethoxy]phenyl]-fluorene (compound C) (4.5 g).

[Chemical Formula 81]

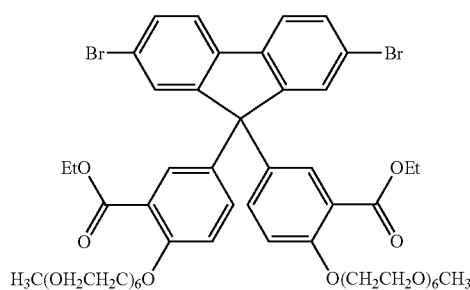

Compound C

Reference Example 12

Synthesis of Polymer G

In an inert atmosphere, the compound C (1.0 g), 4-tert-butylphenyl bromide (0.9 g), 2,2'-bipyridine (0.3 g), and dehydrated tetrahydrofuran (50 mL) were charged into a 200-mL flask and were mixed. The temperature of the resultant reaction mixture was elevated to 55° C., and bis(1,5-cyclooctadiene)nickel (0.6 g) was added to the resultant mixture, followed by stirring the resultant reaction mixture at 55° C. for 5 hours. The reaction mixture was cooled down to room temperature and the reaction mixture was dropped into a solution mixture of methanol (200 mL) and a 1N diluted hydrochloric acid (200 mL). A generated precipitate was collected by filtering and was re-dissolved in tetrahydrofuran. The resultant reaction solution was dropped into a solution mixture of methanol (200 mL) and a 15% ammonia water (100 mL) and a generated precipitate was collected by filtering. The precipitate was re-dissolved in tetrahydrofuran and the resultant reaction solution was dropped into a solution mixture of methanol (200 mL) and water (100 mL), followed by collecting a generated precipitate by filtering. The collected precipitate was dried under reduced pressure, thus obtaining a polymer G (360 mg).

The number average molecular weight in terms of polystyrene of the polymer G was $6.0 \times 10^4$. The polymer G consists of a structural unit represented by Formula (P).

[Chemical Formula 82]

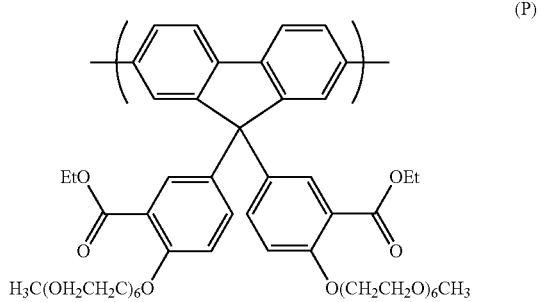

(P)

Experiment Example 10

Synthesis of Cesium Salt of Polymer G

The polymer G (150 mg) was charged into a 100-mL flask inside of which was then purged with nitrogen. Tetrahydrofuran (15 mL) and methanol (5 mL) were mixed with the polymer G. To the resultant reaction mixture, an aqueous solution prepared by dissolving cesium hydroxide (170 mg) in water (2 mL) was added and the resultant reaction mixture was stirred at 65° C. for 6 hours. The reaction mixture was cooled down to room temperature and therefrom, the reaction solvent was distilled off under reduced pressure. A generated solid was washed with water and was dried under reduced pressure, thus obtaining a light yellow solid (95 mg). From the NMR spectrum of the solid, it was confirmed that a signal ascribed to an ethyl group in an ethyl ester moiety in the polymer G disappeared completely. The obtained polymer G cesium salt is called a conjugated macromolecular compound 10. The conjugated macromolecular compound 10 contains a structural unit represented by Formula (Q) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 10 was −5.7 eV and the orbital energy of LUMO of the conjugated macromolecular compound 10 was −2.9 eV.

[Chemical Formula 83]

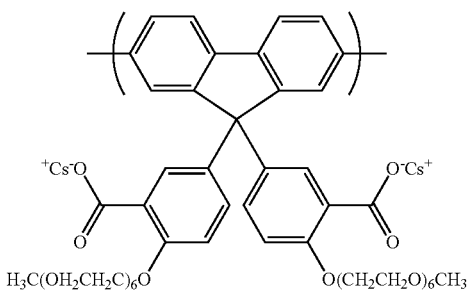

(Q)

Reference Example 13

Synthesis of 1,3-dibromo-5-ethoxycarbonyl-6-[2-[2-(2-methoxyethoxy)ethoxy]ethoxy]benzene In an inert atmosphere, 3,5-dibromosalicylic acid (20 g), ethanol (17 mL), concentrated sulfuric acid (1.5 mL), and toluene (7 mL) were mixed and the resultant reaction mixture was heated-stirred at 130° C. for 20 hours. The reaction mixture was left to be cooled down and the reaction mixture was charged into ice water (100 mL). The resultant reaction mixture was subjected to phase-separation extraction with chloroform and the extract was concentrated. The resultant solid was dissolved in isopropanol and the resultant reaction solution was dropped into distilled water. A resultant deposit was filtered, thus obtaining a solid (18 g). In an inert atmosphere, the obtained solid (1 g), 2-[2-(2-methoxyethoxy)ethoxy]-p-toluene sulfonate (1.5 g), potassium carbonate (0.7 g), and DMF (15 mL) were mixed and the resultant reaction mixture was stirred at 100° C. for 4 hours. The reaction mixture was left to be cooled down and chloroform was added to the resultant mixture. The resultant reaction mixture was subjected to phase-separation extraction, whereby the extract was concentrated. The concentrate was dissolved in chloroform and the resultant solution was passed through a silica gel column to purify the solution. The solution was concentrated, thus obtaining 1,3-dibromo-5-ethoxycarbonyl-6-[2-[2-(2-methoxyethoxy)ethoxy]ethoxy] benzene (1.0 g).

Reference Example 14

Synthesis of Polymer H

In an inert atmosphere, the compound A (0.2 g), the compound B (0.5 g), 1,3-dibromo-5-ethoxycarbonyl-6-[2-[2-(2-methoxyethoxy)ethoxy]ethoxy]benzene (0.1 g), (triphenylphosphine)palladium (30 mg), tetrabutylammonium bromide (4 mg), and toluene (19 mL) were mixed and the resultant reaction mixture was heated to 105° C. Into the reaction mixture, a 2M sodium carbonate aqueous solution (5 mL) was dropped and the resultant reaction mixture was refluxed for 5 hours. To the reaction mixture, phenylboronic acid (6 mg) was added and the resultant reaction mixture was refluxed for 14 hours. Next, to the reaction mixture, a sodium diethyldithiocarbamate aqueous solution (10 mL, concentration: 0.05 g/mL) was added and the resultant reaction mixture was stirred for 2 hours. The aqueous phase was removed and the organic phase was washed with distilled water and was concentrated, thus obtaining a solid. The obtained solid was dissolved in chloroform and the resultant solution was passed through an alumina column and a silica gel column to purify the solution. The eluent from the column was concentrated and dried. The yield of the obtained polymer H was 0.44 g.

The number average molecular weight in terms of polystyrene of the polymer H was $3.6 \times 10^4$. The polymer H consists of a structural unit represented by Formula (R).

[Chemical Formula 84]

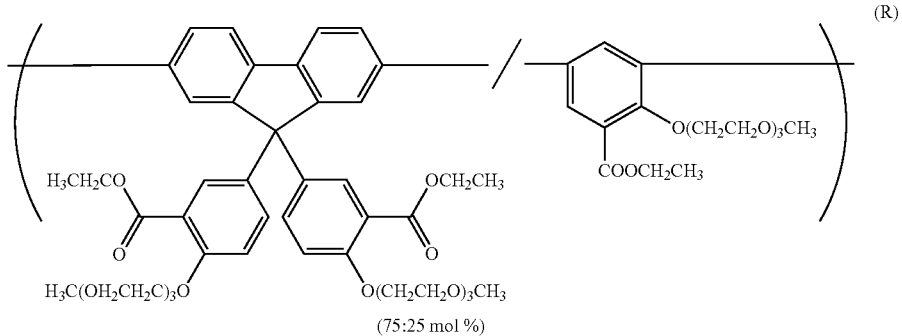

(R)

(75:25 mol %)

Experiment Example 11

Synthesis of Cesium Salt of Polymer H

The polymer H (200 mg) was charged into a 100-mL flask inside of which was then purged with nitrogen. Tetrahydrofuran (14 mL) and methanol (7 mL) were added and the resultant reaction mixture was mixed. To the reaction mixture, an aqueous solution prepared by dissolving cesium hydroxide (90 mg) in water (1 mL) was added and the resultant reaction mixture was stirred at 65° C. for 1 hour. To the reaction mixture, 5 mL of methanol was added and furthermore, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (190 mg). From the NMR spectrum of the solid, it was confirmed that a signal ascribed to an ethyl group in an ethyl ester moiety in the polymer H disappeared completely. The obtained polymer H cesium salt is called a conjugated macromolecular compound 11.

The conjugated macromolecular compound 11 contains a structural unit represented by Formula (S) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are 100% by mole). The orbital energy of HOMO of the conjugated macromolecular compound 11 was −5.6 eV and the orbital energy of LUMO of the conjugated macromolecular compound 11 was −2.8 eV.

[Chemical Formula 85]

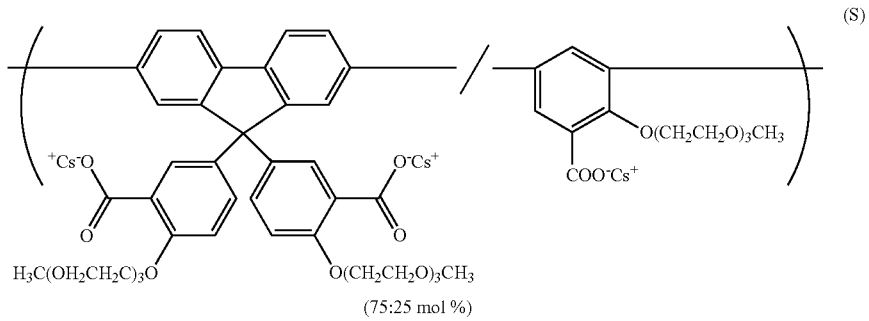

(S)

(75:25 mol %)

Reference Example 15

Synthesis of 2,7-dibromo-9,9-bis[3,4-bis[2-[2-(2-methoxyethoxy)ethoxy]ethoxy]-5-methoxycarbonyl-phenyl]fluorene (compound D)

2,7-dibromo-9-fluorenone (34.1 g), methyl 2,3-dihydroxybenzoate (101.3 g), and mercaptoacetic acid (1.4 g) were charged into a 500-mL flask inside of which was then purged with nitrogen. Methanesulfonic acid (350 mL) was then added into this and the resultant reaction mixture was stirred at 90° C. for 19 hours. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered to obtain a solid. The obtained solid (16.3 g), 2-[2-(2-methoxyethoxy)ethoxy]-p-toluene sulfonate (60.3 g), potassium carbonate (48.6 g), and 18-crown-6 (2.4 g) were dissolved in N,N-dimethylformamide (DMF) (500 mL) and the resultant reaction solution was transferred into a flask and was stirred at 110° C. for 15 hours. The resultant reaction mixture was left to be cooled down to room temperature and was charged into ice water and the resultant reaction mixture was stirred for 1 hour. To the reaction mixture, ethyl acetate (300 mL) was added to subject the resultant reaction mixture to phase-separation extraction and the resultant extract was concentrated. The concentrate was dissolved in a solvent mixture of chloroform/methanol (50/1 (volume ratio)) and the resultant solution was passed through a silica gel column to purify the solution. The solution passed through the column was concentrated, thus obtaining 2,7-dibromo-9,9-bis[3,4-bis[2-[2-(2-methoxyethoxy)ethoxy]ethoxy]-5-methoxycarbonylphenyl]fluorene (compound D) (20.5 g).

Reference Example 16

Synthesis of 2,7-bis[7-(4-methylphenyl)-9,9-dioctyl-fluorene-2-yl]-9,9-bis[5-methoxycarbonyl-3,4-bis[2-[2-(2-methoxyethoxy)ethoxy]ethoxy]phenyl]-fluorene (polymer I)

In an inert atmosphere, the compound D (0.70 g), 2-(4,4,5,5-tetramethyl-1,2,3-dioxaborolan-2-yl)-9,9-dioctylfluorene (0.62 g), (triphenylphosphine)palladium (0.019 g), dioxane (40 mL), water (6 mL), and a potassium carbonate aqueous solution (1.38 g) were mixed and the resultant reaction mixture was heated to 80° C. The reaction mixture was subjected to the reaction for 1 hour. After the completion of the reaction, to the reaction mixture, 5 mL of saturated sodium diethyldithiocarbamate water was added. The resultant reaction mixture was stirred for 30 minutes and therefrom, the organic solvent was removed. The resultant solid was passed through an alumina column (eluent: hexane:ethyl acetate=1:1 (volume ratio)) to purify the solid. The resultant solution was concentrated, thus obtaining 660 mg of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (polymer I).

The number average molecular weight in terms of polystyrene of the polymer I was 2.0×10³. The polymer I is represented by Formula (T). Here, 2-(4,4,5,5-tetramethyl-1,2,3-dioxaborolan-2-yl)-9,9-dioctylfluorene may be synthesized, for example, by a method described in The Journal of Physical Chemistry B 2000, 104, 9118-9125.

[Chemical Formula 86]

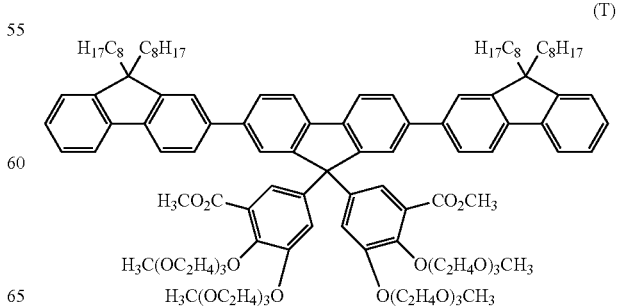

(T)

Experiment Example 12

Synthesis of Cesium Salt of Polymer I

The polymer I (236 mg) was charged into a 100-mL flask and an atmosphere in the flask was purged with argon. Tetrahydrofuran (20 mL) and methanol (10 mL) were then added to this and the temperature of the resultant reaction mixture was elevated to 65° C. Into the flask, an aqueous solution prepared by dissolving cesium hydroxide (240 mg) in water (2 mL) was added and the resultant reaction mixture was stirred at 65° C. for 7 hours. The resultant reaction mixture was cooled down to room temperature and therefrom, the reaction solvent was distilled off under reduced pressure. A generated solid was washed with water and was dried under reduced pressure, thus obtaining a light yellow solid (190 mg). From the NMR spectrum of the solid, it was confirmed that a signal ascribed to an ethyl group in the ethyl ester moiety disappeared completely. The obtained polymer I cesium salt is called a conjugated macromolecular compound 12. The conjugated macromolecular compound 12 is represented by Formula (U) ("the ratio of a structural unit containing one or more groups selected from the group consisting of a group represented by Formula (1) and a group represented by Formula (2) and one or more groups represented by Formula (3) in all structural units" and "the ratio of the structural units represented by Formula (13), Formula (15), Formula (17), and Formula (20) in all structural units" are calculated by rounding off to one decimal place as 33.3% by mole). The orbital energy of HOMO of the conjugated macromolecular compound 12 was −5.6 eV and the orbital energy of LUMO of the conjugated macromolecular compound 12 was −2.8 eV.

injection layer and the substrate was naturally cooled down to room temperature to obtain the substrate in which the hole injection layer was formed.

Here, as the hole injection material solution, PLEX CORE OC1200 (manufactured by Plextronics Inc.) was used.

Next, a light-emitting macromolecular material (manufactured by Sumation K.K.; "Lumation BP361") was mixed with xylene to obtain a composition for forming the light-emitting layer containing a 1.4% by weight light-emitting macromolecular material. Onto the hole injection layer of the substrate, obtained as described above, in which the hole transport layer was formed, a composition for forming the light-emitting layer was applied by a spin coating method to obtain a coating film having a thickness of 60 nm. The substrate in which the coating film was provided was heated in a nitrogen atmosphere at 130° C. for 15 minutes to evaporate the solvent and the substrate was naturally cooled down to room temperature, thus obtaining the substrate in which a first light-emitting layer was formed.

<Formation of Charge Generation Layer>

Methanol and the conjugated macromolecular compound 1 were mixed with each other to obtain a composition containing a 0.5% by weight conjugated macromolecular compound 1. This composition was applied onto the first light-emitting layer, obtained as described above, by a spin coating method to obtain a coating film having a thickness of 20 nm. The substrate in which this coating film was provided was heated in a nitrogen atmosphere at 130° C. for 10 minutes to evaporate the solvent and then, the substrate was naturally cooled down to room temperature, thus obtaining the substrate in which the charge generation layer containing the conjugated macromolecular compound 1 was formed.

[Chemical Formula 87]

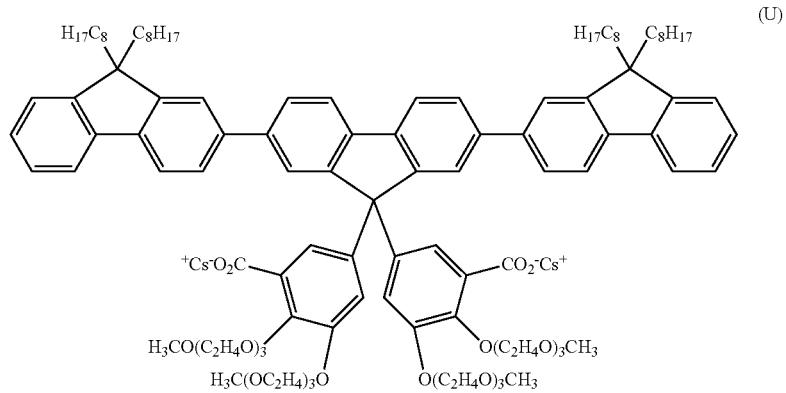

(U)

Example 1

<Manufacture of Multiphoton-Type Organic EL Element>

An ITO anode (thickness: 45 nm) deposited on the surface of a glass substrate was subjected to UV ozone treatment.

<Formation of First Light-Emitting Unit>

Then, onto the ITO anode, a hole injection material solution was applied by a spin coating method to form the hole injection layer so that the layer had a thickness of 50 nm. The glass substrate on which the hole injection layer was formed was heated in an inert atmosphere (nitrogen atmosphere) at 170° C. for 15 minutes to dry the hole <Formation of Second Light-Emitting Unit>

Next, a light-emitting macromolecular material (manufactured by Sumation K.K.; "Lumation BP361") was mixed with xylene to obtain a composition for forming the light-emitting layer containing a 1.4% by weight light-emitting macromolecular material. This composition for forming the light-emitting layer was applied onto the charge generation layer, obtained as described above, by a spin coating method to obtain a coating film having a thickness of 60 nm. The substrate in which this coating film was provided was heated in a nitrogen atmosphere at 130° C. for 15 minutes to evaporate the solvent and the substrate was naturally cooled down to room temperature, thus obtaining the substrate in which a second light-emitting layer was formed.

Methanol and the conjugated macromolecular compound 1 were mixed with each other to obtain a composition containing a 0.5% by weight conjugated macromolecular compound 1. This composition was applied onto the second light-emitting layer, obtained as described above, by a spin coating method to obtain a coating film having a thickness of 20 nm. The substrate in which this coating film was provided was heated in a nitrogen atmosphere at 130° C. for 10 minutes to evaporate the solvent and then, the substrate was naturally cooled down to room temperature to obtain the substrate in which an electron injection layer containing the conjugated macromolecular compound 1 was formed.

The substrate, obtained as described above, in which the electron injection layer containing the conjugated macromolecular compound 1 was formed was inserted into a vacuum device and by a vacuum deposition method, Al was deposited on the electron injection layer in a thickness of 100 nm to form a cathode to manufacture a layered structure 1.

The thus-obtained layered structure 1 was taken out of the vacuum device and was sealed with a sealing glass and a two-fluid mixing type epoxy resin in an inert atmosphere (in a nitrogen atmosphere), thus obtaining a multi-photon-type organic EL element 1.

Reference Example 17

<Manufacture of Single Photon-Type Organic EL Element>

An ITO anode (film thickness: 45 nm) formed and patterned on the surface of a glass substrate was subjected to UV ozone treatment. Onto this ITO anode, a hole injection material solution was applied to form a hole injection layer by a spin coating method so that the layer had a thickness of 50 nm. The glass substrate in which the hole injection layer was formed was heated in a nitrogen atmosphere at 170° C. for 15 minutes to dry the hole injection layer and the substrate was naturally cooled down to room temperature, thus obtaining the substrate in which the hole injection layer was formed.

Here, as the hole injection material solution, PLEX CORE OC1200 (manufactured by Plextronics Inc.) was used.

Next, a light-emitting macromolecular material (manufactured by Sumation K.K.; "Lumation BP361") was mixed with xylene to obtain a composition for forming the light-emitting layer containing a 1.4% by weight light-emitting macromolecular material. The composition for forming the light-emitting layer was applied onto the hole transport layer, obtained as described above, by a spin coating method to obtain a coating film having a thickness of 60 nm. The substrate in which this coating film was provided was heated in a nitrogen atmosphere at 130° C. for 15 minutes to evaporate the solvent and the substrate was naturally cooled down to room temperature to obtain the substrate in which a light-emitting layer was formed.

Next, methanol and the conjugated macromolecular compound 1 were mixed with each other to obtain a composition containing a 0.5% by weight conjugated macromolecular compound 1. This composition was applied onto the light-emitting layer, obtained as described above, by a spin coating method to obtain a coating film having a thickness of 20 nm. The substrate in which this coating film was provided was heated in an inert atmosphere (in a nitrogen atmosphere) at 130° C. for 10 minutes to evaporate the solvent and then, the substrate was naturally cooled down to room temperature to obtain the substrate in which the electron injection layer containing the conjugated macromolecular compound 1 was formed.

The thus-obtained substrate, in which the electron injection layer containing the conjugated macromolecular compound 1 was formed, was inserted into a vacuum apparatus. On the hole injection layer, Al was film-formed in a thickness of 100 nm by a vacuum deposition method to form the cathode to provide a layered structure 2.

The thus-obtained layered structure 2 was taken out of the vacuum apparatus and was sealed with a sealing glass through a two-fluid mixing type epoxy resin in a nitrogen atmosphere, thus obtaining a single photon-type organic EL element 2.

[Measurement]

To the thus-obtained organic EL elements 1 and 2, a forward direction voltage was applied to measure the light-emitting brightness and the light-emitting efficiency when the current density is 50 mA/cm$^2$. The result of the measurement is listed in Table 1.

TABLE 1

| | Light-emitting brightness (cd/m$^2$) | Light-emitting efficiency (cd/A) |
|---|---|---|
| Example 1 (Organic EL element 1) | 800 | 1.6 |
| Reference Example 17 (Organic EL element 2) | 408 | 0.8 |

As is apparent from Table 1, the multi-photon-type organic EL element is excellent in light-emitting efficiency and light-emitting brightness in comparison with the single photon-type organic EL element, so that it was confirmed that a layer containing the ionic polymer functions as the charge generation layer.

EXPLANATIONS OF LETTERS OR NUMERALS

10 Organic EL element
22 First substrate
24 Second substrate
32 Anode
34 Cathode
42a Hole injection layer
42b Hole transport layer
44 Electron injection layer
50 Light-emitting layer
70 Charge generation layer
72 Electron generation layer
74 Hole generation layer
80 Light-emitting unit

The invention claimed is:

1. An organic electroluminescent element comprising:
a pair of electrodes comprising an anode and a cathode;
a plurality of light-emitting layers provided between the electrodes; and
a charge generation layer provided between the light-emitting layers that are adjacent to each other,
wherein the charge generation layer comprises a first polymer that generates electrons and holes respectively or together, and
wherein the first polymer comprises a second polymer having a structural unit containing at least one group selected from the group consisting of groups represented by Formula (1), groups represented by Formula (2), and groups represented by Formula (3) in a content of 15% by mole to 100% by mole based on the number of moles of all structural units, wherein at least one structural unit contains a group represented by Formula (1) or Formula (2);

$$-(Q^1)_{n1}Y^1(M^1)_{a1}(Z^1)_{b1} \quad (1)$$

wherein $Q^1$ represents a divalent organic group; $Y^1$ represents —$CO_2^-$, —$SO_3^-$, —$SO_2^-$, —$PO_3^{2-}$, or —$B(R^a)_3^-$; $M^1$ represents a metal cation or an ammonium cation optionally having a substituent; $Z^1$ represents $F^-$, $Cl^-$, $Br^-$, $I^-$, $OH^-$, $R^aSO_3^-$, $RaCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, $PF_6^-$; n1 represents an integer of 0 or more; a1 represents an integer of 1 or more and b1 represents an integer of 0 or more, provided that a1 and b1 are selected so that the electric charge of the group represented by Formula (1) becomes 0; $R^a$ represents an alkyl group having 1 to 30 carbon atoms that may have a substituent or an aryl group having 6 to 50 carbon atoms that may have a substituent; and when each of $Q^1$, $M^1$, and $Z^1$ are plurally present, a plurality of each $Q^1$, $M^1$, or $Z^1$ may be the same as or different from each other;

$$-(Q^2)_{n2}\text{-}Y^2(M^2)_{a2}(Z^2)_{b2} \quad (2)$$

wherein $Q^2$ represents a divalent organic group; $Y^2$ represents a carbo cation, an ammonium cation, a phosphonyl cation or a sulfonyl cation or an iodonium cation; $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$; $Z^2$ represents a metal cation or an ammonium cation optionally having a substituent; n2 represents an integer of 0 or more; a2 represents an integer of 1 or more and b2 represents an integer of 1 or more, provided that a2 and b2 are selected so that the electric charge of the group represented by Formula (2) becomes 0; $R^b$ represents an alkyl group having 1 to 30 carbon atoms that may have a substituent or an aryl group having 6 to 50 carbon atoms that may have a substituent; and when each of $Q^2$, $M^2$, and $Z^2$ are plurally present, a plurality of each $Q^2$, $M^2$, or $Z^2$ may be the same as or different from each other;

$$-(Q^3)_{n3}\text{-}Y^3 \quad (3)$$

wherein $Q^3$ represents a divalent organic group; $Y^3$ represents —CN or a group represented by any one of Formula (4) to Formula (12); and n3 represents an integer of 0 or more;

—O—(R'O)$_{a3}$—R"  (4)

  (5)

—S—(R'S)$_{a4}$—R"  (6)

—C(=O)—(R'—C(=O))$_{a4}$—R"  (7)

—C(=S)—(R'—C(=S))$_{a4}$—R"  (8)

—N((R')$_{a4}$R")$_2$  (9)

—C(=O)O—(R'—C(=O)O)$_{a4}$—R"  (10)

—C(=O)O—(R'O)$_{a4}$—R"  (11)

—NHC(=O)—(R'NHC(=O))$_{a4}$—R"  (12)

wherein R' represents a divalent hydrocarbon group optionally having a substituent; R" represents a hydrogen atom, a monovalent hydrocarbon group optionally having a substituent, —COOH, —$SO_3H$, —OH, —SH, —$NR^c_2$, —CN, or —C(=O)$NR^c_2$; R''' represents a trivalent hydrocarbon group optionally having a substituent; a3 represents an integer of 1 or more; a4 represents an integer of 0 or more; $R^c$ represents an alkyl group having 1 to 30 carbon atoms that may have a substituent or an aryl group having 6 to 50 carbon atoms that may have a substituent; and when each of R', R", and R''' are plurally present, a plurality of each R', R", or R''' may be the same as or different from each other.

2. The organic electroluminescent element according to claim 1, wherein the charge generation layer is formed of a single layer.

3. The organic electroluminescent element according to claim 1, further comprising: an electron injection layer provided between the cathode and one of the light-emitting layers that is arranged closest to the cathode, wherein the electron injection layer comprises a polymer.

* * * * *